US012727379B2

(12) United States Patent
An et al.

(10) Patent No.: US 12,727,379 B2
(45) Date of Patent: Sep. 1, 2026

(54) COMPOUND FOR ORGANIC OPTOELECTRONIC DEVICE, COMPOSITION FOR ORGANIC OPTOELECTRONIC DEVICE, ORGANIC OPTOELECTRONIC DEVICE, AND DISPLAY DEVICE

(71) Applicant: SAMSUNG SDI CO., LTD., Yongin-si (KR)

(72) Inventors: Eunhye An, Suwon-si (KR); Seonyeong Gwak, Suwon-si (KR); Wook Kim, Suwon-si (KR); Changwoo Kim, Suwon-si (KR); Hyung Sun Kim, Suwon-si (KR); Hanill Lee, Suwon-si (KR); Sung-Hyun Jung, Suwon-si (KR); Suyong Lim, Suwon-si (KR); Youngkyoung Jo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 815 days.

(21) Appl. No.: 17/518,829

(22) Filed: Nov. 4, 2021

(65) Prior Publication Data

US 2022/0149289 A1 May 12, 2022

(30) Foreign Application Priority Data

Nov. 6, 2020 (KR) ........................ 10-2020-0148013

(51) Int. Cl.

*H10K 85/60* (2023.01)
*H10K 50/11* (2023.01)

(Continued)

(52) U.S. Cl.

CPC ........... *H10K 85/654* (2023.02); *H10K 50/11* (2023.02); *H10K 85/40* (2023.02); *H10K 85/622* (2023.02);

(Continued)

(58) Field of Classification Search

CPC ............. H10K 85/654; H10K 85/6572; H10K 2101/90; H10K 85/657; C07D 495/04; C07D 491/048

See application file for complete search history.

(56) References Cited

U.S. PATENT DOCUMENTS 5,061,569 A 10/1991 Vanslyke et al.
10,297,761 B2 5/2019 Kawamura et al.

(Continued)

FOREIGN PATENT DOCUMENTS

CN 108695440 A 10/2018
CN 109251199 A 1/2019

(Continued)

OTHER PUBLICATIONS

ACS Appl. Mater. Interfaces 2016, 8, 23190-23196.

(Continued)

*Primary Examiner* — Jenna N Chandhok
(74) *Attorney, Agent, or Firm* — Lee IP Law, P.C.

(57) ABSTRACT

A compound for an organic optoelectronic device, a composition for an organic optoelectronic device including the same, an organic optoelectronic device, and a display device, the compound being represented by a combination of Chemical Formula 1 and Chemical Formula 2, (Continued)

[Chemical Formula 1]

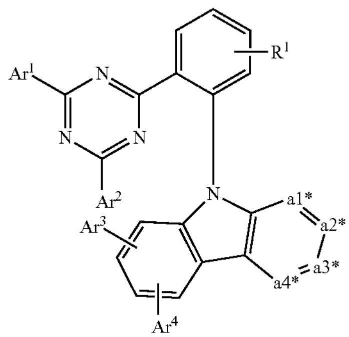

[Chemical Formula 2]

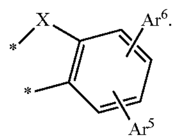

9 Claims, 2 Drawing Sheets

(51) Int. Cl.

*H10K 85/40* (2023.01)
*H10K 101/00* (2023.01)
*H10K 101/10* (2023.01)
*H10K 101/30* (2023.01)
*H10K 101/40* (2023.01)

(52) U.S. Cl.

CPC ..... *H10K 85/6572* (2023.02); *H10K 85/6574* (2023.02); *H10K 85/6576* (2023.02); *H10K 2101/10* (2023.02); *H10K 2101/30* (2023.02); *H10K 2101/40* (2023.02); *H10K 2101/90* (2023.02)

(56) References Cited

U.S. PATENT DOCUMENTS

2014/0145151 A1 5/2014 Xia et al.
2014/0332793 A1 11/2014 Park et al.
2017/0117488 A1 4/2017 Ahn et al.
2020/0062734 A1 2/2020 Esteban et al.
2021/0355128 A1 11/2021 Jung et al.
2022/0029108 A1* 1/2022 Kim .................. H10K 85/6572
2022/0278278 A1 9/2022 Rota Matir et al.
2023/0240140 A1* 7/2023 Han .................... H10K 85/631

FOREIGN PATENT DOCUMENTS

| | | | |
|---|---|---|---|
| CN | 109326741 | A | 2/2019 |
| CN | 109923191 | A | 6/2019 |
| CN | 110785407 | A | 2/2020 |
| CN | 110862378 | A | 3/2020 |
| CN | 111689946 | A | 9/2020 |
| JP | 1993-009471 | A | 1/1993 |
| JP | 1995-126615 | A | 5/1995 |
| JP | 1998-095973 | A | 4/1998 |
| JP | 2018-080161 | A | 5/2018 |
| JP | 2019-176082 | A | 10/2019 |
| JP | 2019-201042 | A | 11/2019 |
| KR | 10-2014-0067914 | A | 6/2014 |
| KR | 10-1498278 | B1 | 2/2015 |
| KR | 10-2015-0116776 | A | 10/2015 |
| KR | 10-1877678 | B1 | 7/2018 |
| KR | 10-2019-0007968 | A | 1/2019 |
| KR | 10-2019-0110775 | A | 10/2019 |
| KR | 10-2019-0113661 | A | 10/2019 |
| KR | 10-2027025 | B1 | 10/2019 |
| KR | 10-2020-0063048 | A | 6/2020 |
| KR | 10-2022-0005388 | A | 1/2022 |
| KR | 10-2022-0038149 | A | 3/2022 |
| WO | WO 1995/009147 | A1 | 4/1995 |
| WO | WO 2018-189356 | A1 | 10/2018 |
| WO | WO 2019-073077 | A1 | 4/2019 |
| WO | WO 2019/120099 | A1 | 6/2019 |
| WO | WO 2019/175160 | A1 | 9/2019 |
| WO | WO 2019/176605 | A1 | 9/2019 |

OTHER PUBLICATIONS

Chinese Office action mailed Apr. 28, 2023.
Korean Office Action dated Jan. 18, 2024, of the corresponding Korean Patent Application No. 10-2020-0148013.
Korean Notice of Allowance dated Jun. 17, 2025.

* cited by examiner

200

COMPOUND FOR ORGANIC OPTOELECTRONIC DEVICE, COMPOSITION FOR ORGANIC OPTOELECTRONIC DEVICE, ORGANIC OPTOELECTRONIC DEVICE, AND DISPLAY DEVICE

CROSS-REFERENCE TO RELATED APPLICATION

This application claims priority to and the benefit of Korean Patent Application No. 10-2020-0148013 filed in the Korean Intellectual Property Office on Nov. 6, 2020, the entire contents of which are incorporated herein by reference.

BACKGROUND

1. Field

Embodiments relate to a compound for an organic optoelectronic device, a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be largely divided into two types according to a principle of operation. One type includes a photoelectric device that generates electrical energy by separating excitons formed by light energy into electrons and holes, and transferring the electrons and holes to different electrodes, respectively and another type includes a light emitting device that generates light energy from electrical energy by supplying voltage or current to the electrodes.

Examples of the organic optoelectronic device include an organic photoelectric device, an organic light emitting diode, an organic solar cell, and an organic photoconductor drum.

Among them, organic light emitting diodes (OLEDs) are attracting much attention in recent years due to increasing demands for flat panel display devices. The organic light emitting diode is a device that converts electrical energy into light, and the performance of the organic light emitting diode may be influenced by an organic material between electrodes.

SUMMARY

The embodiments may be realized by providing a compound for an organic optoelectronic device, the compound being represented by a combination of Chemical Formula 1 and Chemical Formula 2,

[Chemical Formula 1]

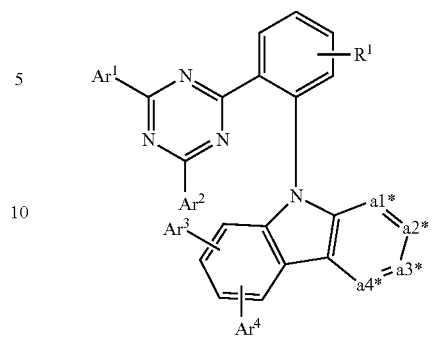

[Chemical Formula 2]

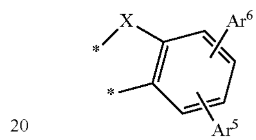

wherein, in Chemical Formula 1 and Chemical Formula 2, X is O or S, two adjacent ones of a1* to a4* of Chemical Formula 1 are linking carbons linked at * of Chemical Formula 2, the remaining two of a1* to a4* of Chemical Formula 1, not linked at * of Chemical Formula 2, are $CR^a$, $Ar^1$ and $Ar^2$ are each independently a substituted or unsubstituted C6 to C30 aryl group or a substituted or unsubstituted C2 to C30 heterocyclic group, $R^a$, $R^1$, and $Ar^3$ to $Ar^6$ are each independently hydrogen, deuterium, a substituted or unsubstituted C1 to C10 alkyl group, or a substituted or unsubstituted C6 to C18 aryl group, and at least one of $Ar^3$ to $Ar^6$ is a substituted or unsubstituted C6 to C18 aryl group.

The embodiments may be realized by providing a composition for an organic optoelectronic device, the composition including a first compound and a second compound, wherein the first compound is the compound according to an embodiment, and the second compound is represented by Chemical Formula 3; or a combination of Chemical Formula 4 and Chemical Formula 5,

[Chemical Formula 3]

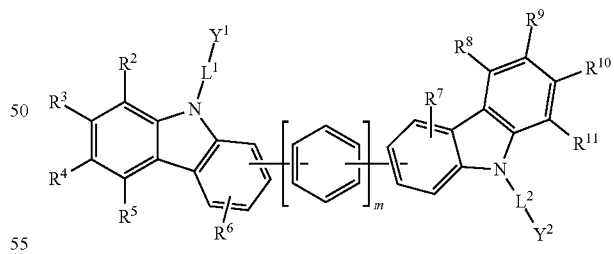

in Chemical Formula 3, $Y^1$ and $Y^2$ are each independently a substituted or unsubstituted C6 to C20 aryl group or a substituted or unsubstituted C2 to C30 heterocyclic group, $L^1$ and $L^2$ are each independently a single bond or a substituted or unsubstituted C6 to C20 arylene group, $R^b$ and $R^2$ to $R^{11}$ are each independently hydrogen, deuterium, a cyano group, a halogen, a substituted or unsubstituted amino group, a substituted or unsubstituted C1 to C30 alkyl group, a substituted or unsubstituted C6 to C30 aryl group, or a substituted or unsubstituted C2 to C30 heterocyclic group, and m is an integer of 0 to 2,

[Chemical Formula 4]

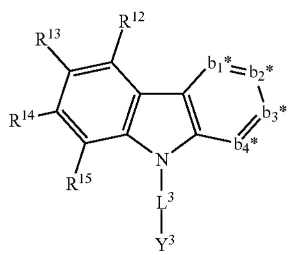

[Chemical Formula 5]

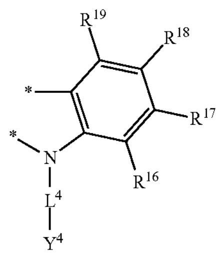

in Chemical Formulas 4 and 5, $Y^3$ and $Y^4$ are each independently a substituted or unsubstituted C6 to C20 aryl group or a substituted or unsubstituted C2 to C30 heterocyclic group, two adjacent ones of $b_1$* to $b_4$* of Chemical Formula 4 are linking carbons linked at * of Chemical Formula 5, the remaining two of $b_1$* to $b_4$* of Chemical Formula 4, not linked at * of Chemical Formula 5, are $C-L^a-R^c$, $L^a$, $L^3$, and $L^4$ are each independently a single bond or a substituted or unsubstituted C6 to C20 arylene group, and $R^c$ and $R^{12}$ to $R^{19}$ are each independently hydrogen, deuterium, a cyano group, a halogen, a substituted or unsubstituted amino group, a substituted or unsubstituted C1 to C30 alkyl group, a substituted or unsubstituted C6 to C30 aryl group, or a substituted or unsubstituted C2 to C30 heterocyclic group.

The embodiments may be realized by providing an organic optoelectronic device including an anode and a cathode facing each other, and at least one organic layer between the anode and the cathode, wherein the at least one organic layer includes the compound according to an embodiment.

The embodiments may be realized by providing an organic optoelectronic device including an anode and a cathode facing each other, and at least one organic layer between the anode and the cathode, wherein the at least one organic layer includes the composition according to an embodiment.

The embodiments may be realized by providing a display device including the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
FIGS. 1 to 4 are cross-sectional views of organic light emitting diodes according to embodiments.
Figure 1:
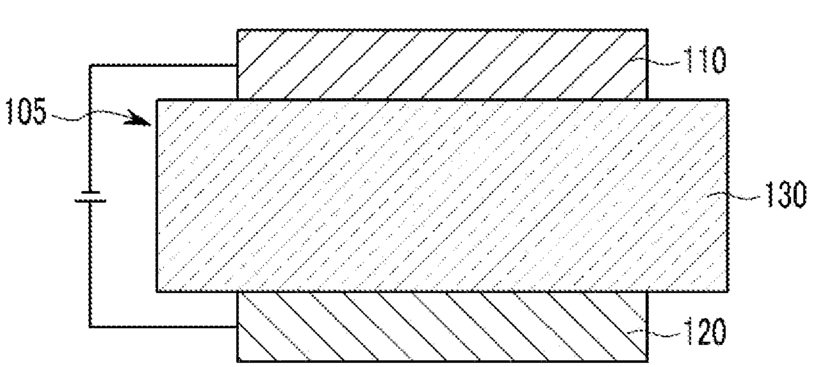

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or A and B.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In a specific example, the "substituted" refers to replacement of at least one hydrogen of a substituent or a compound by deuterium, a C1 to C20 alkyl group, a C6 to C30 aryl group, or a cyano group. In a specific example, the "substituted" refers to replacement of at least one hydrogen of a substituent or a compound by deuterium, a C1 to C5 alkyl group, a C6 to C18 aryl group, or a cyano group. In a specific example, the "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "an aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, a substituted or unsubstituted dibenzothiophenyl group, or a combination thereof, but is not limited thereto.

As used herein, hole characteristics refer to an ability to donate an electron to form a hole when an electric field is applied, and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied, and that electron formed in the cathode may be easily injected into the light emitting layer and transported in the light emitting layer due to conductive characteristics according to a lowest unoccupied molecular orbital (LUMO) level.

Hereinafter, a compound for an organic optoelectronic device according to an embodiment is described.

The compound for an organic optoelectronic device according to an embodiment may be represented by, e.g., a combination of Chemical Formula 1 and Chemical Formula 2.

[Chemical Formula 1]

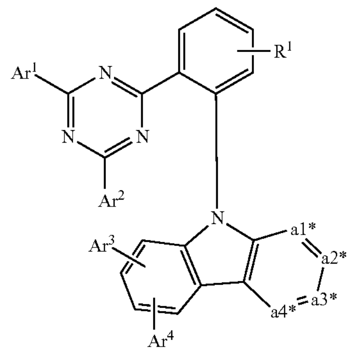

[Chemical Formula 2]

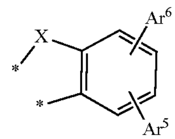

In Chemical Formula 1 and Chemical Formula 2, X may be, e.g., O or S.

Two adjacent ones of a1* to a4* of Chemical Formula 1 are linking carbons linked at * of Chemical Formula 2, the remaining two of a1* to a4* of Chemical Formula 1, not linked at * of Chemical Formula 2, are $CR^a$. As used herein, the term "linking carbon" refers to a shared carbon at which fused rings are linked.

$Ar^1$ and $Ar^2$ may each independently be or include, e.g., a substituted or unsubstituted C6 to C30 aryl group or a substituted or unsubstituted C2 to C30 heterocyclic group.

$R^a$, $R^1$, and $Ar^3$ to $Ar^6$ may each independently be or include, e.g., hydrogen, deuterium, a substituted or unsubstituted C1 to C10 alkyl group, or a substituted or unsubstituted C6 to C18 aryl group.

In an implementation, at least one of $Ar^3$ to $Ar^6$ may be, e.g., a substituted or unsubstituted C6 to C18 aryl group.

The compound represented by Chemical Formula 1 may include a skeleton in which carbazole and benzofuran (or benzothiophene) are fused, and may have a structure in which the carbazole moiety is substituted (on the N atom) with triazine through an ortho-phenylene linker.

In addition, the compound represented by Chemical Formula 1 may have a structure in which a skeleton including carbazole and benzofuran (or benzothiophene) fused to each other is substituted with a substituted or unsubstituted C6 to C18 aryl group.

As such, when it is substituted with triazine through an ortho-phenylene linker, the triazine may help maximize electron transfer (ET) characteristics of the entire compound, thereby lowering driving voltage of the organic light emitting device including the same and maximizing efficiency.

In addition, by introducing the substituted or unsubstituted C6 to C18 aryl group onto the skeleton including carbazole and benzofuran (or benzothiophene) fused to each other, the HOMO cloud may be expanded, and the life-span performance of an organic light emitting device including the same may be secured.

The combination of Chemical Formula 1 and Chemical Formula 2 may be represented by, e.g., one of Chemical Formula 1A to Chemical Formula 1F depending on the fusion position of benzofuran (or benzothiophene).

[Chemical Formula 1A]

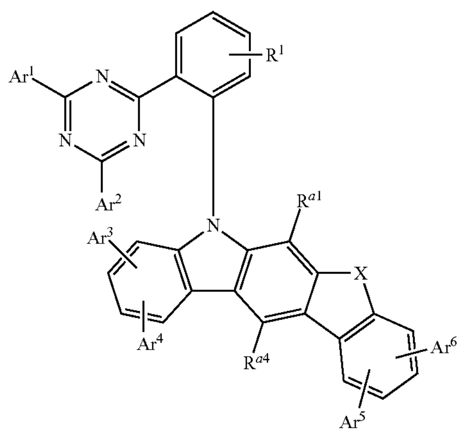

[Chemical Formula 1B]

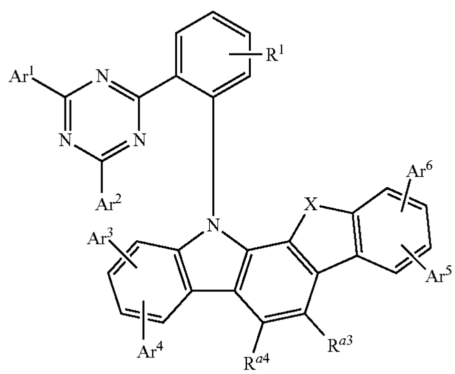

[Chemical Formula 1C]

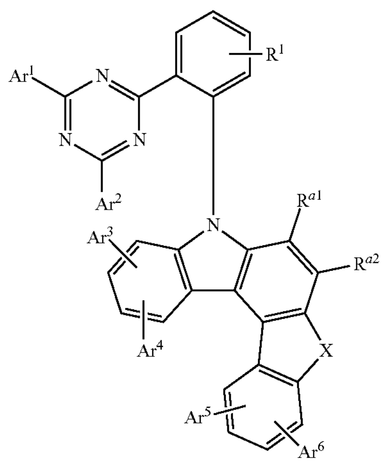

-continued

[Chemical Formula 1D]

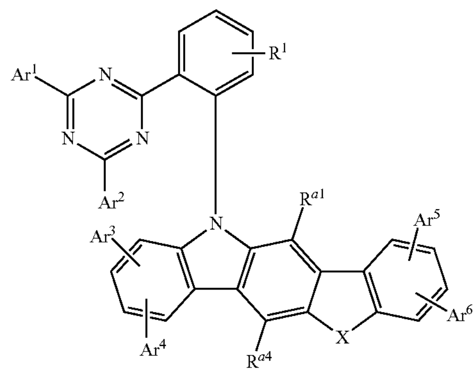

[Chemical Formula 1E]

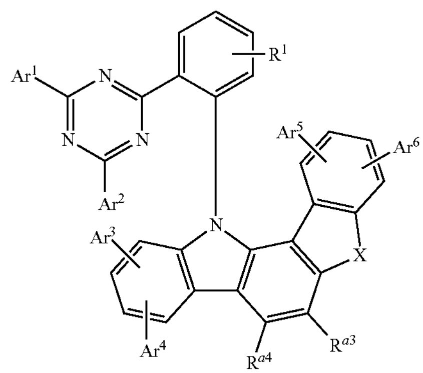

[Chemical Formula 1F]

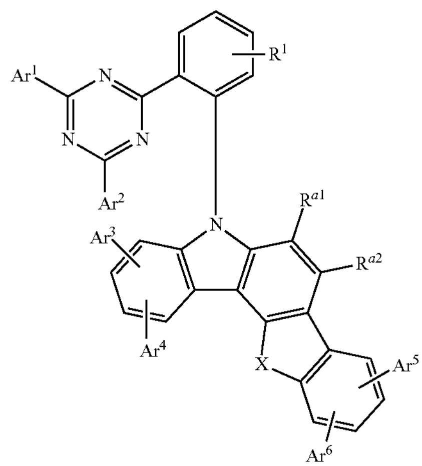

In Chemical Formula 1A to Chemical Formula 1F, X, $Ar^1$ to $Ar^6$, and $R^1$ may be defined the same as those described above.

$R^{a1}$ to $R^{a4}$ may each independently be defined the same as $R^a$.

In an implementation, the combination of Chemical Formula 1 and Chemical Formula 2 may be represented by, e.g., one of Chemical Formula 1A-I to Chemical Formula 1F-I and Chemical Formula 1A-II to Chemical Formula 1F-II, depending on the position of a substituent introduced into the skeleton in which benzofuran (or benzothiophene) is fused to carbazole.

[Chemical Formula 1A-I]
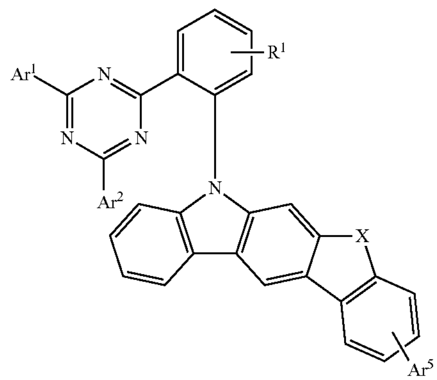
[Chemical Formula 1B-I]
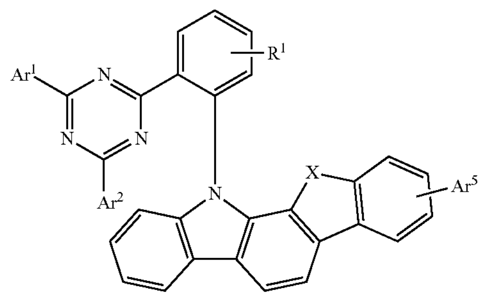
[Chemical Formula 1C-I]
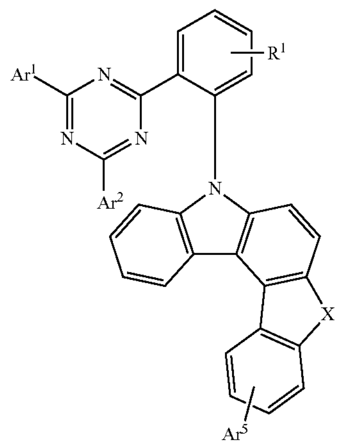
[Chemical Formula 1D-I]
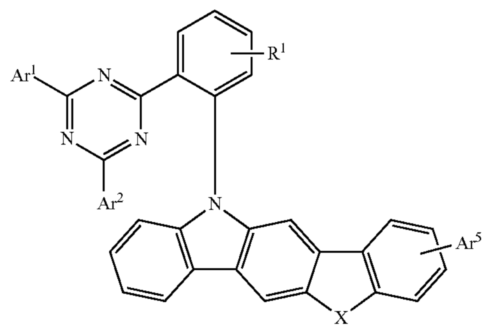
-continued
[Chemical Formula 1E-I]
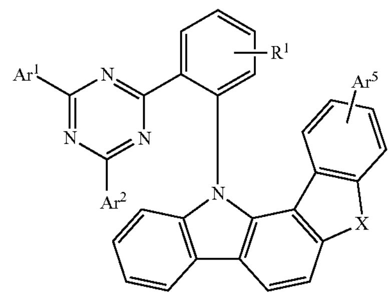
[Chemical Formula 1F-I]
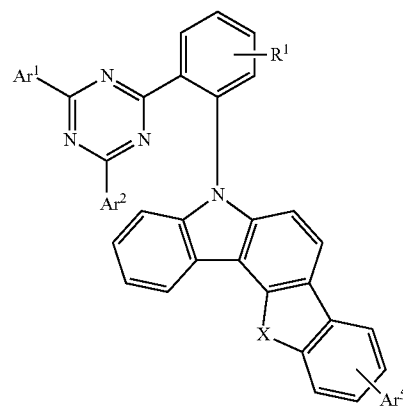
[Chemical Formula 1A-II]
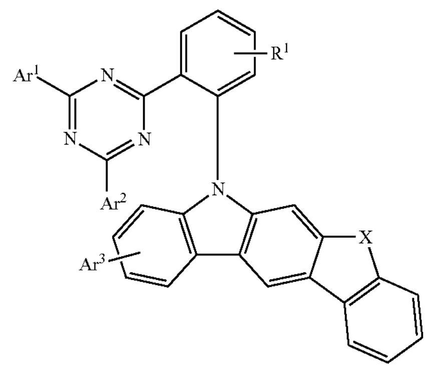
[Chemical Formula 1B-II]
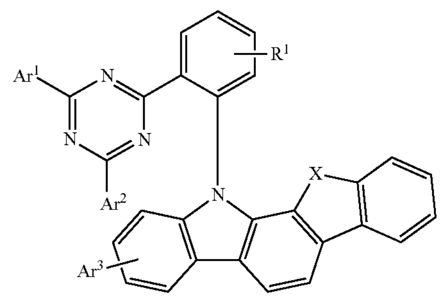

-continued

[Chemical Formula 1C-II]

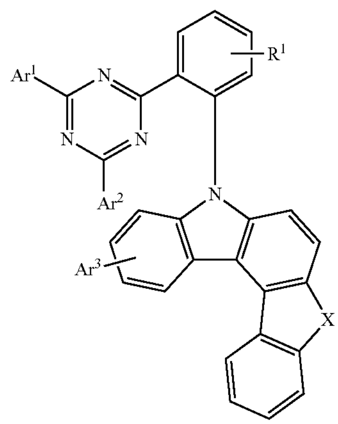

[Chemical Formula 1D-II]

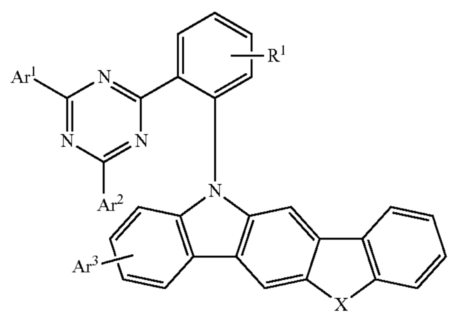

[Chemical Formula 1E-II]

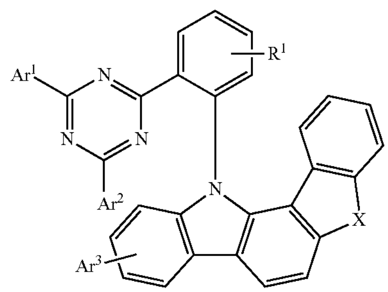

[Chemical Formula 1F-II]

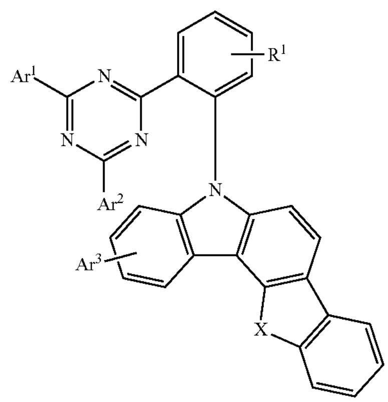

In Chemical Formula 1A-I to Chemical Formula 1F-I and Chemical Formula 1A-II to Chemical Formula 1F-II, X, $Ar^1$, $Ar^2$, and $R^1$ may be defined the same as those described above.

$Ar^3$ and $Ar^5$ may each independently be, e.g., a substituted or unsubstituted C6 to C18 aryl group.

In an implementation, the compound represented by the combination of Chemical Formula 1 and Chemical Formula 2 may be represented by, e.g., Chemical Formula 1A-I, Chemical Formula 1B-I, Chemical Formula 1C-I, Chemical Formula 1E-I, Chemical Formula 1F-I, Chemical Formula 1A-II, Chemical Formula 1B-II, or Chemical Formula 1F-II.

In an implementation, the compound represented by the combination of Chemical Formula 1 and Chemical Formula 2 may be represented by, e.g., Chemical Formula 1A-I, Chemical Formula 1B-I, or Chemical Formula 1F-I.

In an implementation, Chemical Formula 1A-I to Chemical Formula 1F-I may be represented by, e.g., one of Chemical Formula 1A-I-1 to Chemical Formula 1A-I-4, Chemical Formula 1B-I-1 to Chemical Formula 1B-I-4, Chemical Formula 1C-I-1 to Chemical Formula 1C-I-4, Chemical Formula 1D-I-1 to Chemical Formula 1D-I-4, Chemical Formula 1E-I-1 to Chemical Formula 1E-I-4, and Chemical Formula 1F-I-1 to Chemical Formula 1F-I-4, depending on a substituted position of $Ar^5$.

[Chemical Formula 1A-I-1]

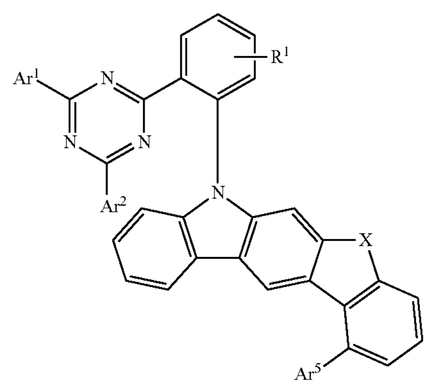

[Chemical Formula 1A-I-2]

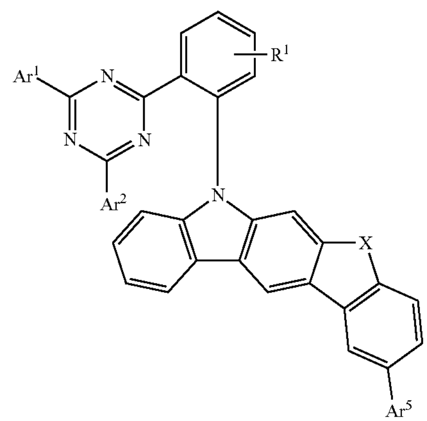

-continued
[Chemical Formula 1A-I-3]
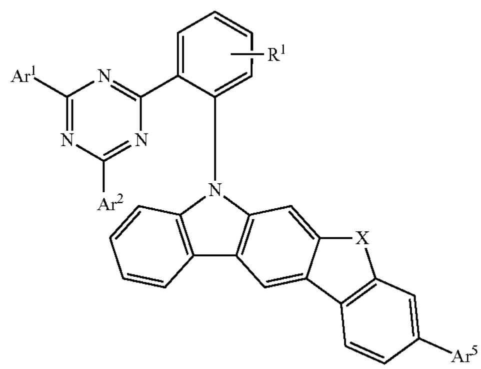
[Chemical Formula 1A-I-4]
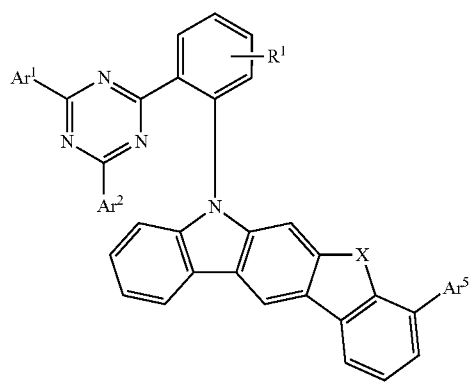
[Chemical Formula 1B-I-1]
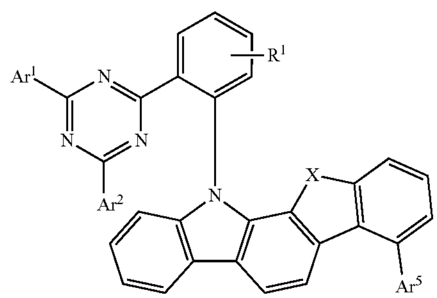
[Chemical Formula 1B-I-2]
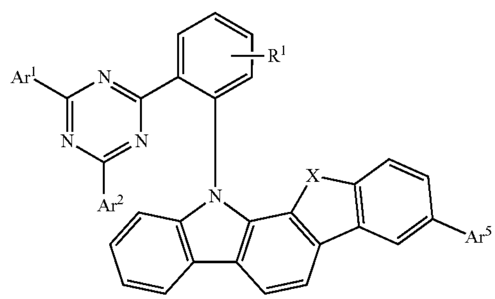
-continued
[Chemical Formula 1B-I-3]
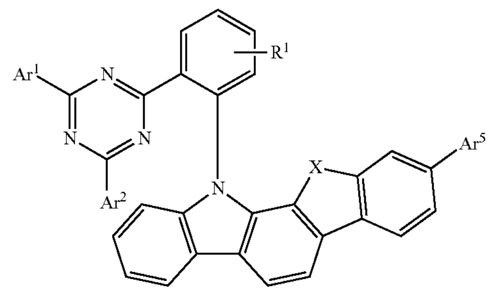
[Chemical Formula 1B-I-4]
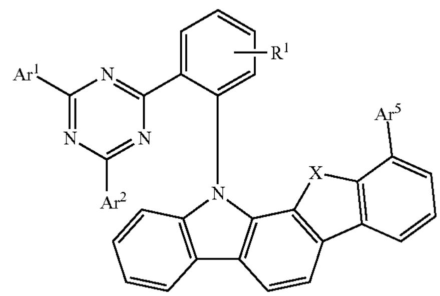
[Chemical Formula 1C-I-1]
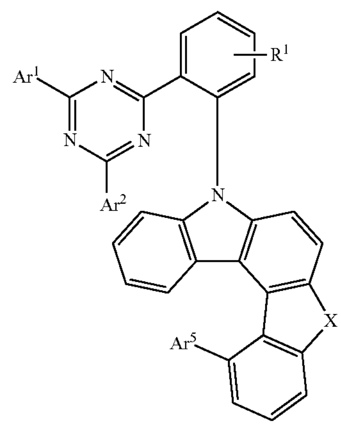
[Chemical Formula 1C-I-2]
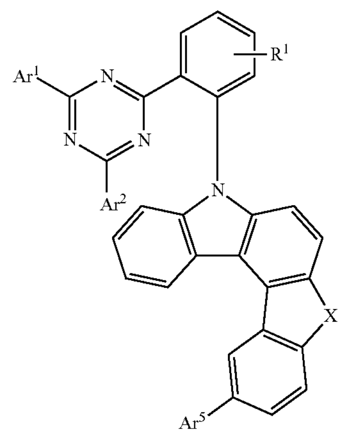

-continued
[Chemical Formula 1C-I-3]
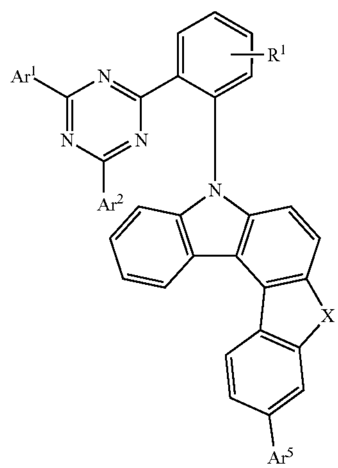
[Chemical Formula 1C-I-4]
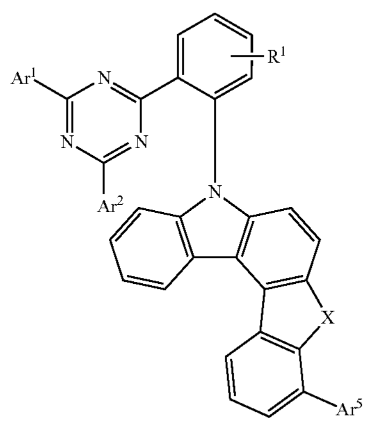
[Chemical Formula 1D-I-1]
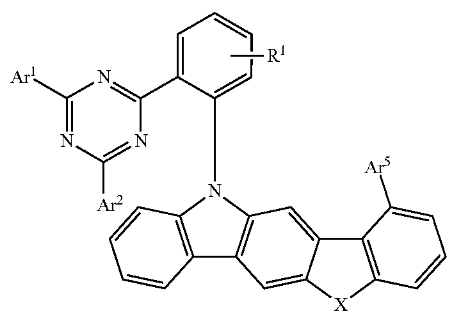
[Chemical Formula 1D-I-2]
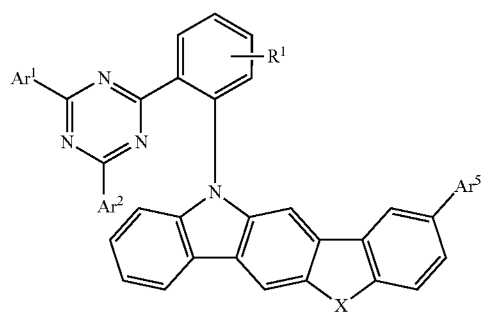
-continued
[Chemical Formula 1D-I-3]
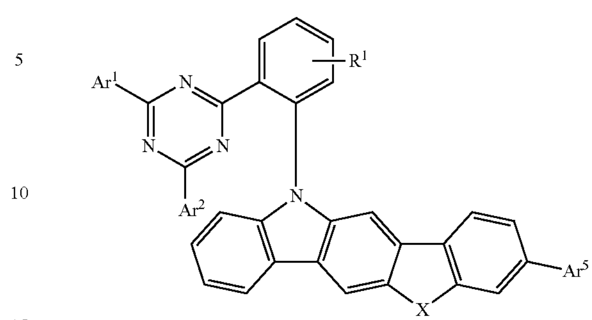
[Chemical Formula 1D-I-4]
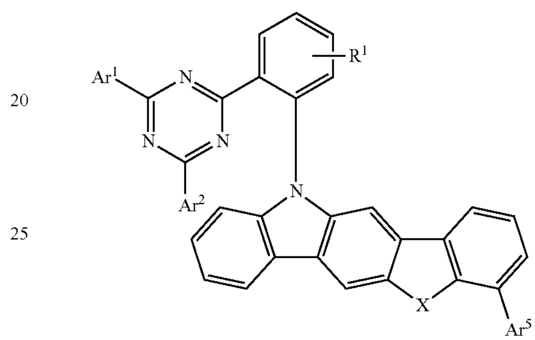
[Chemical Formula 1E-I-1]
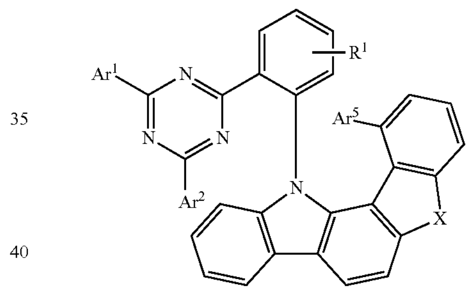
[Chemical Formula 1E-I-2]
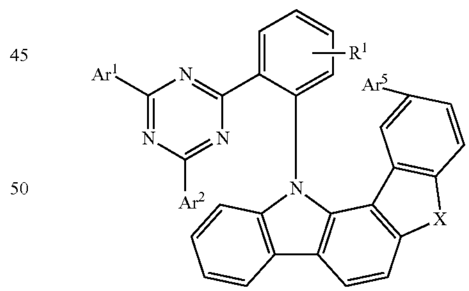
[Chemical Formula 1E-I-3]
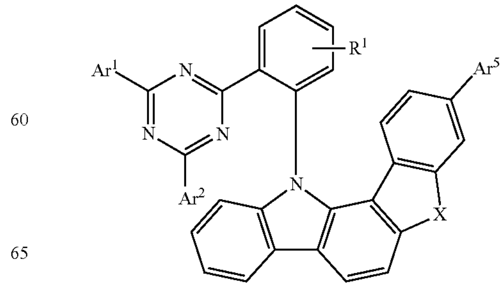

-continued

[Chemical Formula 1E-I-4]

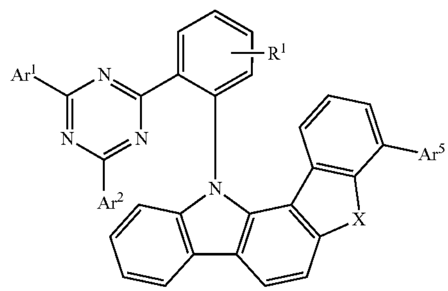

[Chemical Formula 1F-I-1]

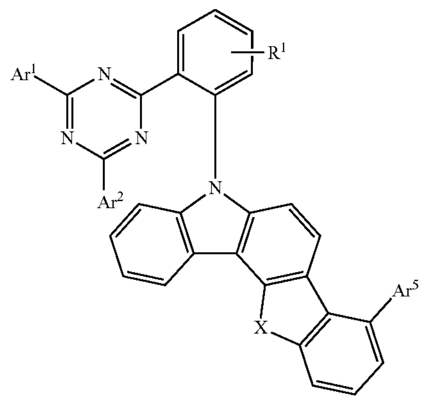

[Chemical Formula 1F-I-2]

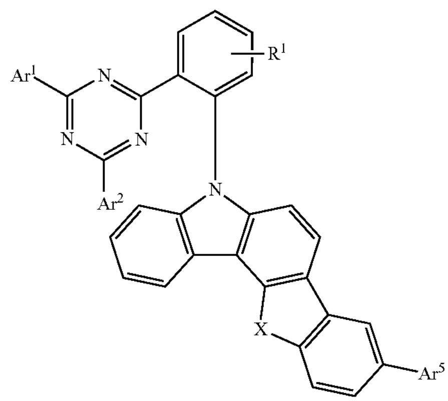

[Chemical Formula 1F-I-3]

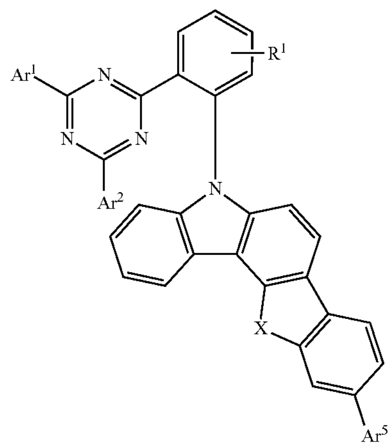

-continued

[Chemical Formula 1F-I-4]

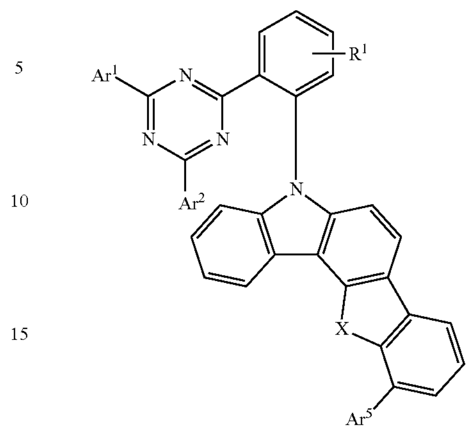

In Chemical Formula 1A-I-1 to Chemical Formula 1A-I-4, Chemical Formula 1B-I-1 to Chemical Formula 1B-I-4, Chemical Formula 1C-I-1 to Chemical Formula 1C-I-4, Chemical Formula 1D-I-1 to Chemical Formula 1D-I-4, Chemical Formula 1E-I-1 to Chemical Formula 1E-I-4, and Chemical Formula 1F-I-1 to Chemical Formula 1F-I-4, X, $Ar^1$, $Ar^2$, $Ar^5$, and $R^1$ may be defined the same as those described above.

In an implementation, the combination of Chemical Formula 1 and Chemical Formula 2 may be represented by, e.g., Chemical Formula 1A-I-4, Chemical Formula 1B-I-4, or Chemical Formula 1F-I-4.

In an implementation, at least one of $Ar^3$ to $Ar^6$ may be, e.g., a substituted or unsubstituted C6 to C12 aryl group.

In an implementation, $Ar^1$ and $Ar^2$ may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted fluorenyl group, a substituted or unsubstituted dibenzofuranyl group, a substituted or unsubstituted dibenzothiophenyl group, or a substituted or unsubstituted dibenzosilolyl group.

In an implementation, $Ar^1$ and $Ar^2$ may each independently be, e.g., a substituted or unsubstituted phenyl group, a substituted or unsubstituted biphenyl group, a substituted or unsubstituted terphenyl group, a substituted or unsubstituted triphenylene group, a substituted or unsubstituted fluorenyl group, a substituted or unsubstituted dibenzofuranyl group, a substituted or unsubstituted dibenzothiophenyl group, or a substituted or unsubstituted dibenzosilolyl group, provided that at least one of $Ar^1$ and $Ar^2$ may be a substituted or unsubstituted biphenyl group, a substituted or unsubstituted terphenyl group, a substituted or unsubstituted triphenylene group, a substituted or unsubstituted fluorenyl group, a substituted or unsubstituted dibenzofuranyl group, a substituted or unsubstituted dibenzothiophenyl group, or a substituted or unsubstituted dibenzosilolyl group.

In an implementation, the moiety
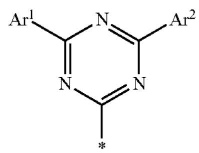
or Chemical Formula 1 may be a moiety of Group I.
[Group I]
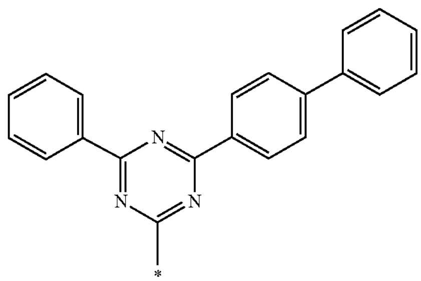
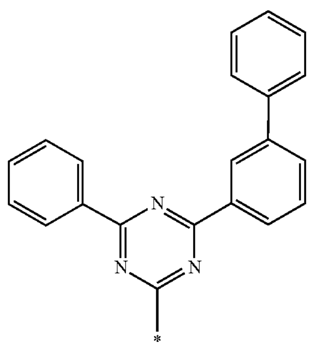
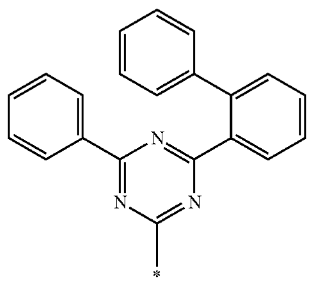
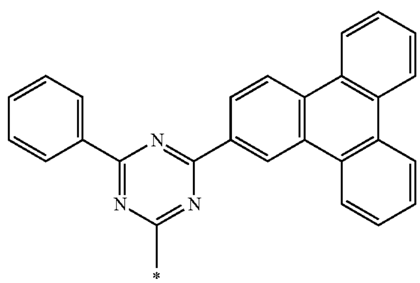
-continued
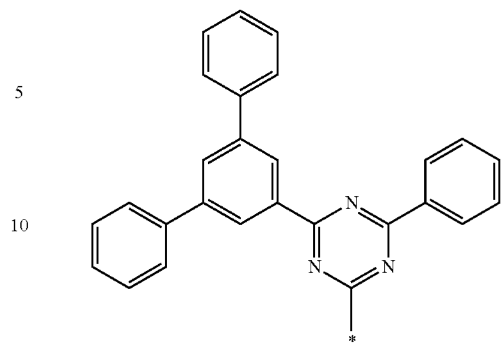
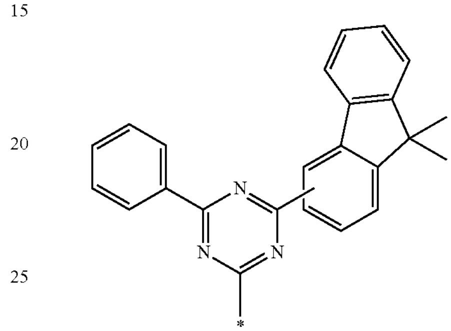
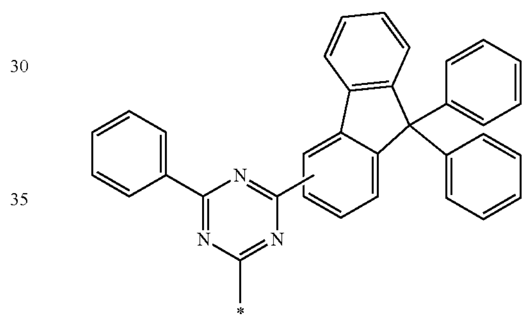
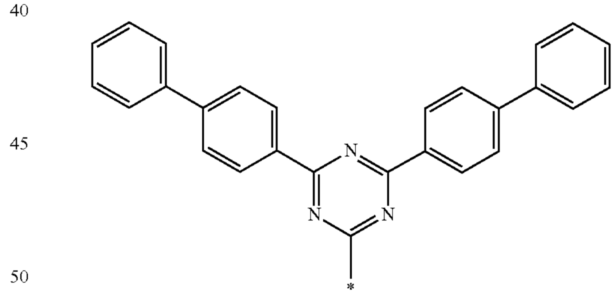
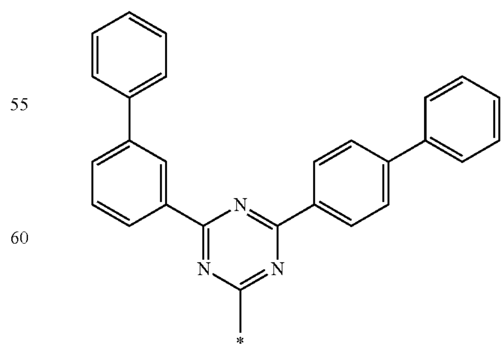

-continued
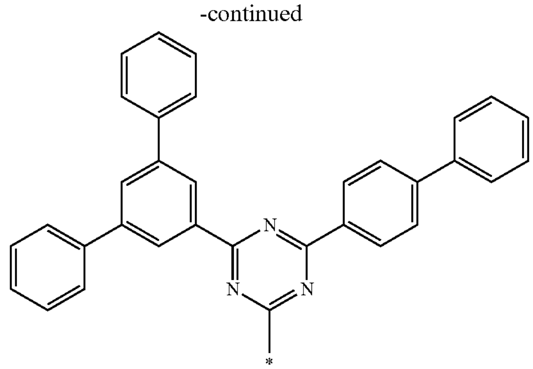
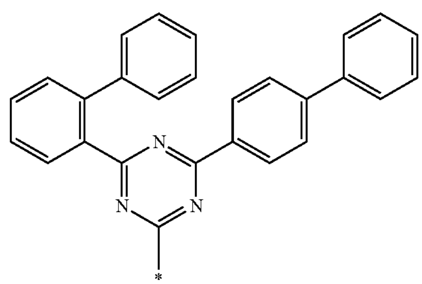
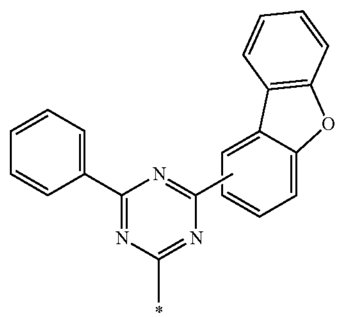
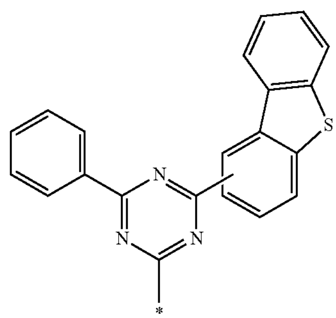
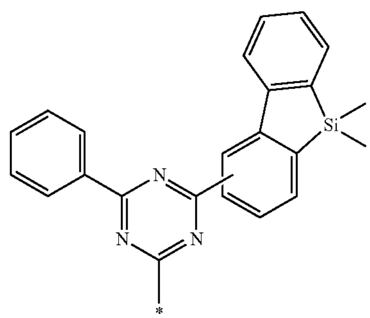
-continued
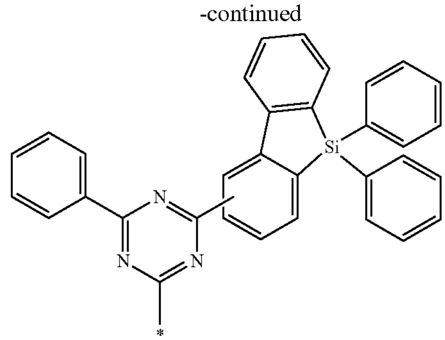
In Group I, * is a linking point (e.g., to the phenylene linker).
In an implementation, the combination of Chemical Formula 1 and Chemical Formula 2 may include, e.g., a compound of Group 1.
[Group 1]
1
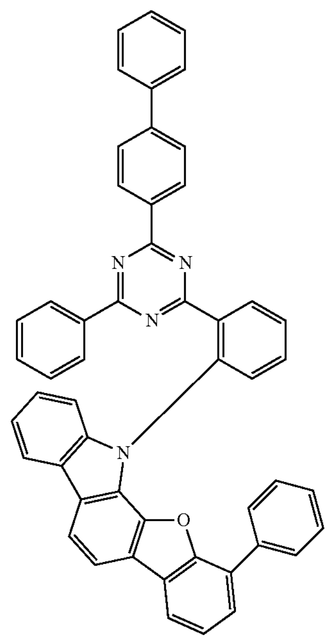

-continued
2
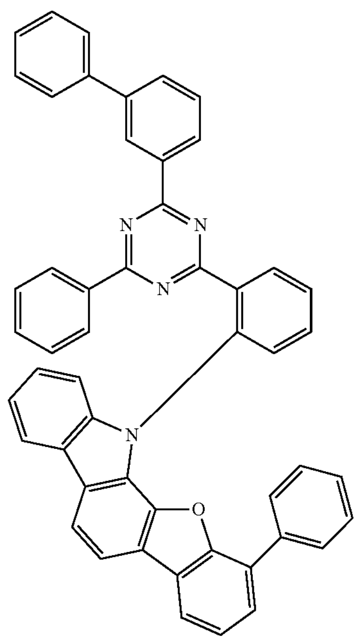
3
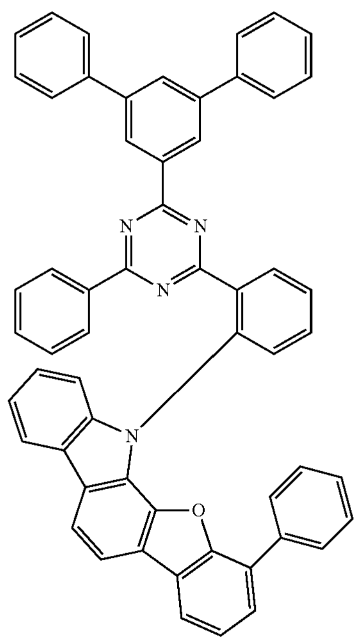
-continued
4
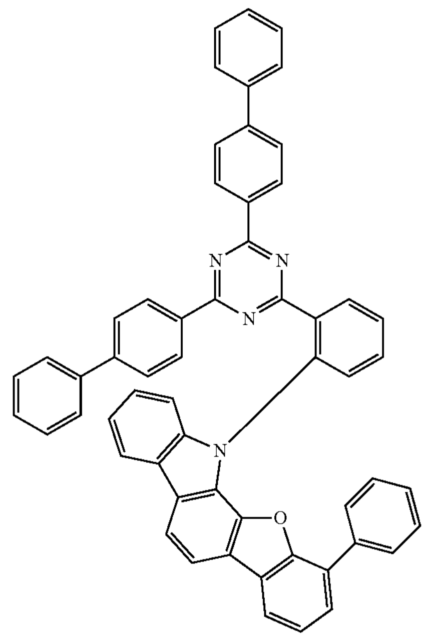
5
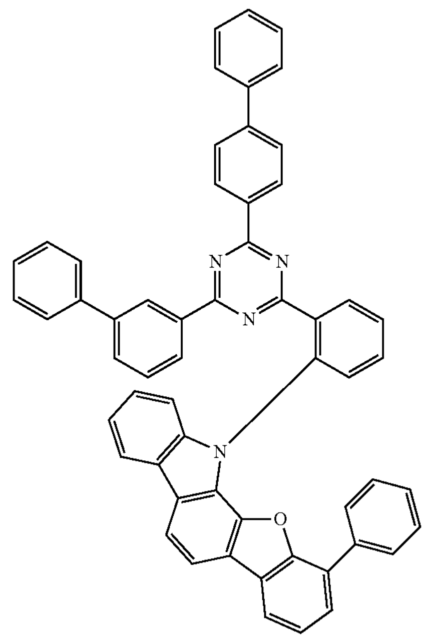

6
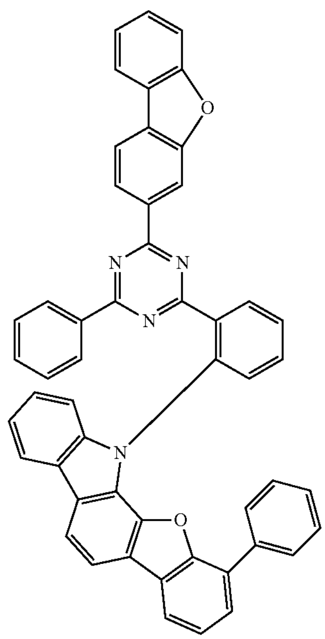
7
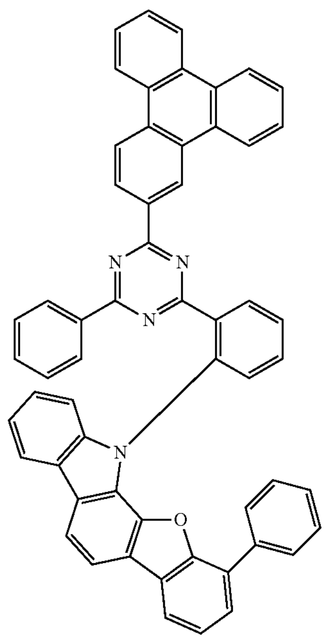
8
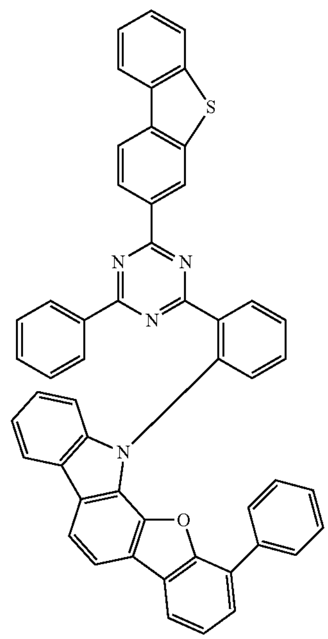
9
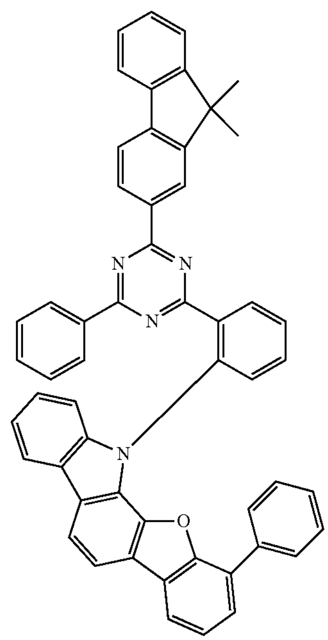

-continued
10
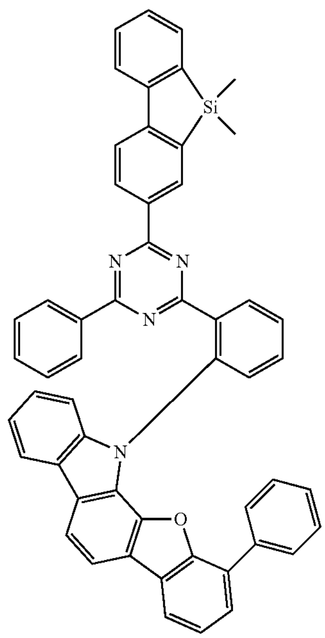
11
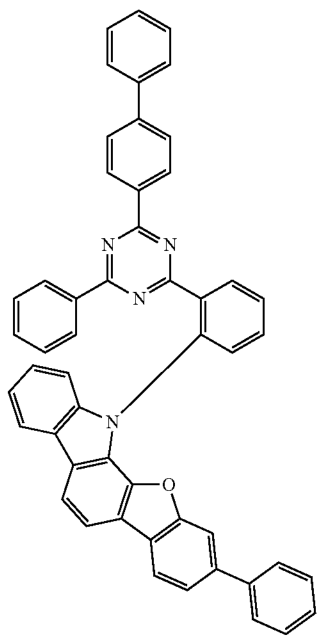
-continued
12
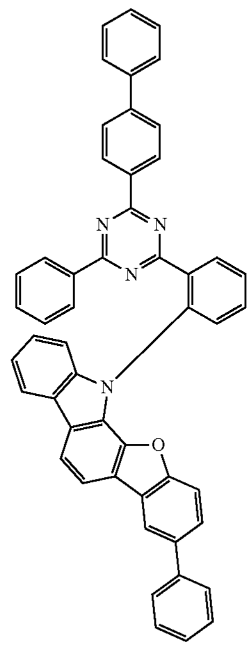
13
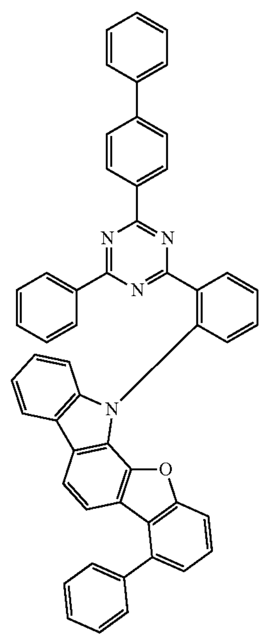

-continued
14
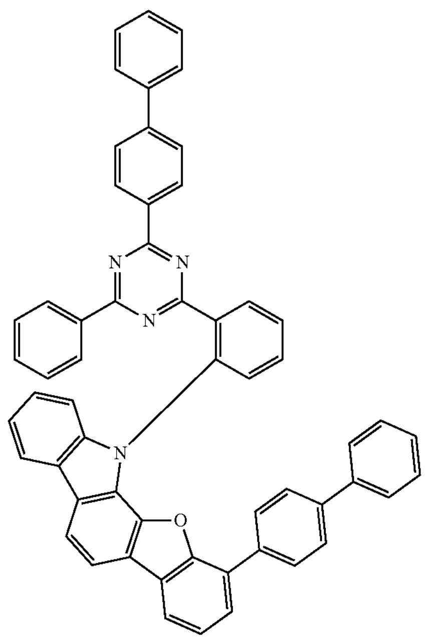
15
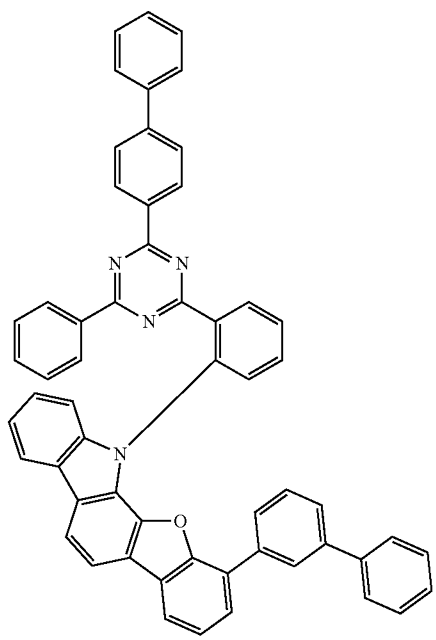
-continued
16
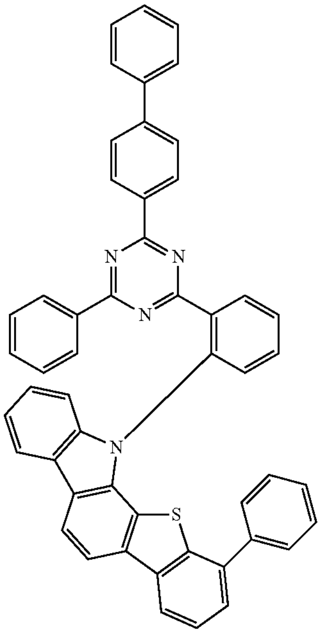
17
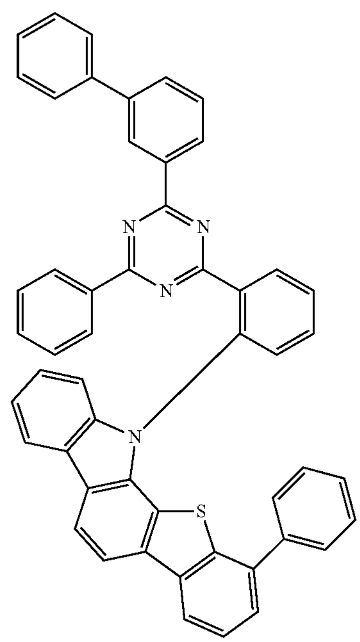

-continued
18
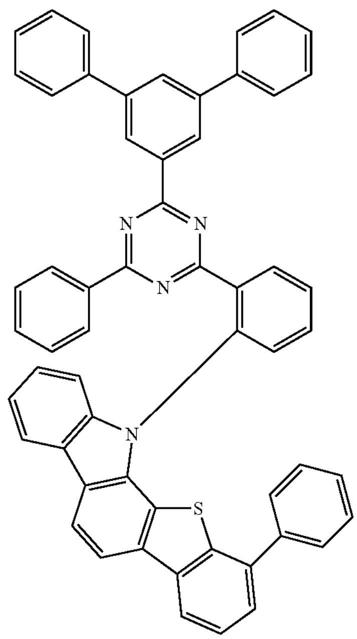
19
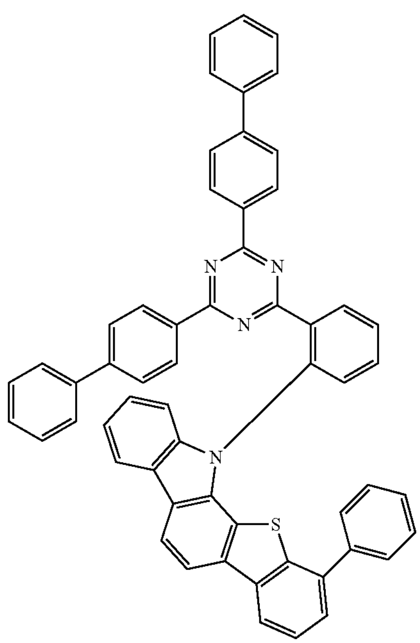
-continued
20
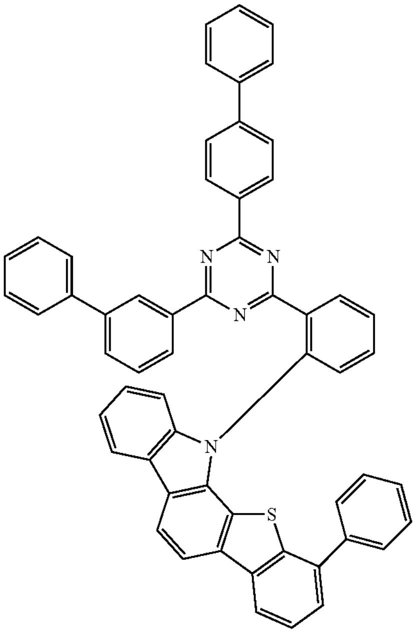
21
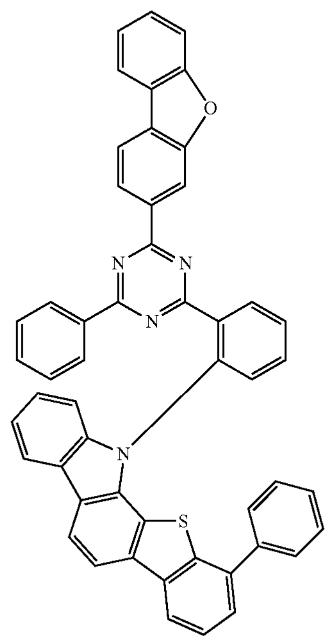

-continued
22
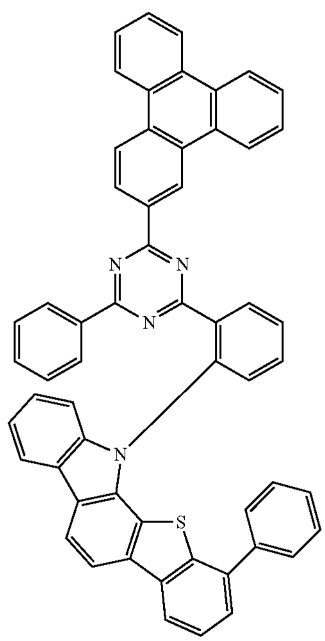
23
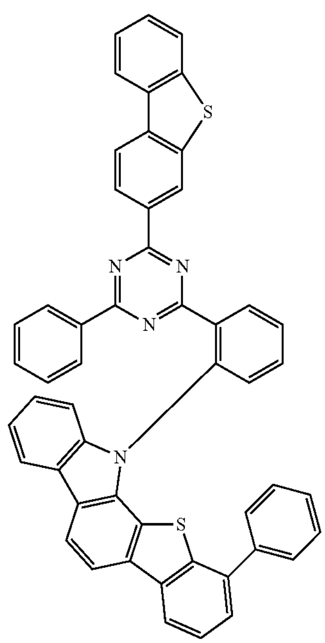
-continued
24
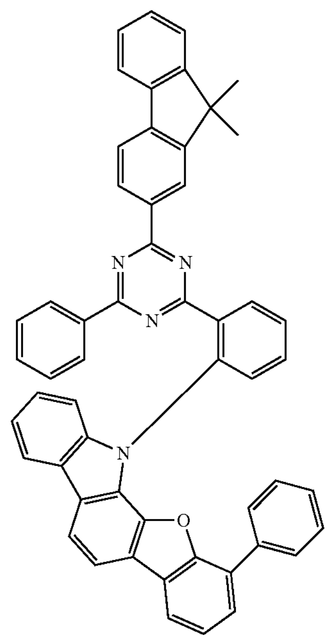
25
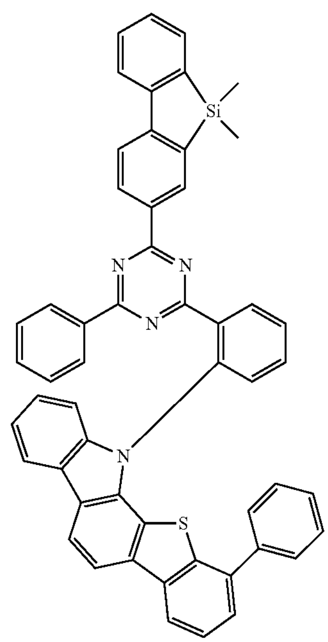

-continued
26
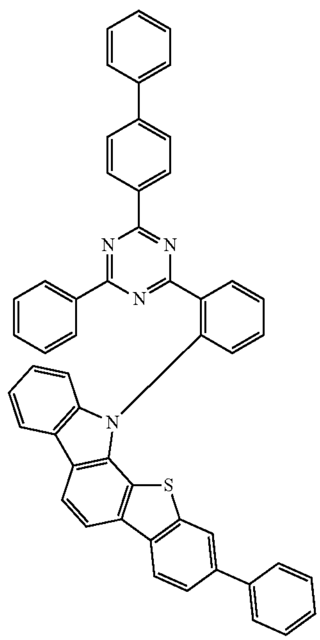
27
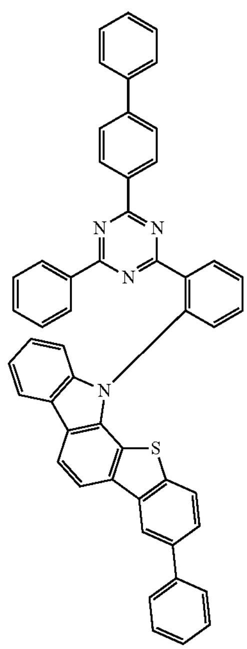
-continued
28
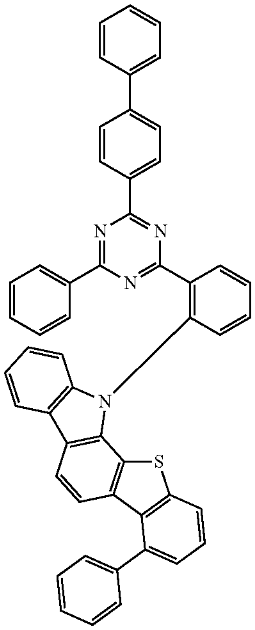
29
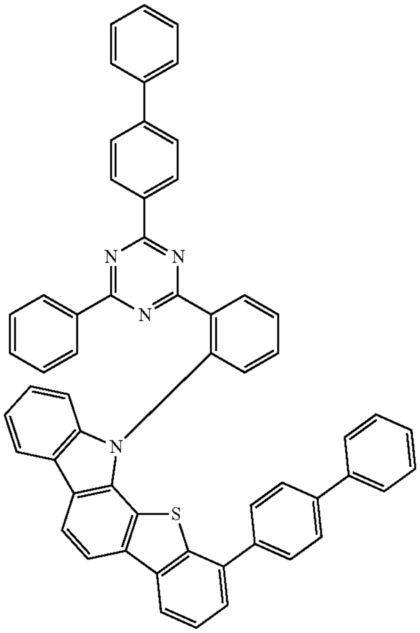

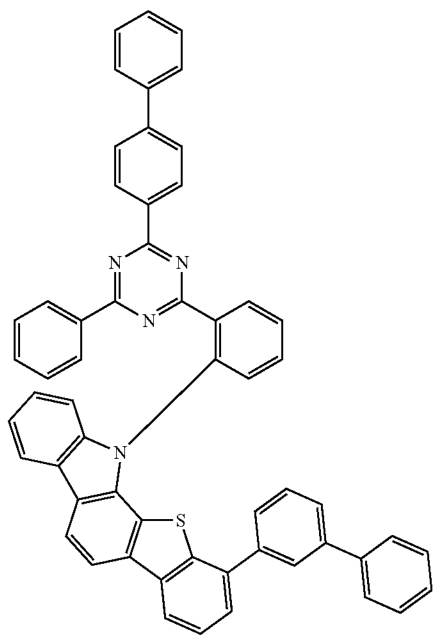
30
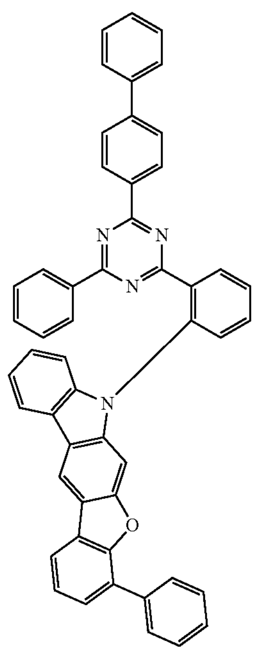
31
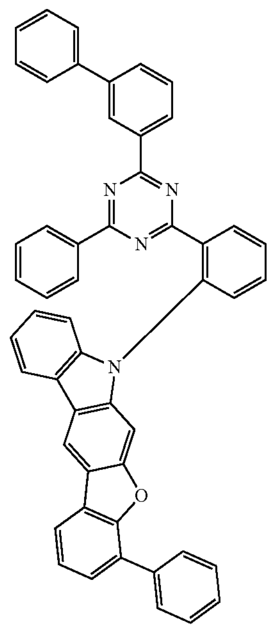
32
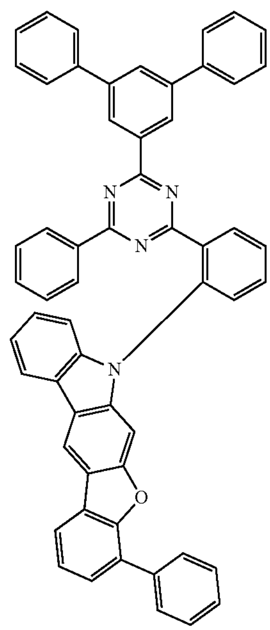
33

-continued
34
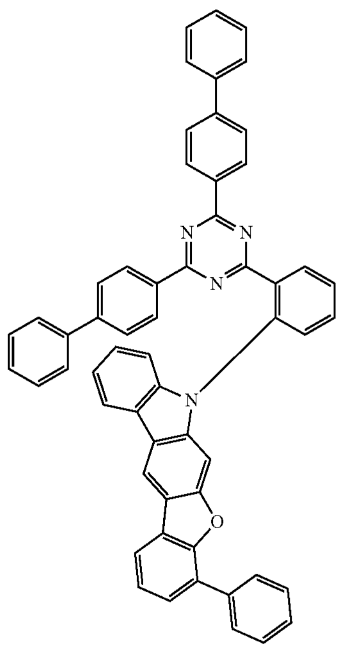
36
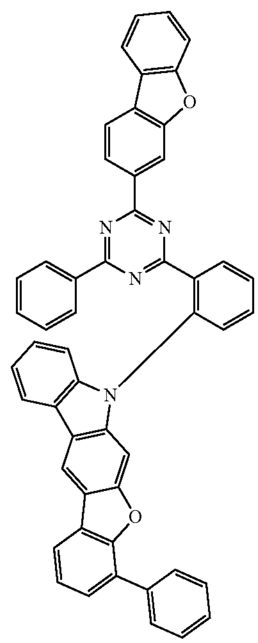
35
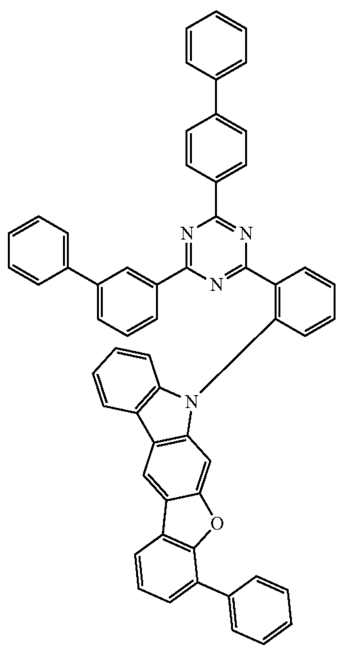
37
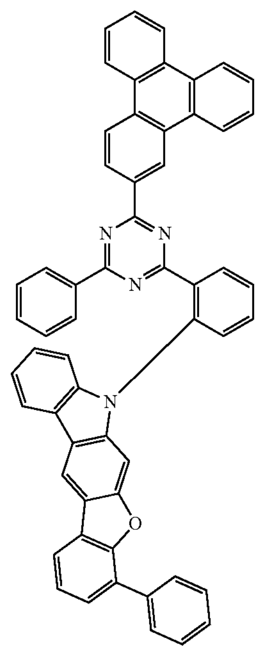

-continued
38
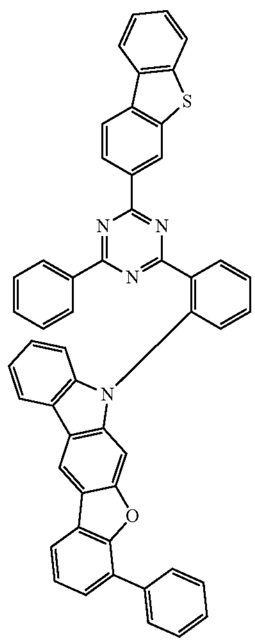
40
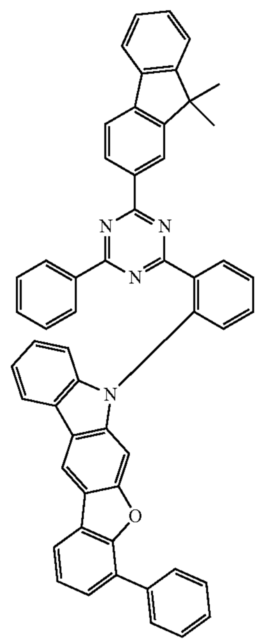
39
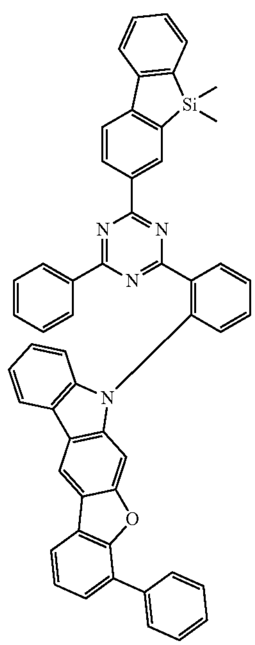
41
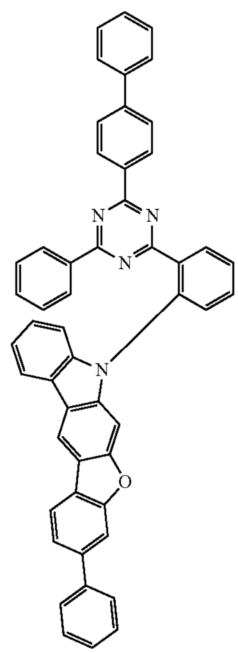

-continued
42
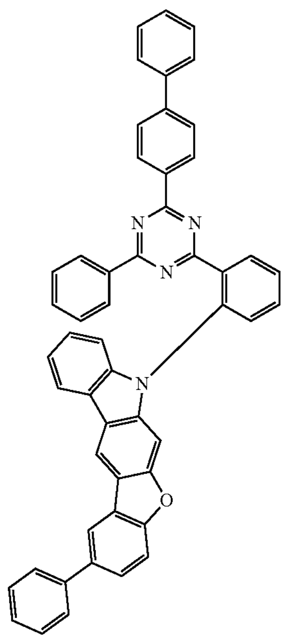
-continued
44
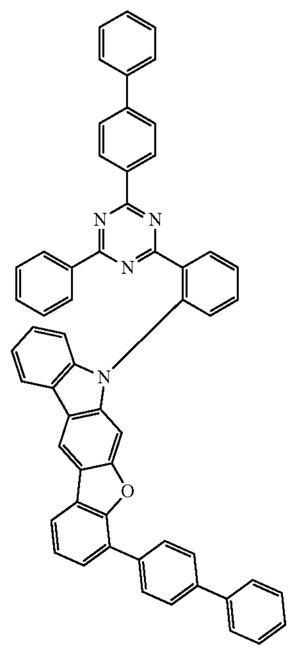
43
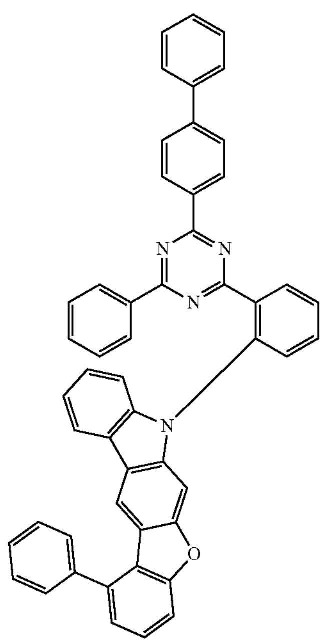
45
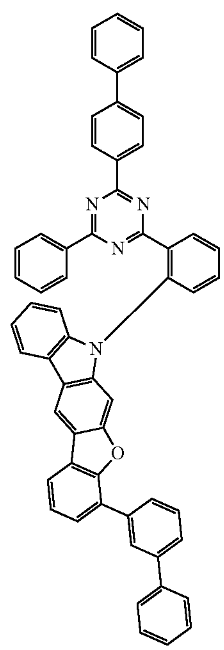

-continued
46
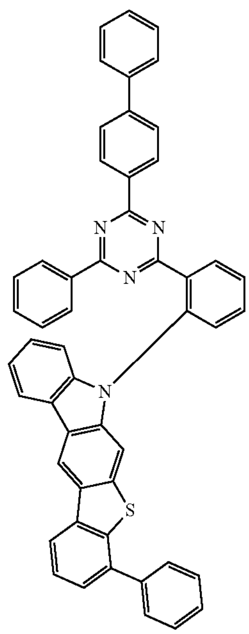
48
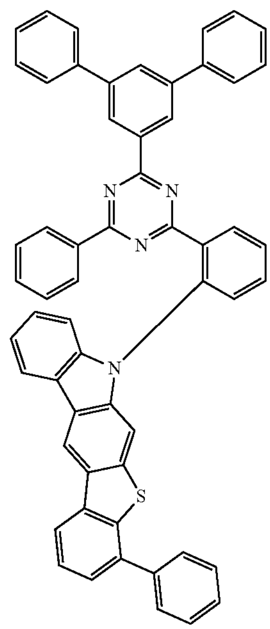
47
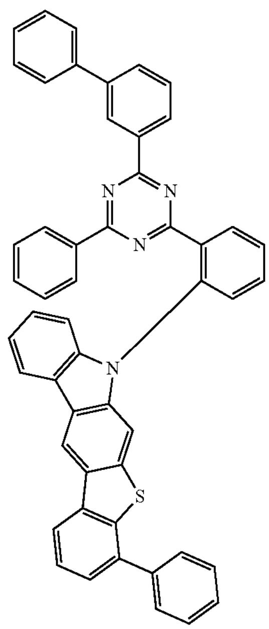
49
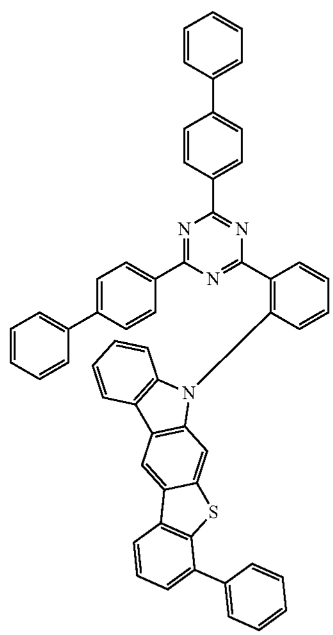
-continued -continued
50
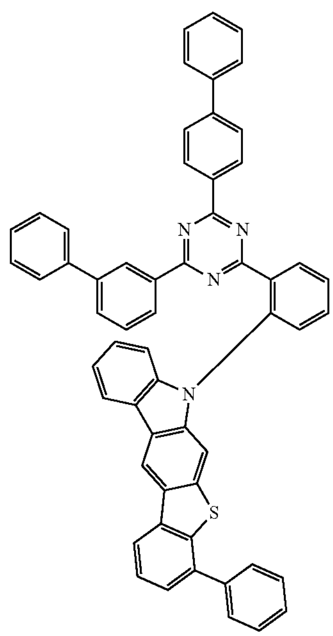
-continued
52
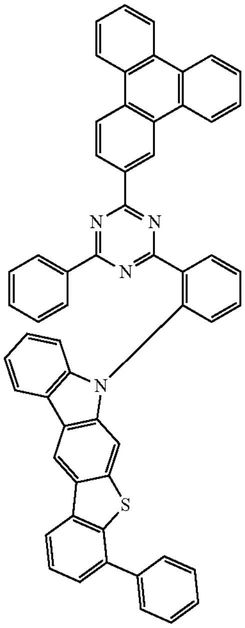
51
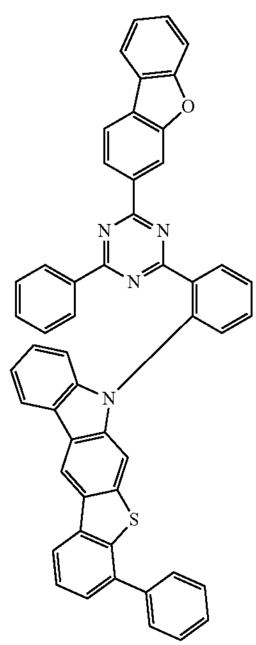
53
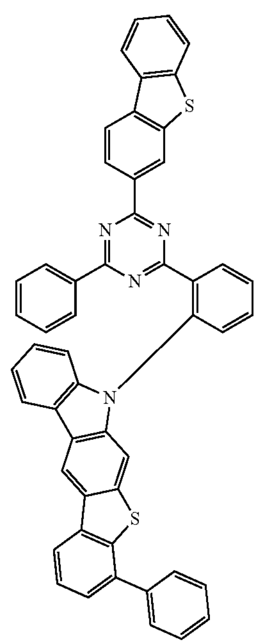

-continued
54
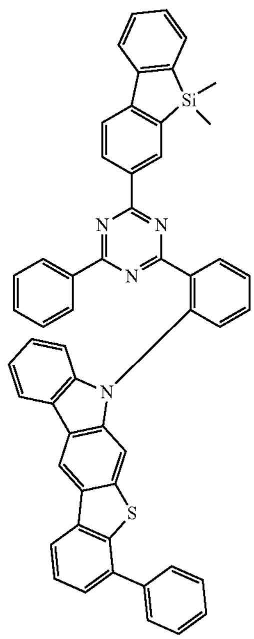
55
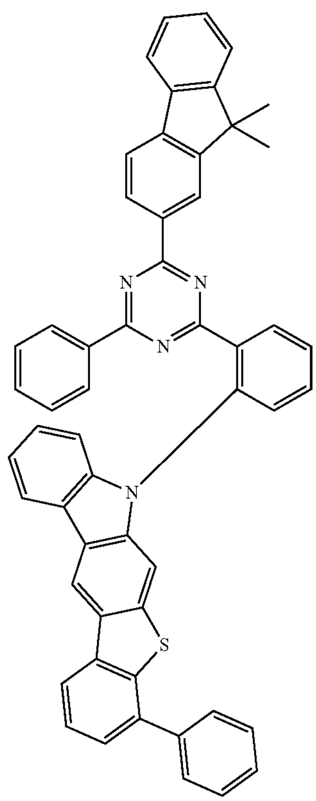
-continued
56
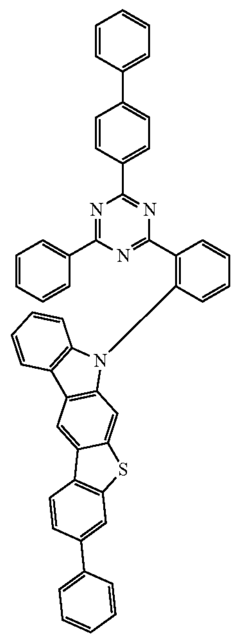
57
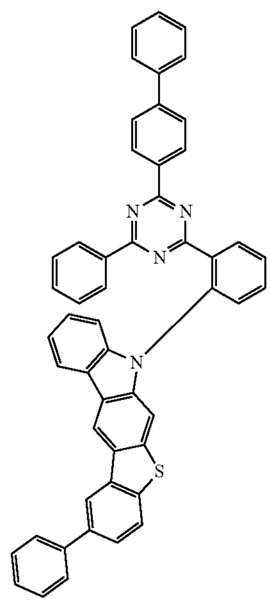

-continued
58
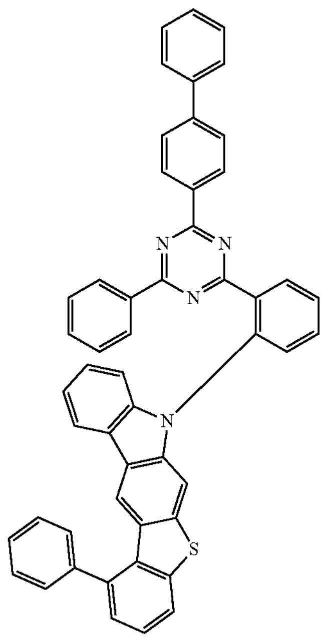
59
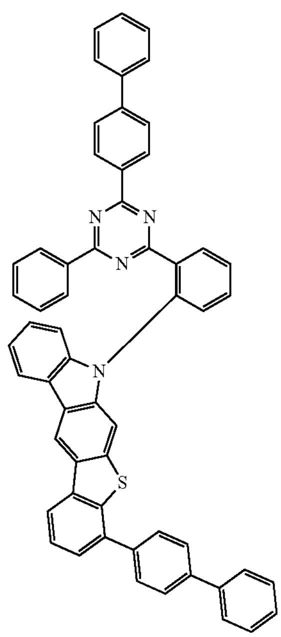
-continued
60
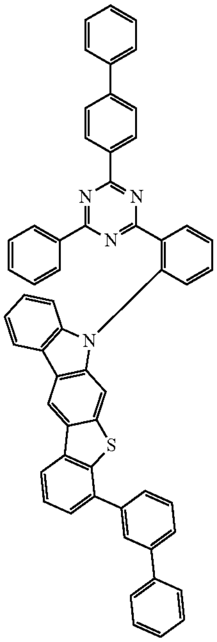
61
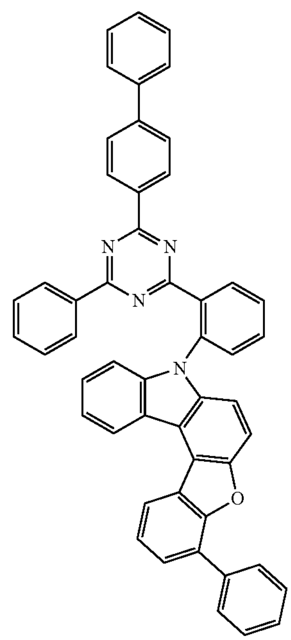

62
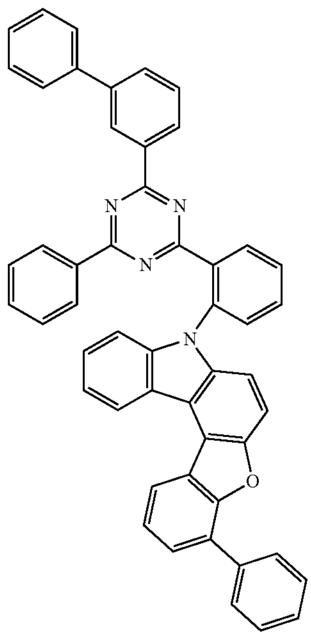
63
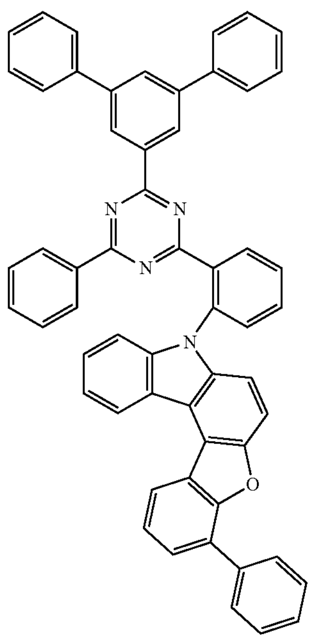
64
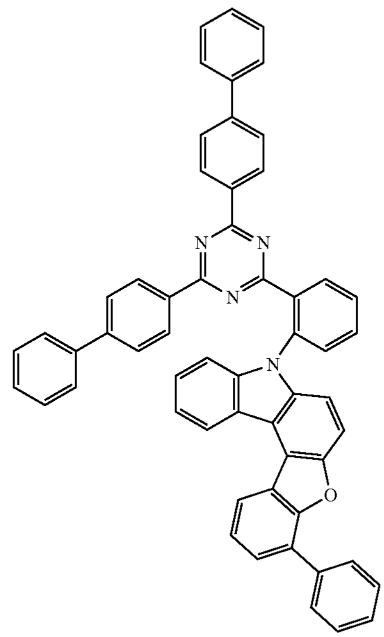
65
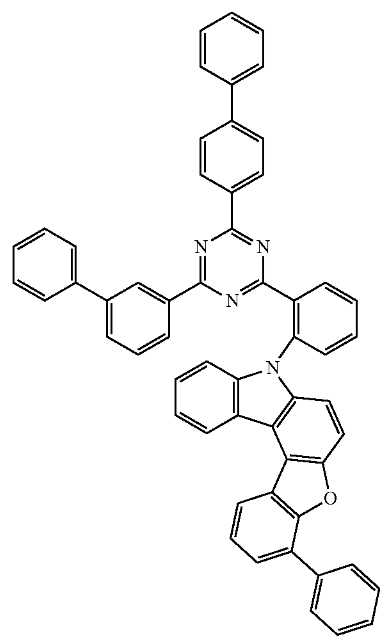

-continued
66
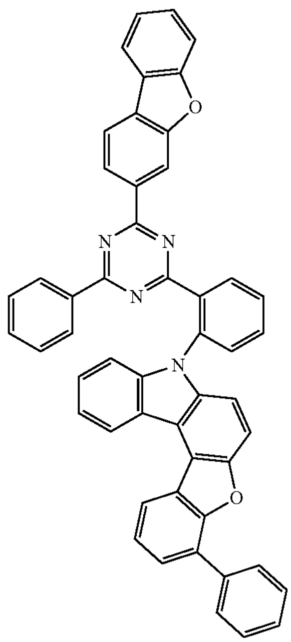
67
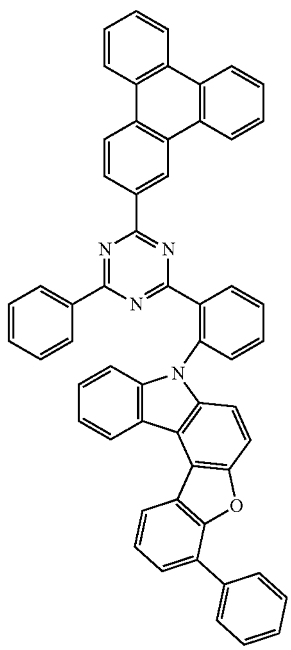
-continued
68
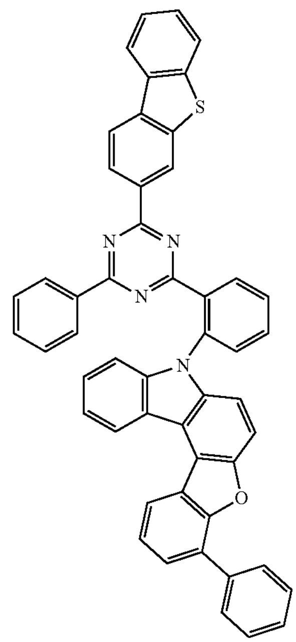
69
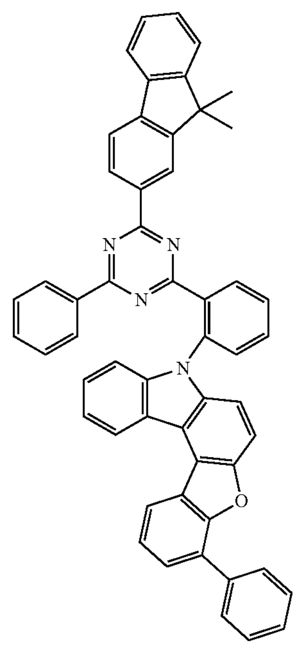

-continued
70
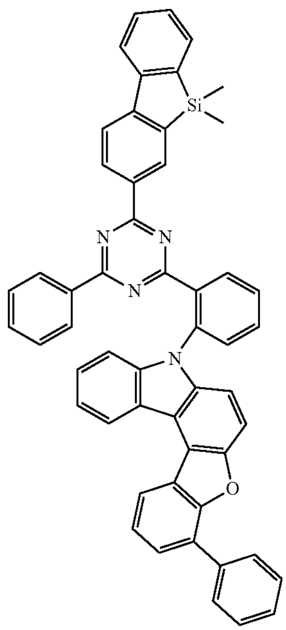
71
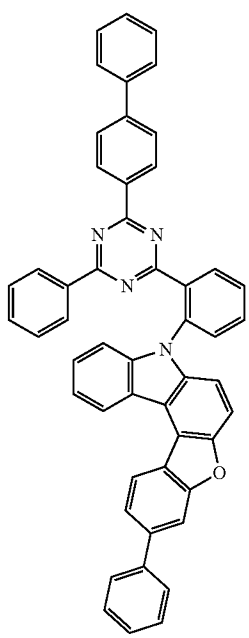
-continued
72
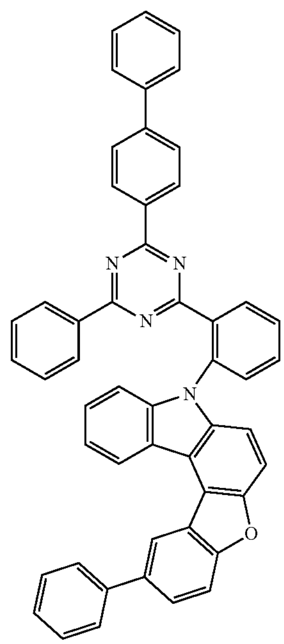
73
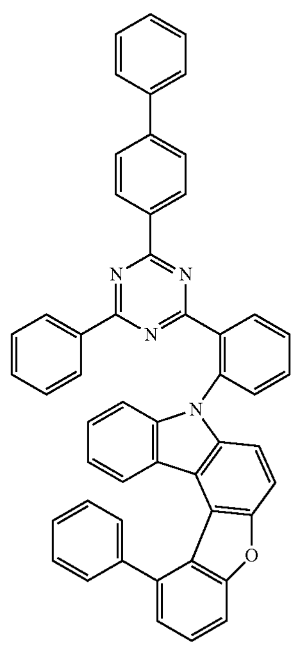

-continued
74
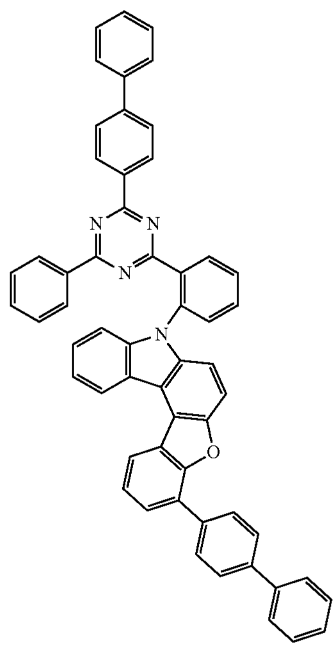
75
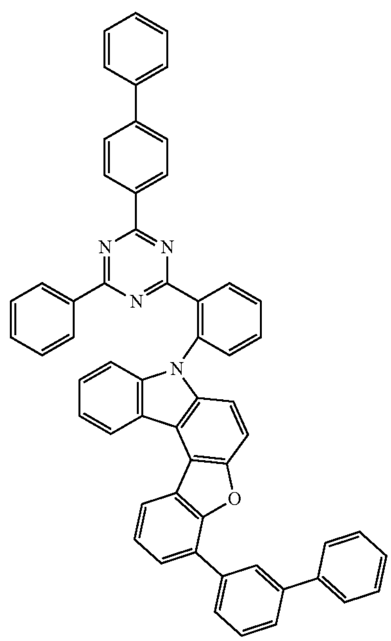
-continued
76
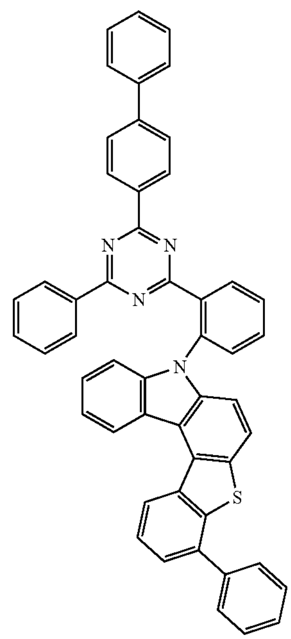
77
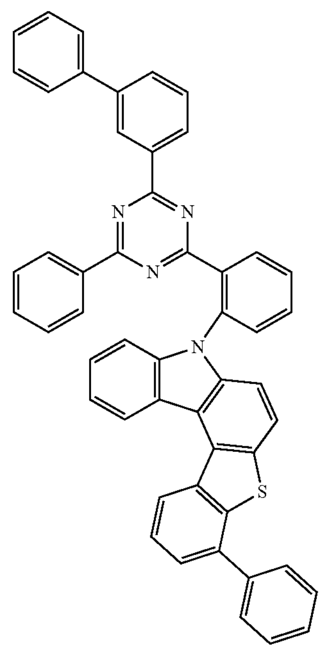

-continued
78
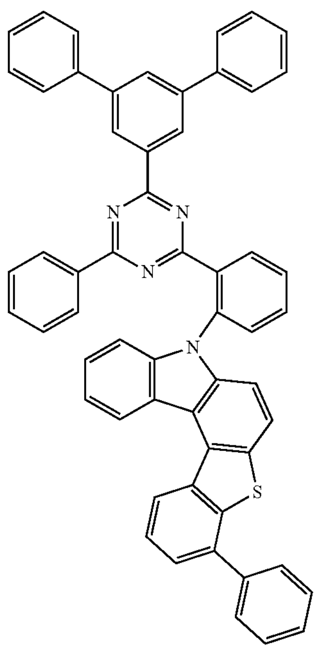
79
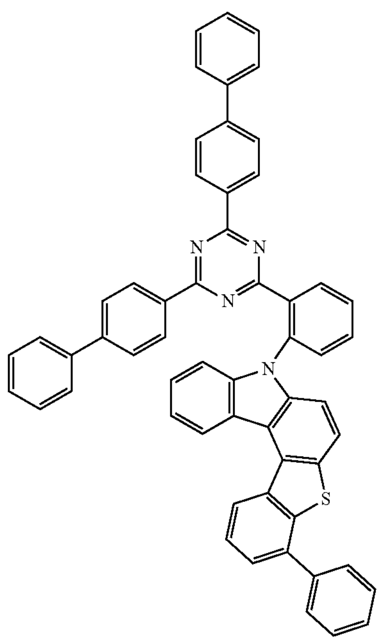
-continued
80
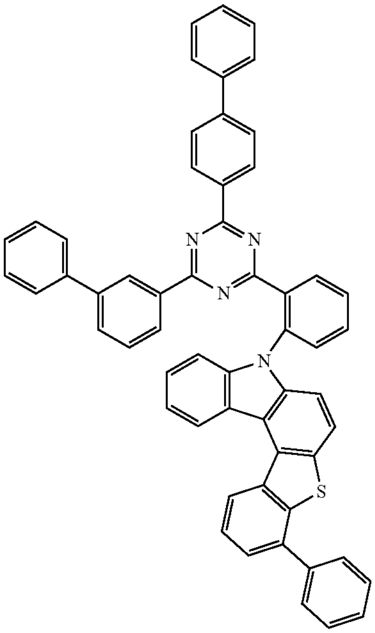
81
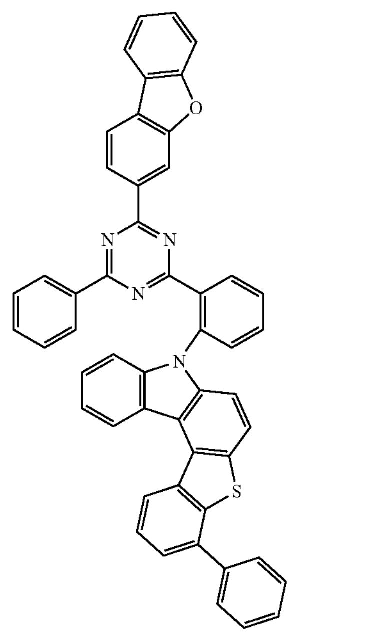

-continued
82
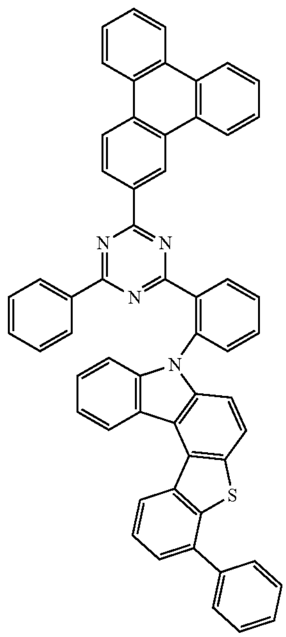
84
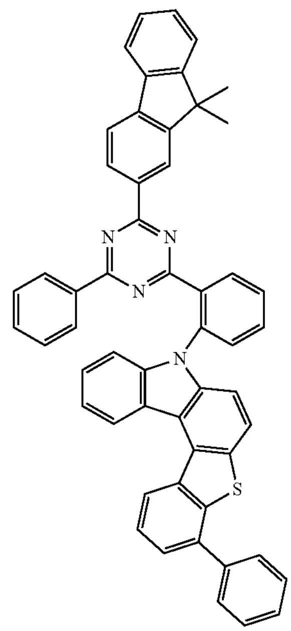
83
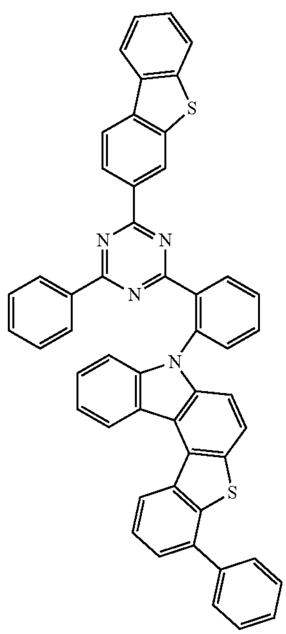
85
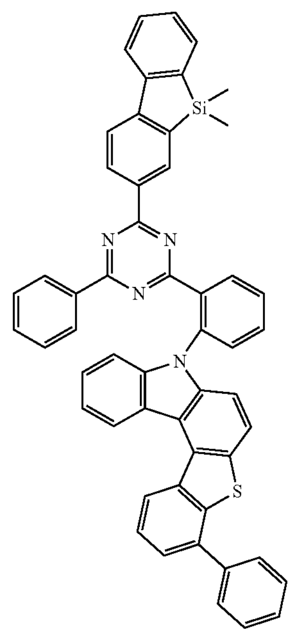

-continued
86
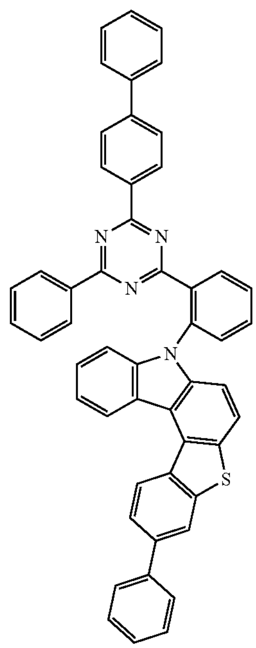
87
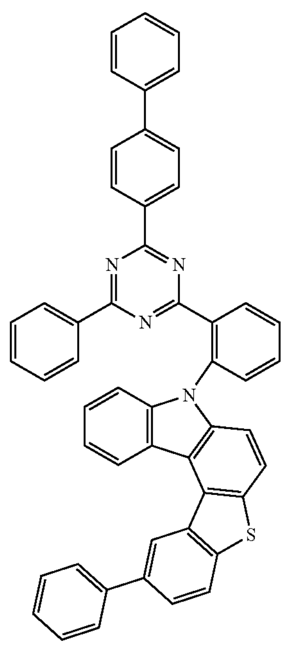
-continued
88
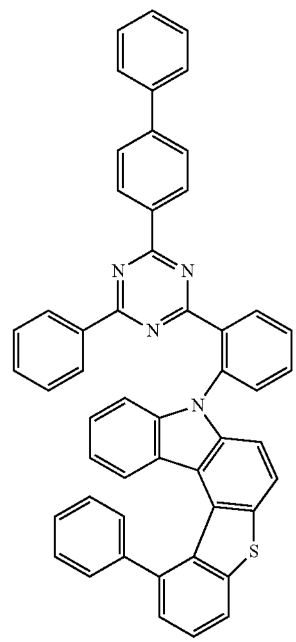
89
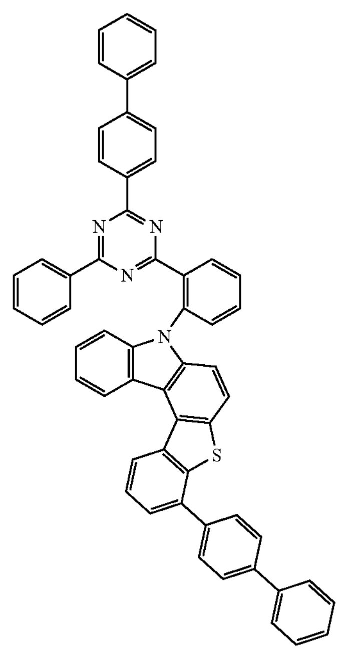

-continued
90
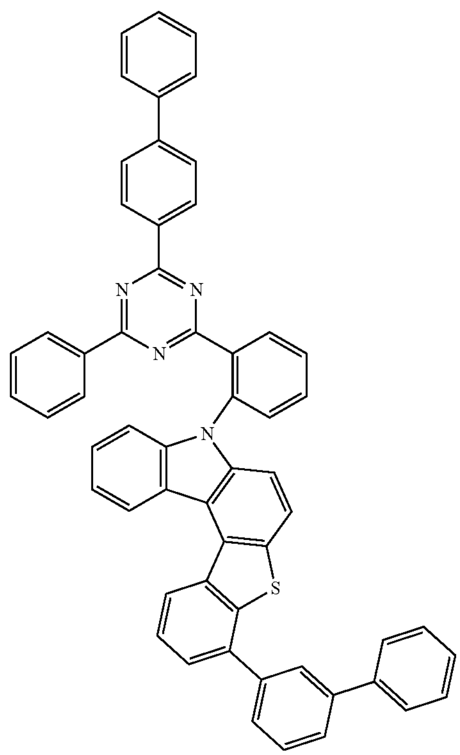
91
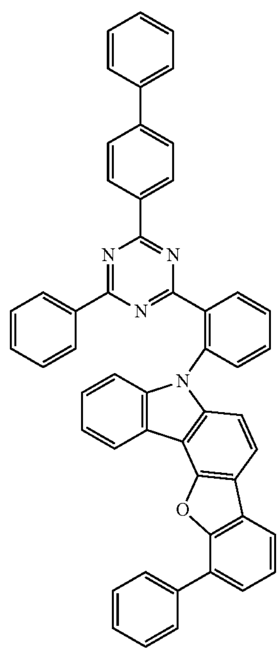
-continued
92
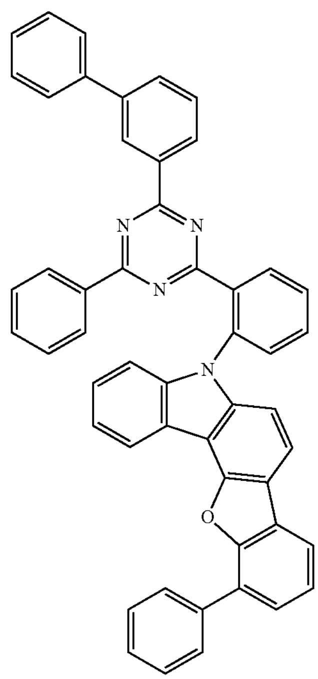
93
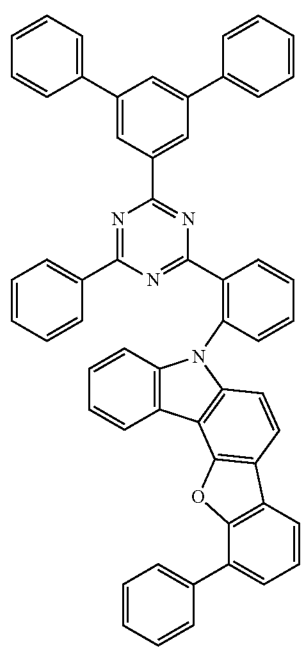

-continued
94
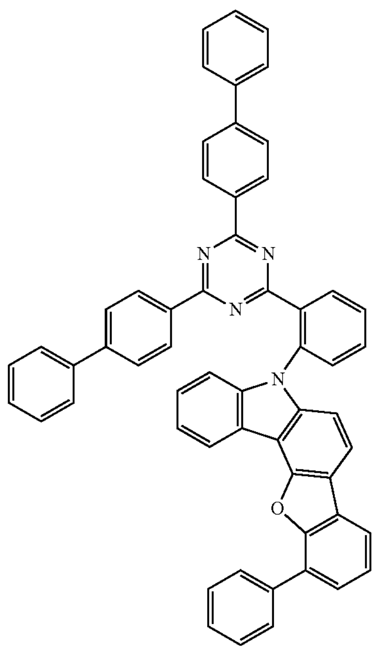
95
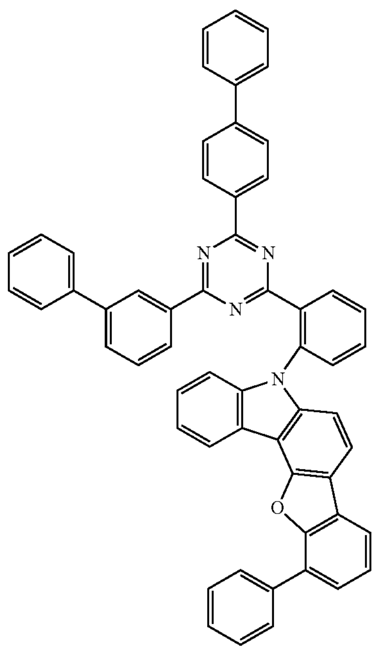
-continued
96
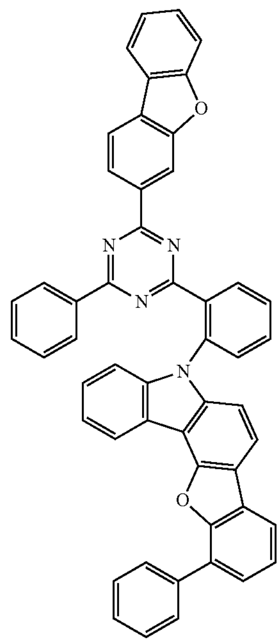
97
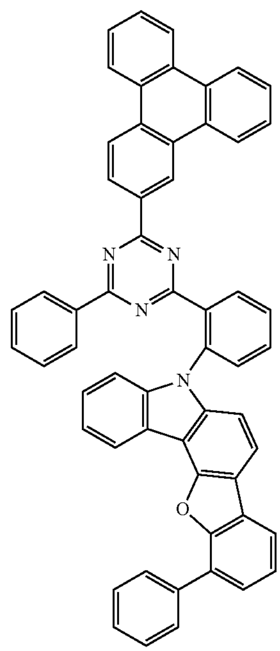

-continued
98
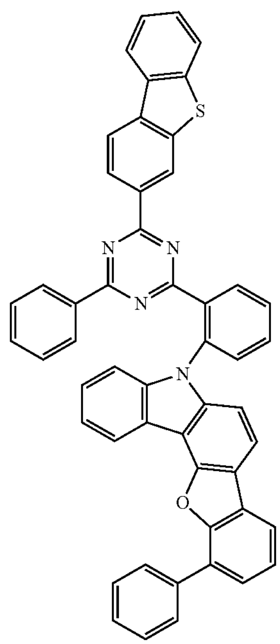
100
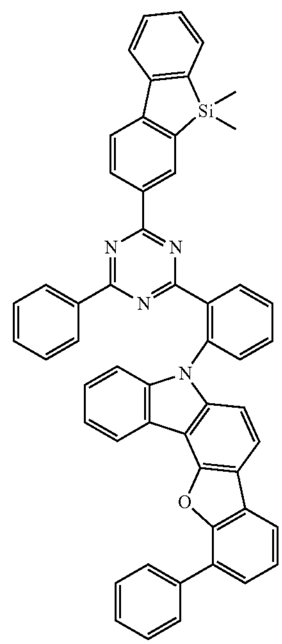
99
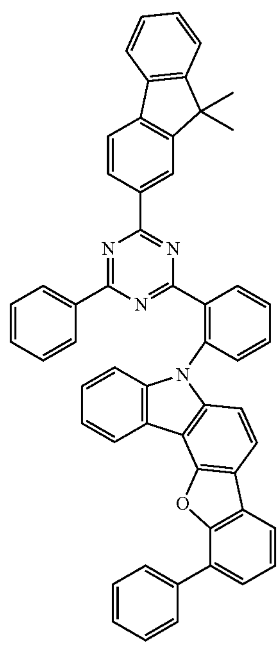
101
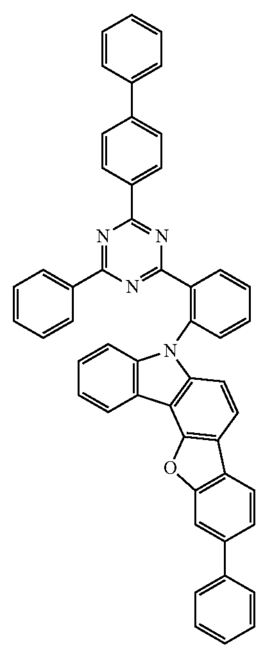
-continued -continued
102
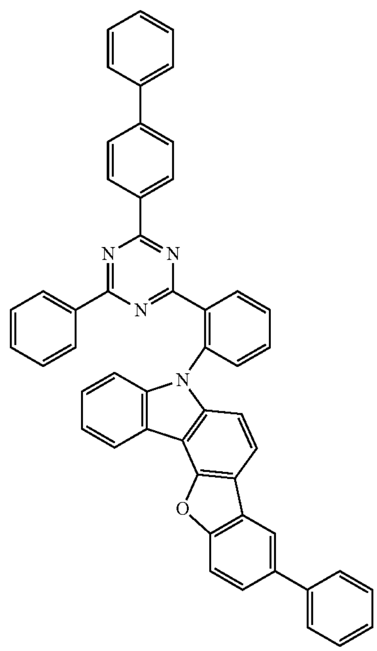
103
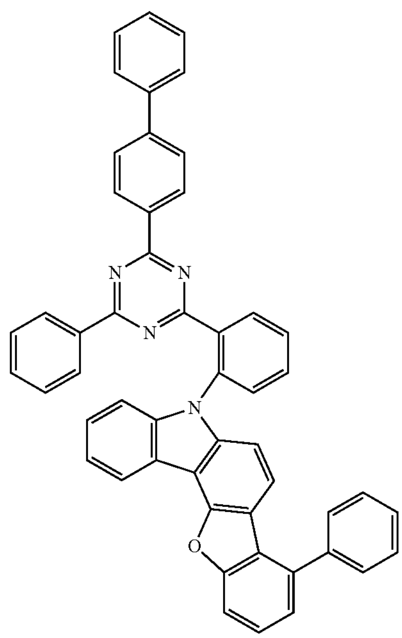
-continued
104
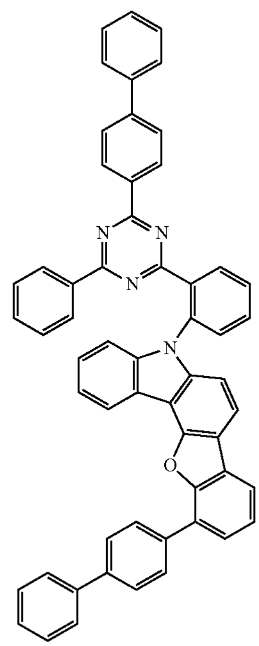
105
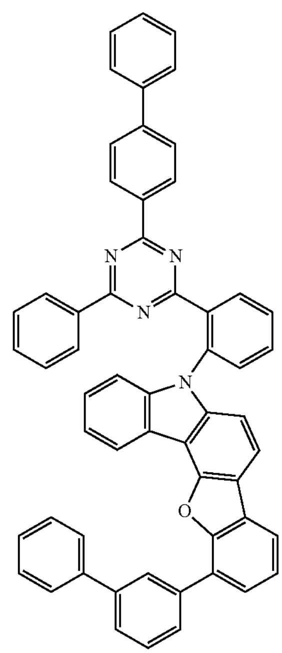

-continued
106
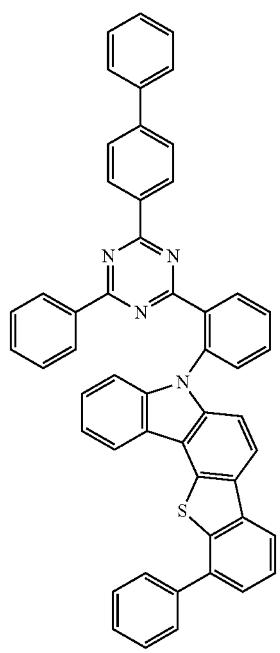
107
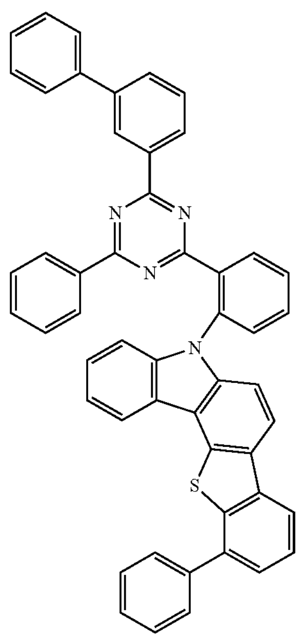
-continued
108
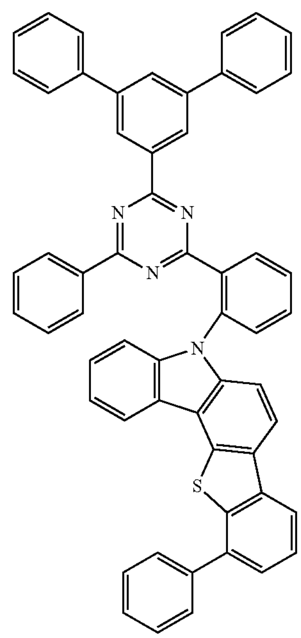
109
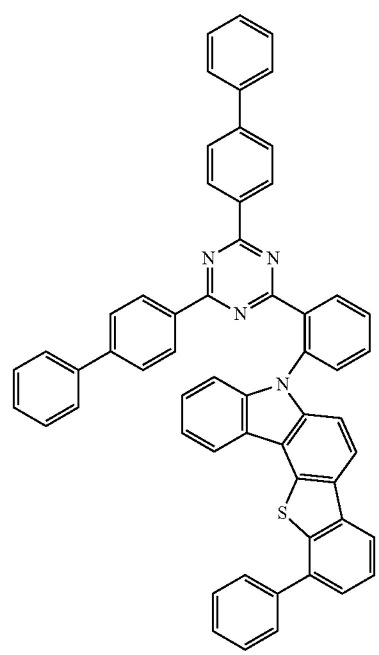

-continued
110
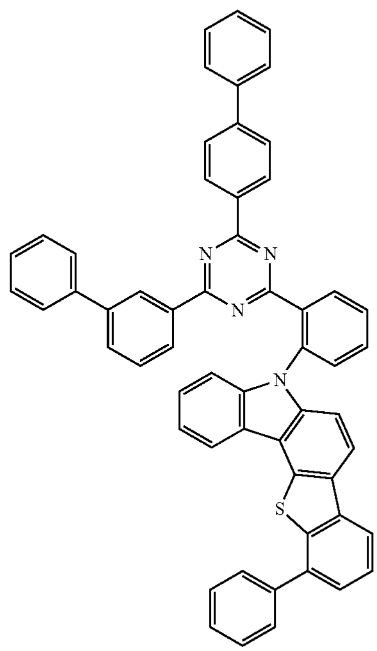
111
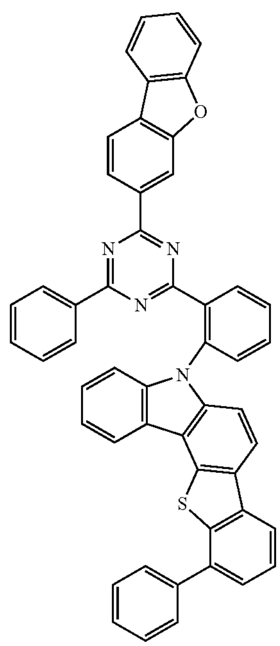
-continued
112
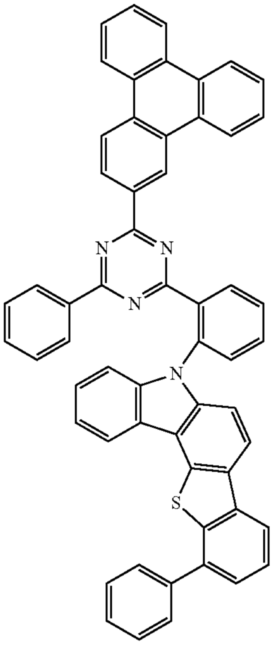
113
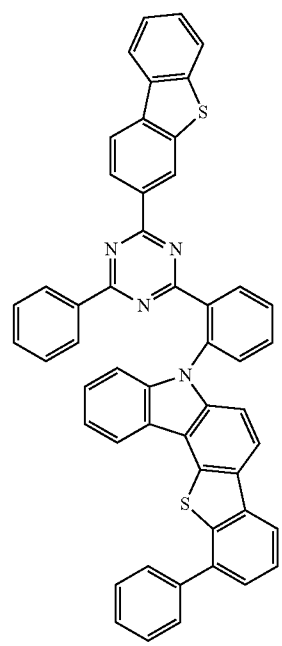

-continued
114
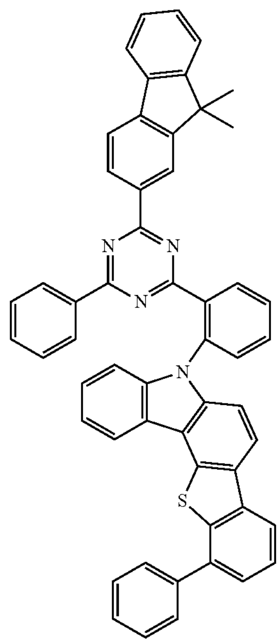
115
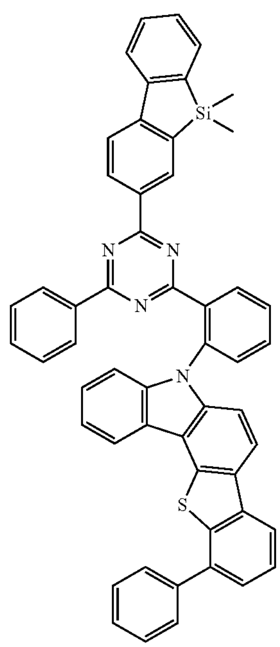
-continued
116
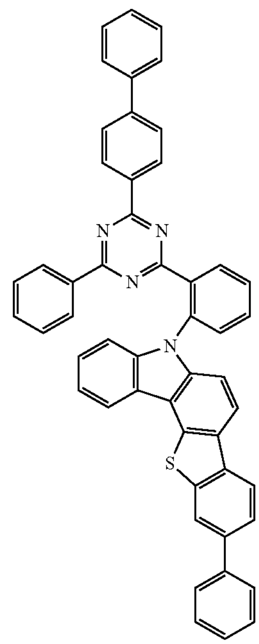
117
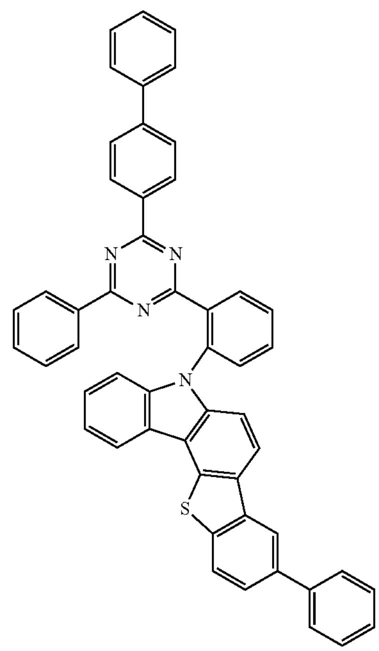

118
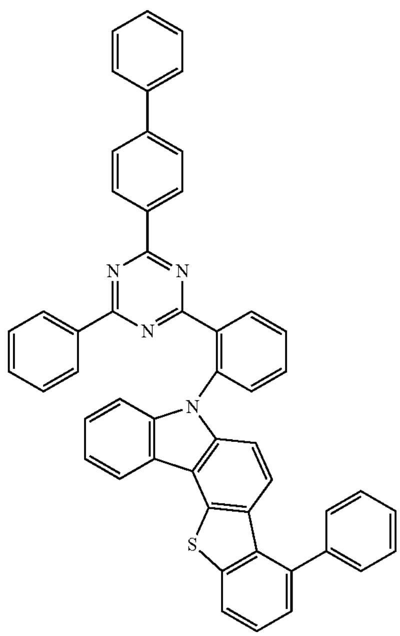
119
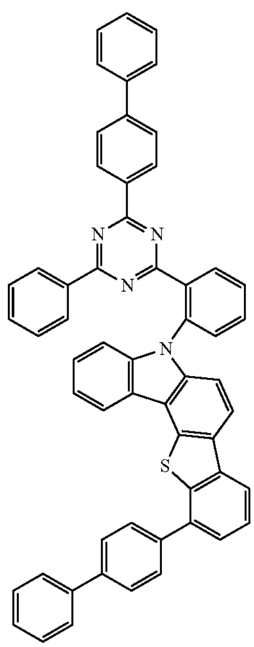
120
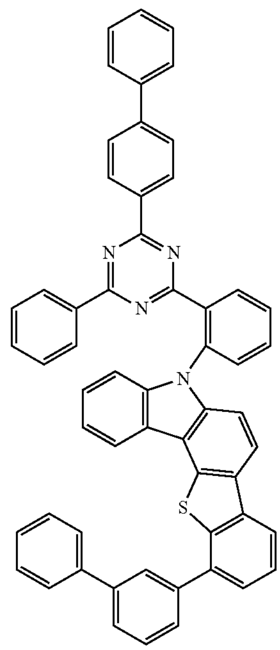
121
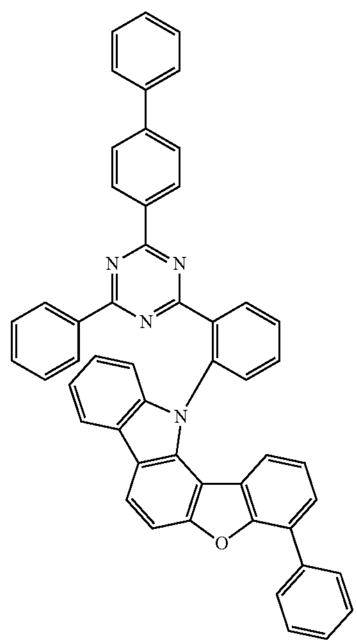

-continued
122
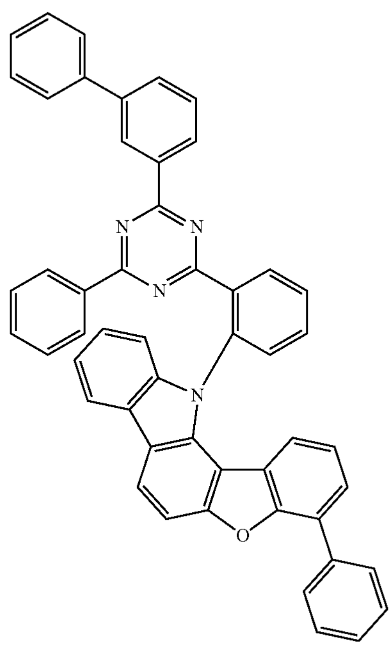
123
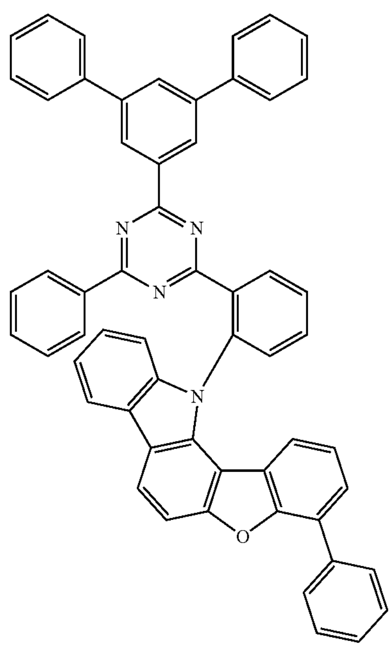
-continued
124
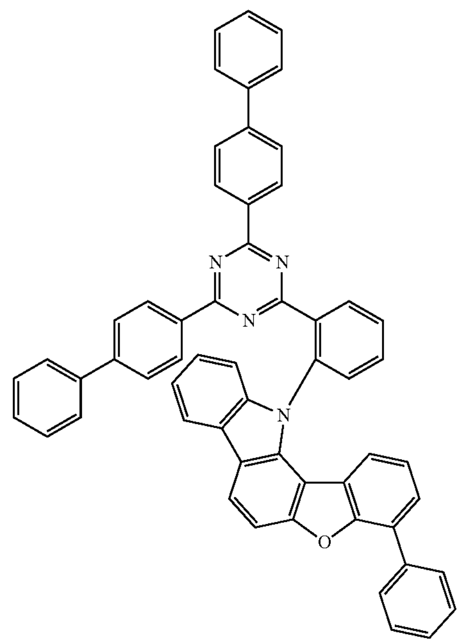
125
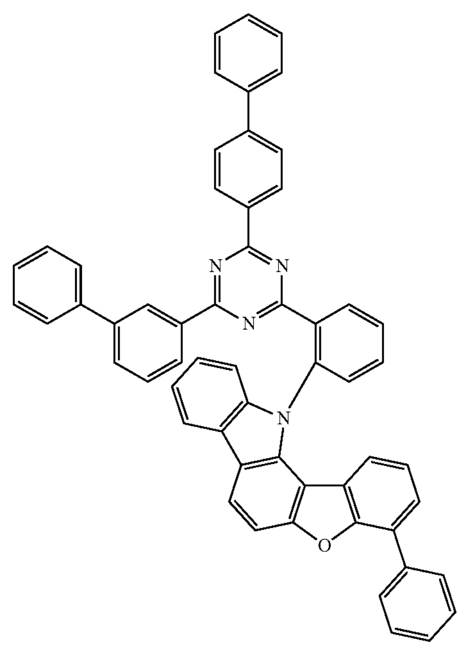

-continued
126
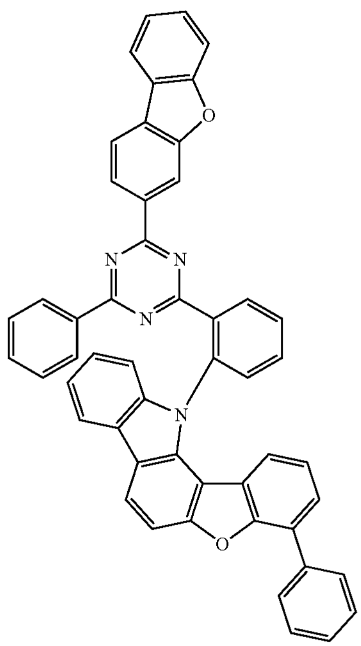
127
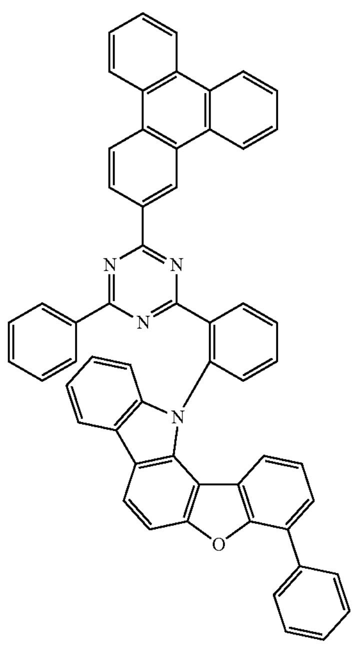
-continued
128
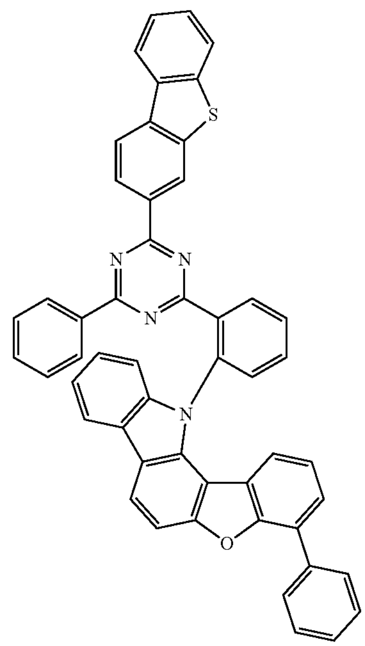
129
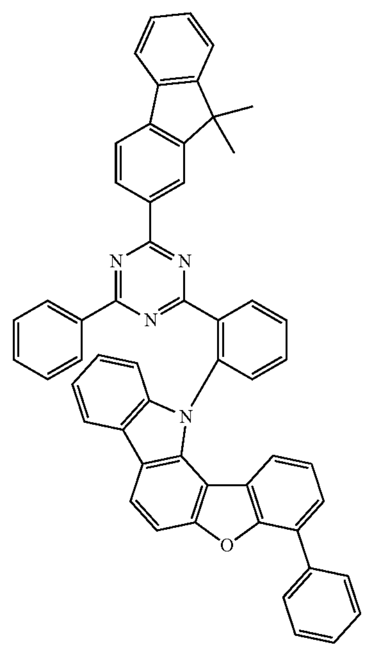

-continued
130
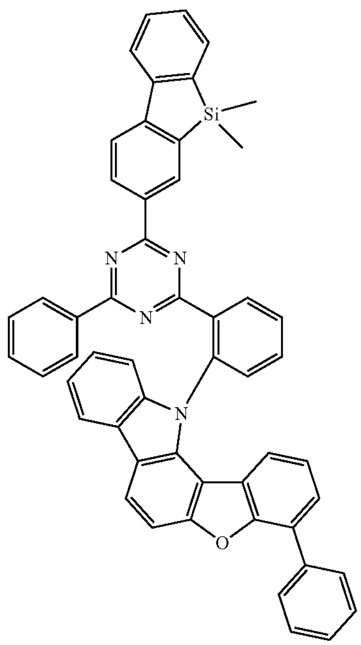
131
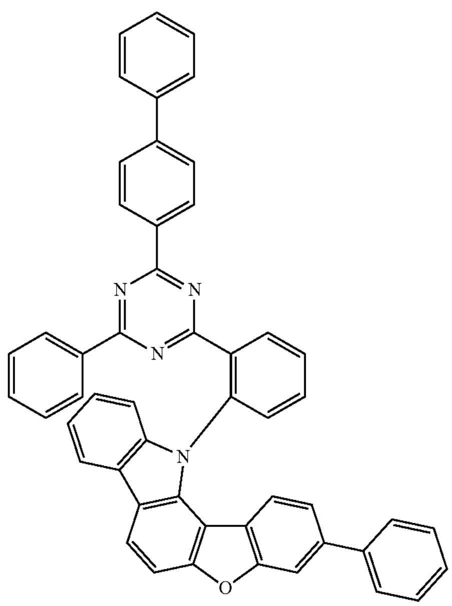
-continued
132
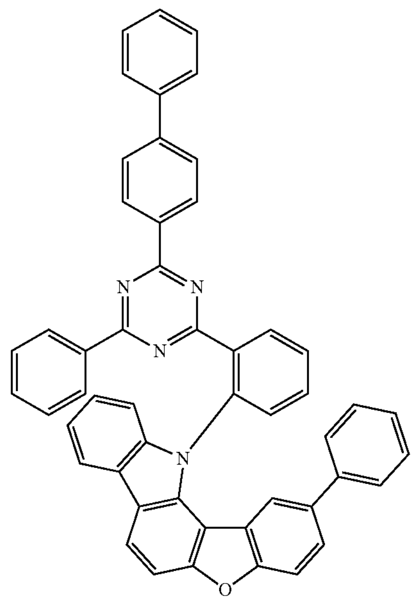
133
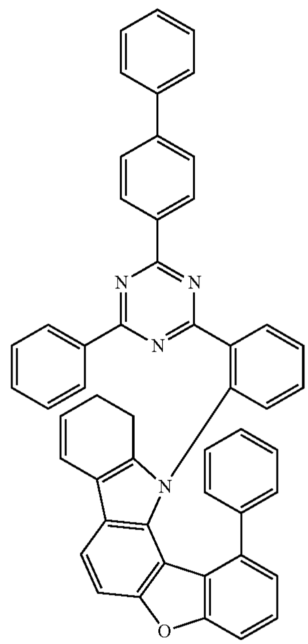

-continued
134
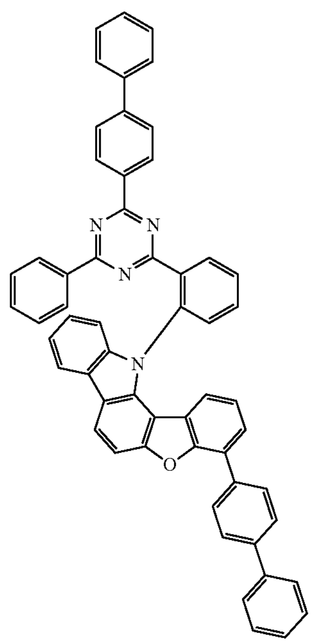
135
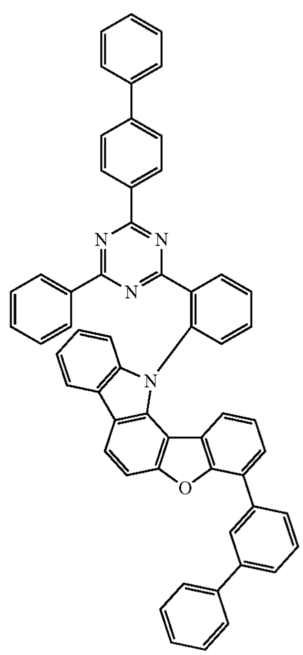
-continued
136
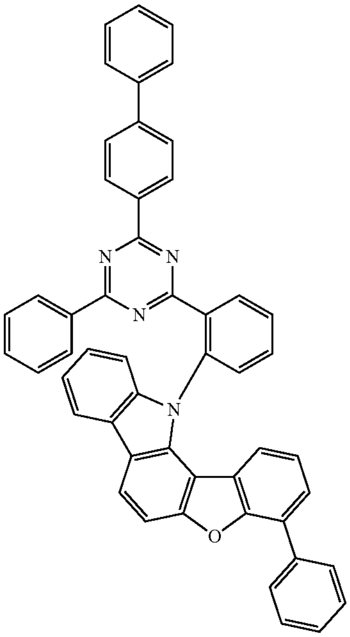
137
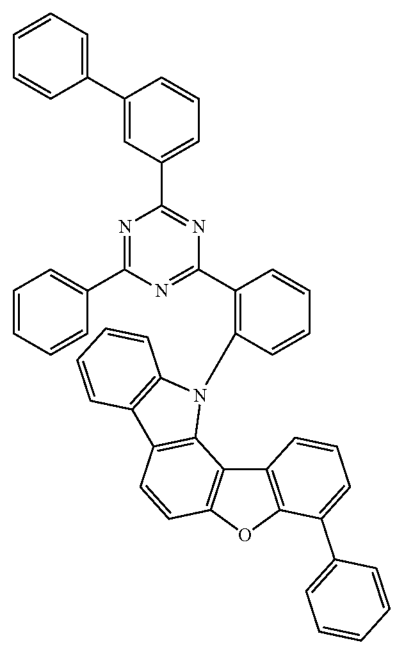

-continued
138
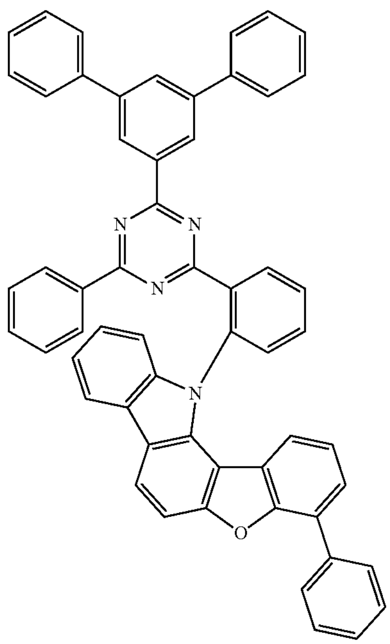
139
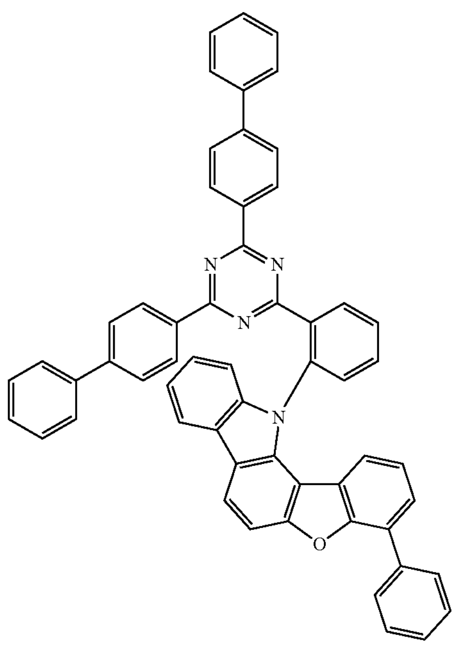
-continued
140
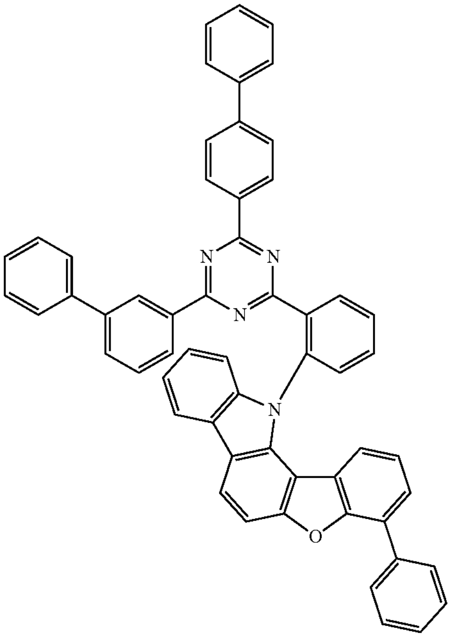
141
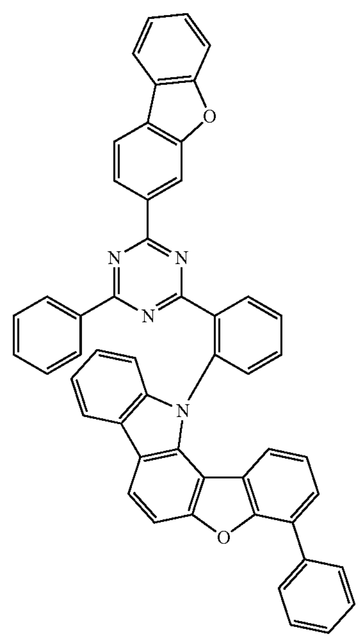

-continued
142
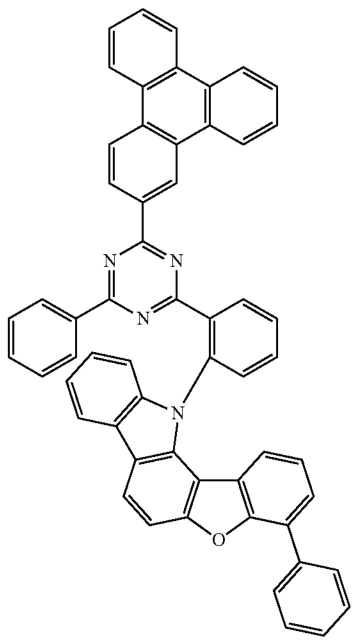
143
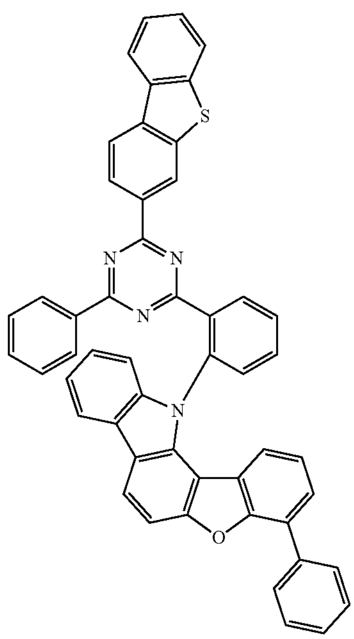
-continued
144
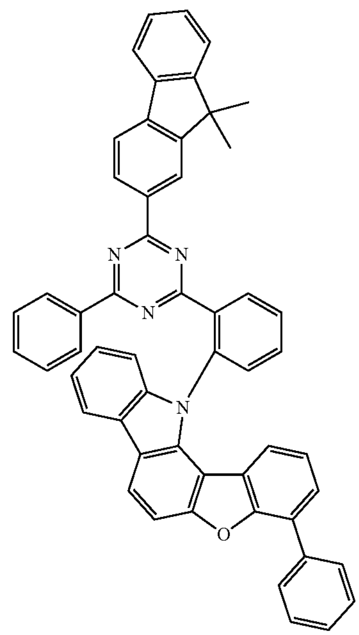
145
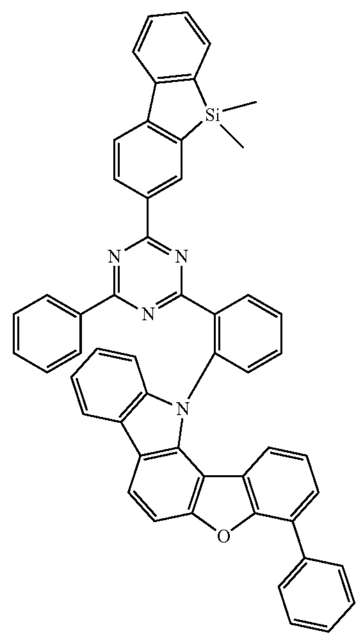

-continued
146
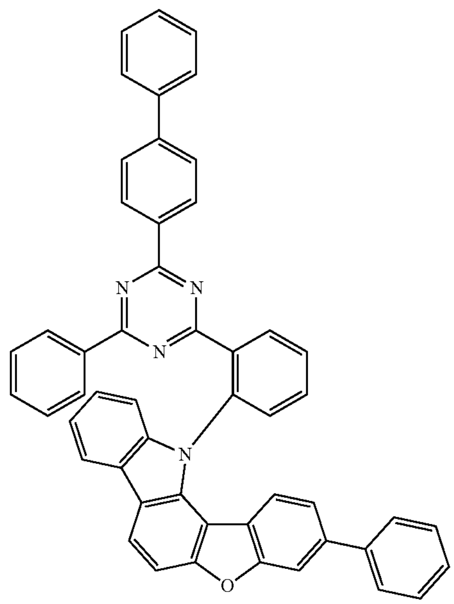
147
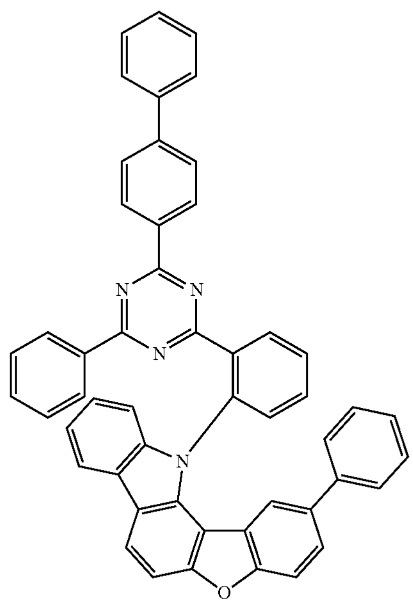
-continued
148
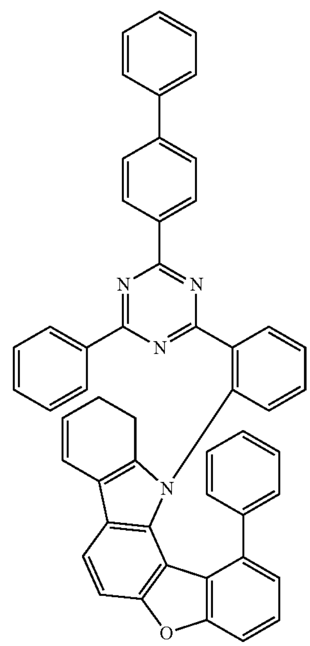
149
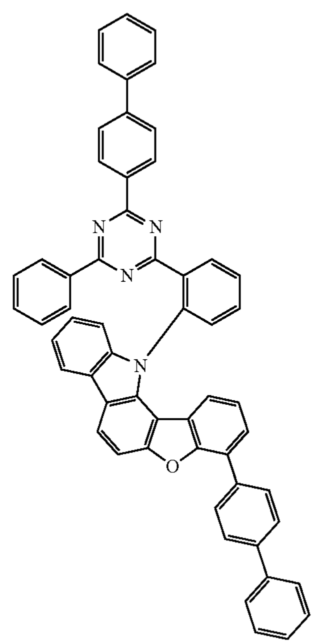

-continued
150
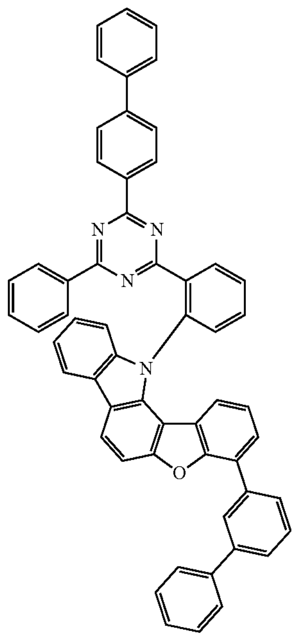
151
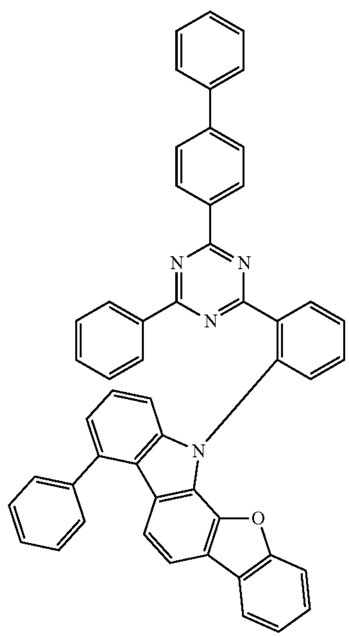
-continued
152
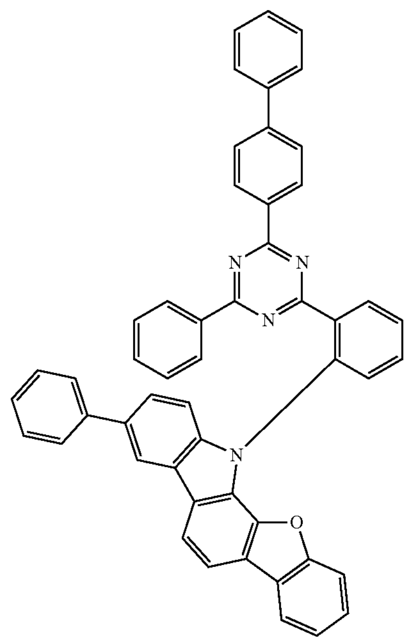
153
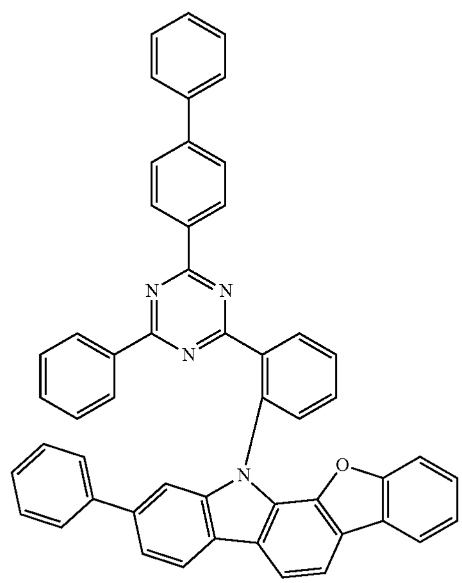

-continued
154
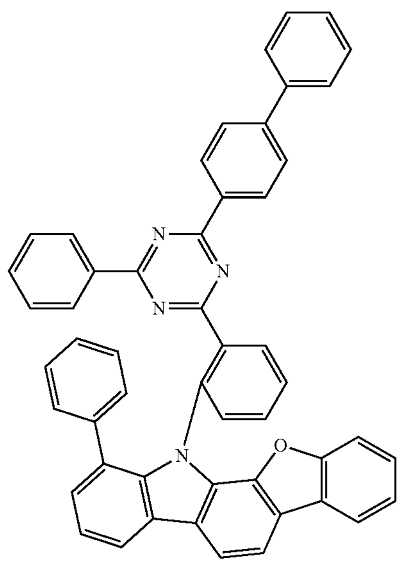
155
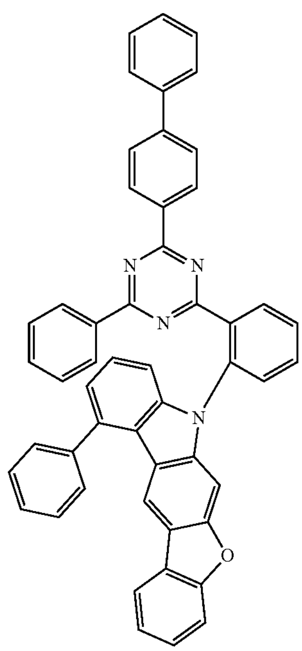
-continued
156
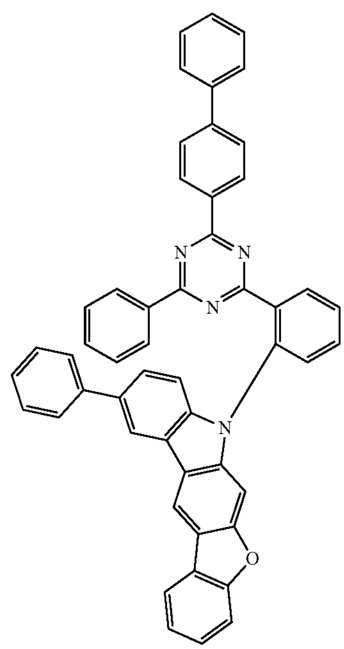
157
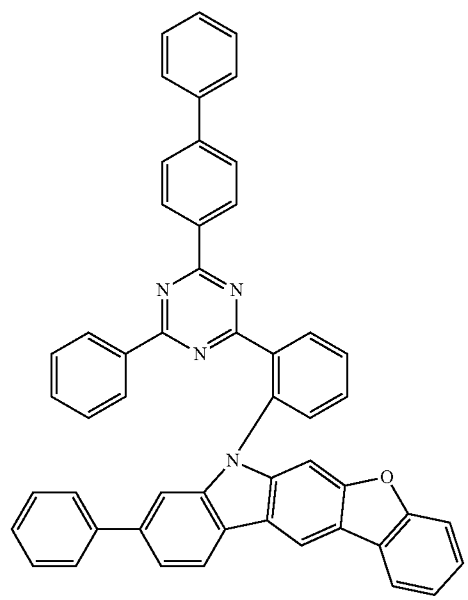

-continued
158
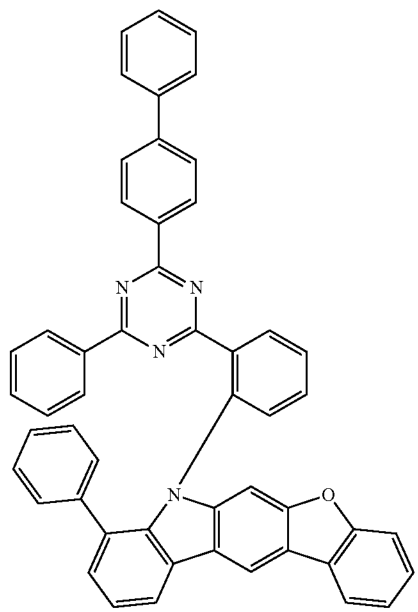
159
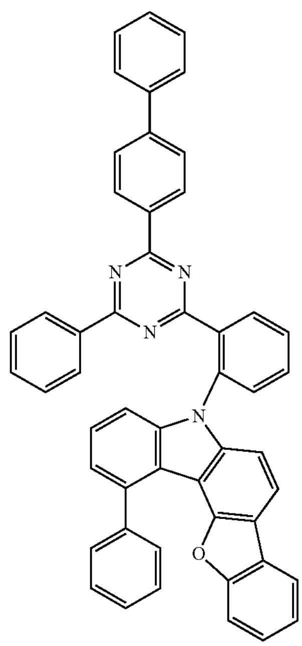
-continued
160
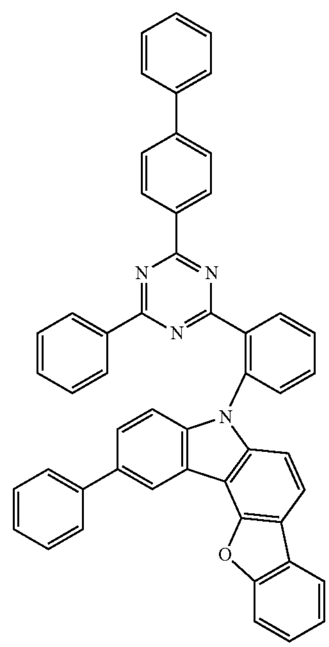
161
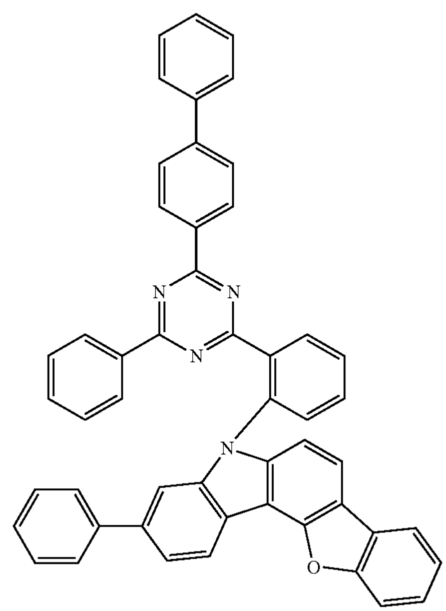

-continued

162

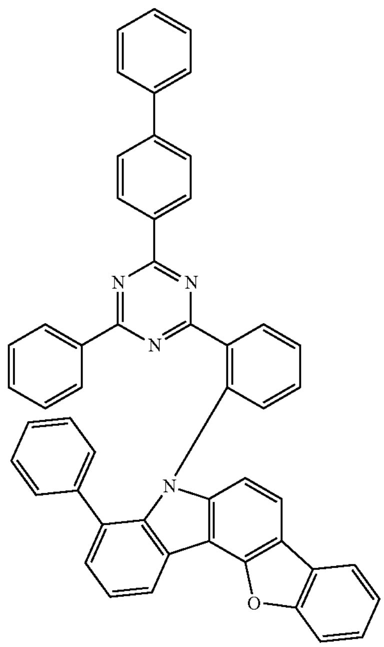

A composition for an organic optoelectronic device according to an embodiment may include, e.g., a first compound for an organic optoelectronic device and a second compound for an organic optoelectronic device (e.g., as a mixture). In an implementation, the first compound may be, e.g., the aforementioned compound represented by the combination of Chemical Formulae 1 and 2, and the second compound may be represented by, e.g., Chemical Formula 3; or a combination of Chemical Formula 4 and Chemical Formula 5.

[Chemical Formula 3]

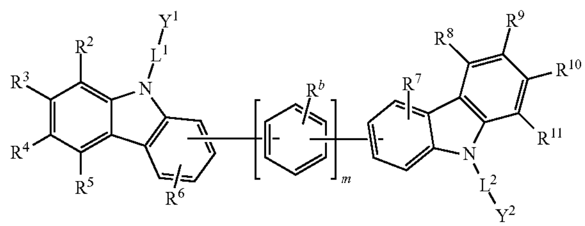

In Chemical Formula 3, $Y^1$ and $Y^2$ may each independently be or include, e.g., a substituted or unsubstituted C6 to C20 aryl group or a substituted or unsubstituted C2 to C30 heterocyclic group.

$L^1$ and $L^2$ may each independently be or include, e.g., a single bond or a substituted or unsubstituted C6 to C20 arylene group.

$R^b$ and $R^2$ to $R^{11}$ may each independently be or include, e.g., hydrogen, deuterium, a cyano group, a halogen, a substituted or unsubstituted amino group, a substituted or unsubstituted C1 to C30 alkyl group, a substituted or unsubstituted C6 to C30 aryl group, or a substituted or unsubstituted C2 to C30 heterocyclic group.

m may be, e.g., an integer of 0 to 2.

[Chemical Formula 4]

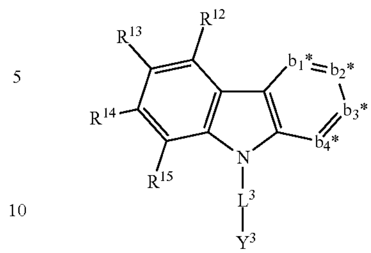

[Chemical Formula 5]

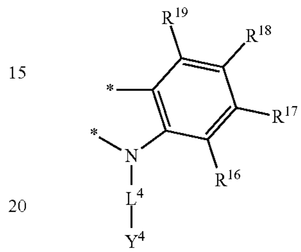

In Chemical Formulas 4 and 5, $Y^3$ and $Y^4$ may each independently be or include, e.g., a substituted or unsubstituted C6 to C20 aryl group or a substituted or unsubstituted C2 to C30 heterocyclic group.

Two adjacent ones of $b_1$* to $b_4$* of Chemical Formula 4 are linking carbons linked at * of Chemical Formula 5, the remaining two of $b_1$* to $b_4$* of Chemical Formula 4, not linked at * of Chemical Formula 5, are C-$L^a$-$R^c$.

$L^a$, $L^3$, and $L^4$ may each independently be or include, e.g., a single bond or a substituted or unsubstituted C6 to C20 arylene group.

$R^c$ and $R^{12}$ to $R^{19}$ may each independently be or include, e.g., hydrogen, deuterium, a cyano group, a halogen, a substituted or unsubstituted amino group, a substituted or unsubstituted C1 to C30 alkyl group, a substituted or unsubstituted C6 to C30 aryl group, or a substituted or unsubstituted C2 to C30 heterocyclic group.

The second compound may be used in the light emitting layer together with the first compound to help improve the mobility of charges and improve stability, thereby improving luminous efficiency and life-span characteristics.

In an implementation, $Y^1$ and $Y^2$ of Chemical Formula 3 may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted carbazolyl group, a substituted or unsubstituted dibenzothiophenyl group, a substituted or unsubstituted dibenzofuranyl group, a substituted or unsubstituted fluorenyl group, or a substituted or unsubstituted pyridinyl group.

In an implementation, $L^1$ and $L^2$ of Chemical Formula 3 may each independently be, e.g., a single bond, a substituted or unsubstituted phenylene group, or a substituted or unsubstituted biphenylene group.

In an implementation, $R^2$ to $R^{11}$ of Chemical Formula 3 may each independently be, e.g., hydrogen, deuterium, or a substituted or unsubstituted C6 to C12 aryl group.

In an implementation, m may be, e.g., 0 or 1.

In an implementation, "substituted" of Chemical Formula 3 refers to replacement of at least one hydrogen by deuterium, a C1 to C4 alkyl group, a C6 to C18 aryl group, or a C2 to C30 heteroaryl group.

In an implementation, Chemical Formula 3 may be represented by, e.g., one Chemical Formula 3-1 to Chemical Formula 3-15.
[Chemical Formula 3-1]
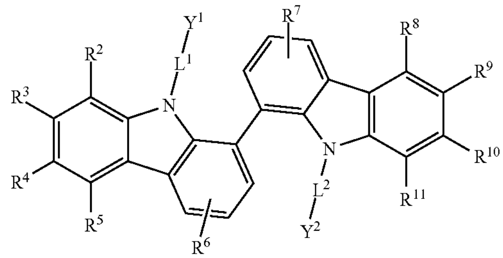
[Chemical Formula 3-2]
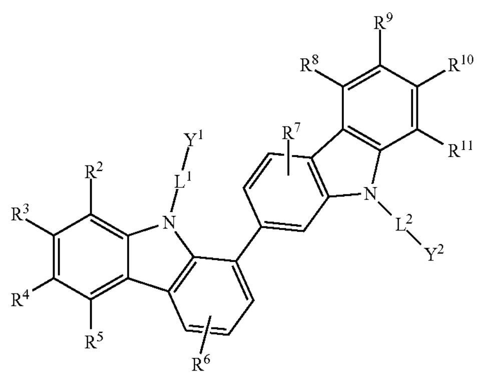
[Chemical Formula 3-3]
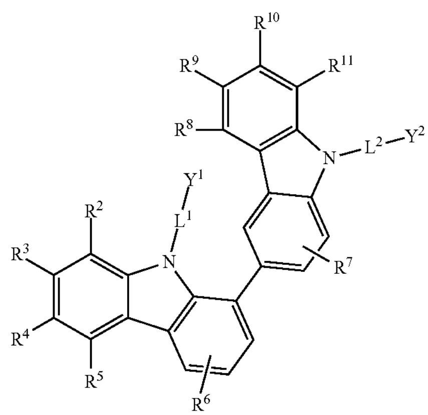
[Chemical Formula 3-4]
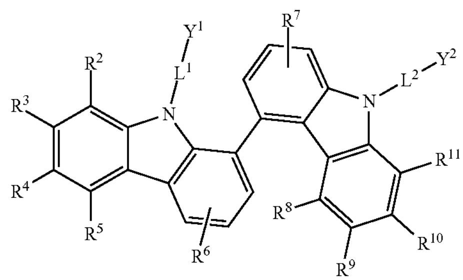
-continued
[Chemical Formula 3-5]
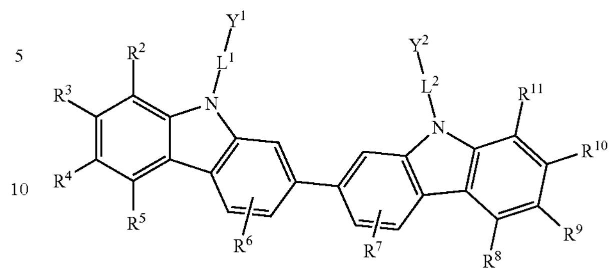
[Chemical Formula 3-6]
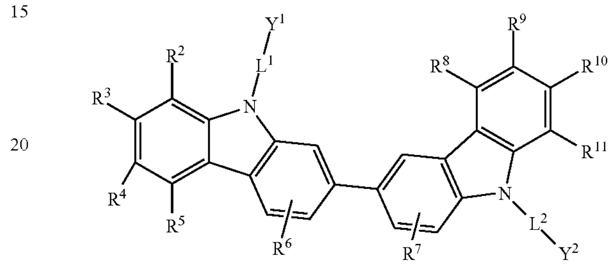
[Chemical Formula 3-7]
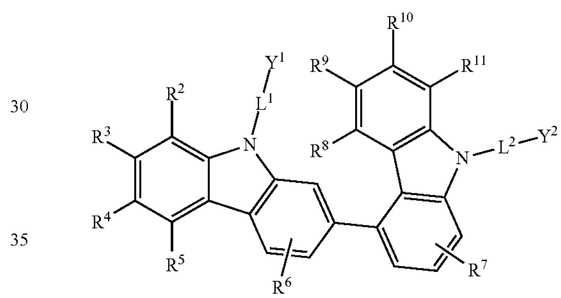
[Chemical Formula 3-8]
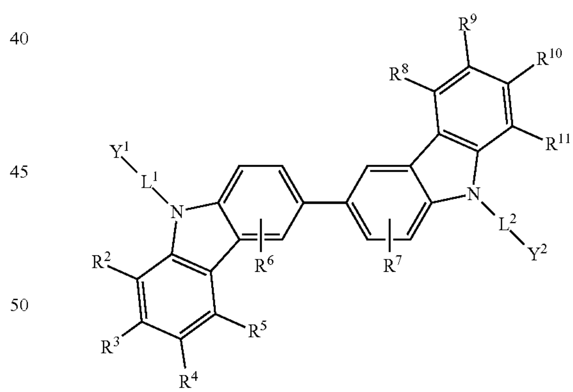
[Chemical Formula 3-9]
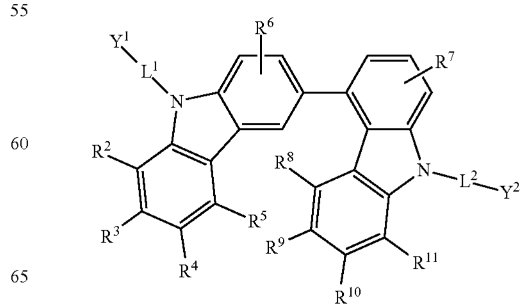

-continued
[Chemical Formula 3-10]
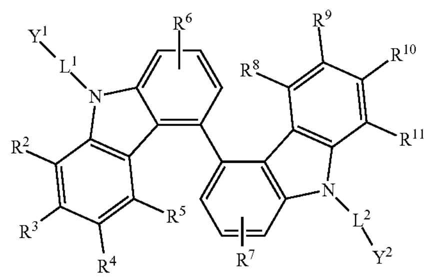
[Chemical Formula 3-11]
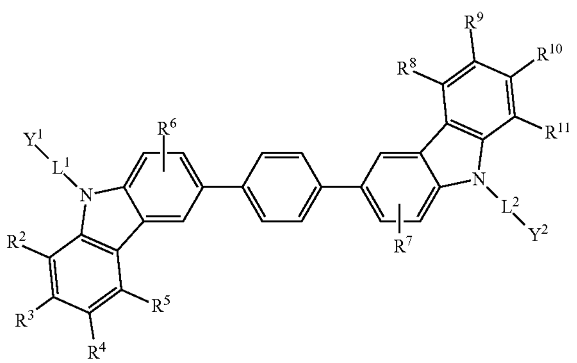
[Chemical Formula 3-12]
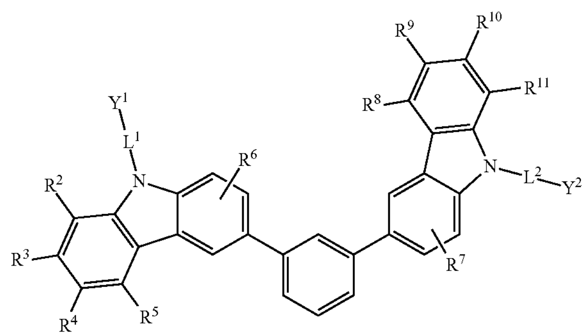
[Chemical Formula 3-13]
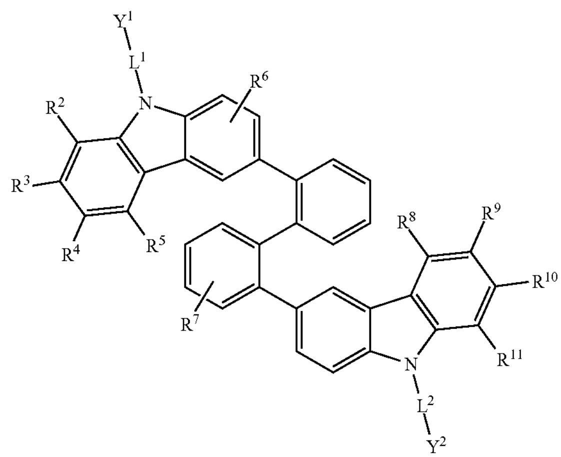
-continued
[Chemical Formula 3-14]
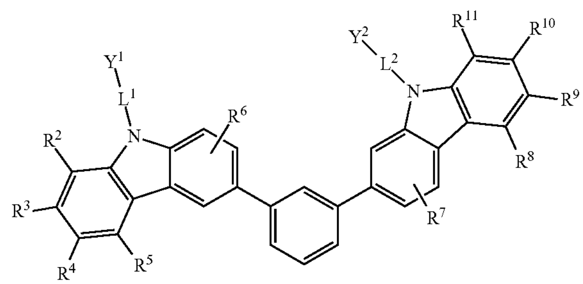
[Chemical Formula 3-15]
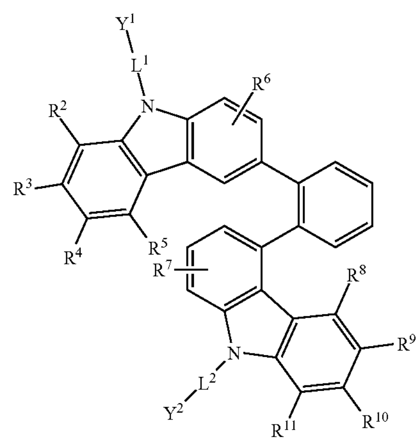
In Chemical Formula 3-1 to Chemical Formula 3-15, $R^2$ to $R^{11}$ may each independently be, e.g., hydrogen or a substituted or unsubstituted C6 to C12 aryl group. The moieties $*-L^1-Y^1$ and $*-L^2-Y^2$ may each independently be a moiety of Group II.
[Group II]
C-1
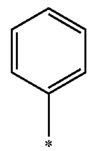
C-2
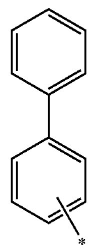

-continued
C-3
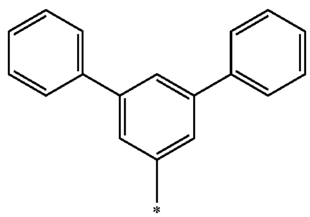
C-4
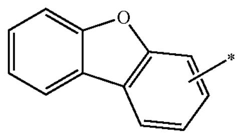
C-5
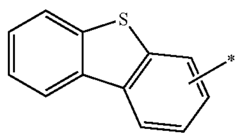
C-6
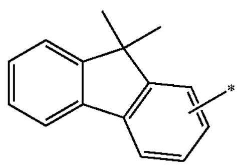
C-7
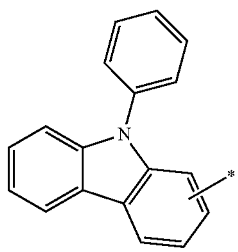
C-8
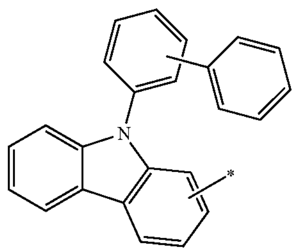
C-9
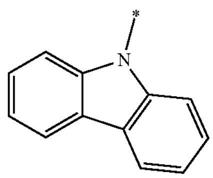
C-10
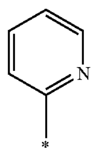
-continued
C-11
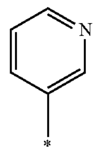
C-12
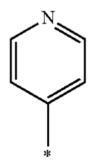
C-13
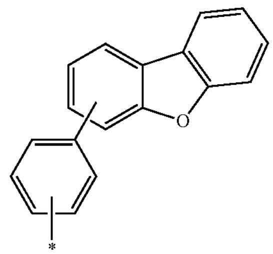
C-14
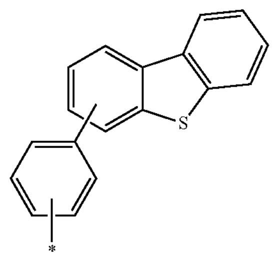
C-15
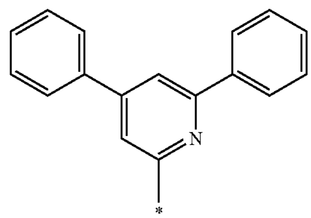
C-16
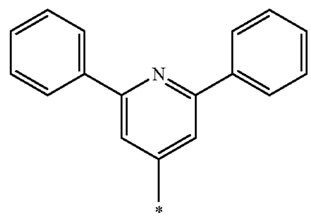
C-17
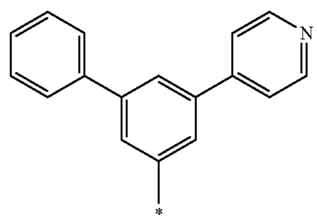

-continued

C-18

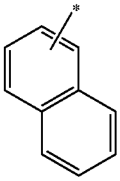

C-19

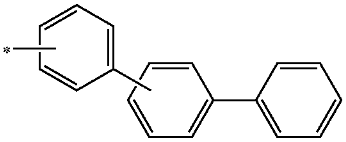

C-20

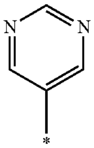

C-21

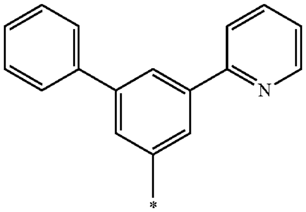

C-22

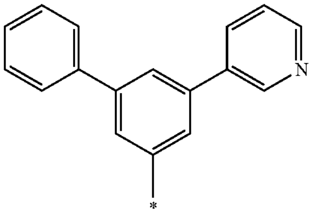

C-23

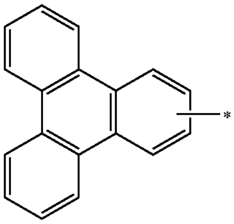

C-24

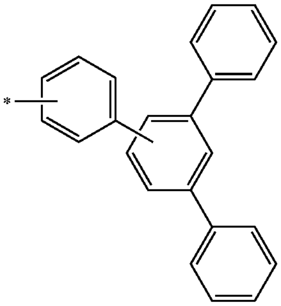

In Group II, * is a linking point (e.g., to the N atom).

In an implementation, Chemical Formula 3 may be represented by, e.g., Chemical Formula 3-8.

In an implementation, the moieties *-$L^1$-$Y^1$ and *-$L^2$-$Y^2$ of Chemical Formula 3-8 may each independently be a moiety of Group II, e.g., C-1, C-2, C-3, C-16, or C-23.

In an implementation, the moieties *-$L^1$-$Y^1$ and *-$L^2$-$Y^2$ may each independently be, e.g., moieties C-1, C-2, or C-3 of Group II.

In an implementation, the second compound represented by the combination of Chemical Formula 4 and Chemical Formula 5 may be represented by, e.g., Chemical Formula 4A, Chemical Formula 4B, Chemical Formula 4C, Chemical Formula 4D, or Chemical Formula 4E.

[Chemical Formula 4A]

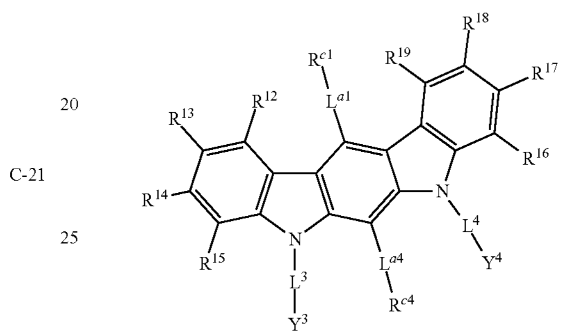

[Chemical Formula 4B]

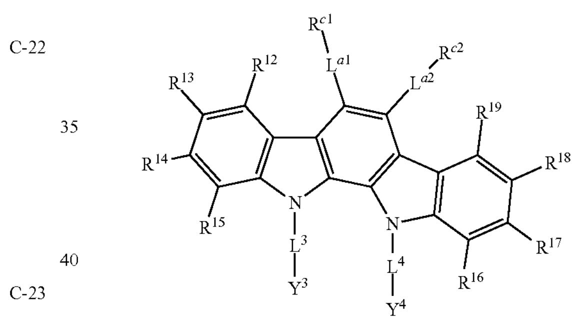

[Chemical Formula 4C]

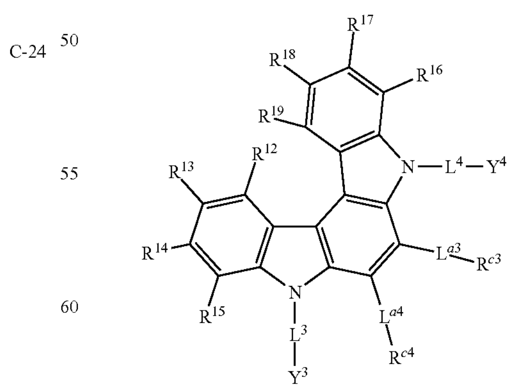

-continued

[Chemical Formula 4D]

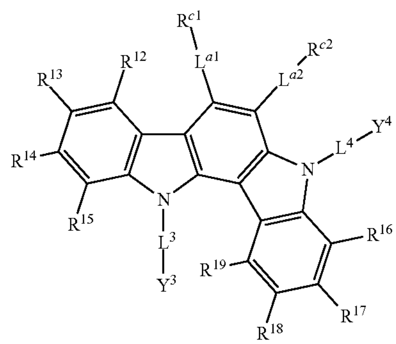

[Chemical Formula 4E]

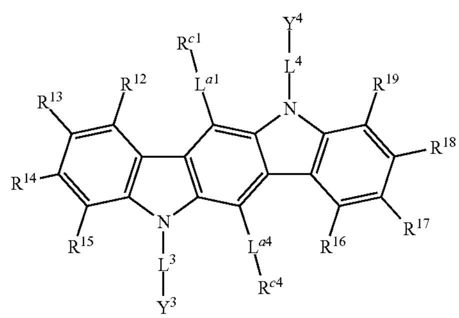

In Chemical Formula 4A to Chemical Formula 4E, $Y^3$, $Y^4$, $L^3$, $L^4$, and $R^{12}$ to $R^{19}$ may be defined the same as those described above.

$L^{a1}$ to $L^{a4}$ may be defined the same as $L^3$ and $L^4$.

$R^{c1}$ to $R^{c4}$ may be defined the same as $R^{12}$ to $R^{19}$.

In an implementation, $Y^3$ and $Y^4$ of Chemical Formulas 4 and 5 may each independently be, e.g., a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $R^{c1}$ to $R^{c4}$ and $R^{12}$ to $R^{19}$ may each independently be, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $Y^3$ and $Y^4$ in Chemical Formulas 4 and 5 may each independently be, e.g., a group of Group IT.

[Group II]

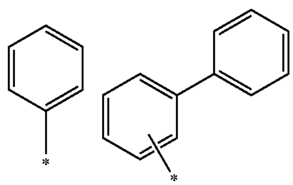

-continued

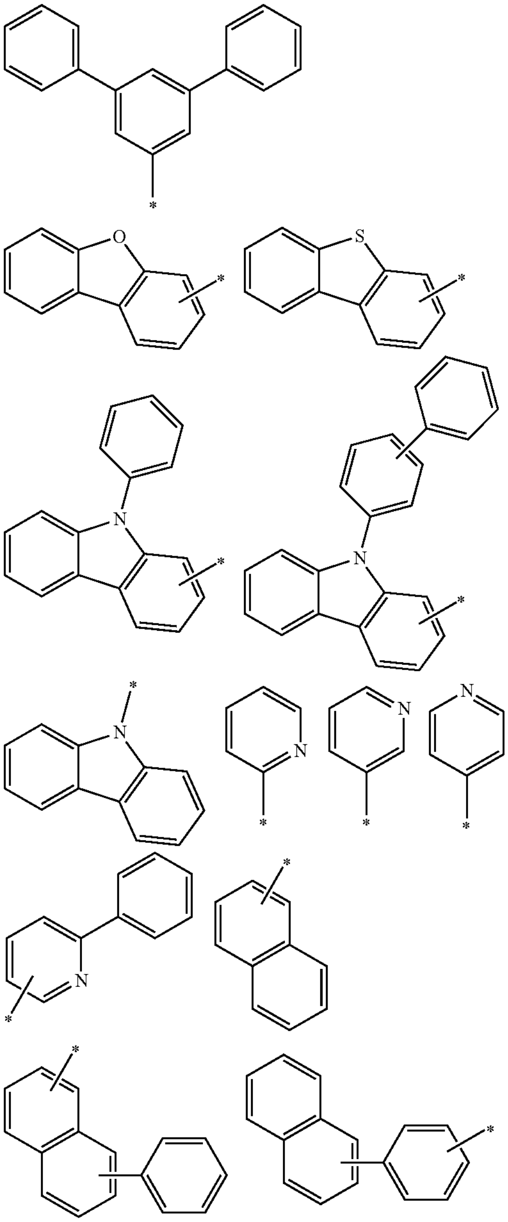

In Group III, * is a linking point with $L^3$ and $L^4$, respectively.

In an implementation, $R^{c1}$ to $R^{c4}$ and $R^{12}$ to $R^{19}$ may each independently be, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $R^{c1}$ to $R^{c4}$ and $R^{12}$ to $R^{19}$ may each independently be, e.g., hydrogen, deuterium, a cyano group, or a substituted or unsubstituted phenyl group.

In an implementation, each of $R^{c1}$ to $R^{c4}$ may be, e.g., hydrogen, and $R^{12}$ to $R^{19}$ may each independently be, e.g., hydrogen or a substituted or unsubstituted phenyl group.

In an implementation, the second compound may be represented by, e.g., Chemical Formula 3-8, and in Chemical Formula 3-8, $Y^1$ and $Y^2$ may each independently be, e.g., a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group, $L^1$ and $L^2$ may each independently be, e.g., a single bond or a substituted or unsubstituted C6 to C20 arylene group, and $R^2$ to $R^{11}$ may each independently be, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, the second compound may be represented by, e.g., Chemical Formula 4C, and in Chemical Formula 4C, $L^{a1}$ and $L^{a2}$ may each be, e.g., a single bond, $L^3$ and $L^4$ may each independently be, e.g., a single bond or a substituted or unsubstituted C6 to C12 arylene group, $R^{12}$ to $R^{19}$, $R^{c1}$, and $R^{c2}$ may each be, e.g., hydrogen, and $Y^3$ and $Y^4$ may each independently be, e.g., a substituted or unsubstituted phenyl group, a substituted or unsubstituted naphthyl group, or a substituted or unsubstituted biphenyl group.

In an implementation, the second compound may be, e.g., a compound of Group 2.

[Group 2]

[A-1]

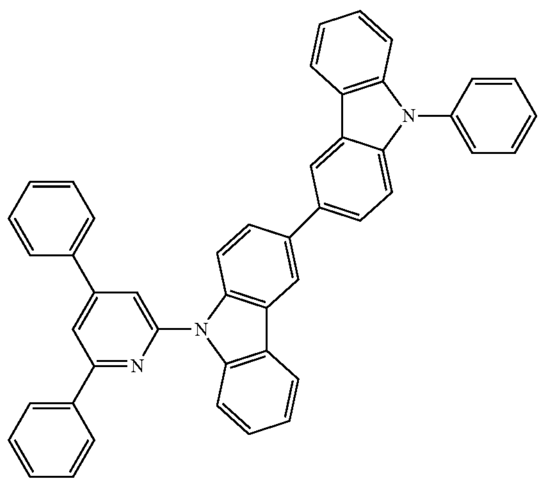

[A-2]

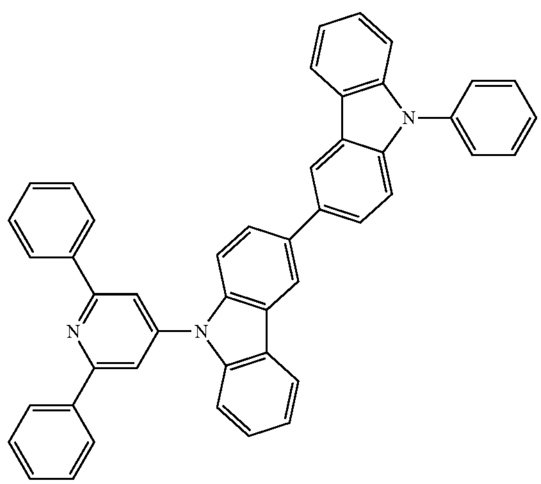

-continued

[A-3]

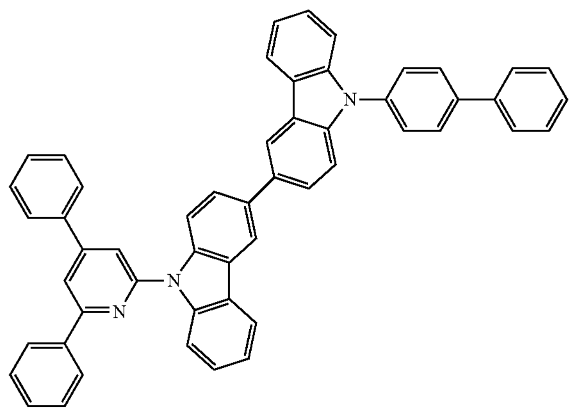

[A-4]

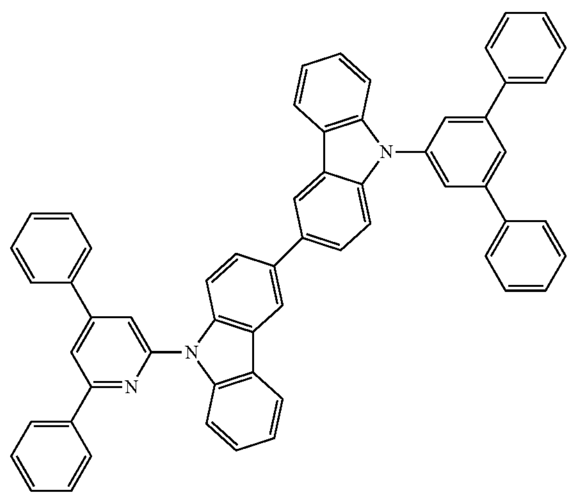

[A-5]

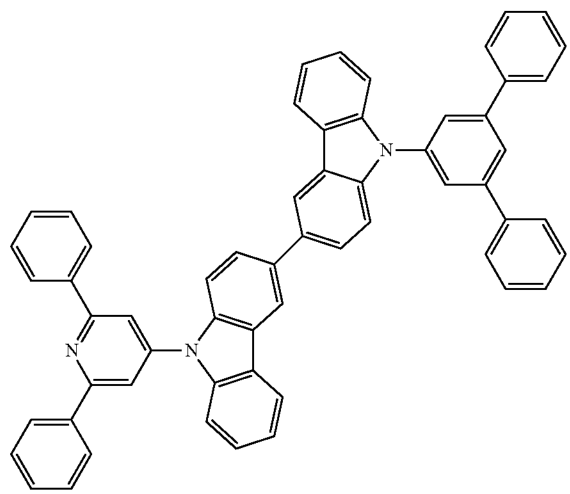

-continued
[A-6]
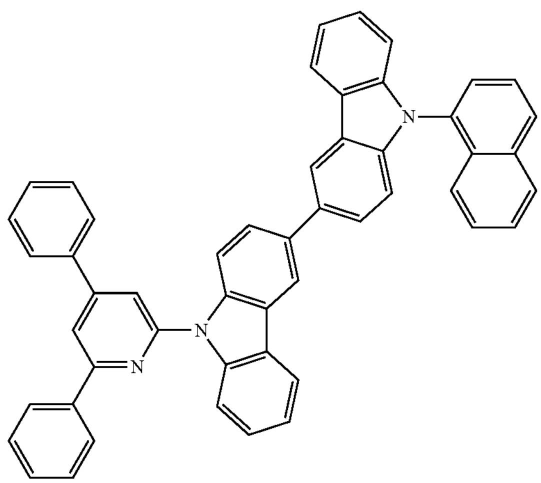
[A-7]
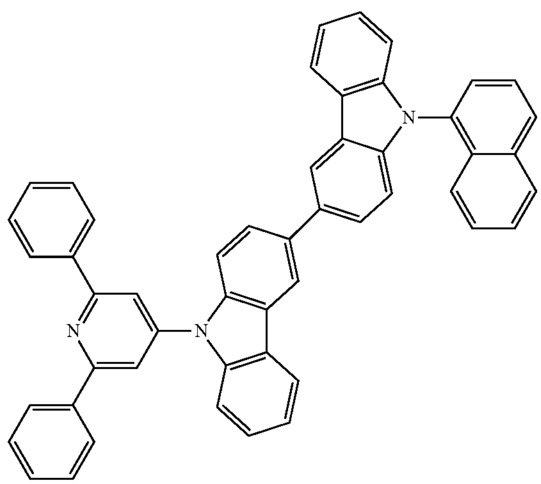
[A-8]
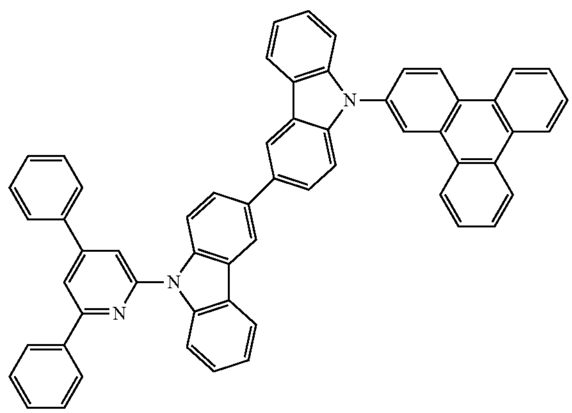
-continued
[A-9]
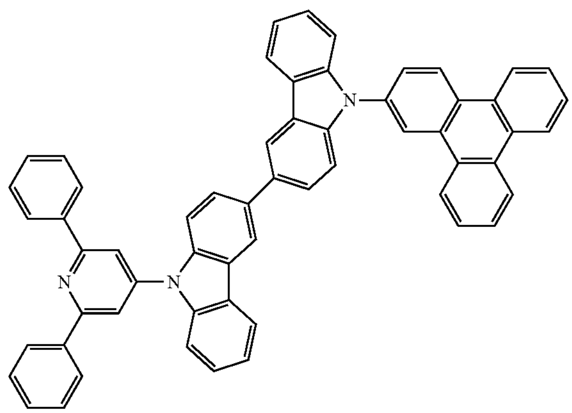
[A-10]
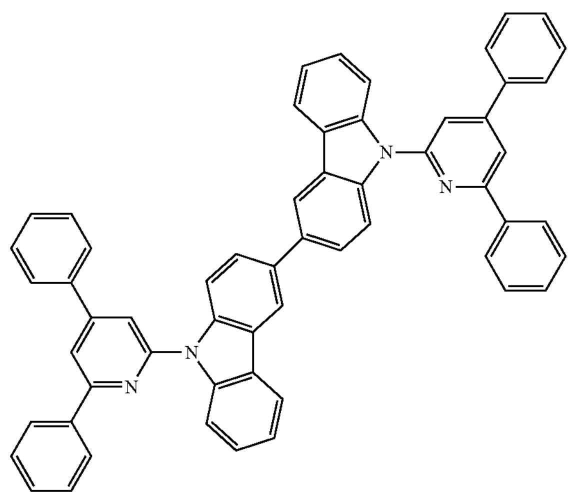
[A-11]
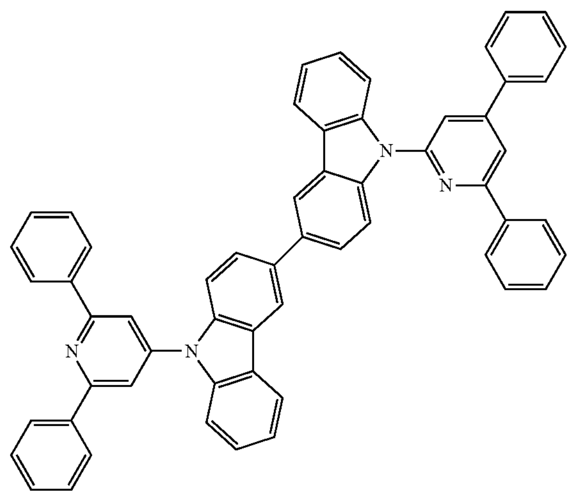

-continued
[A-12]
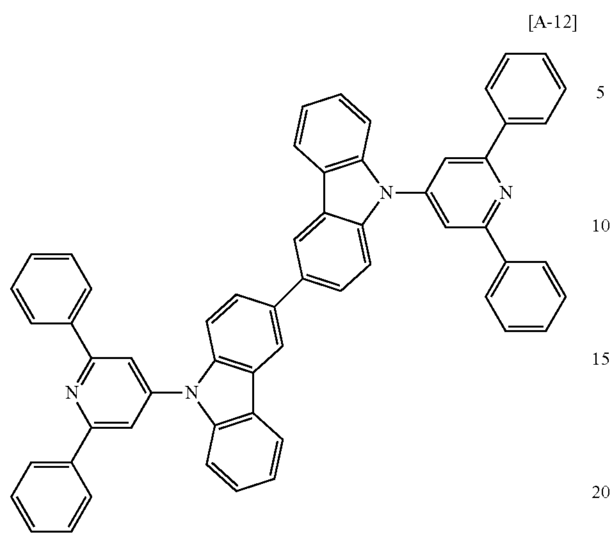
[A-13]
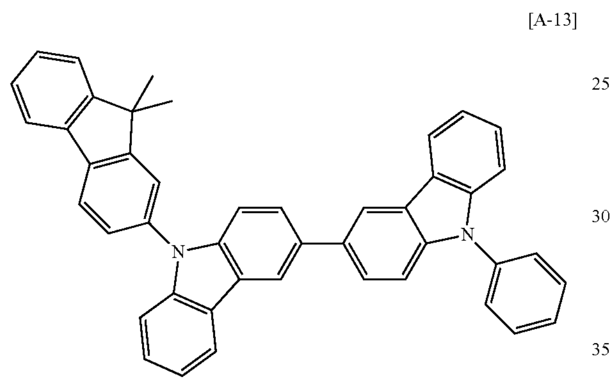
[A-14]
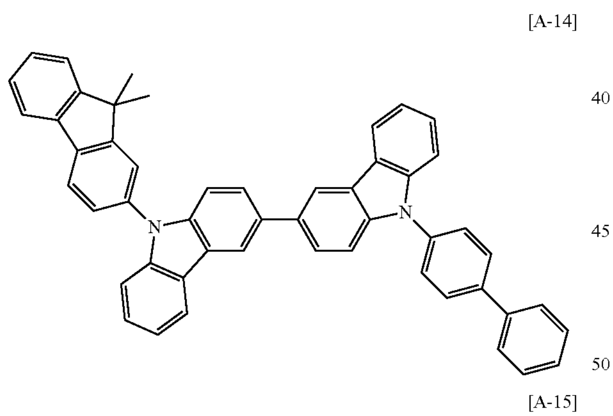
[A-15]
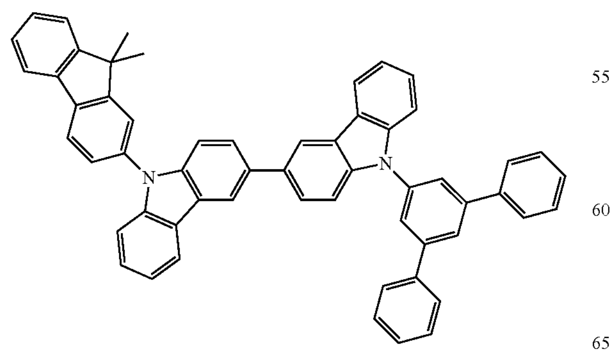
-continued
[A-16]
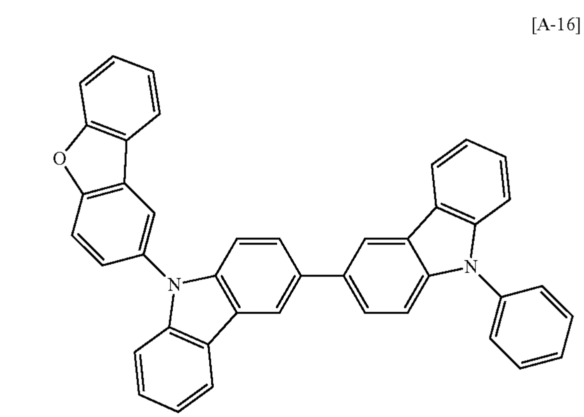
[A-17]
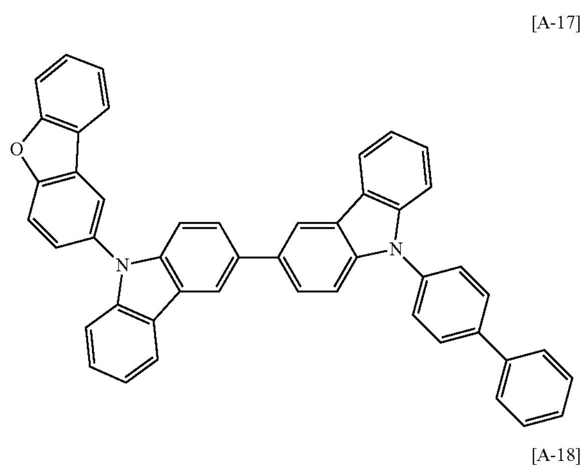
[A-18]
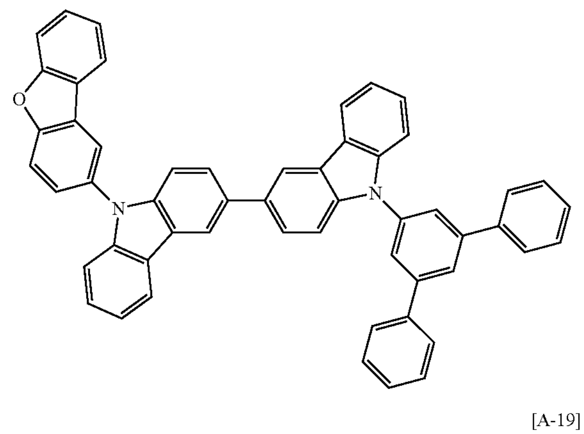
[A-19]
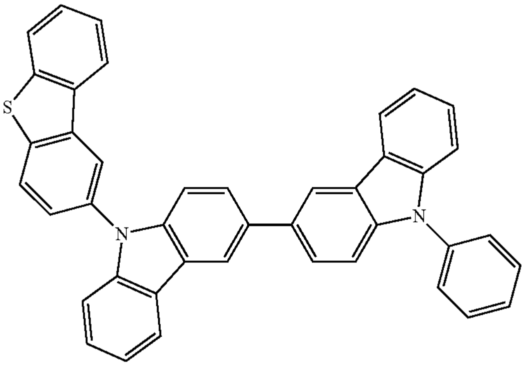

[A-20]
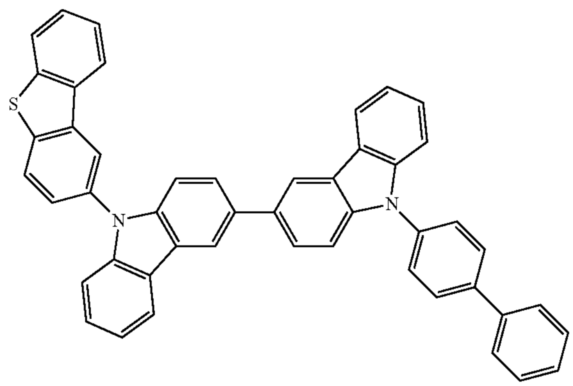
[A-21]
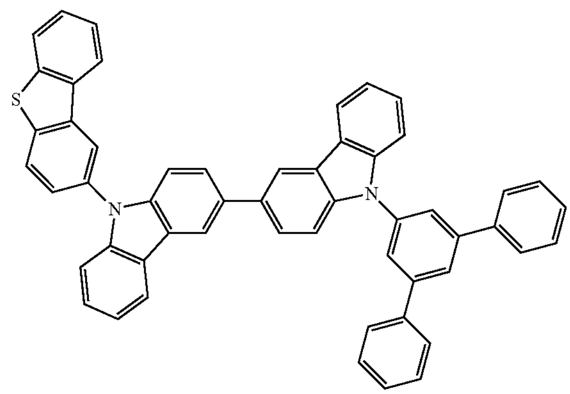
[A-22]
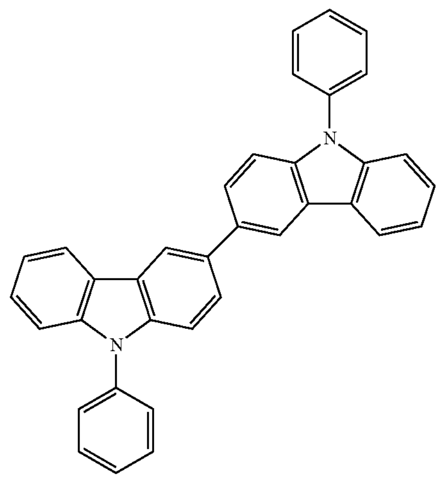
[A-23]
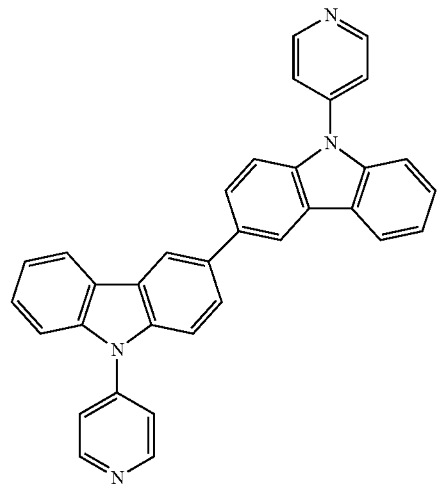
[A-24]
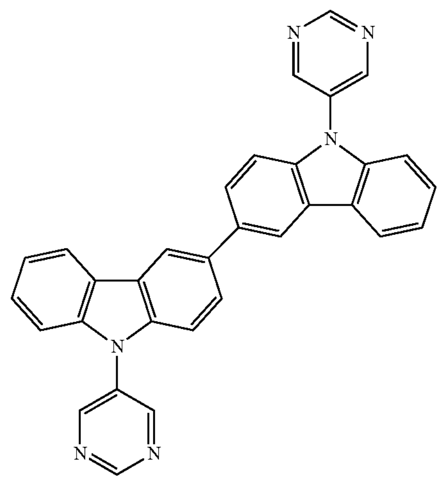
[A-25]
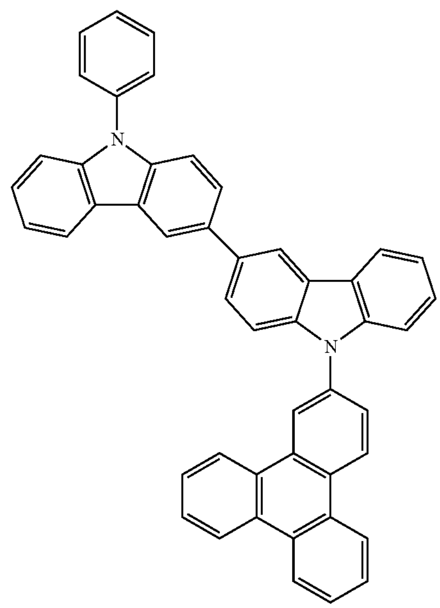

-continued
[A-26]
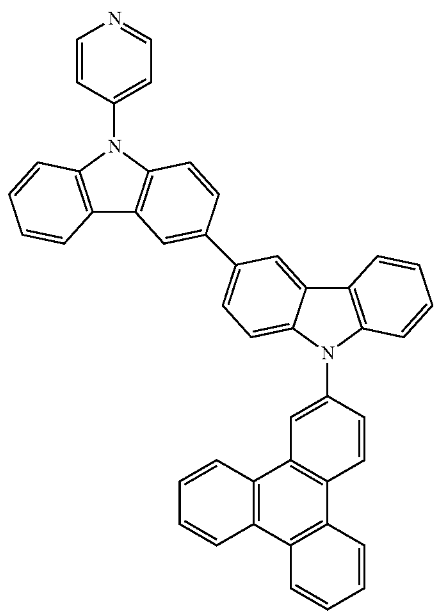
[A-27]
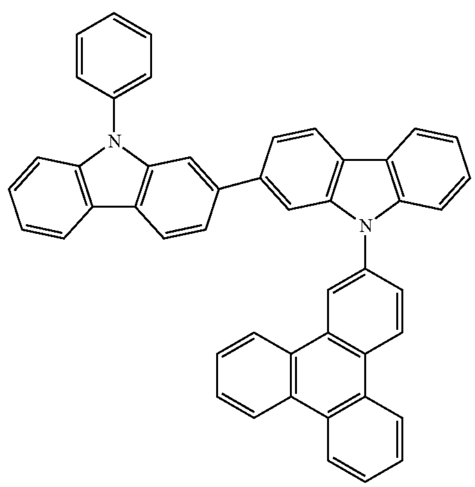
[A-28]
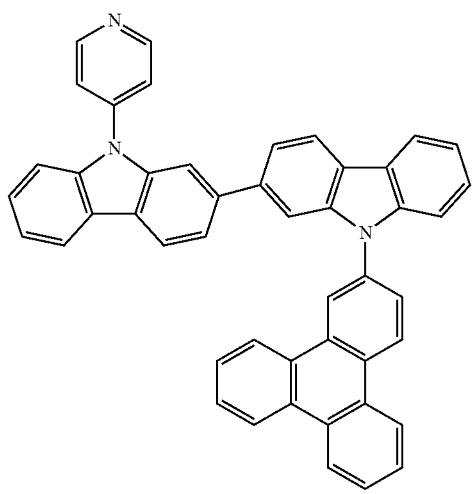
-continued
[A-29]
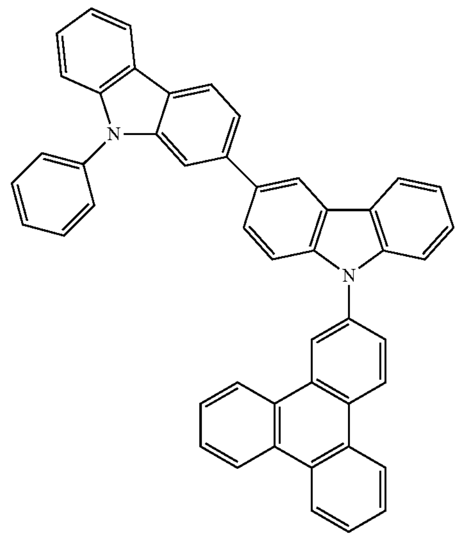
[A-30]
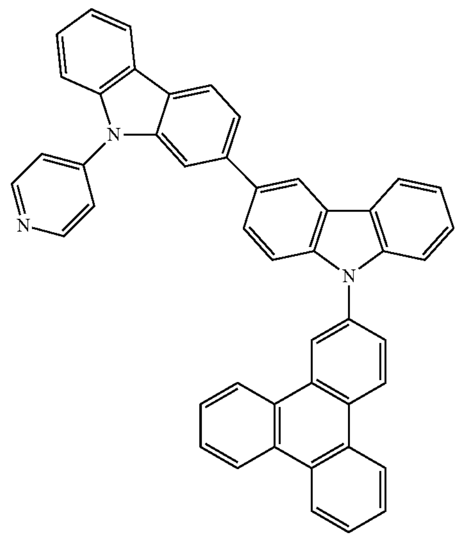
[A-31]
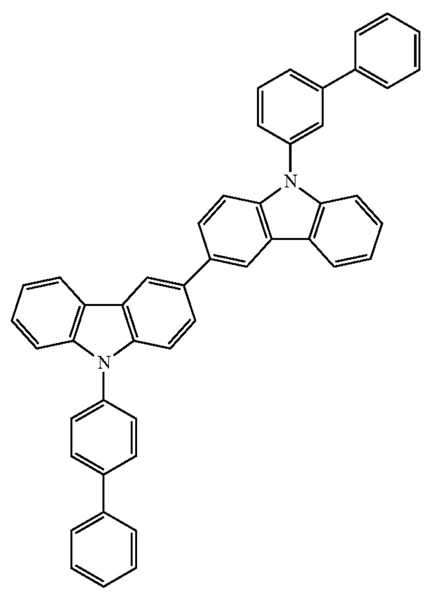

-continued
[A-32]
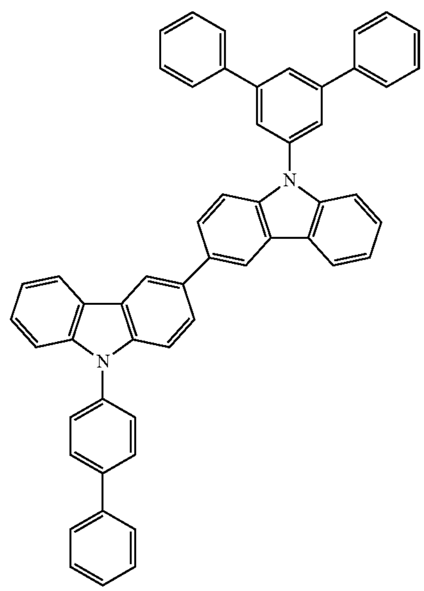
[A-33]
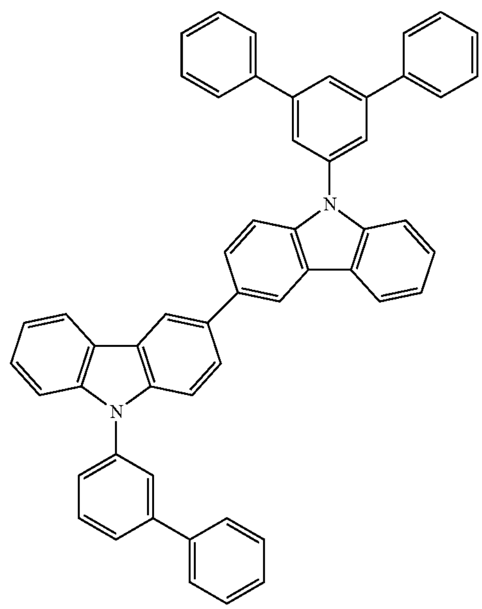
-continued
[A-34]
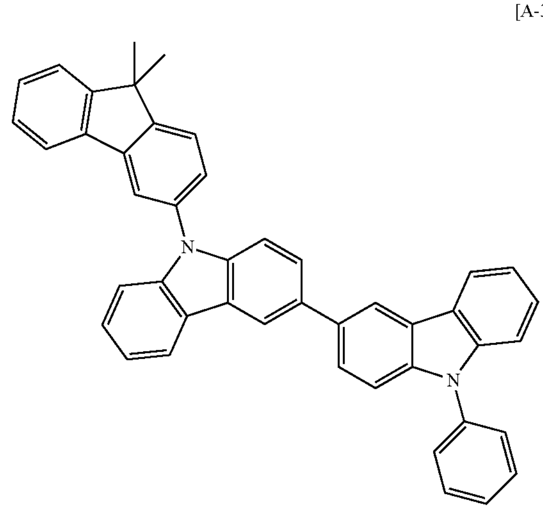
[A-35]
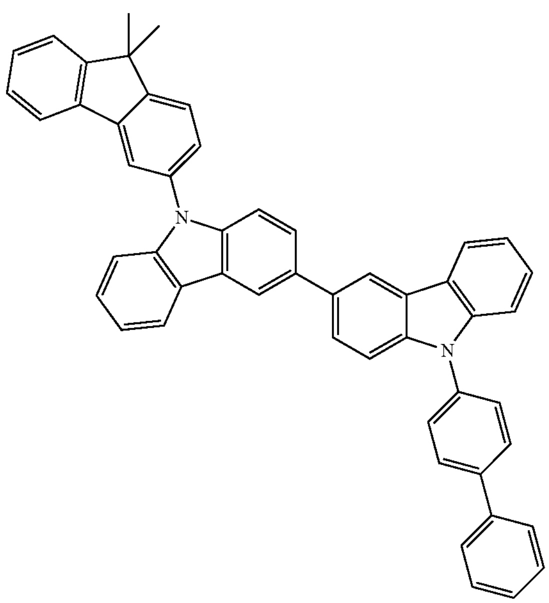
[A-36]
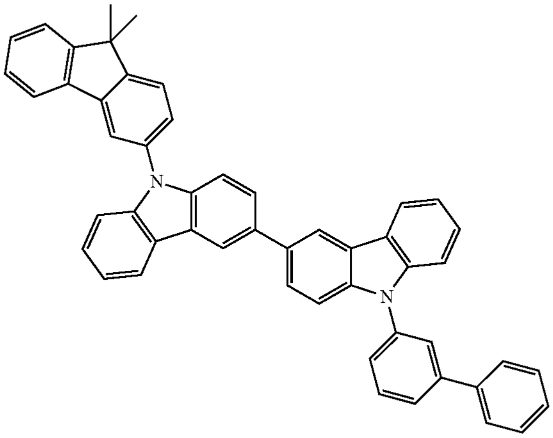

-continued
[A-37]
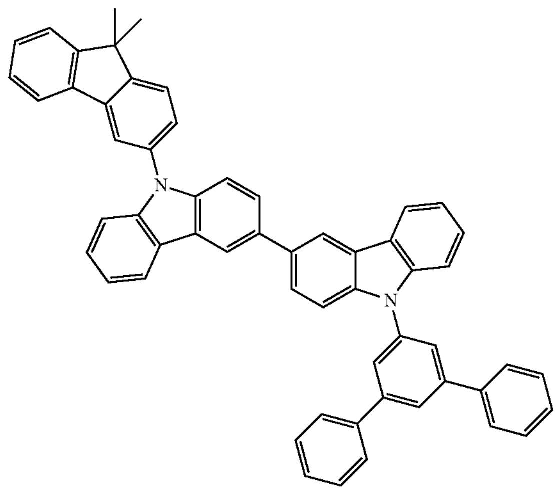
[A-38]
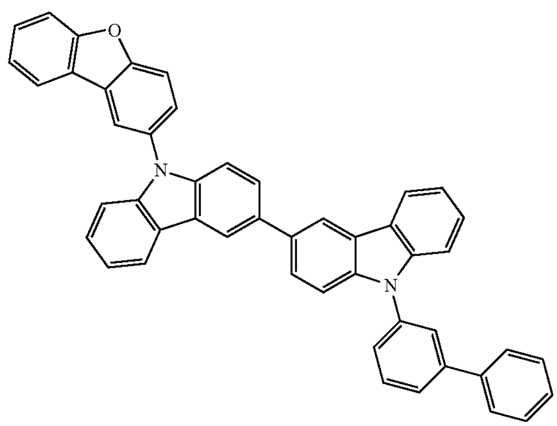
[A-39]
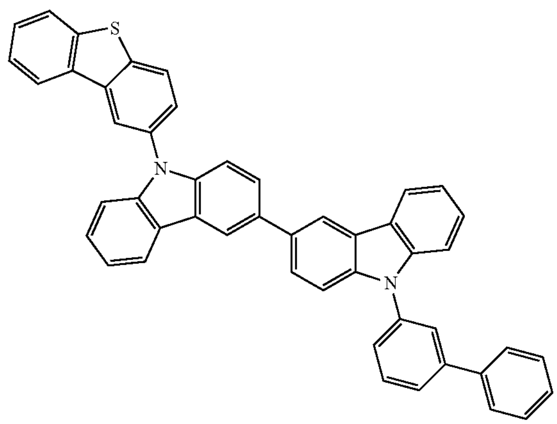
-continued
[A-40]
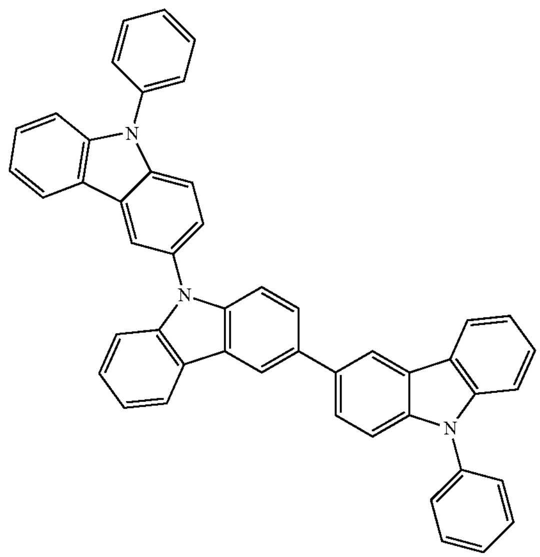
[A-41]
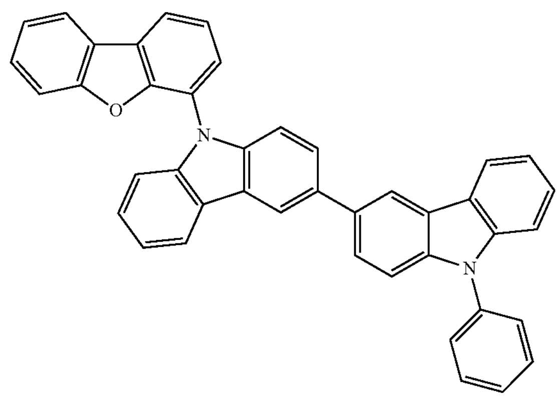
[A-42]
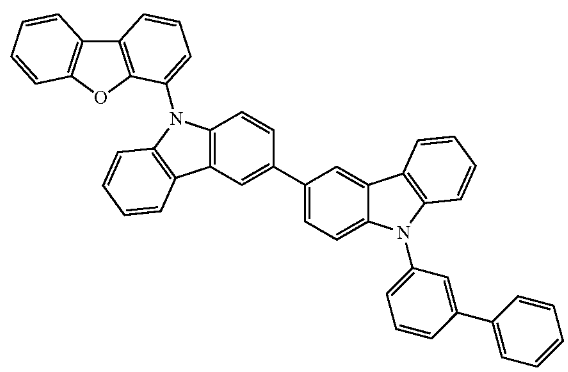

-continued
[A-43]
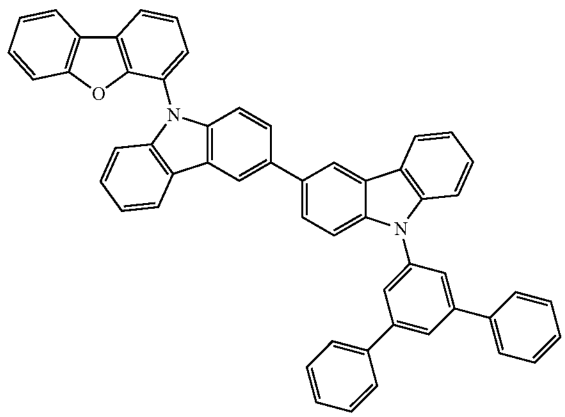
[A-44]
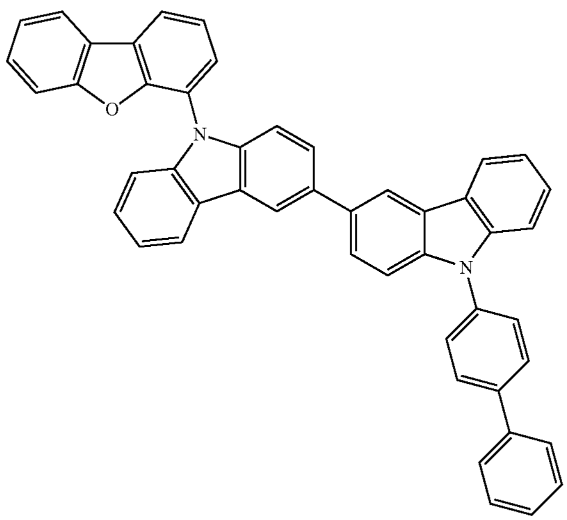
[A-45]
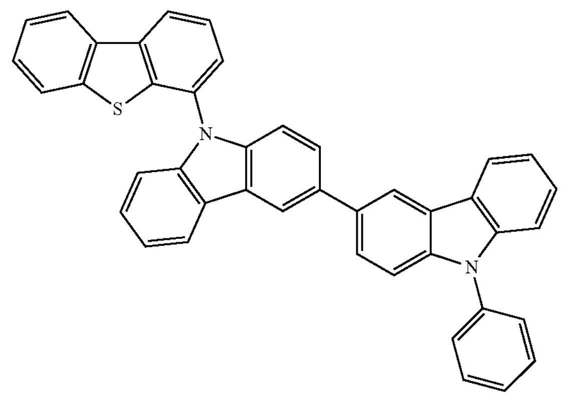
-continued
[A-46]
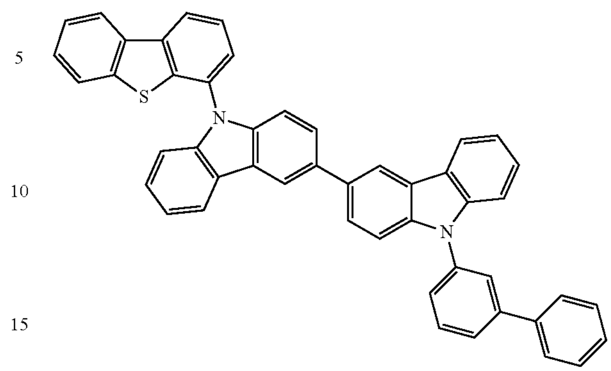
[A-47]
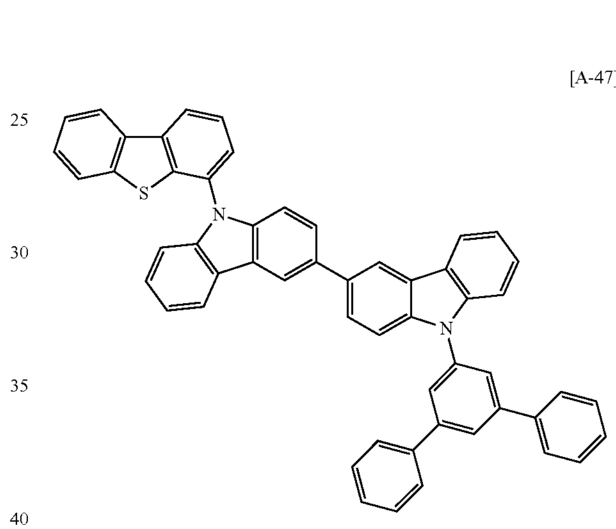
[A-48]
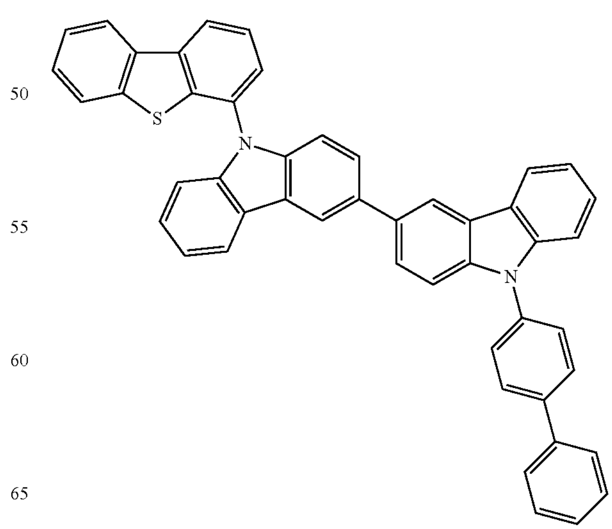

[A-49]
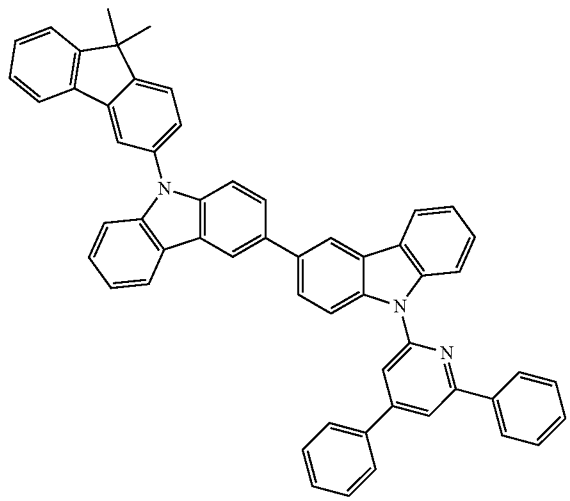
[A-50]
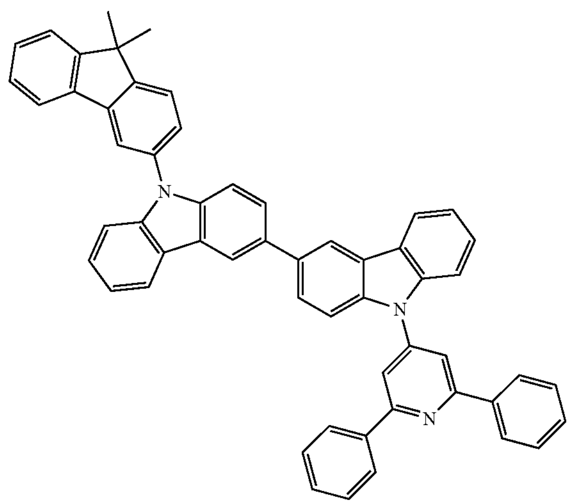
[A-51]
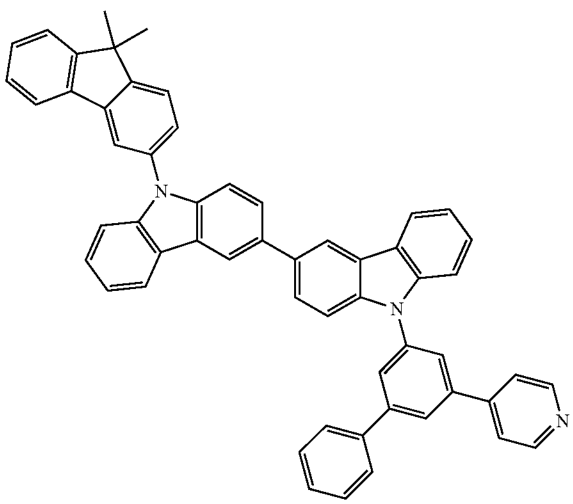
[A-52]
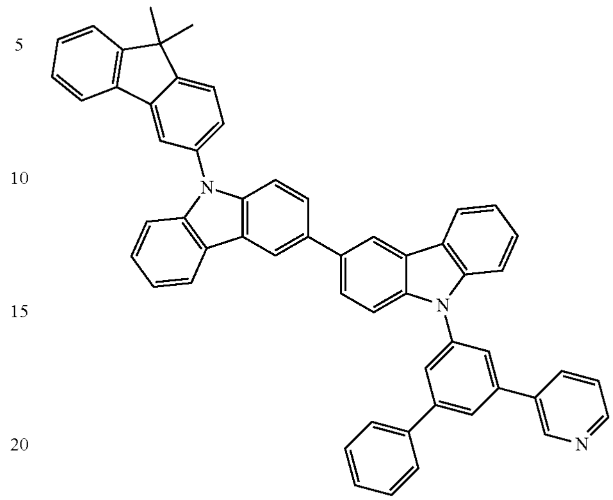
[A-53]
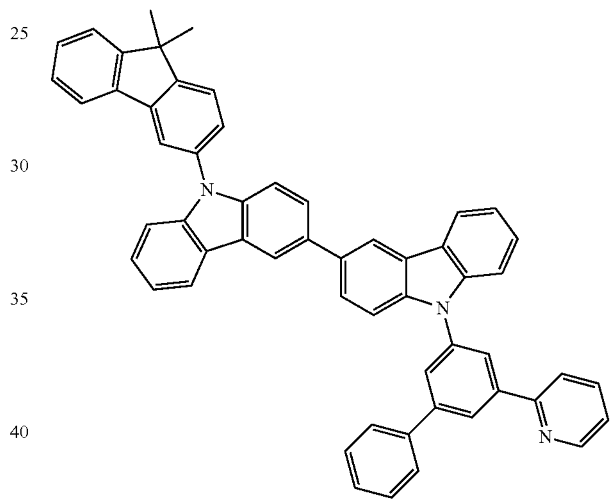
[A-54]
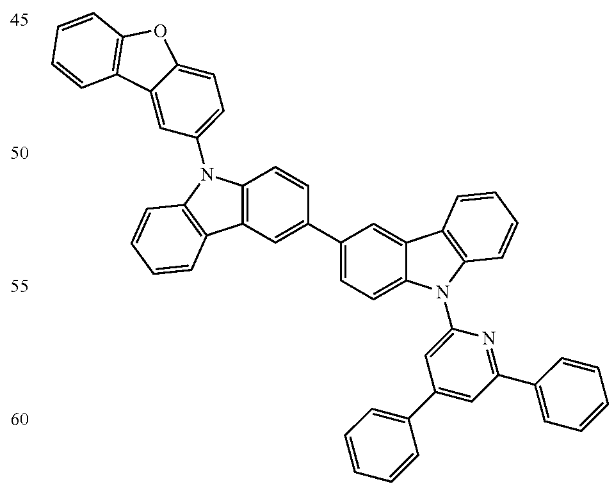

-continued
[A-55]
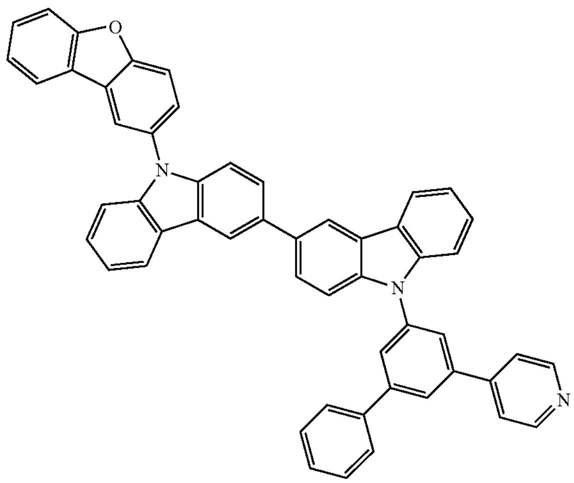
[A-56]
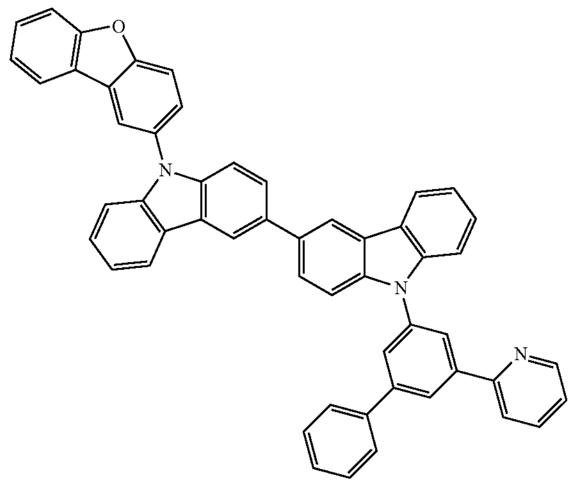
[A-57]
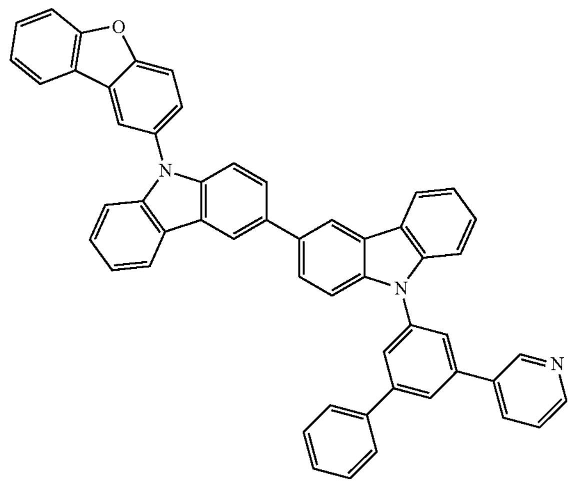
[A-58]
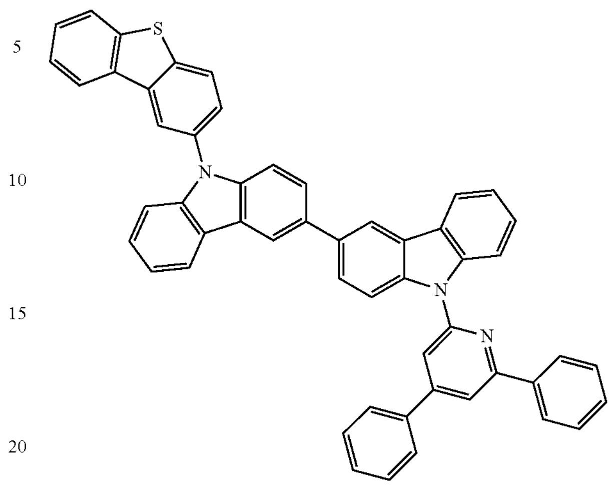
[A-59]
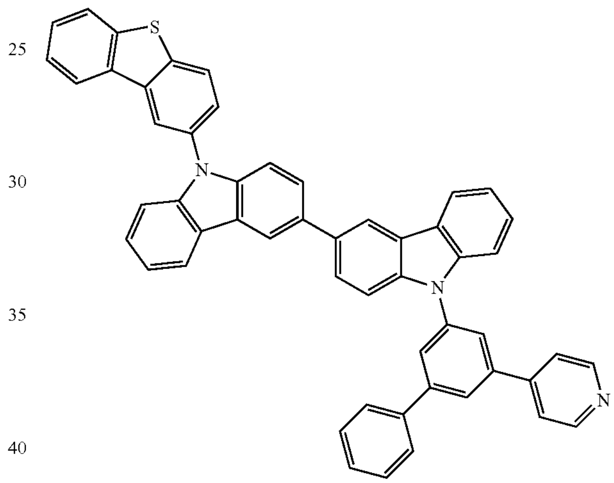
[A-60]
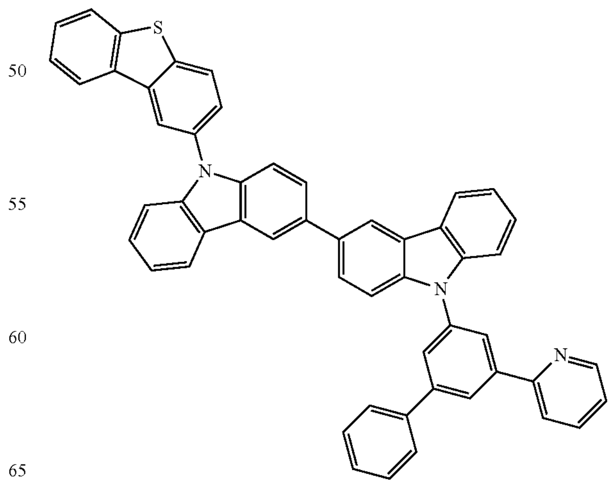

-continued
[A-61]
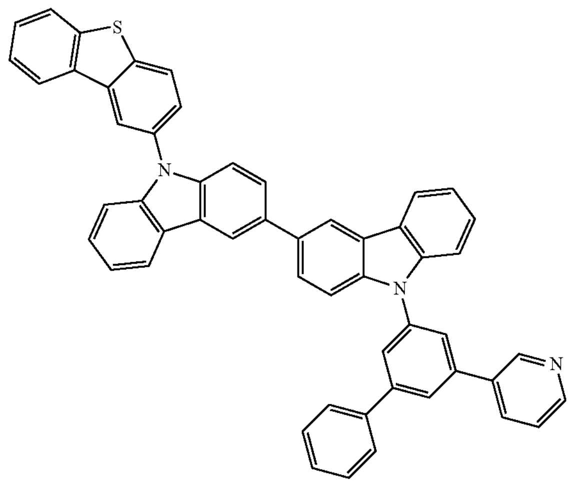
[A-62]
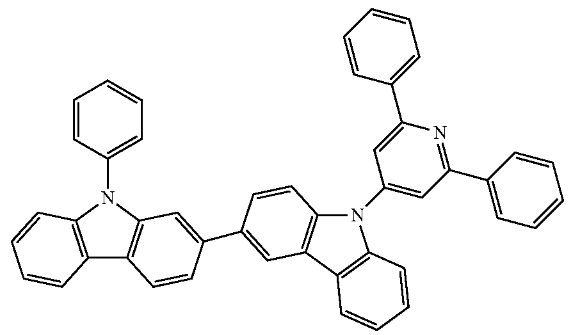
[A-63]
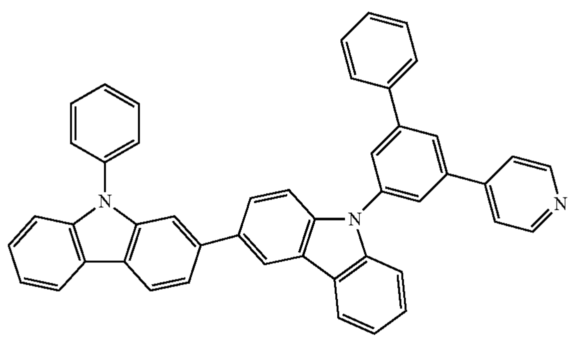
[A-64]
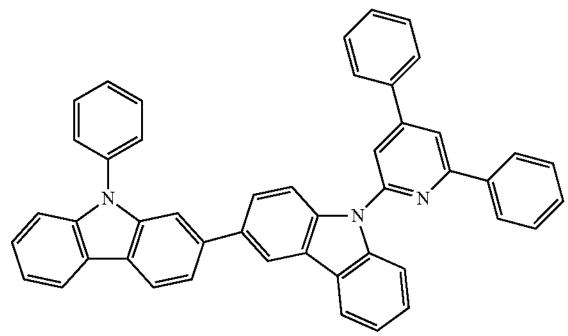
-continued
[A-65]
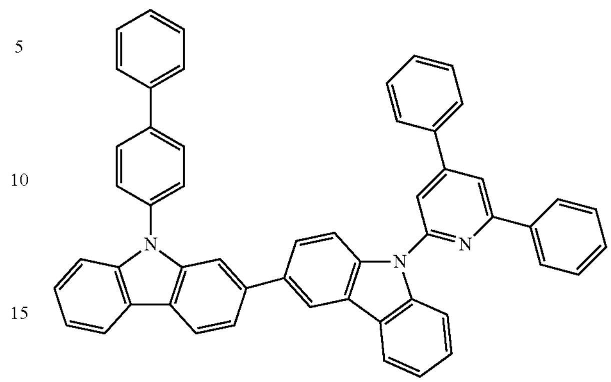
[A-66]
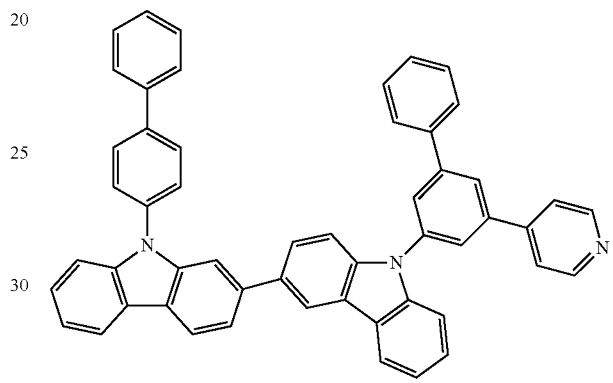
[A-67]
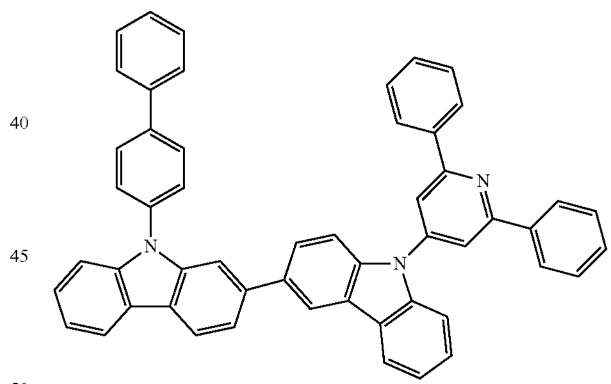
[A-68]
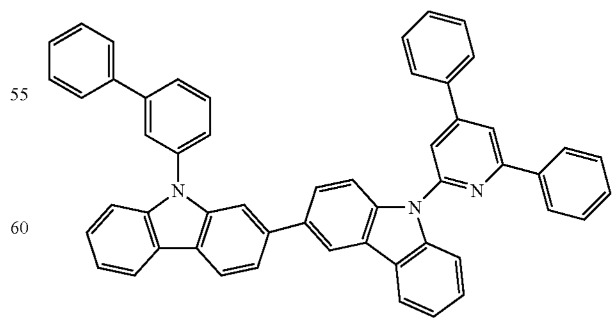

-continued
[A-69]
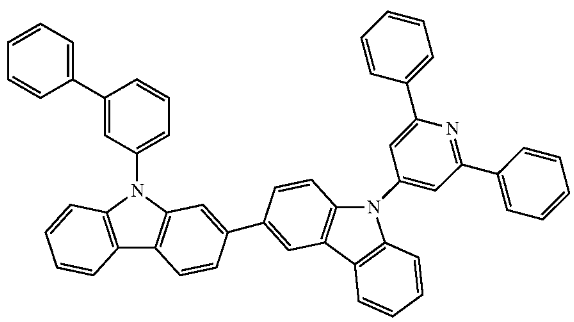
[A-70]
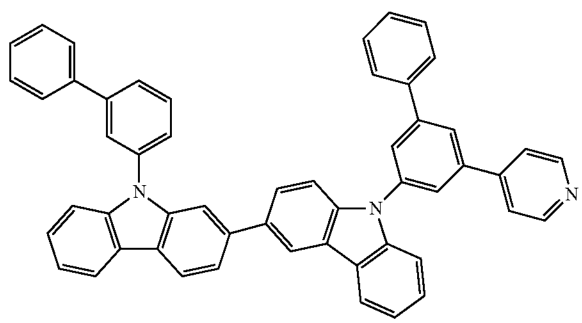
[A-71]
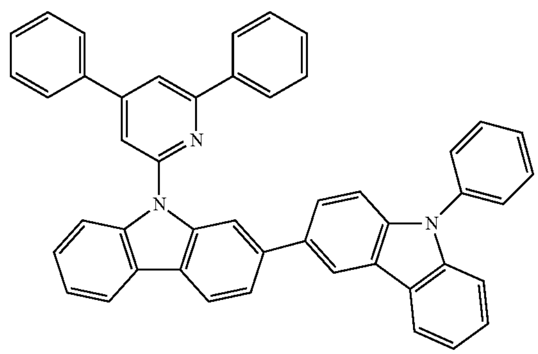
[A-72]
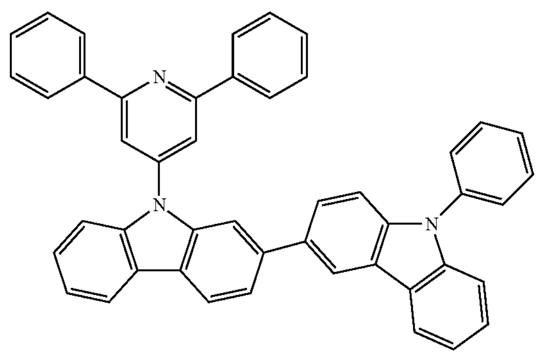
-continued
[A-73]
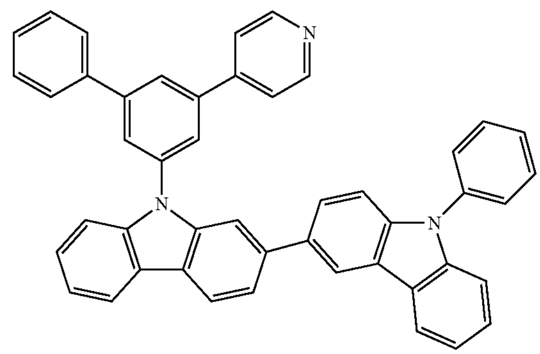
[A-74]
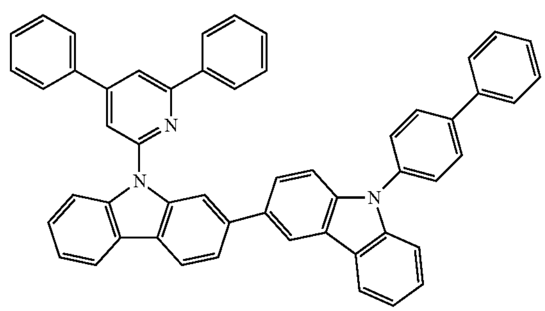
[A-75]
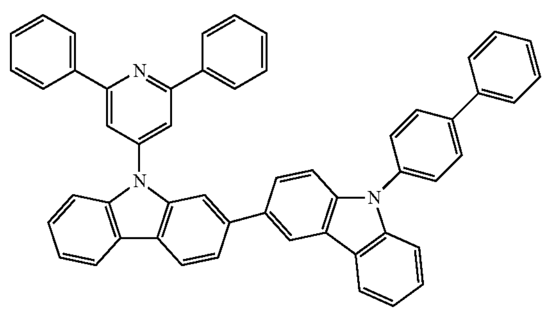
[A-76]
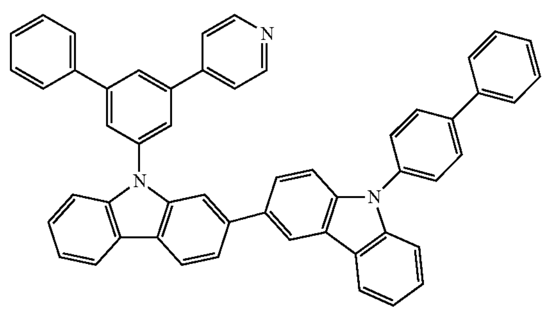

-continued
[A-77]
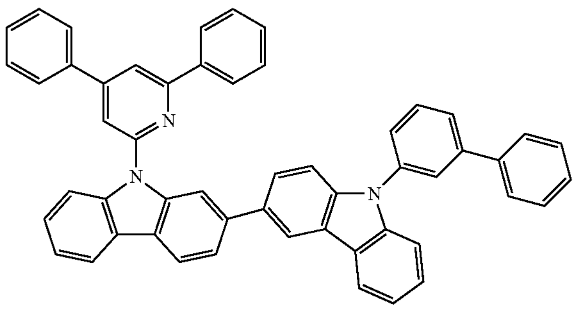
[A-78]
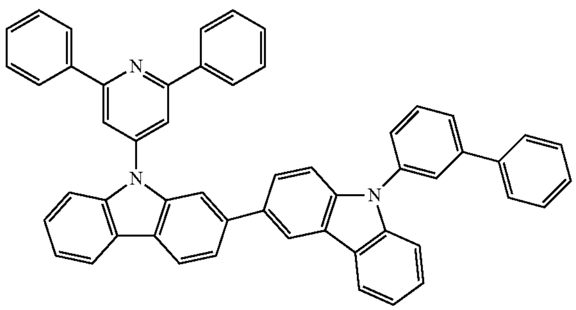
[A-79]
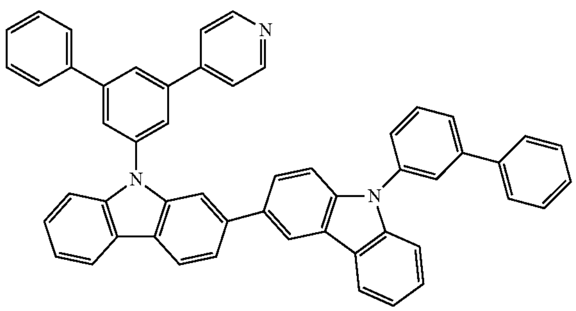
[A-80]
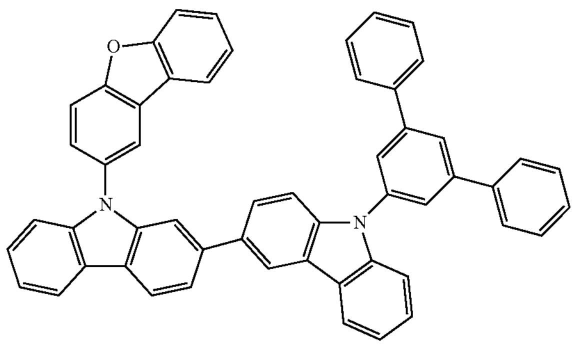
-continued
[A-81]
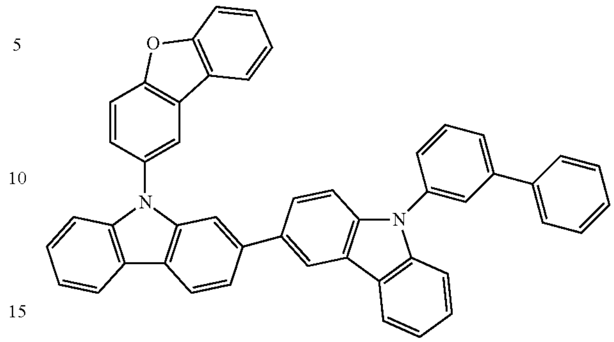
[A-82]
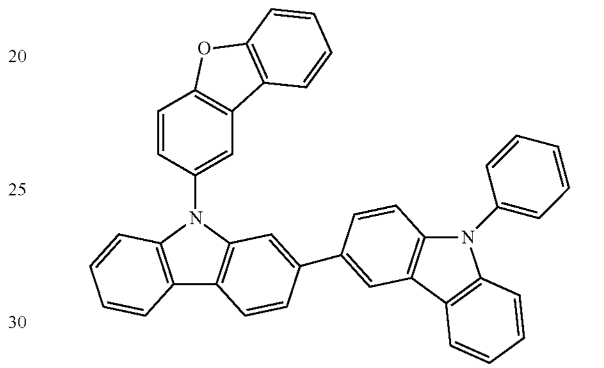
[A-83]
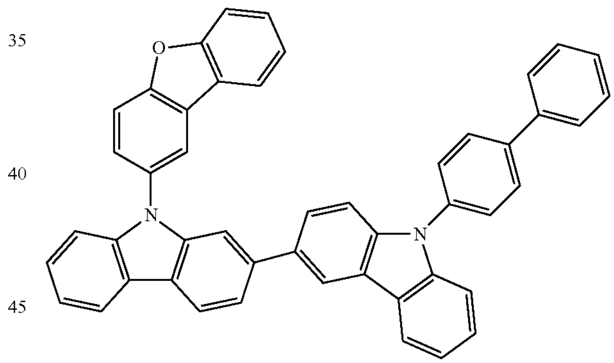
[A-84]
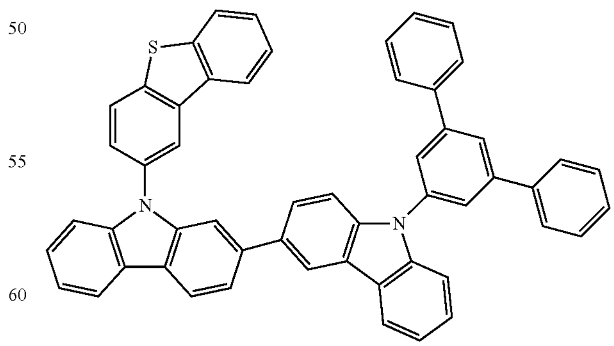

-continued
[A-85]
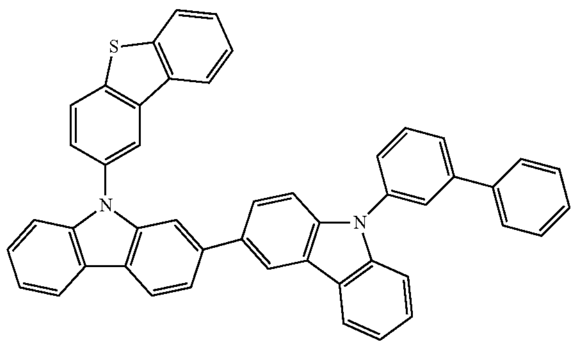
[A-86]
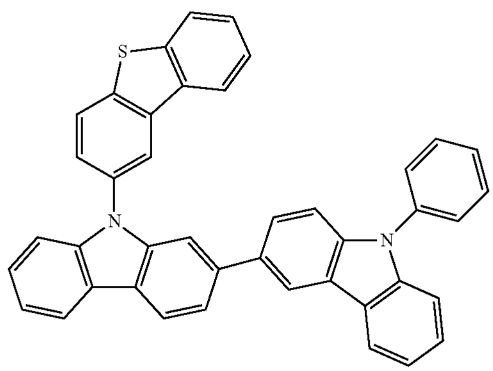
[A-87]
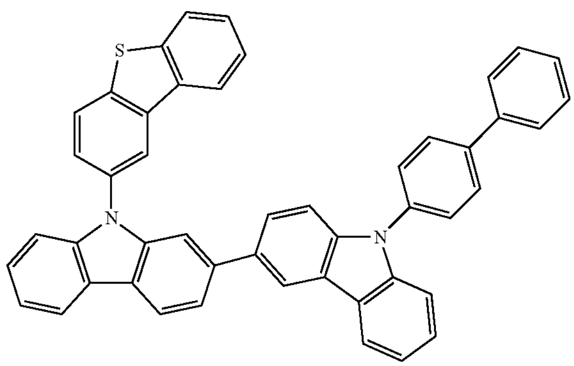
[A-88]
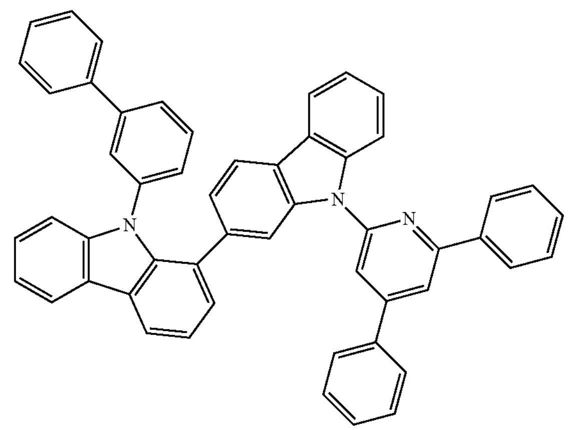
-continued
[A-89]
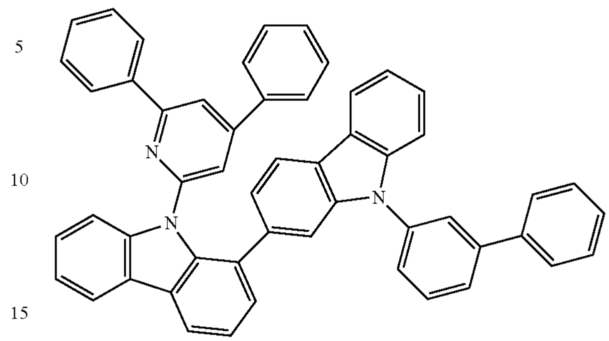
[A-90]
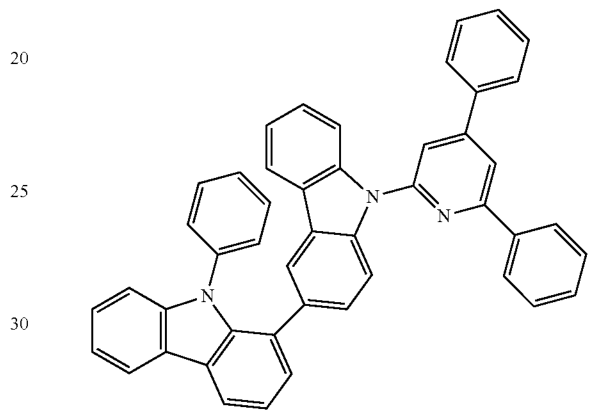
[A-91]
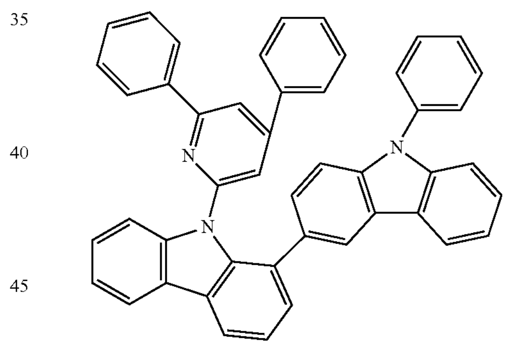
[A-92]
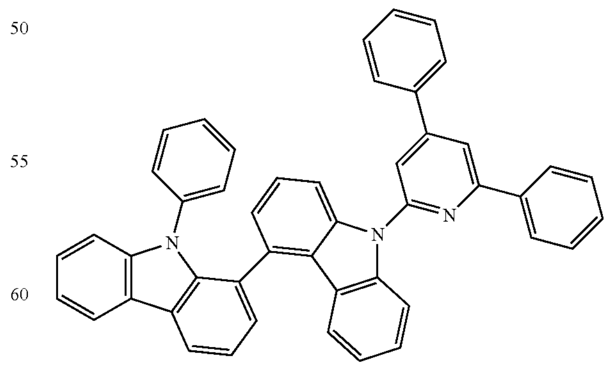

-continued
[A-93]
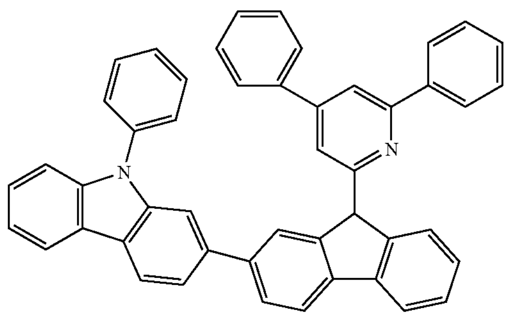
[A-94]
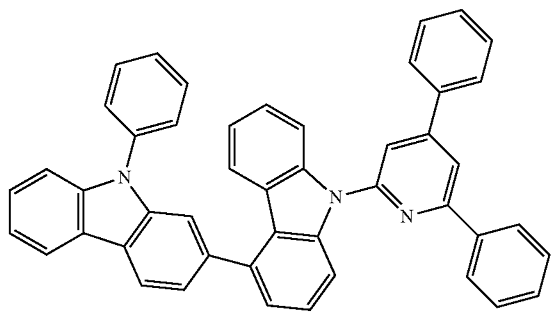
[A-95]
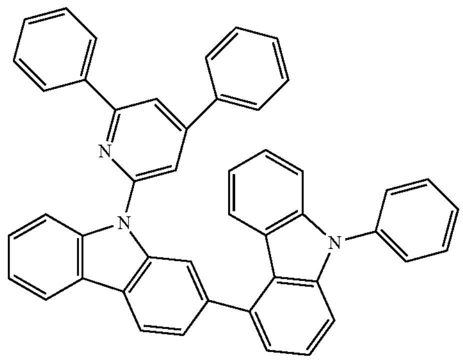
[A-96]
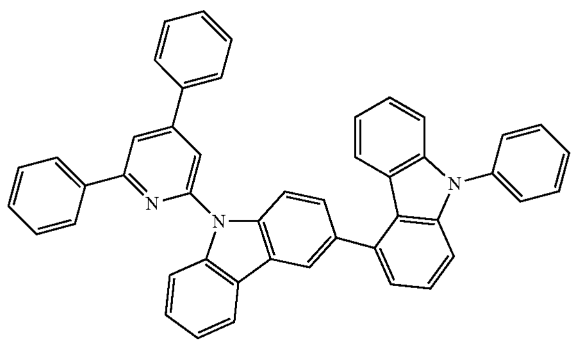
-continued
[A-97]
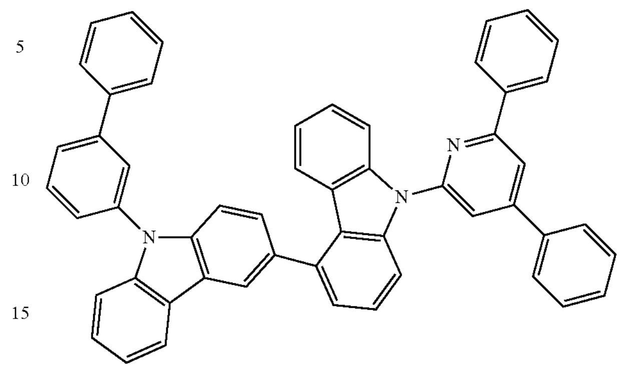
[A-98]
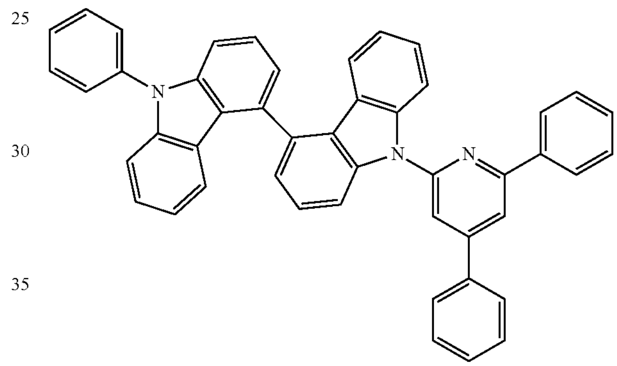
[A-99]
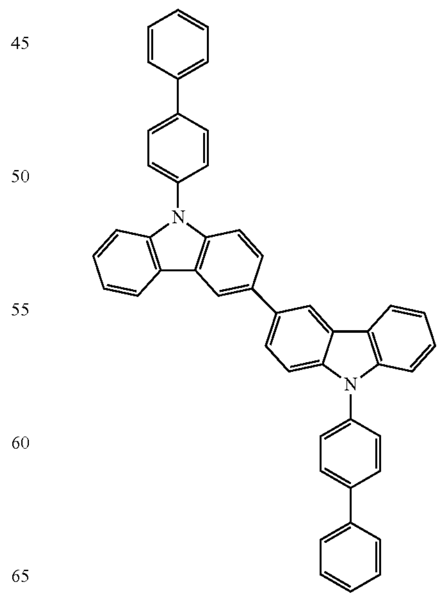

-continued
[A-100]
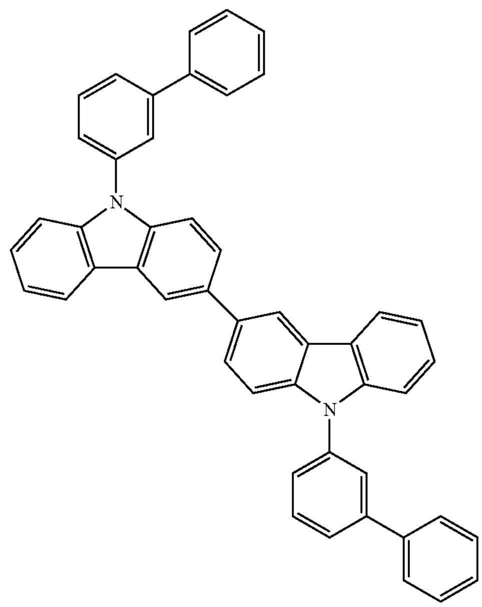
[A-101]
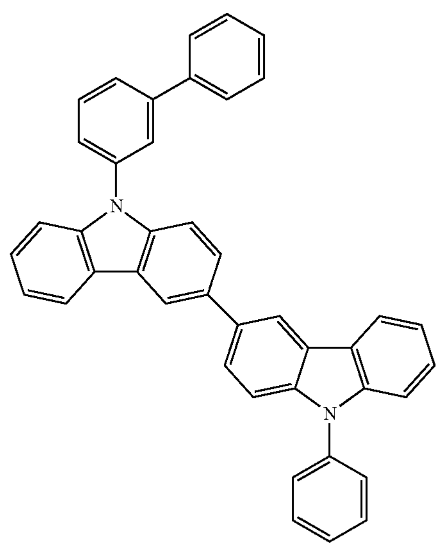
[A-102]
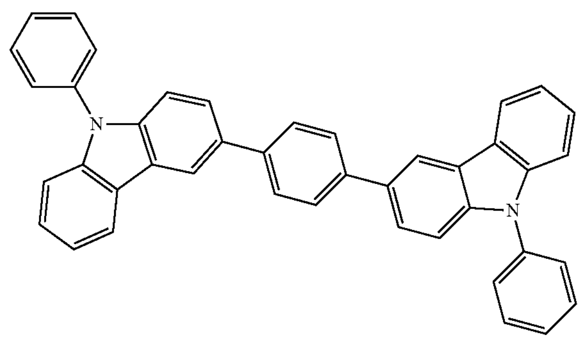
-continued
[A-103]
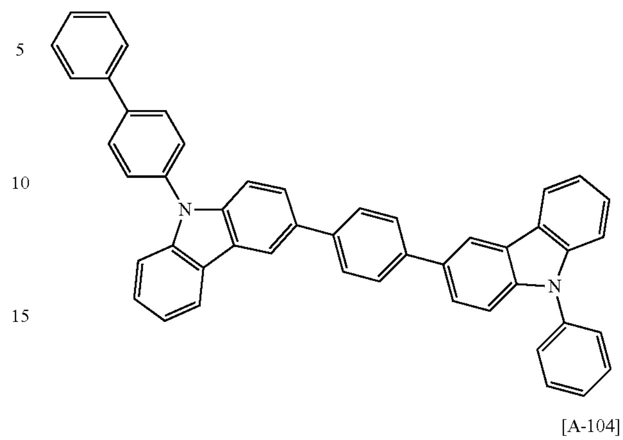
[A-104]
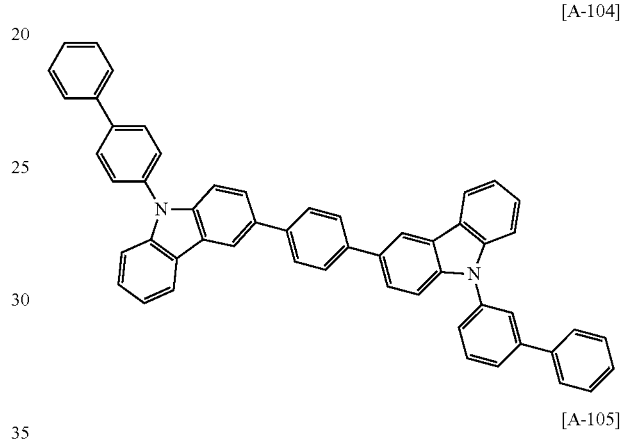
[A-105]
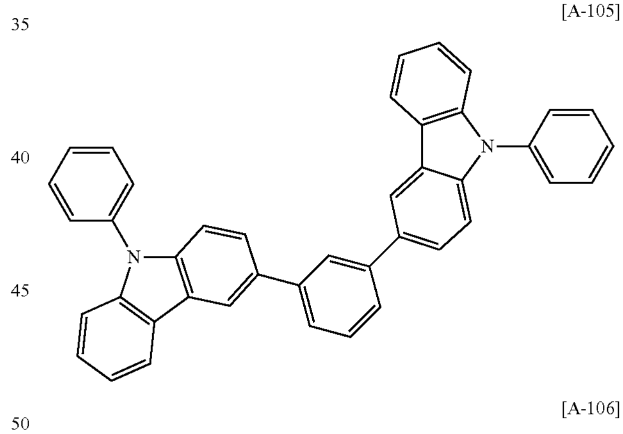
[A-106]
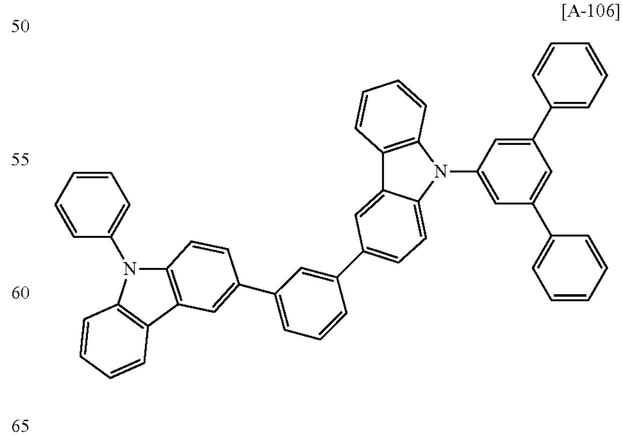

-continued
[A-107]
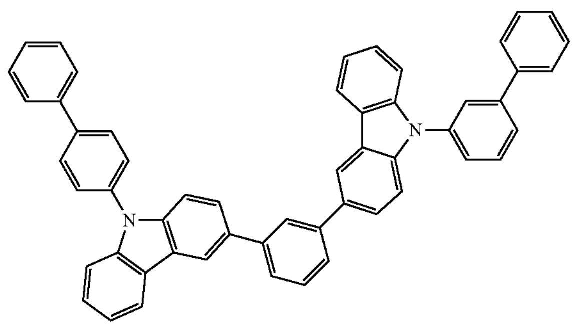
[A-108]
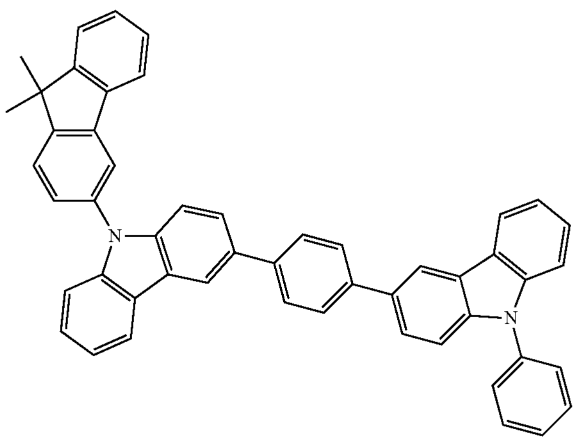
[A-109]
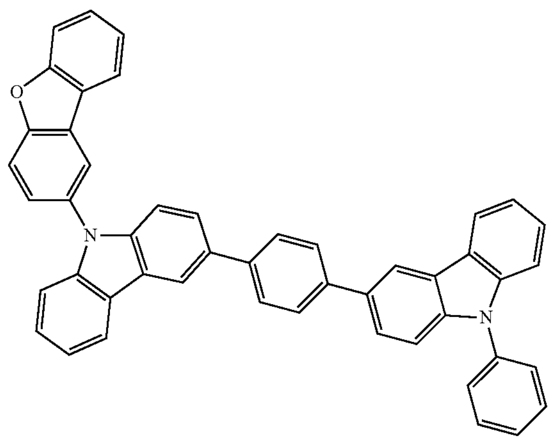
-continued
[A-110]
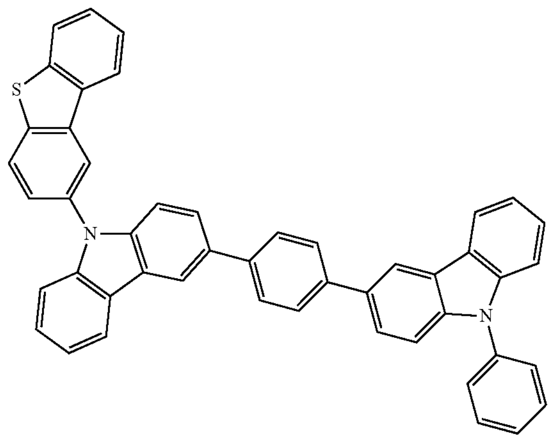
[A-111]
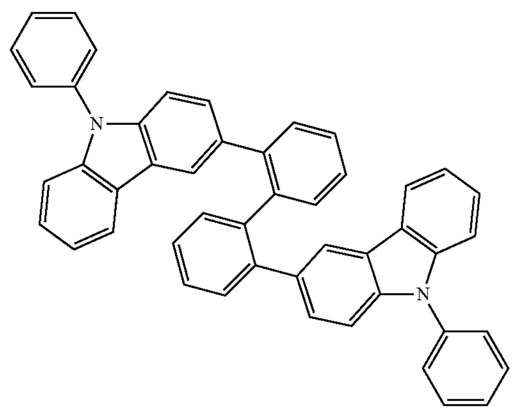
[A-112]
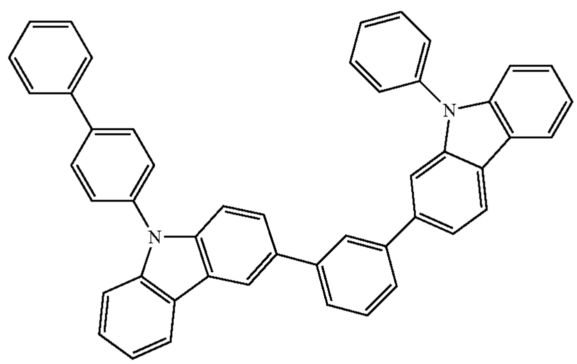

-continued
[A-113]
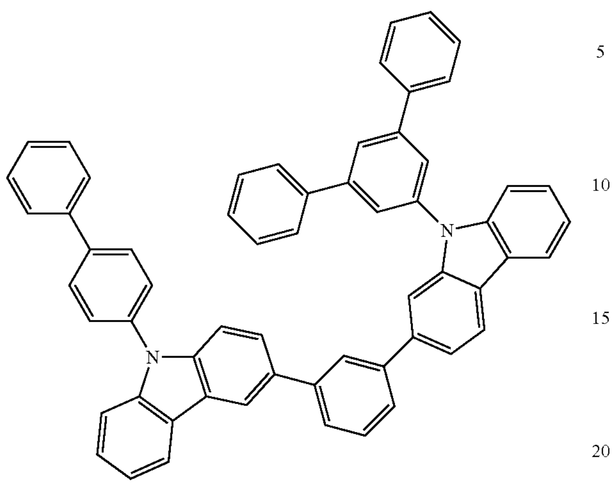
[A-114]
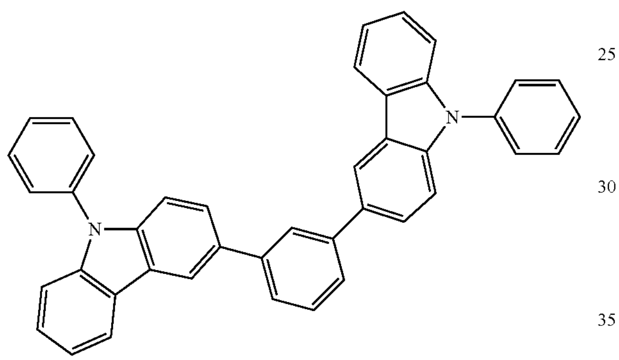
[A-115]
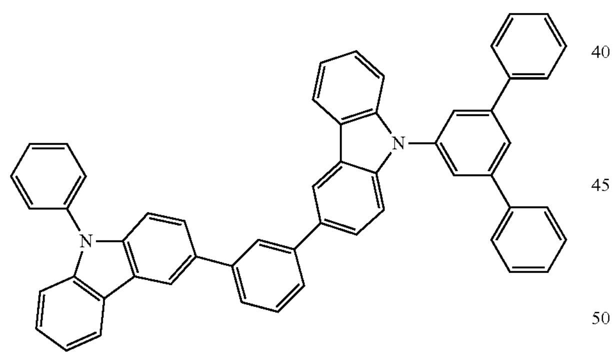
[A-116]
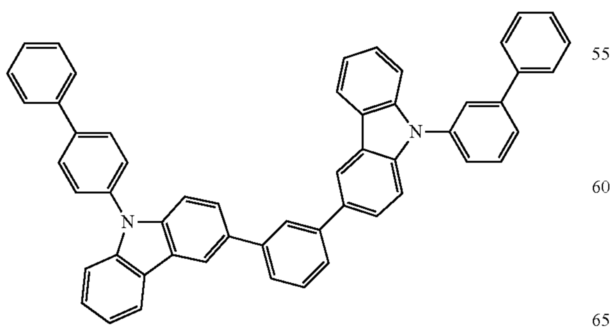
-continued
[A-117]
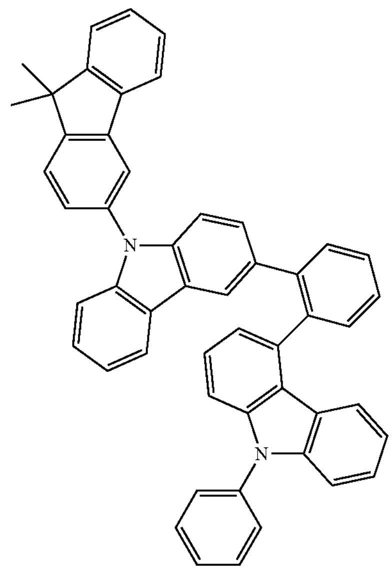
[A-118]
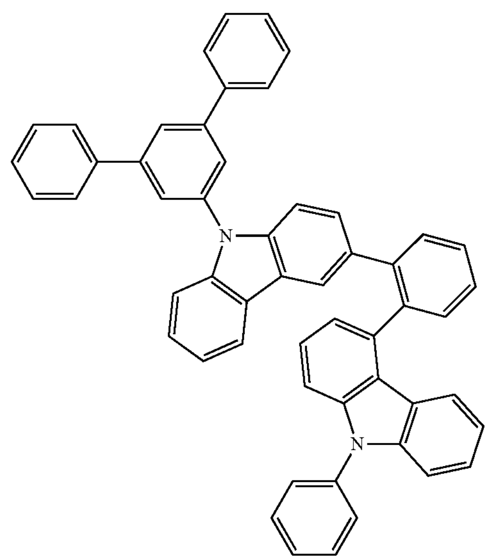

-continued
[A-119]
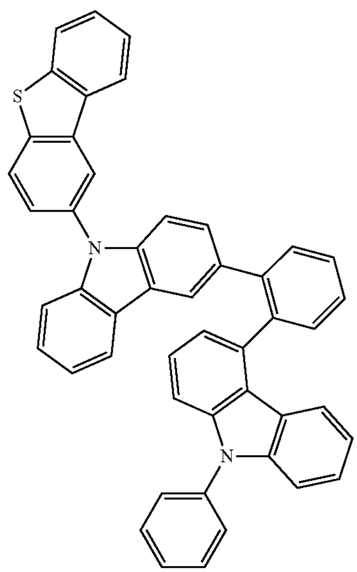
[A-120]
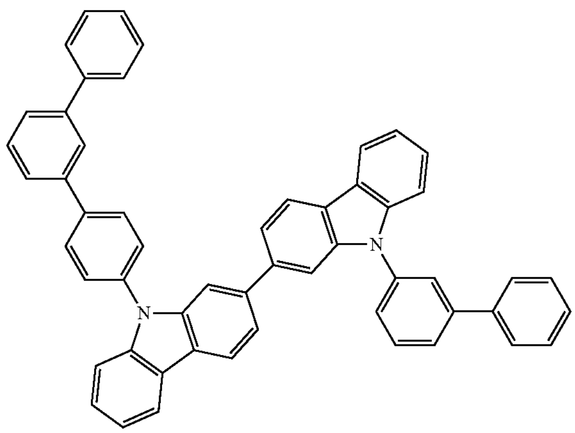
[A-121]
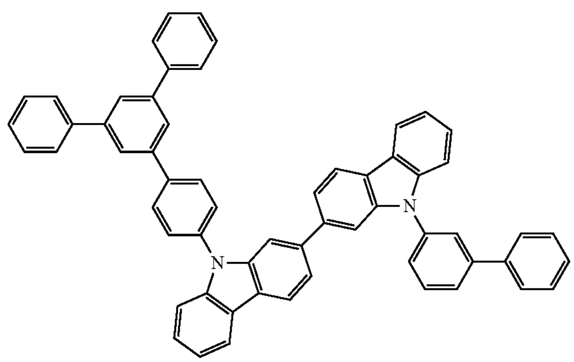
-continued
[A-122]
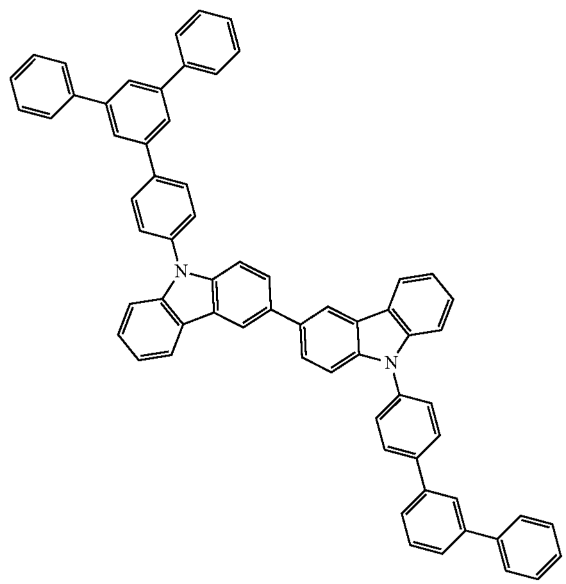
[A-123]
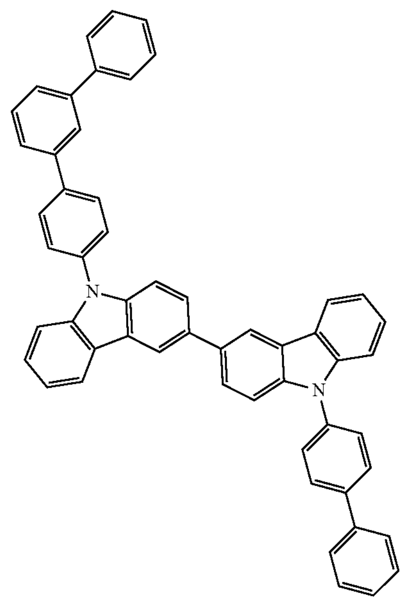

-continued
[A-124]
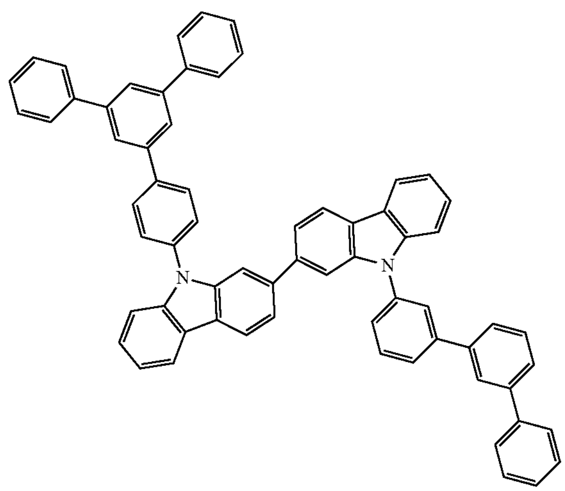
[A-125]
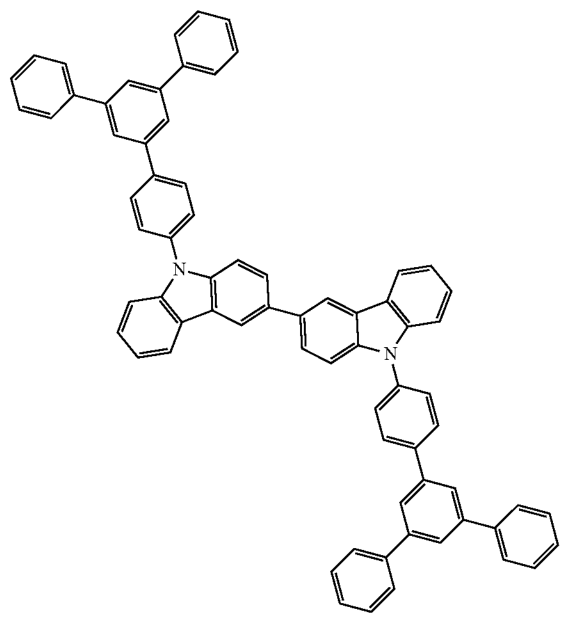
-continued
[A-126]
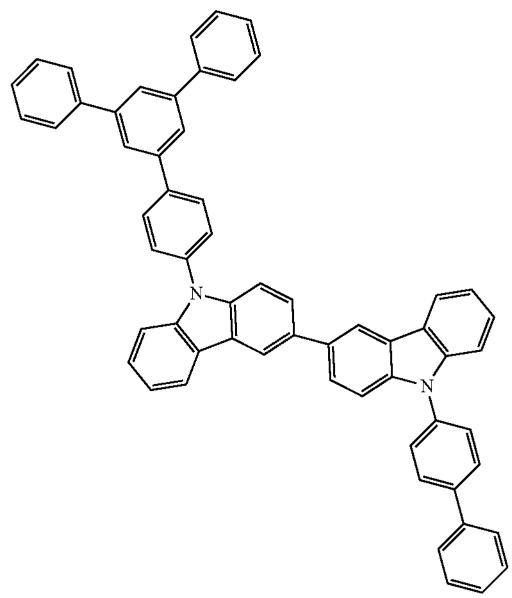
[A-127]
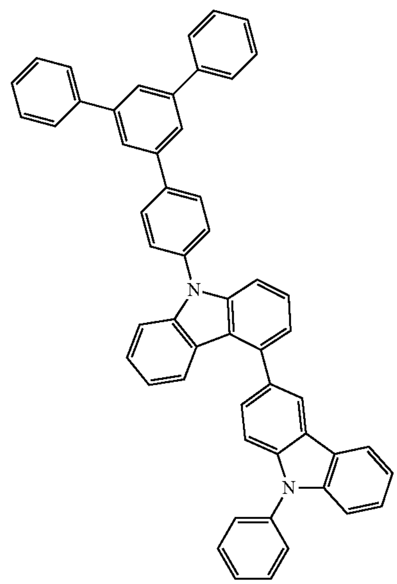

-continued
[A-128]
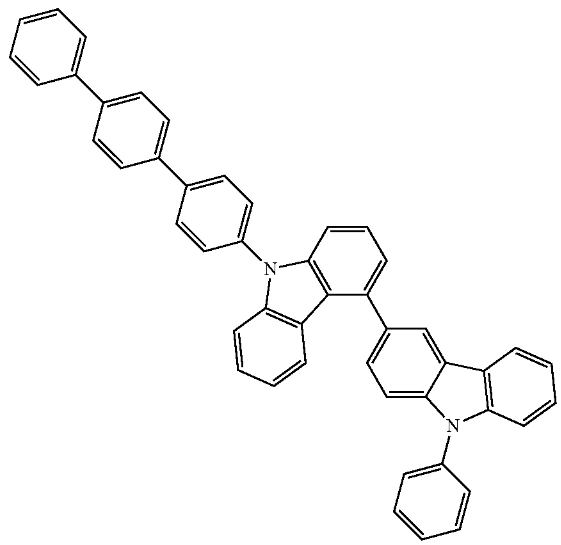
[A-129]
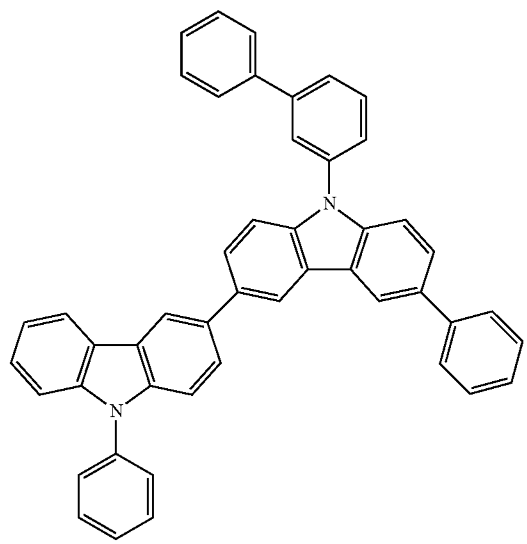
-continued
[A-130]
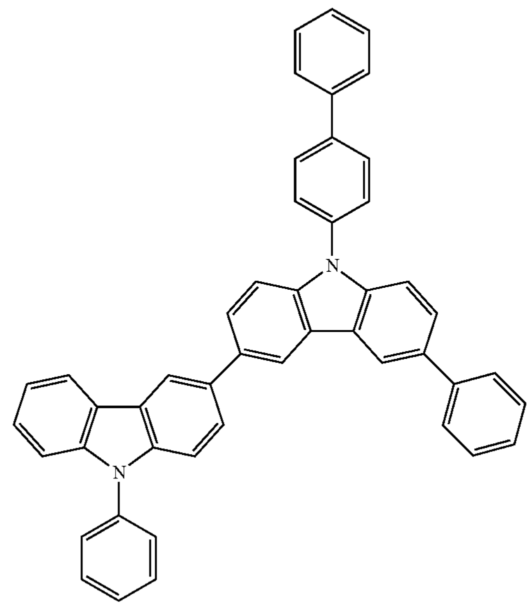
[A-131]
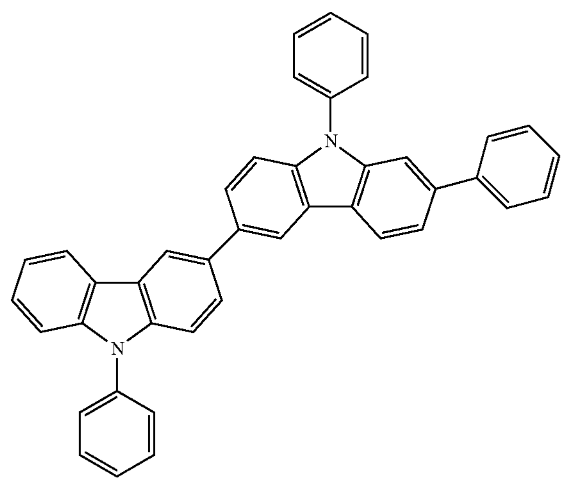
[A-132]
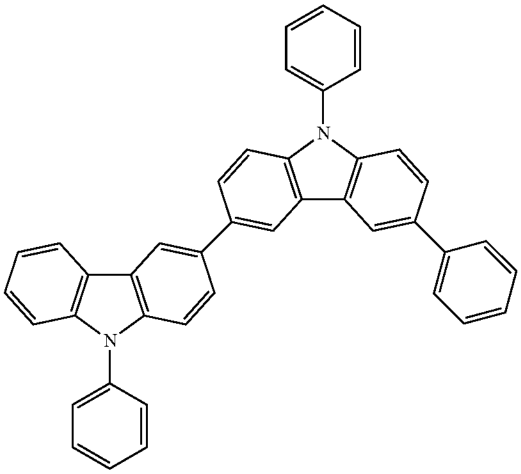

-continued
[A-133]
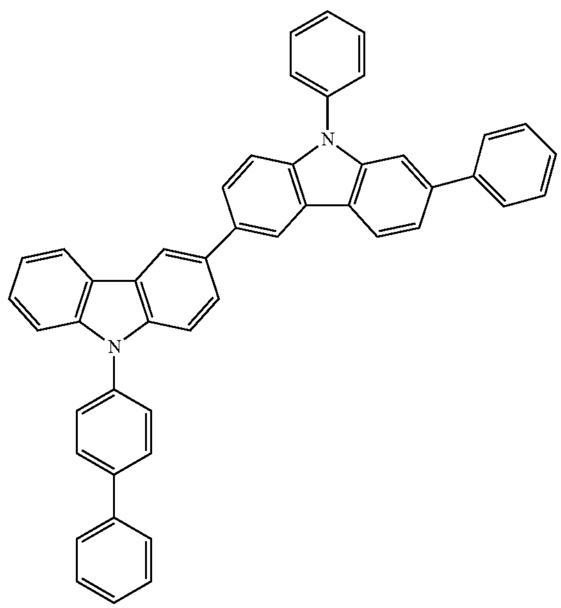
[A-134]
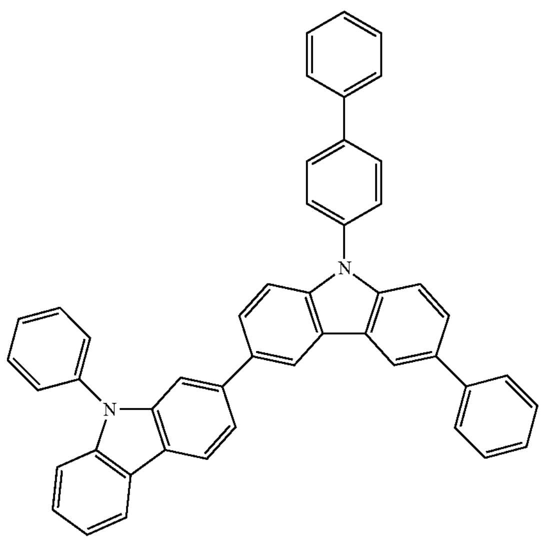
[A-135]
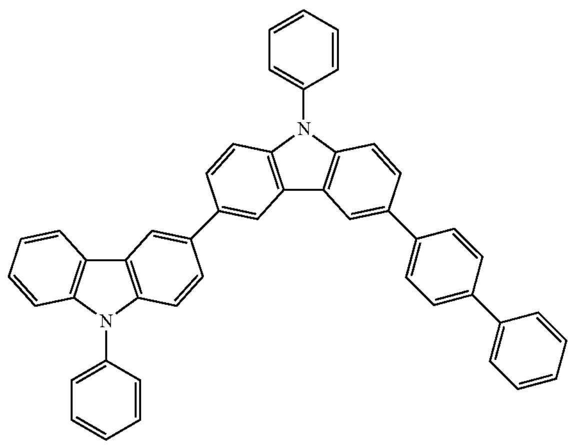
-continued
[A-136]
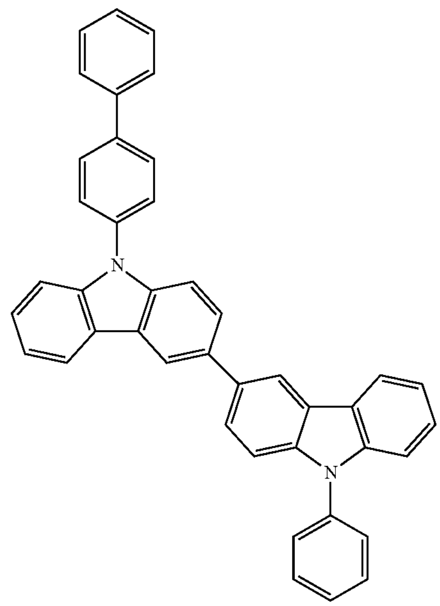
[A-137]
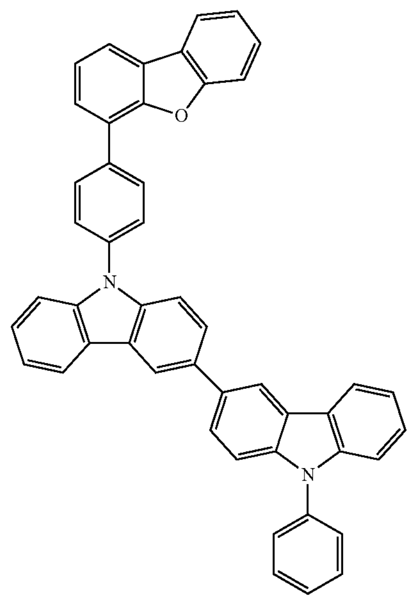

-continued
[A-138]
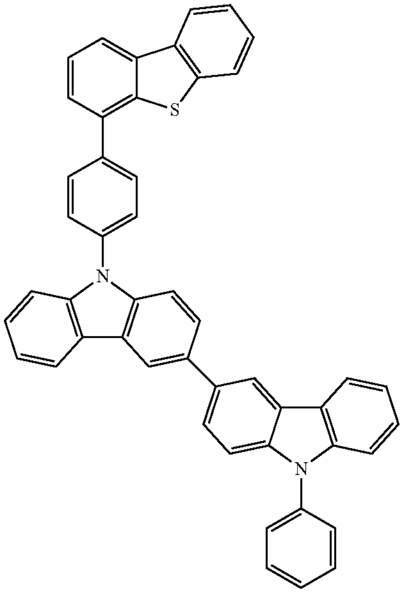
[B-1]
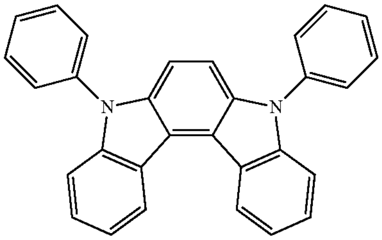
[B-2]
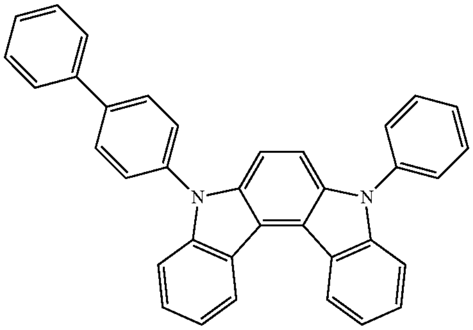
[B-3]
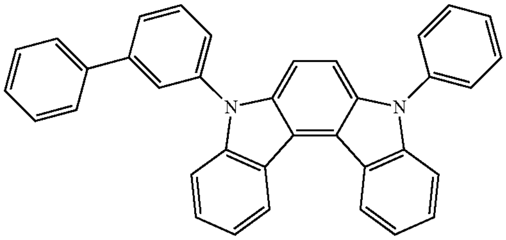
-continued
[B-4]
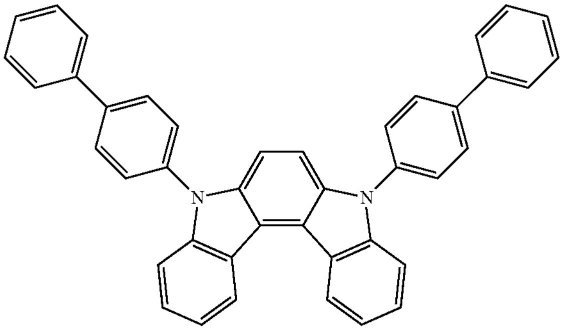
[B-5]
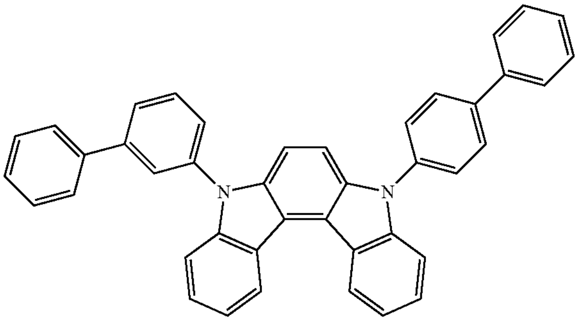
[B-6]
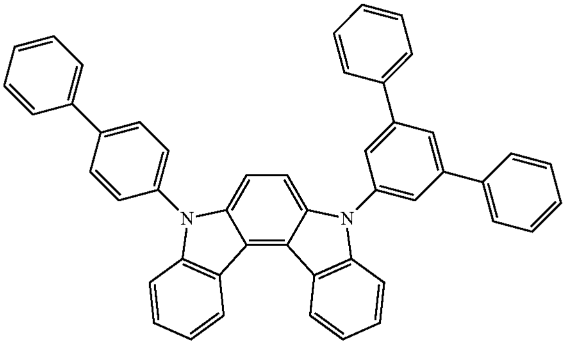
[B-7]
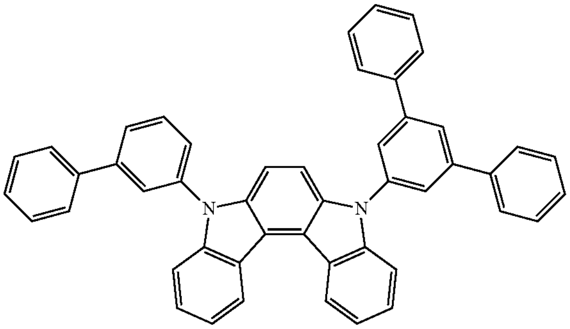

-continued
[B-8]
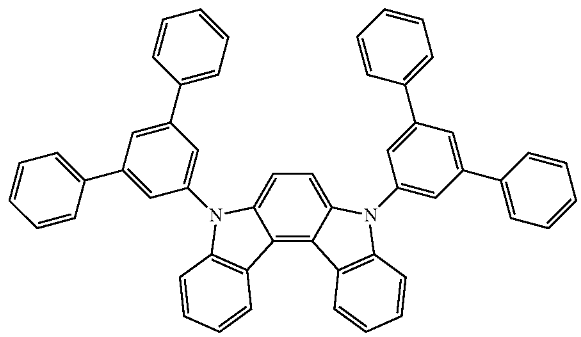
[B-9]
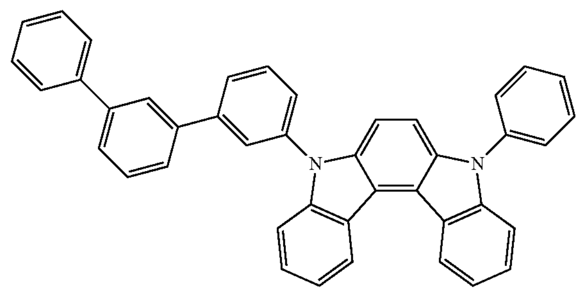
[B-10]
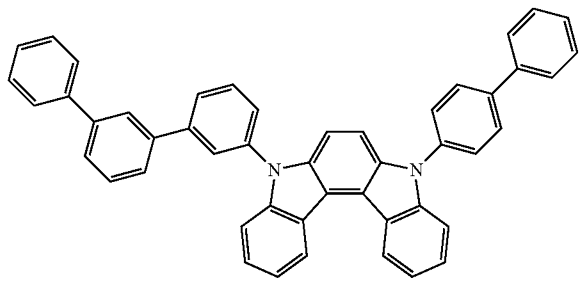
[B-11]
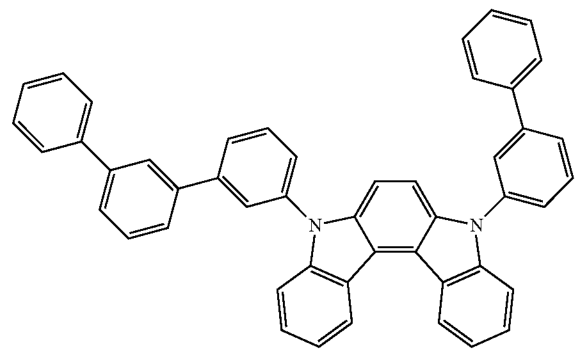
-continued
[B-12]
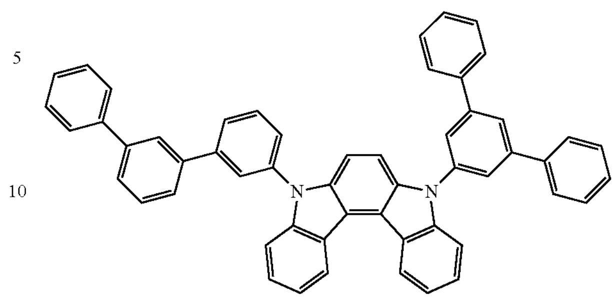
[B-13]
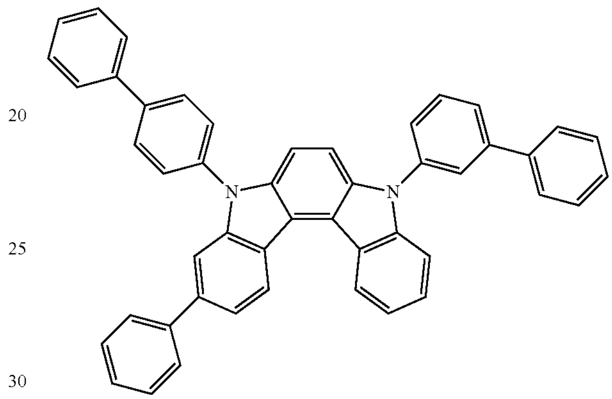
[B-14]
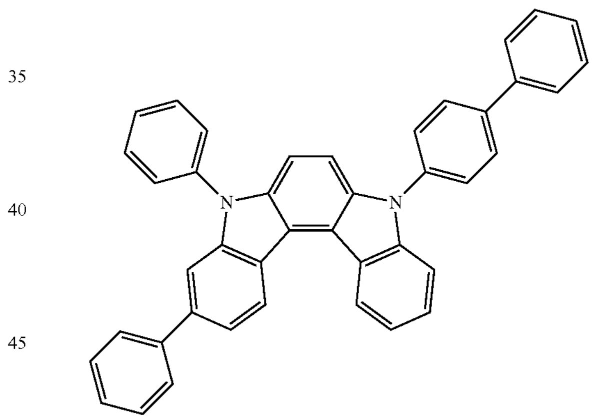
[B-15]
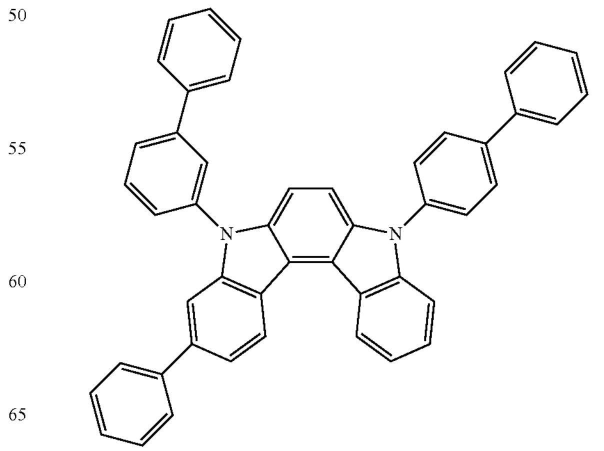

-continued
[B-16]
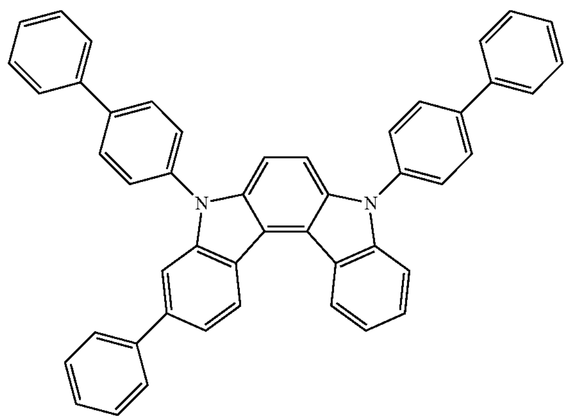
[B-17]
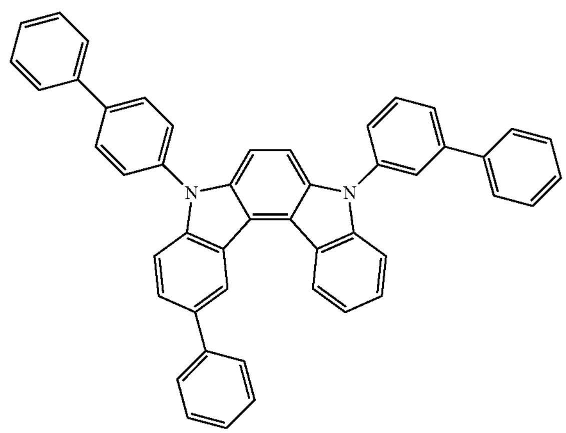
[B-18]
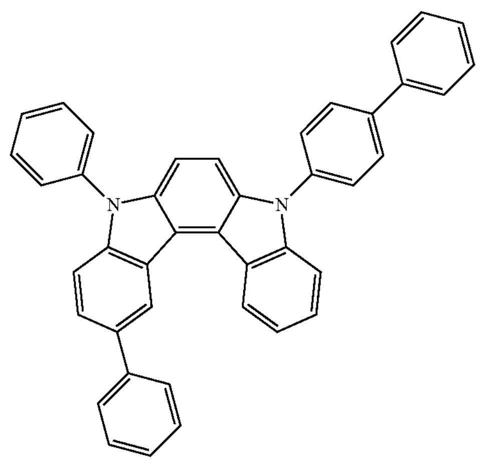
-continued
[B-19]
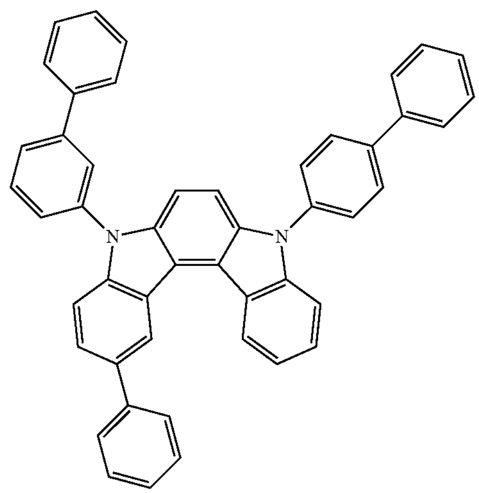
[B-20]
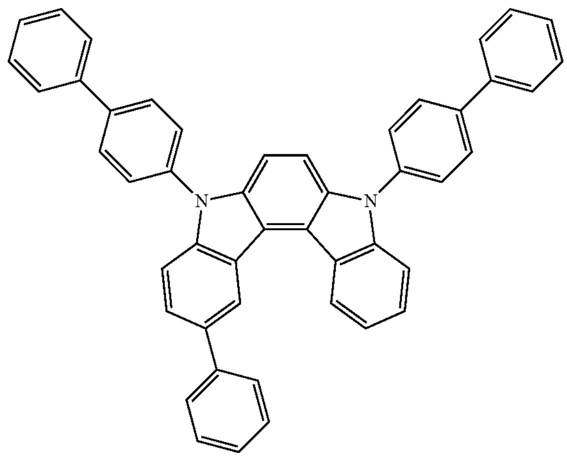
[B-21]
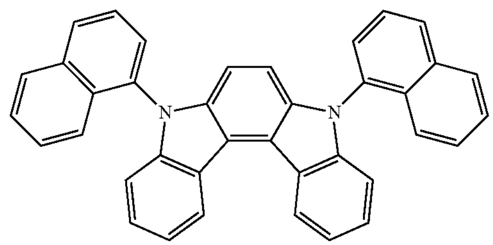
[B-22]
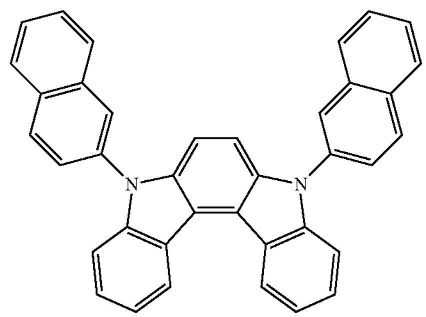

-continued
[B-23]
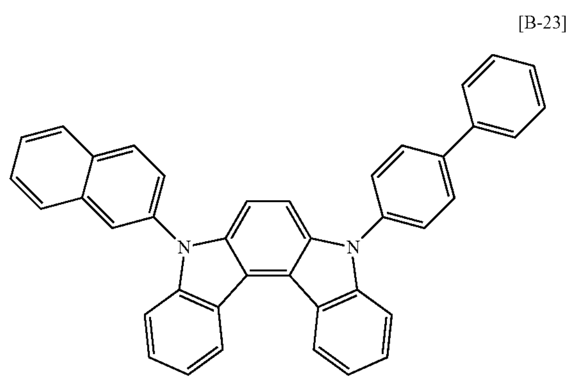
[B-24]
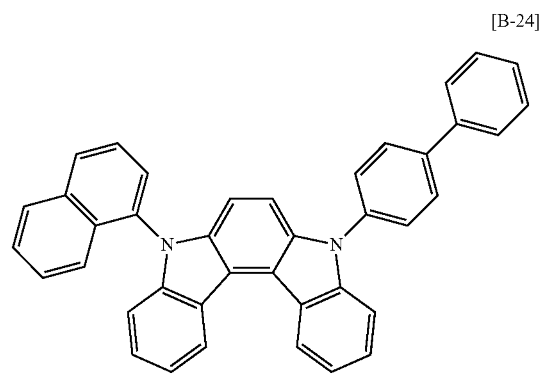
[B-25]
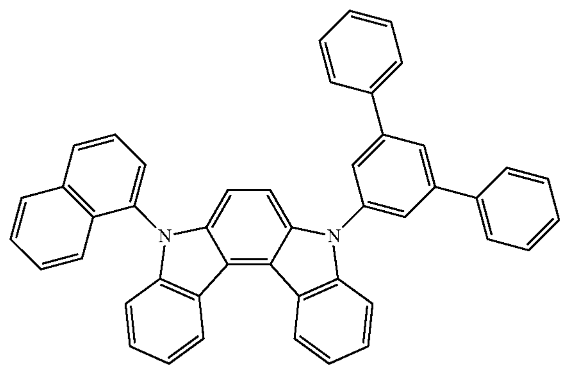
[B-26]
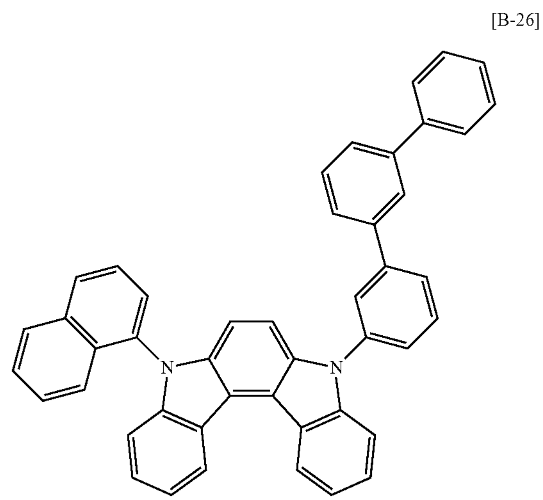
-continued
[B-27]
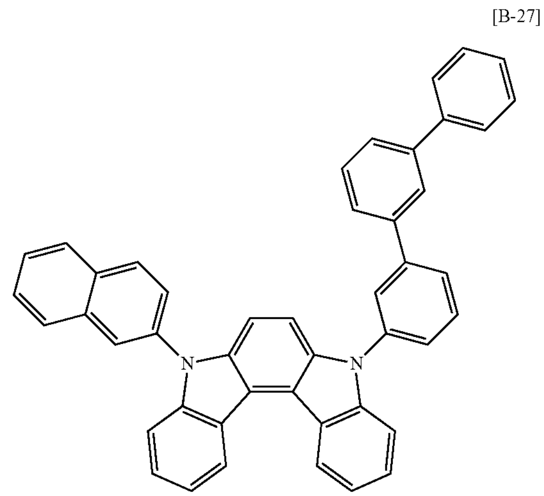
[B-28]
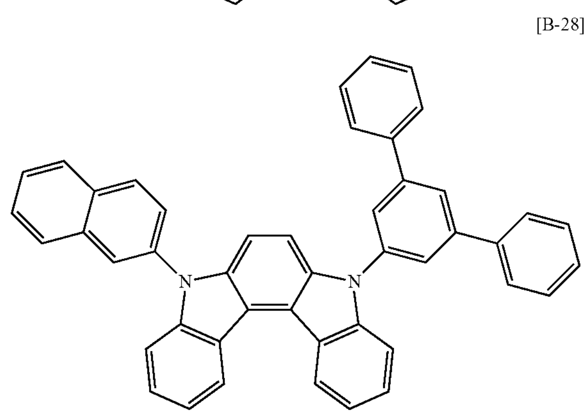
[B-29]
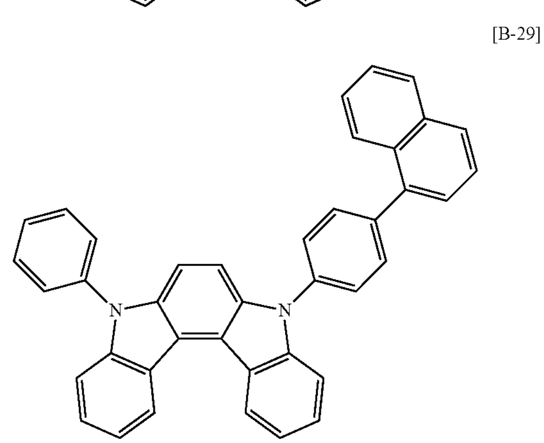
[B-30]
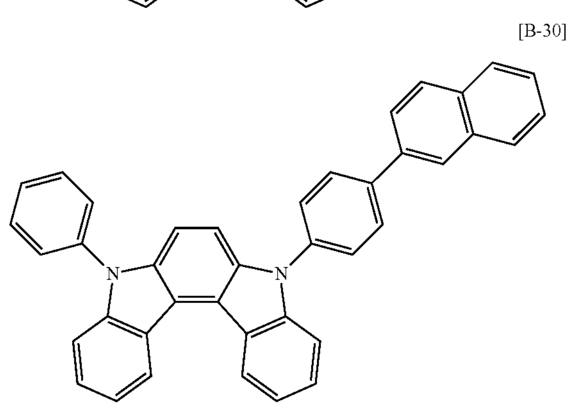

-continued
[B-31]
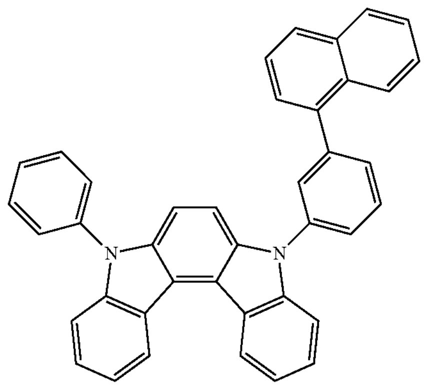
[B-32]
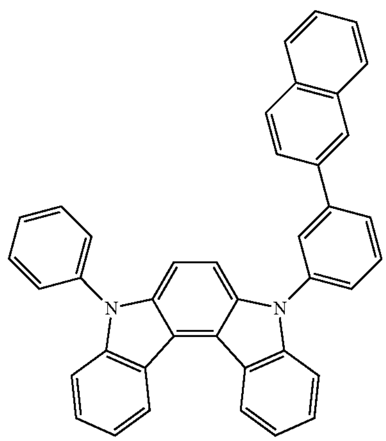
[B-33]
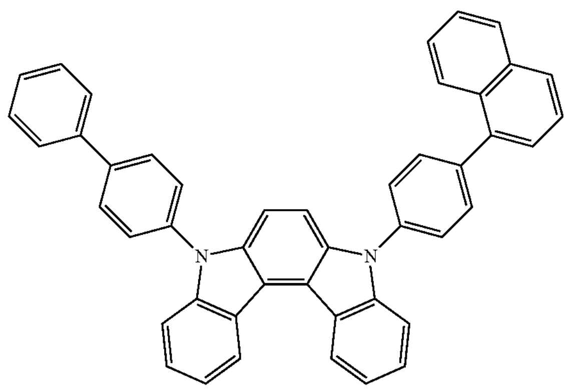
[B-34]
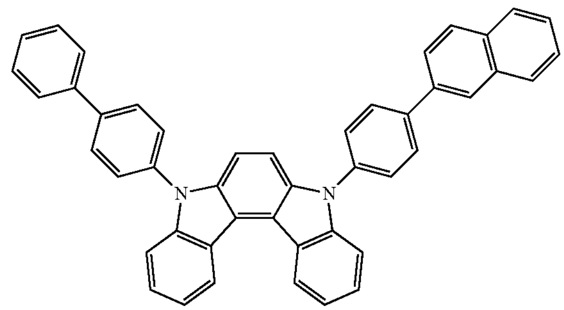
-continued
[B-35]
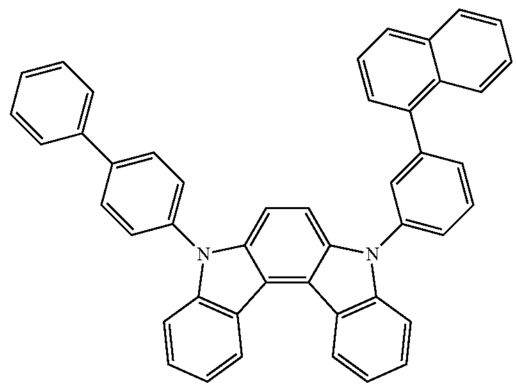
[B-36]
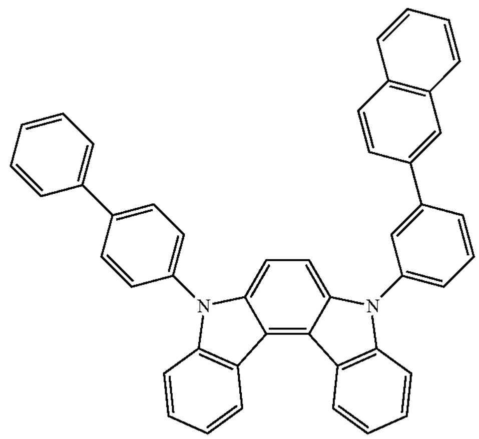
[B-37]
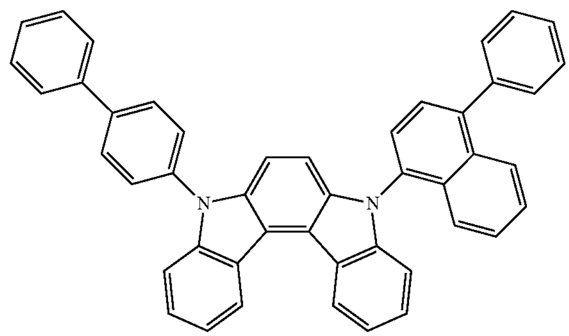
[B-38]
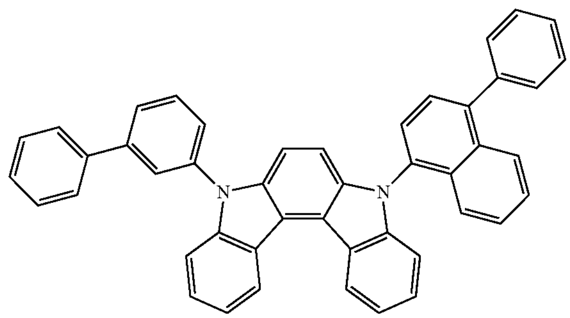

-continued
[B-39]
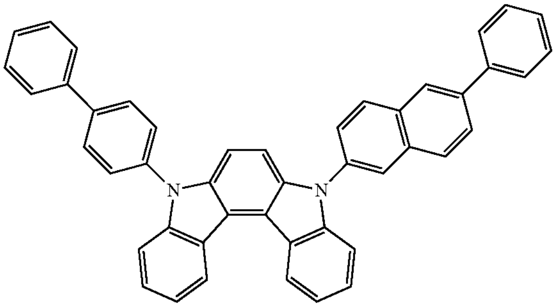
[B-40]
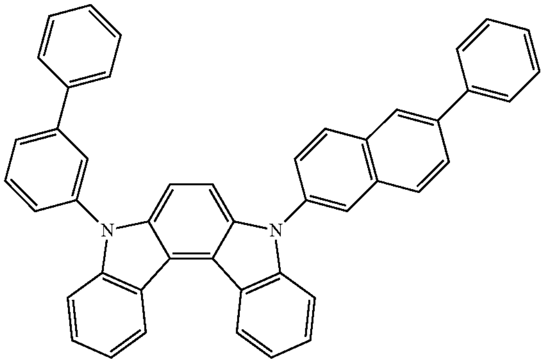
[B-41]
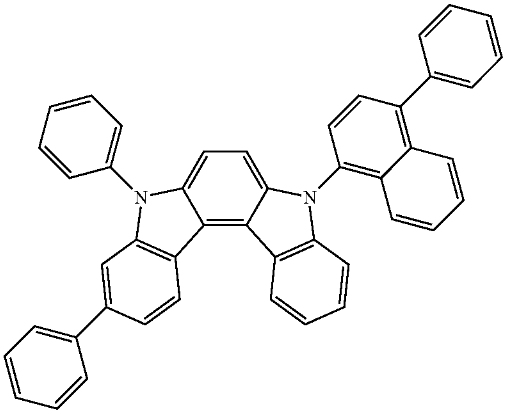
[B-42]
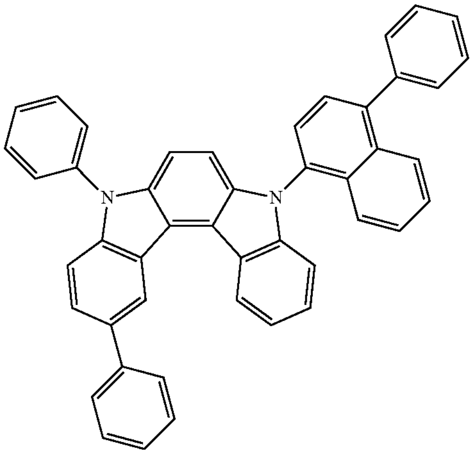
-continued
[B-43]
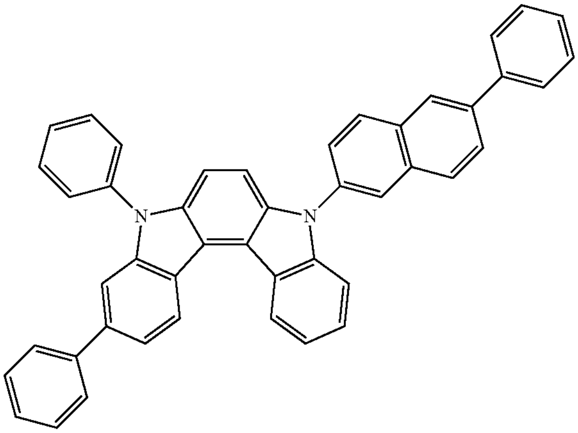
[B-44]
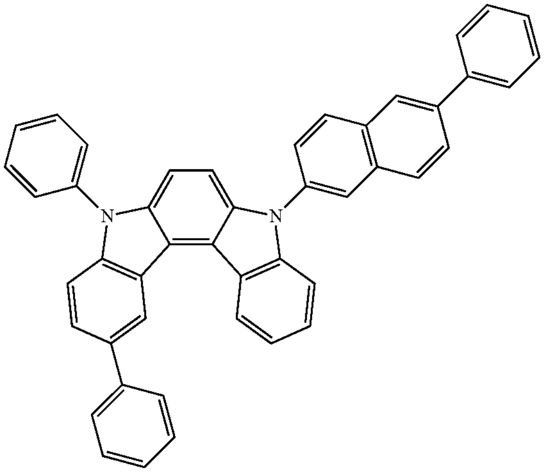
[B-45]
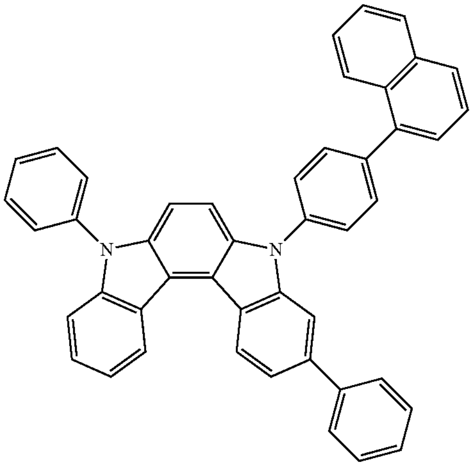

-continued
[B-46]
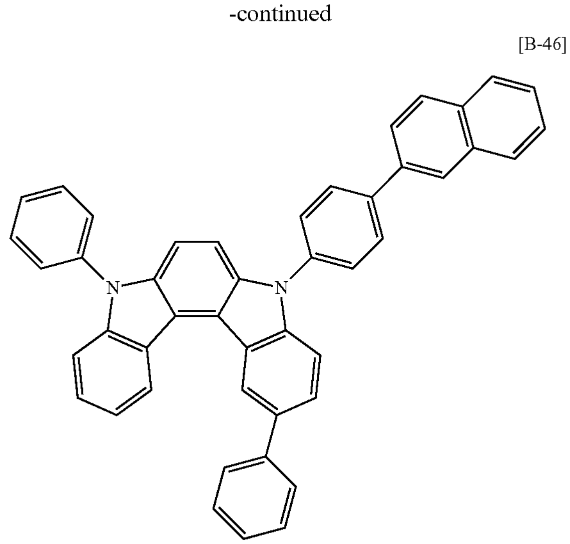
[B-47]
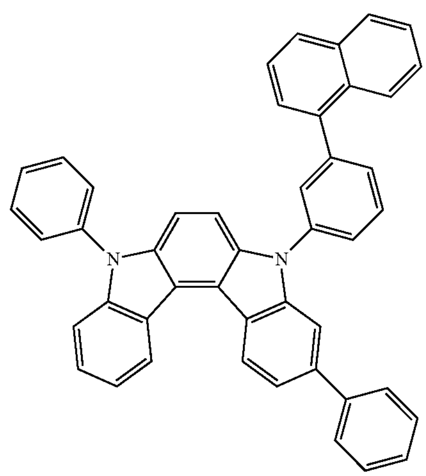
[B-48]
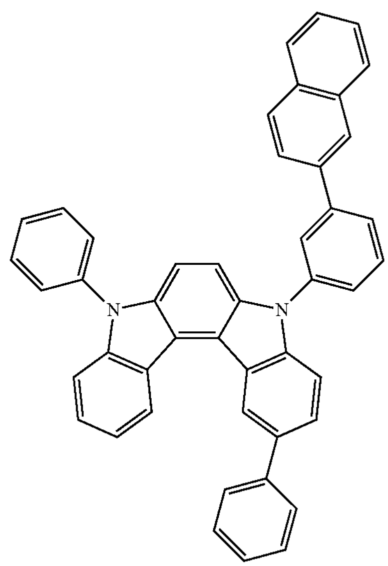
-continued
[B-49]
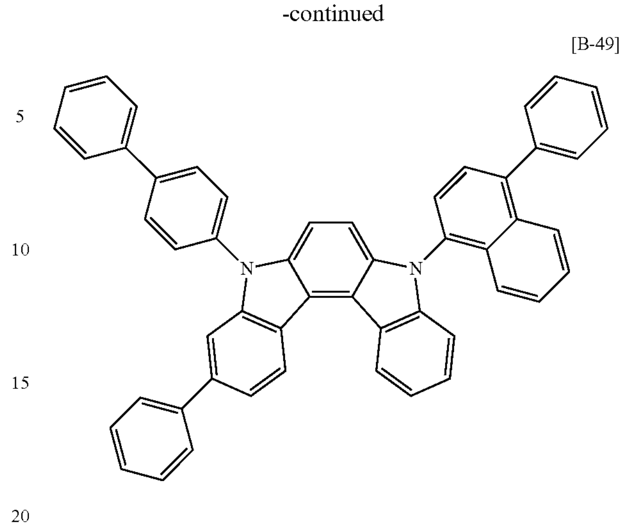
[B-50]
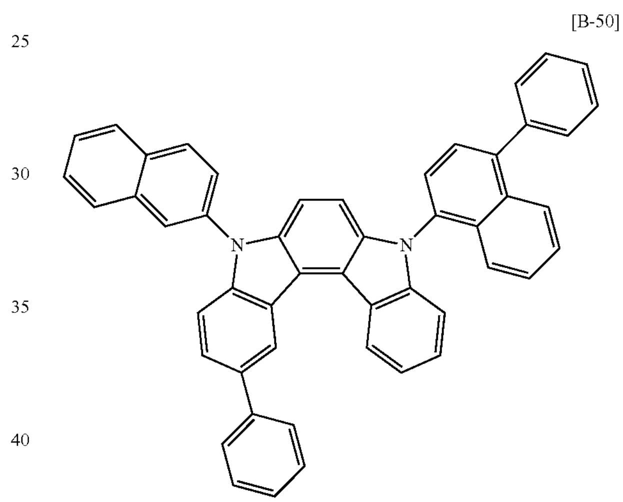
[B-51]
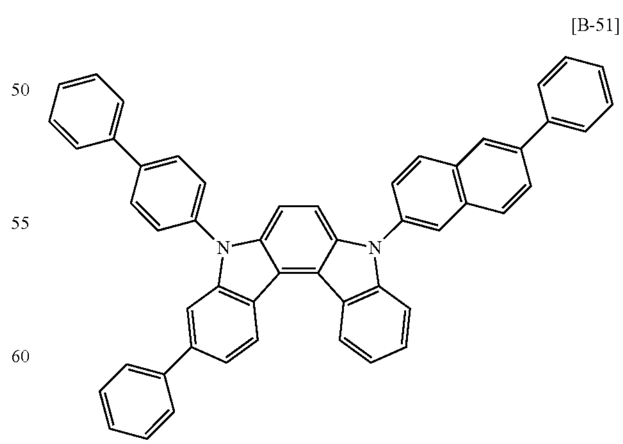

-continued

[B-52]

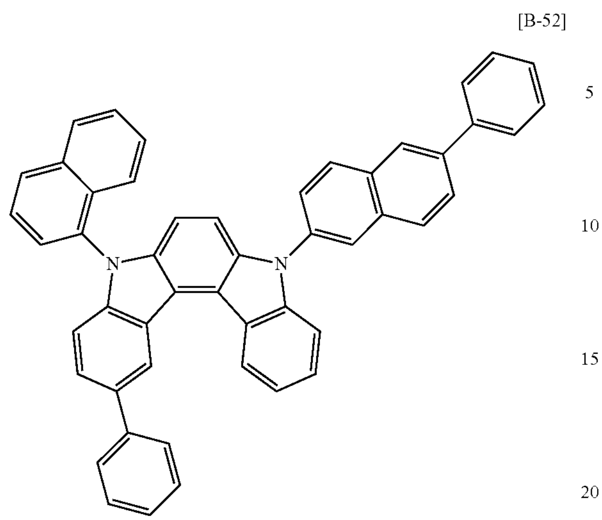

[B-53]

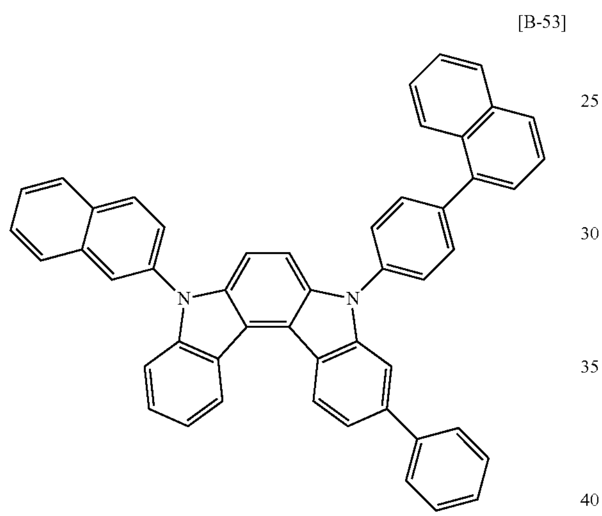

[B-54]

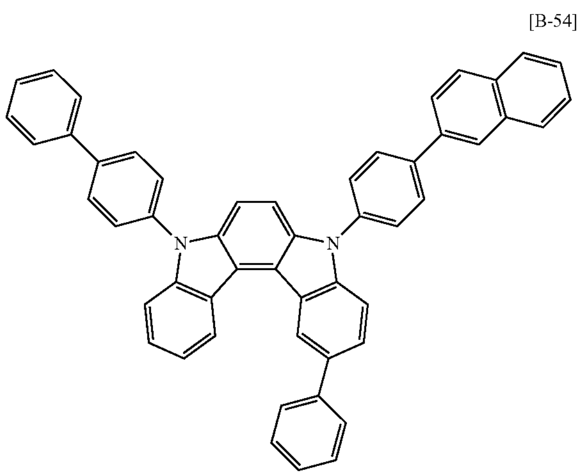

-continued

[B-55]

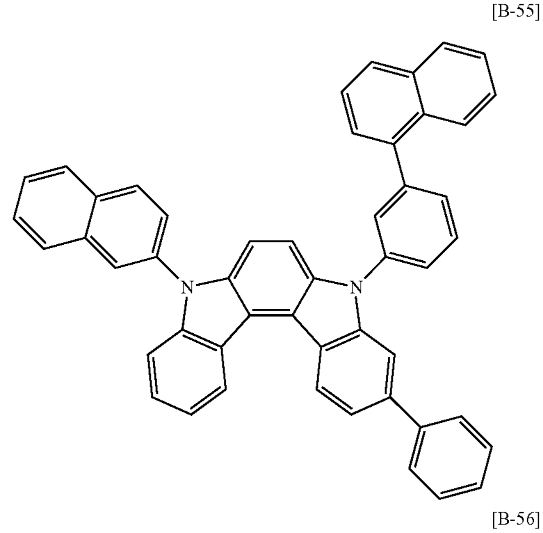

[B-56]

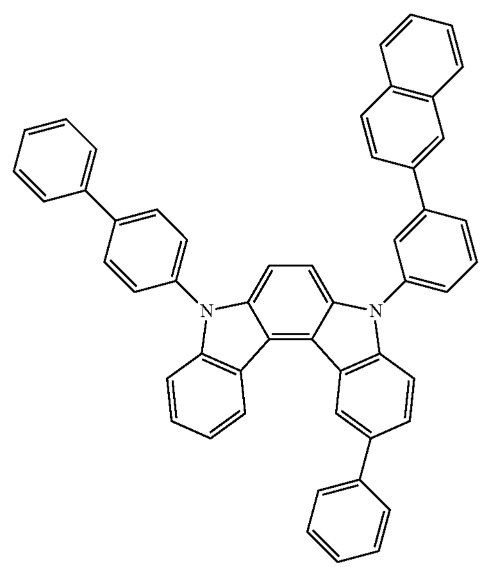

The first compound and the second compound may be included, e.g., in a weight ratio of about 1:99 to about 99:1. Within the above range, an appropriate weight ratio may be adjusted using the electron transport capability of the first compound and the hole transport capability of the second compound to implement bipolar characteristics and to improve the efficiency and life-span. Within the above range, e.g., they may be included in a weight ratio of about 10:90 to about 90:10, about 10:90 to about 80:20, for example about 10:90 to about 70:30, about 10:90 to about 60:40, or about 10:90 to about 50:50. In an implementation, they may be included in a weight ratio of about 20:80, about 30:70, or about 40:60.

In addition to the aforementioned first compound and second compound, one or more additional compounds may be further included.

The aforementioned compound for an organic optoelectronic device or composition for an organic optoelectronic device may be a composition further including a dopant.

The dopant may be, e.g., a phosphorescent dopant and may be, for example a red, green or blue phosphorescent dopant. In an implementation, the dopant may be, e.g., a red or green phosphorescent dopant.

The dopant is a material mixed with the compound or composition for an organic optoelectronic device in a trace amount to cause light emission, and may be a material such as a metal complex that emits light by multiple excitation into a triplet or more. The dopant may be, e.g., an inorganic, organic, or organic-inorganic compound, and one or more types thereof may be used.

Examples of the dopant may include a phosphorescent dopant and examples of the phosphorescent dopant may be an organic metal compound including Ir, Pt, Os, Ti, Zr, Hf, Eu, Tb, Tm, Fe, Co, Ni, Ru, Rh, Pd, or a combination thereof. In an implementation, the phosphorescent dopant may be, e.g., a compound represented by Chemical Formula Z.

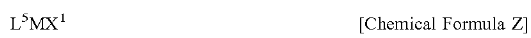

$L^5MX^1$ [Chemical Formula Z]

In Chemical Formula Z, M may be, e.g., a metal, and $L^5$ and $X^1$ may each independently be, e.g., ligands forming a complex with M.

M may be, e.g., Ir, Pt, Os, Ti, Zr, Hf, Eu, Tb, Tm, Fe, Co, Ni, Ru, Rh, Pd, or a combination thereof, and $L^5$ and X may each independently be, e.g., a bidentate ligand.

Hereinafter, an organic optoelectronic device including the aforementioned compound for an organic optoelectronic device or composition for an organic optoelectronic device is described.

The organic optoelectronic device may be a suitable device to convert electrical energy into photoenergy and vice versa, and may be, e.g., an organic photoelectric device, an organic light emitting diode, an organic solar cell, or an organic photoconductor drum.

Herein, an organic light emitting diode as one example of an organic optoelectronic device is described referring to drawings.

FIGS. 1 to 4 are cross-sectional views showing organic light emitting diodes according to embodiments.

Referring to FIG. 1, an organic light emitting diode 100 according to an embodiment may include an anode 120 and a cathode 110 facing each other and an organic layer 105 between the anode 120 and the cathode 110.

The anode 120 may be made of a conductor having a large work function to help hole injection, and may be, e.g., a metal, a metal oxide, or a conductive polymer. The anode 120 may be, e.g., a metal such as nickel, platinum, vanadium, chromium, copper, zinc, gold, or the like or an alloy thereof; a metal oxide such as zinc oxide, indium oxide, indium tin oxide (ITO), indium zinc oxide (IZO), or the like; a combination of a metal and an oxide such as ZnO and Al or $SnO_2$ and Sb; or a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum silver, tin, lead, cesium, barium, or the like, or an alloy thereof; or a multi-layer structure material such as LiF/Al, $LiO_2$/Al, LiF/Ca, $BaF_2$/Ca.

The organic layer 105 may include the aforementioned compound for an organic optoelectronic device or composition for an organic optoelectronic device.

The organic layer 105 may include the light emitting layer 130, and the light emitting layer 130 may include the aforementioned compound for an organic optoelectronic device or composition for an organic optoelectronic device.

The composition for an organic optoelectronic device further including the dopant may be, e.g., a red light emitting composition.

The light emitting layer 130 may include, e.g., the aforementioned first compound for an organic optoelectronic device and second compound for an organic optoelectronic device, respectively, as a phosphorescent host.

The organic layer may further include a charge transport region in addition to the light emitting layer.

The charge transport region may be, e.g., the hole transport region 140.

Figure 2:
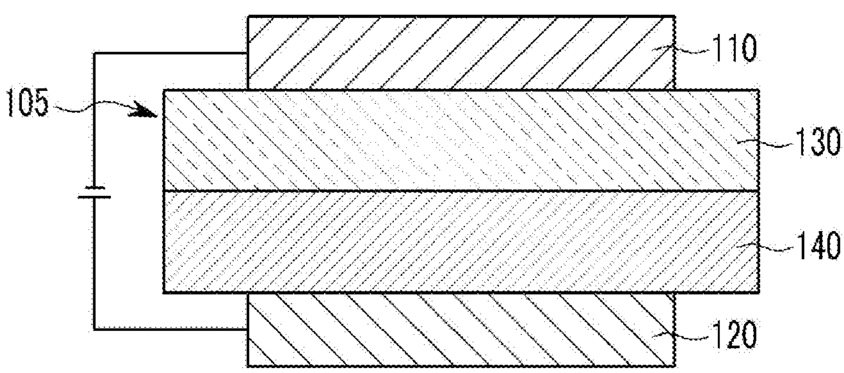

Referring to FIG. 2, an organic light emitting diode 200 may further include a hole transport region 140 in addition to the light emitting layer 130. The hole transport region 140 may help further increase hole injection and/or hole mobility and block electrons between the anode 120 and the light emitting layer 130. In an implementation, the hole transport region 140 may include a hole transport layer between the anode 120 and the light emitting layer 130, and a hole transport auxiliary layer between the light emitting layer 130 and the hole transport layer, and at least one of the compounds of Group E may be included in at least one of the hole transport layer and the hole transport auxiliary layer.

[Group E]

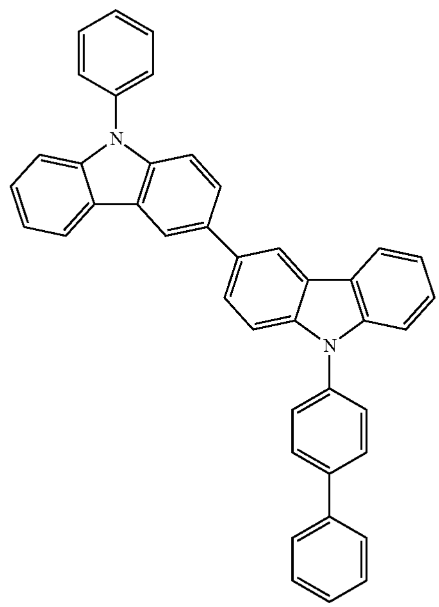

-continued
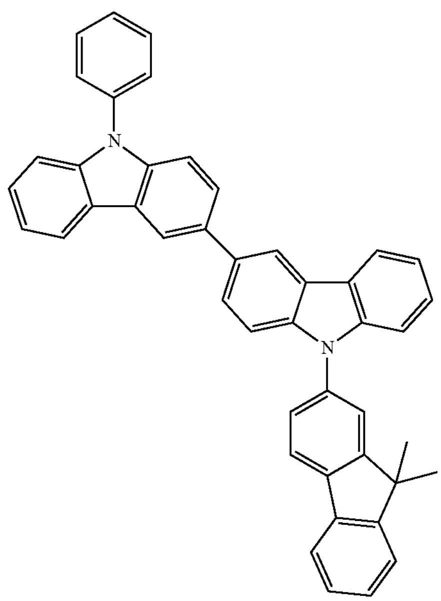
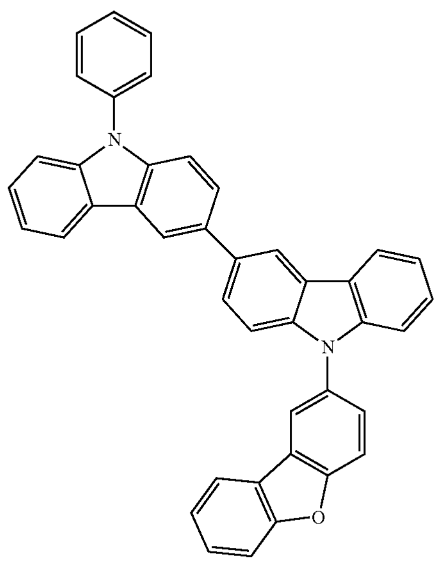
-continued
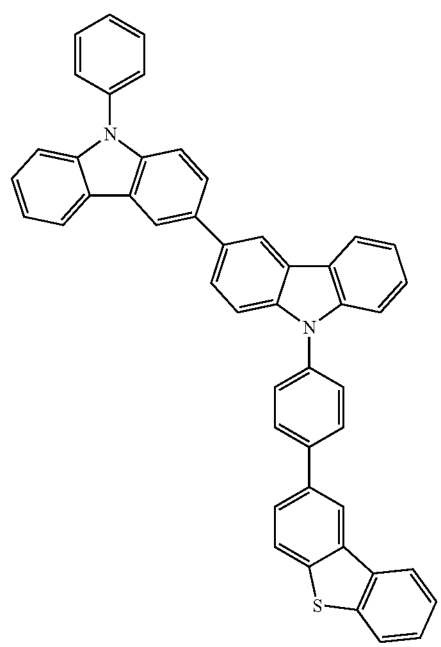
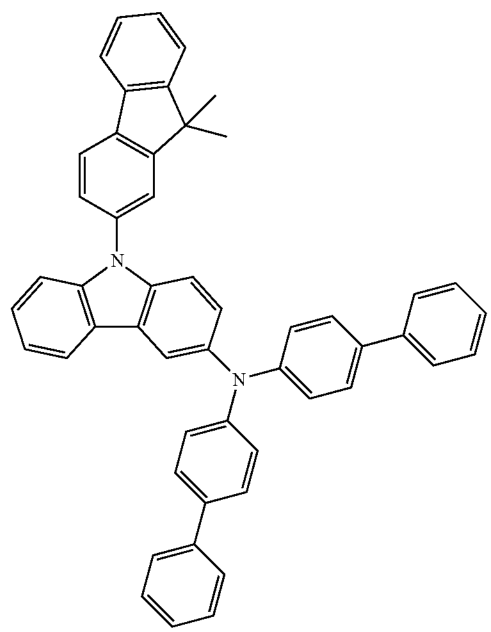

-continued
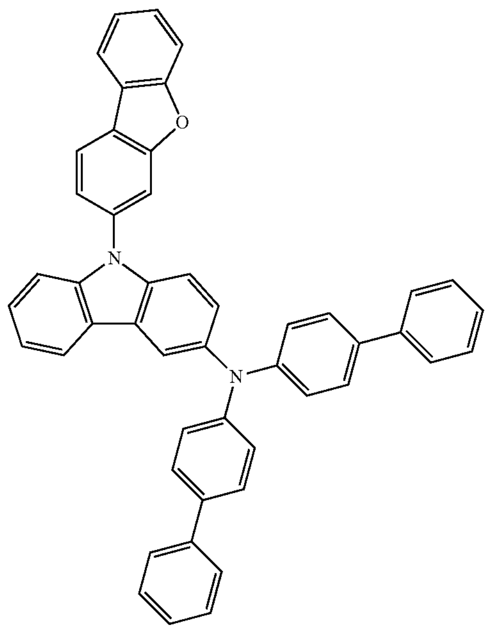
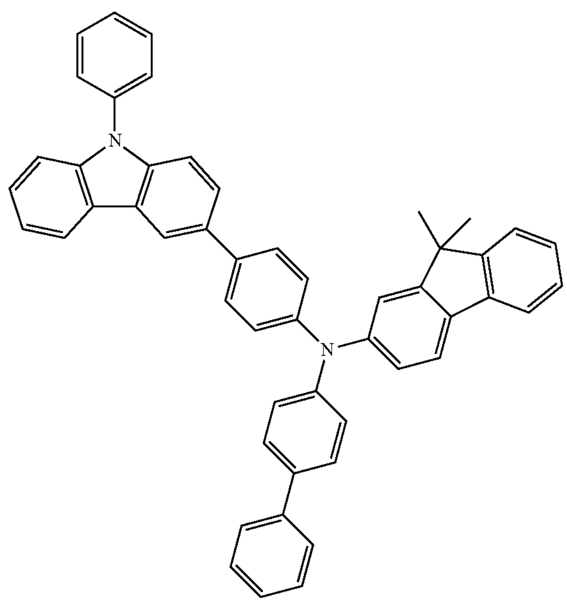
-continued
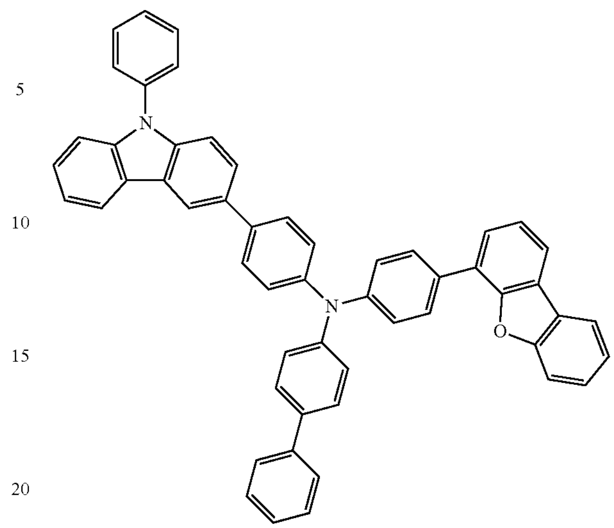
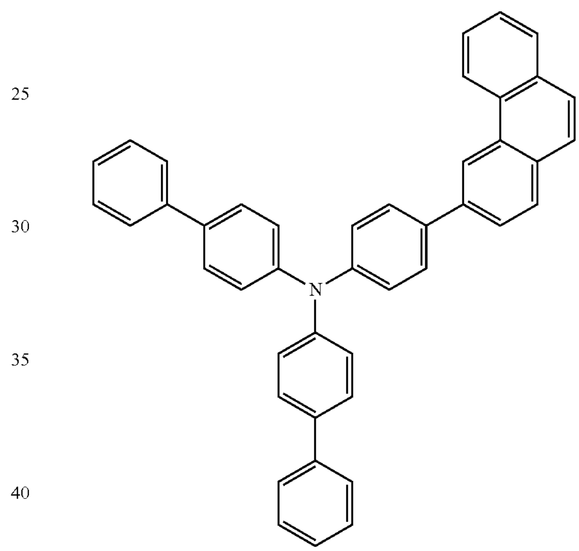
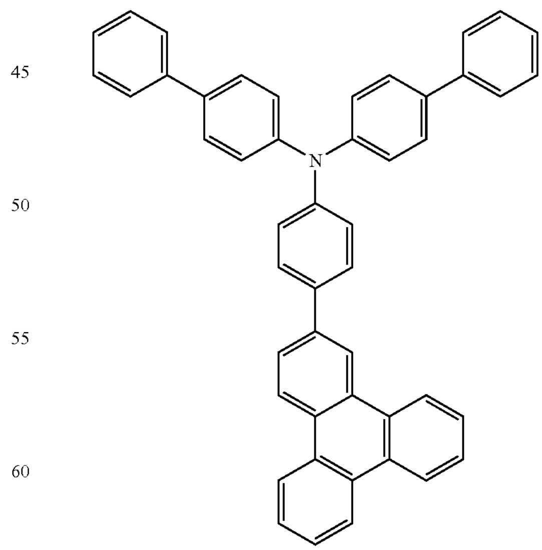

-continued
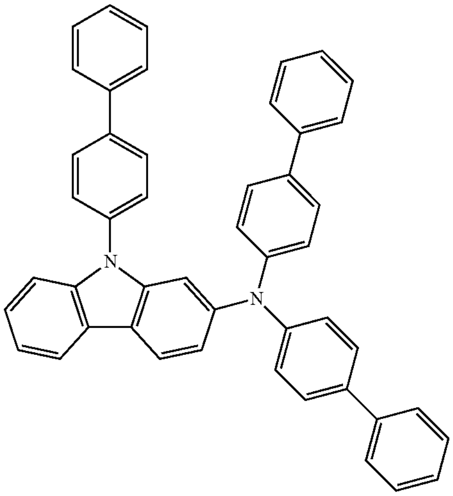
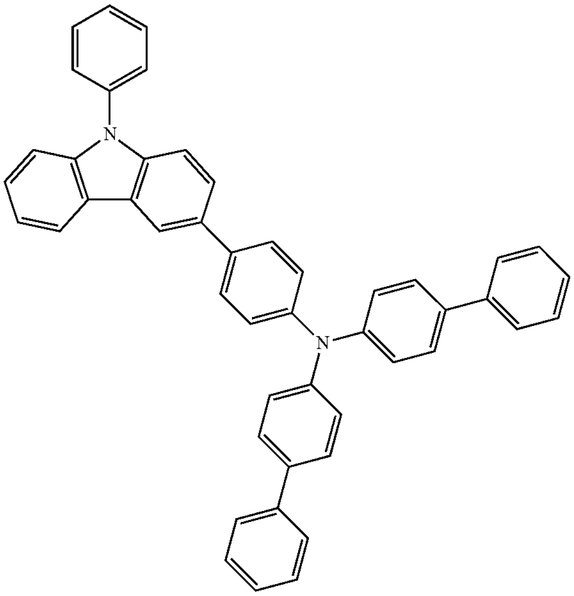
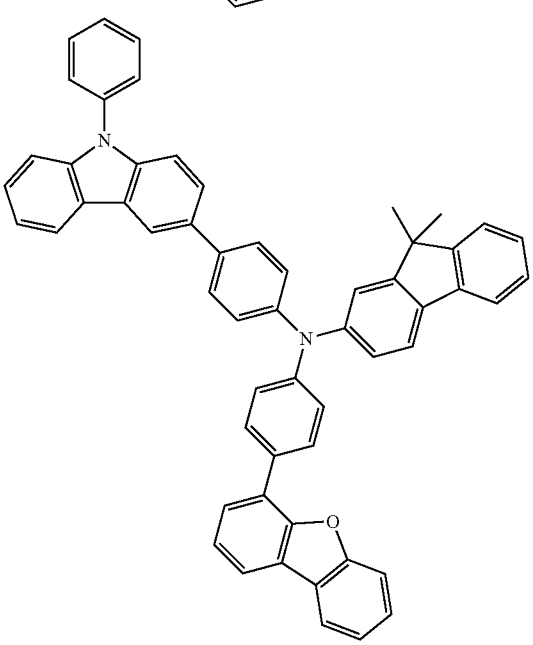
-continued
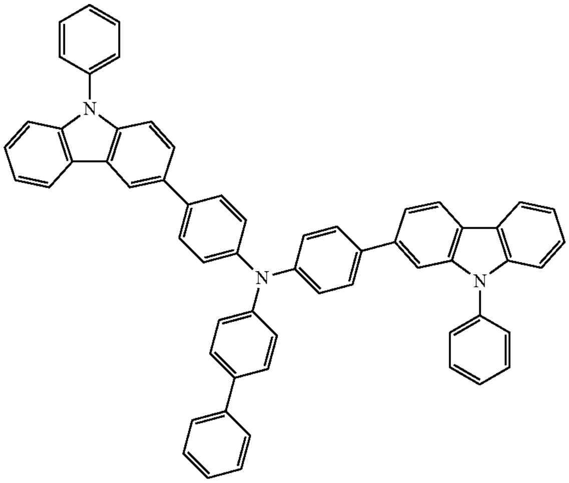
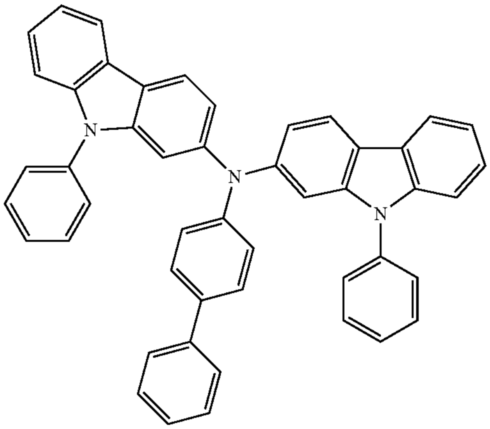
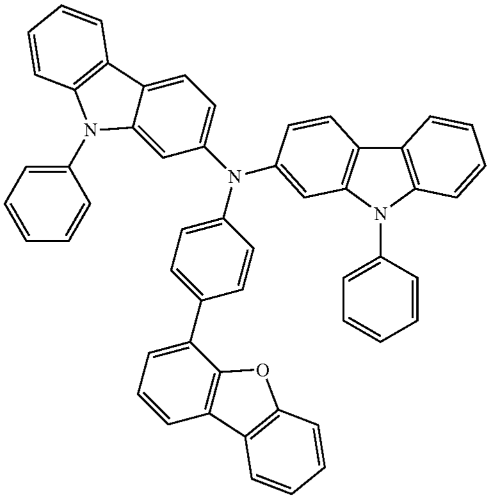

-continued
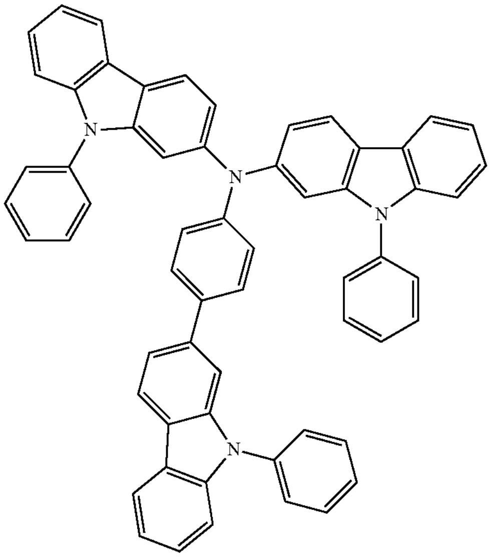
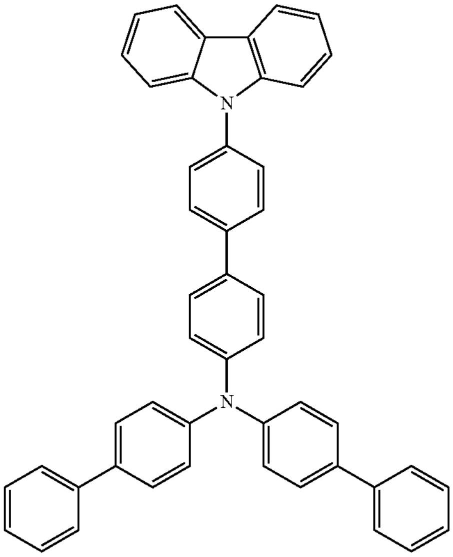
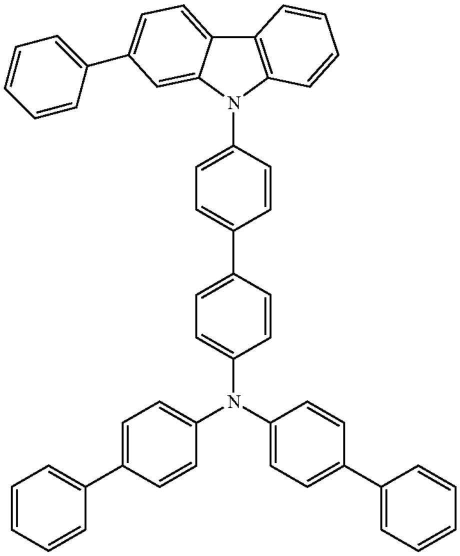
-continued
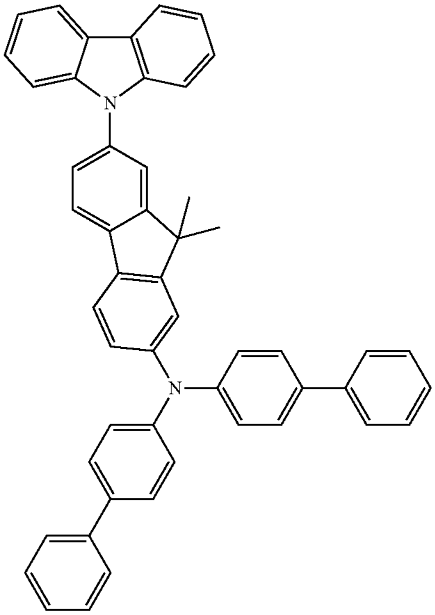
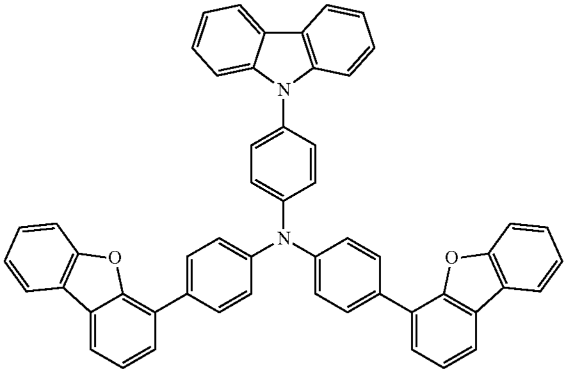
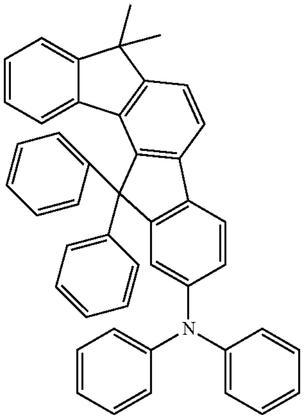

-continued
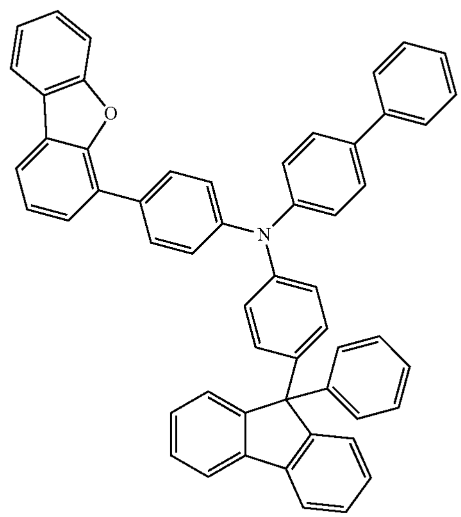
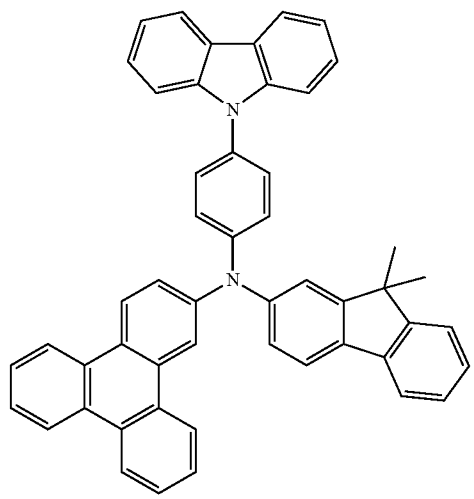
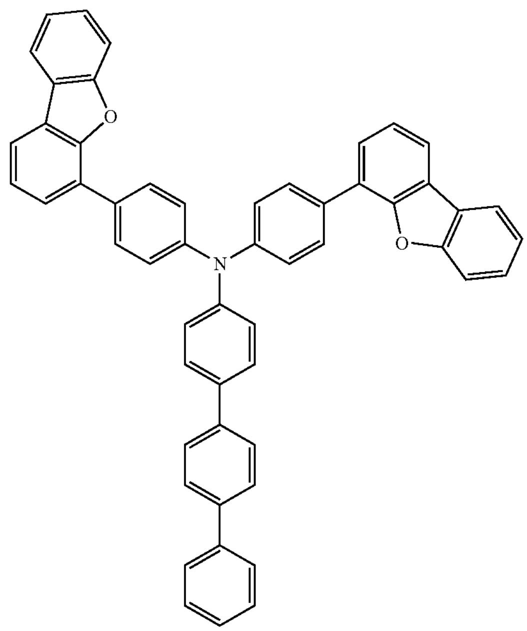
-continued
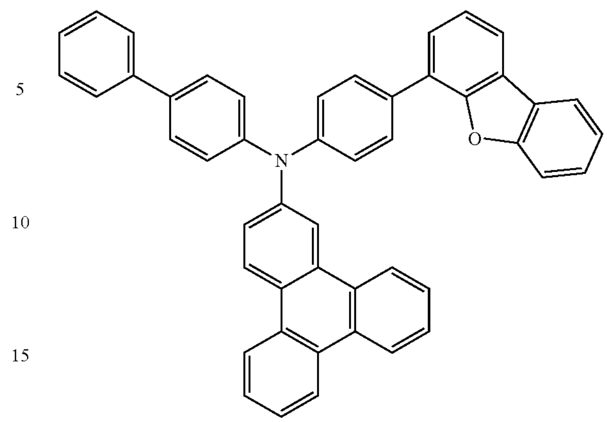
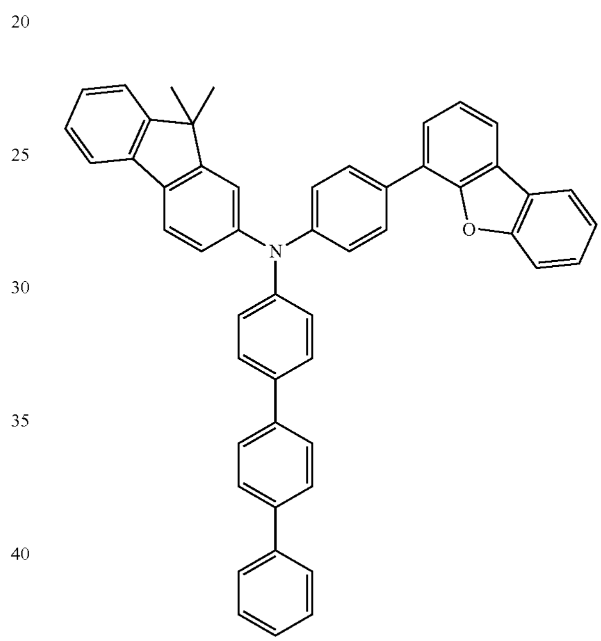
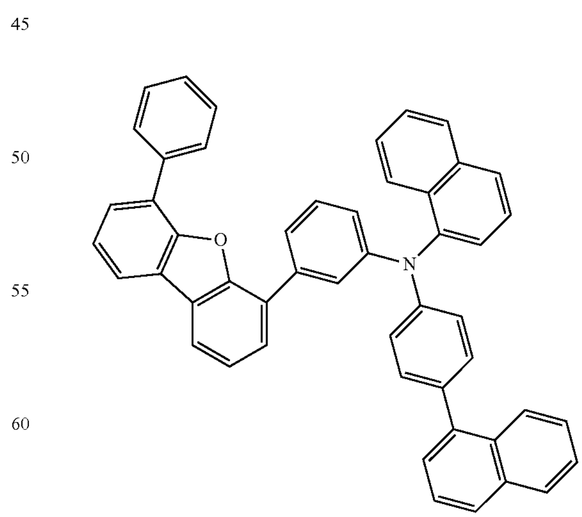

-continued
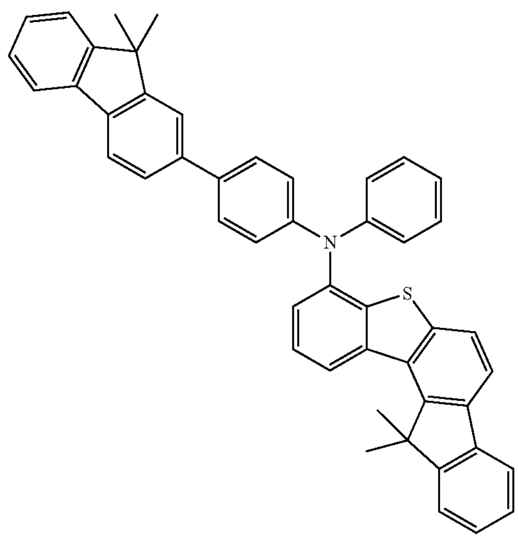
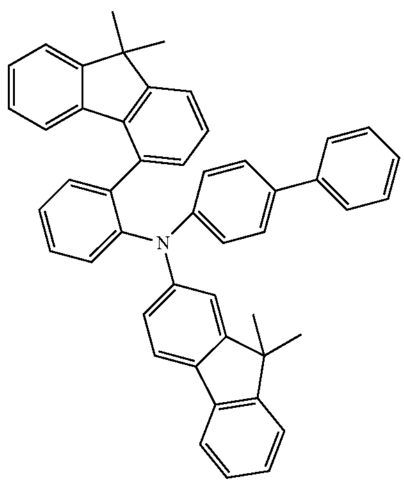
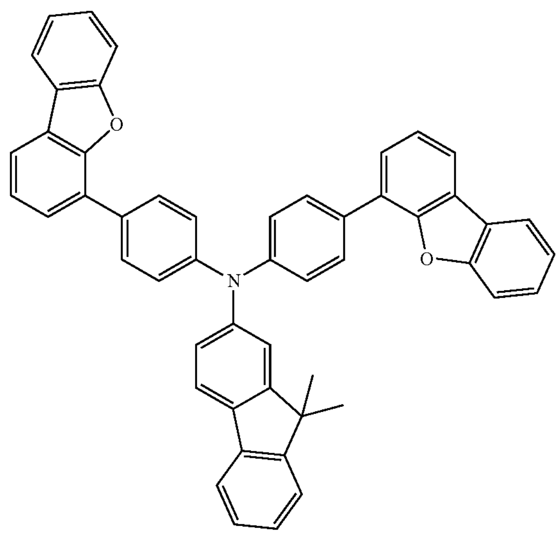
-continued
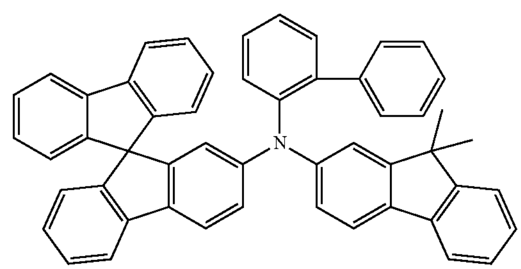
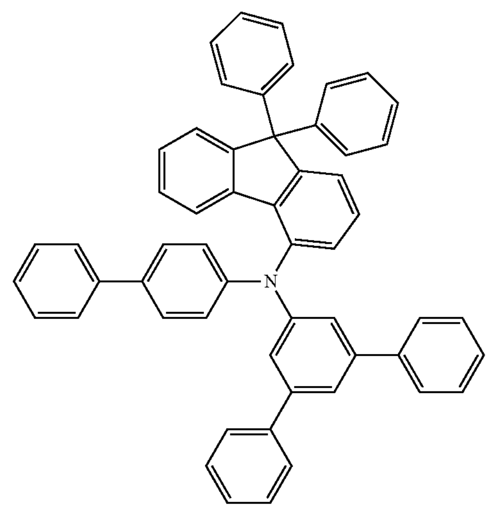
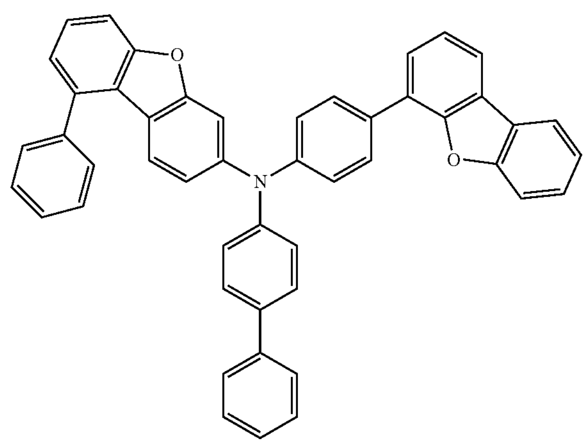

-continued
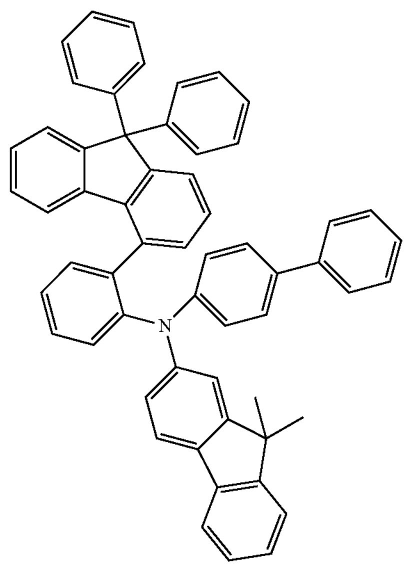
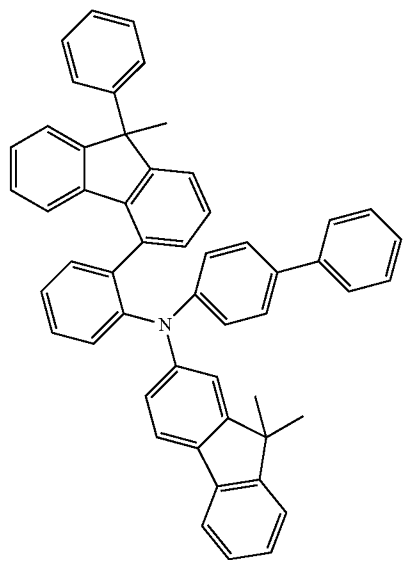
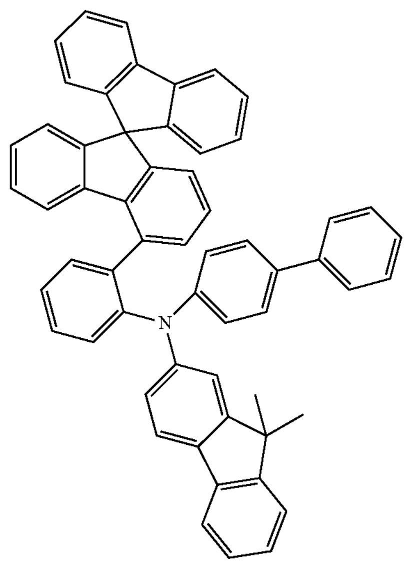
-continued
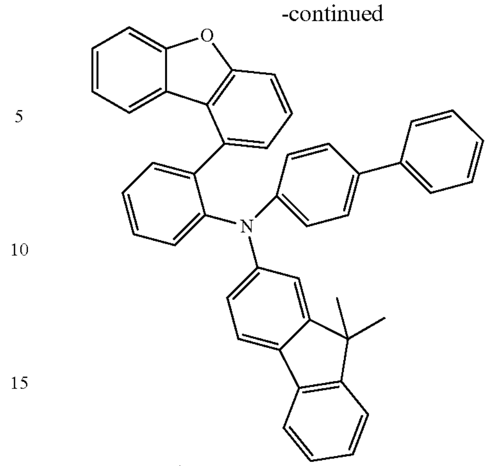
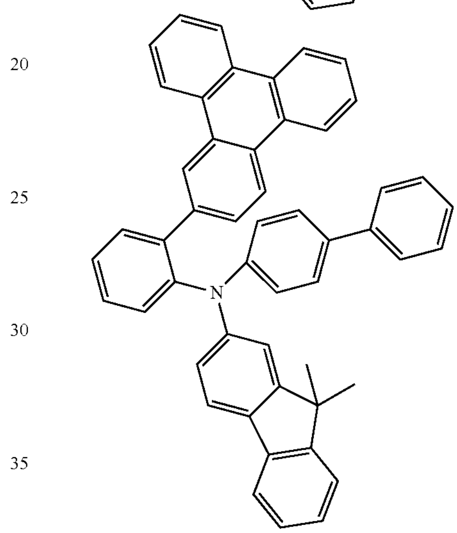
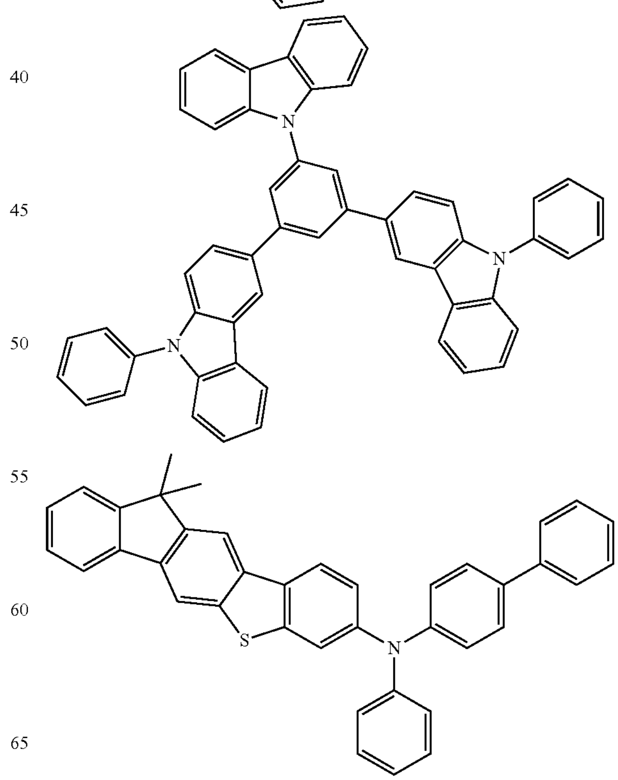

-continued
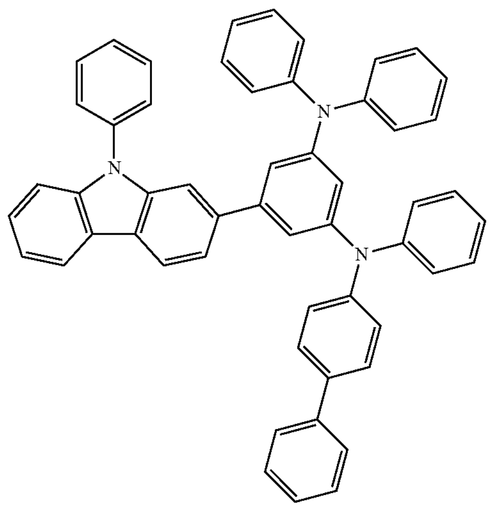
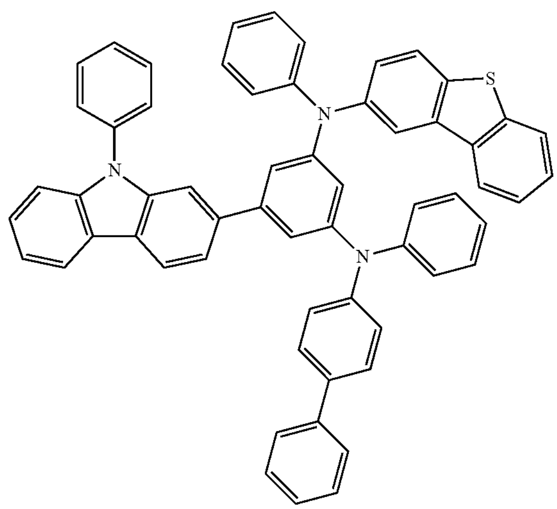
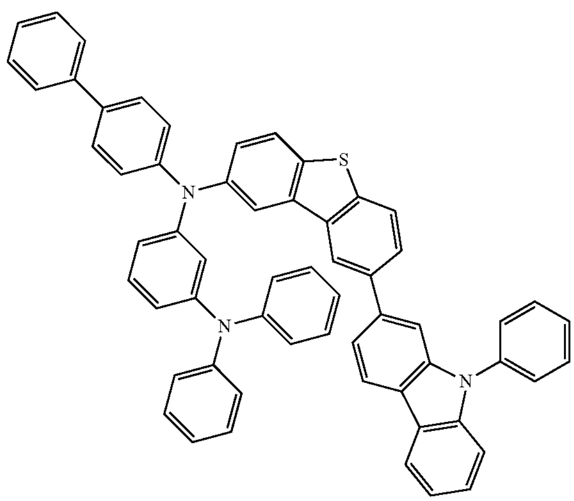
-continued
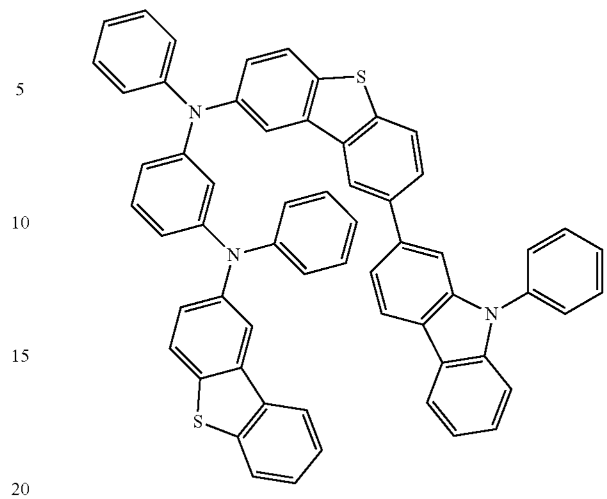
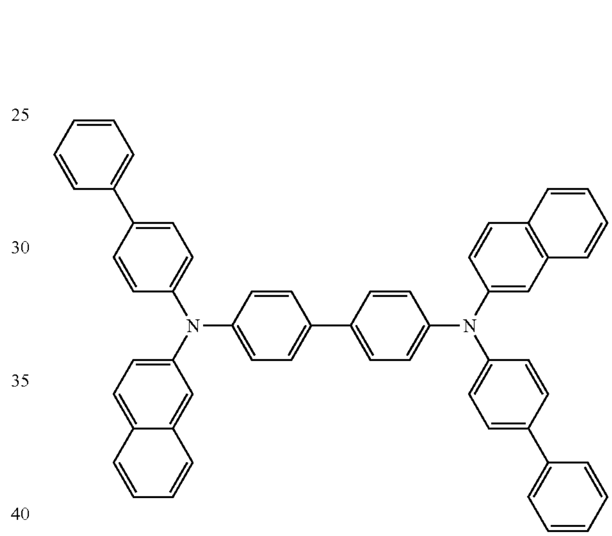
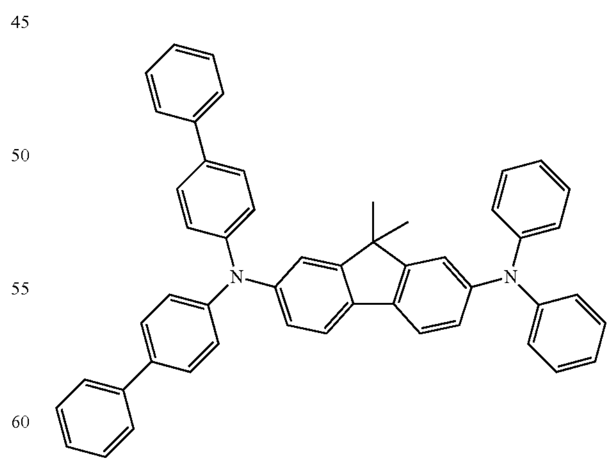

-continued
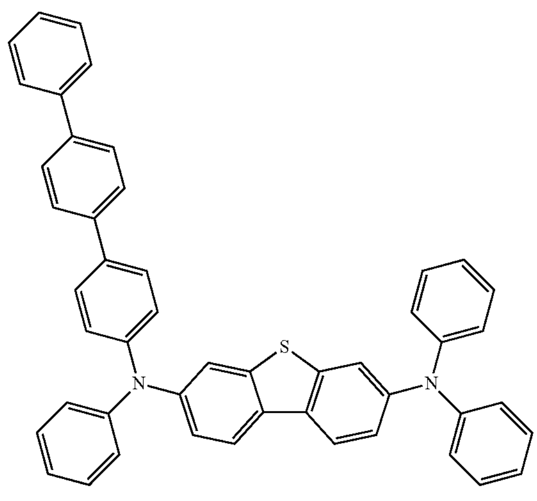
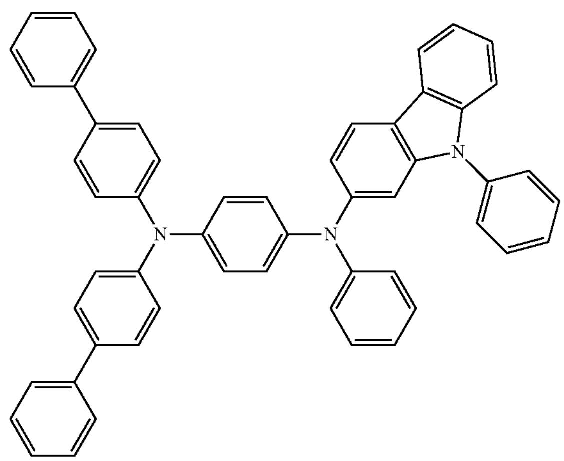
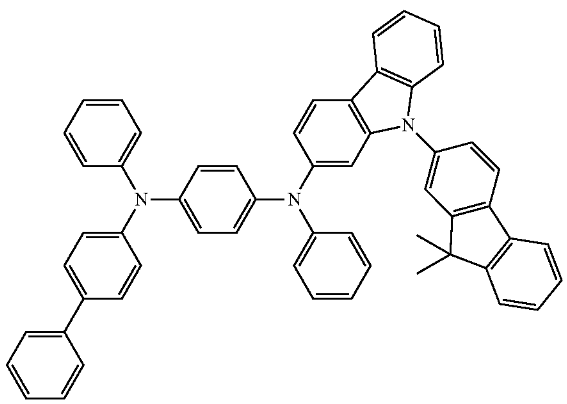
-continued
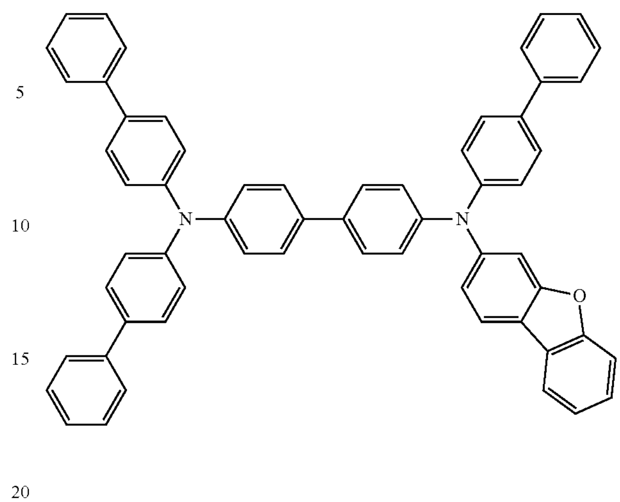
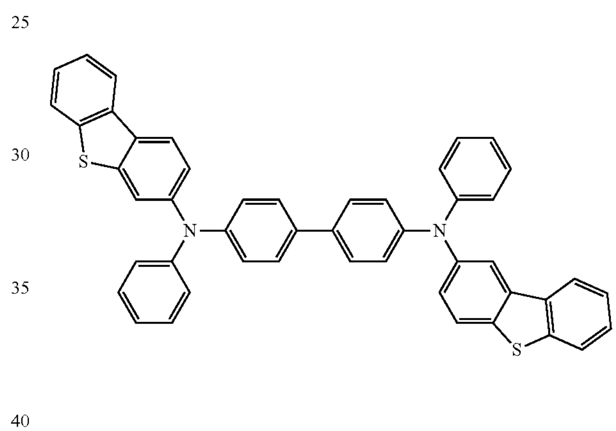
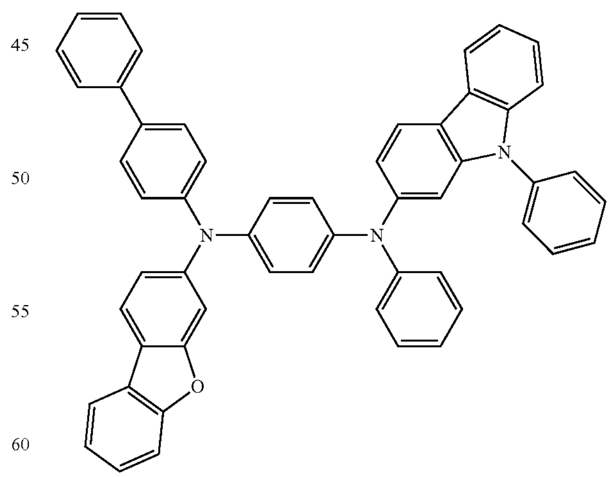

-continued
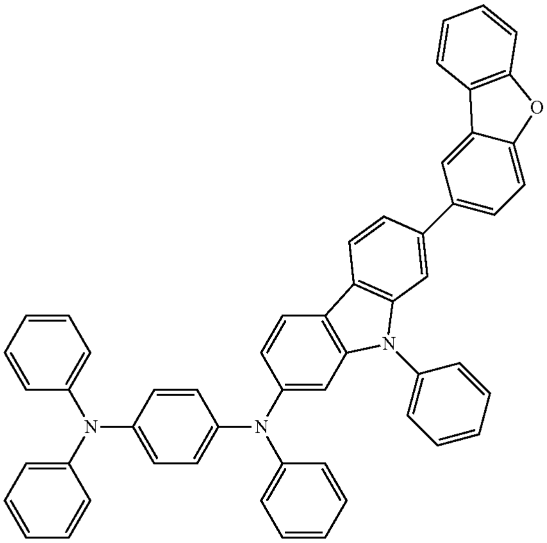
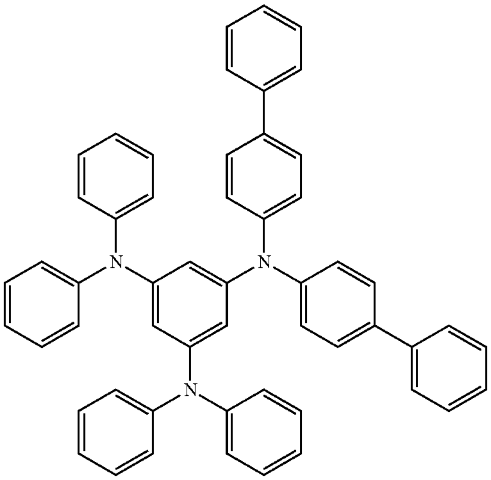
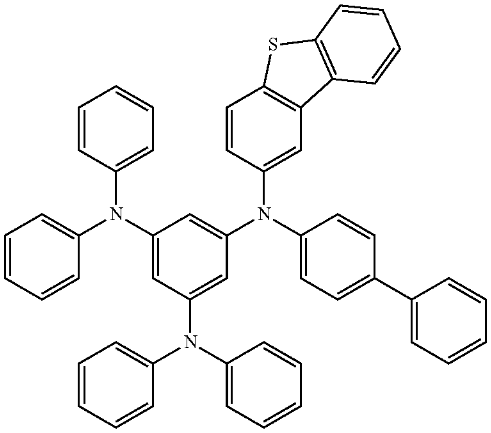
-continued
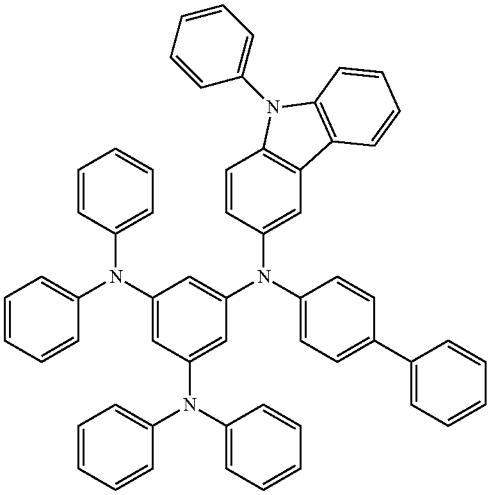
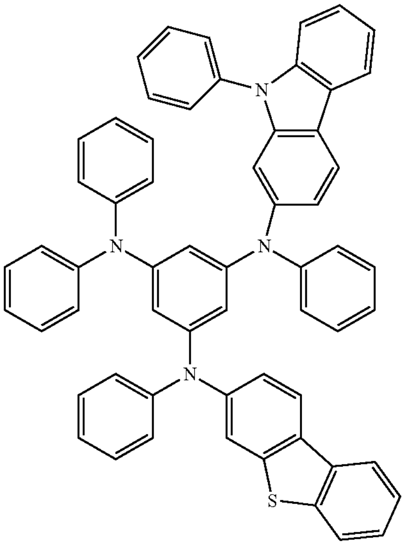
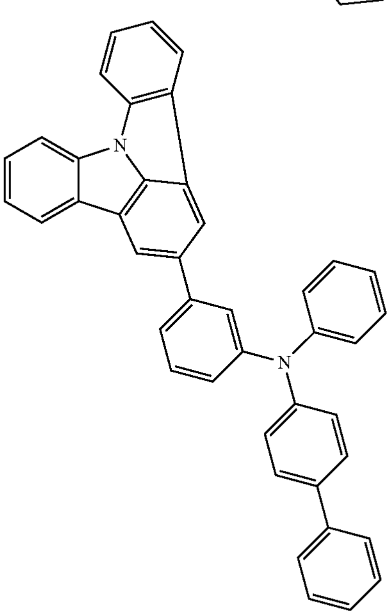

-continued
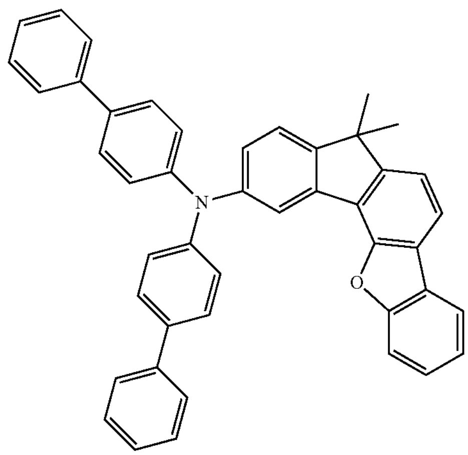
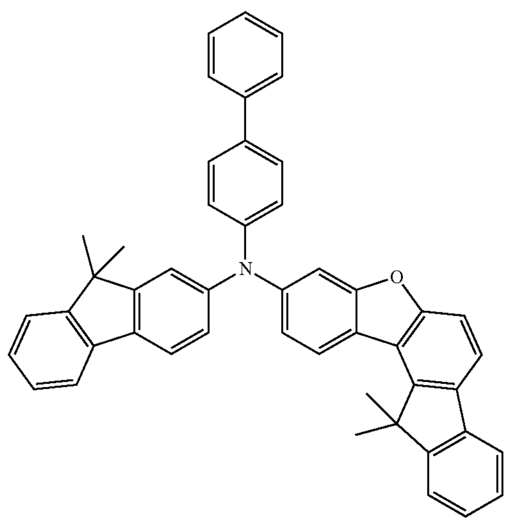
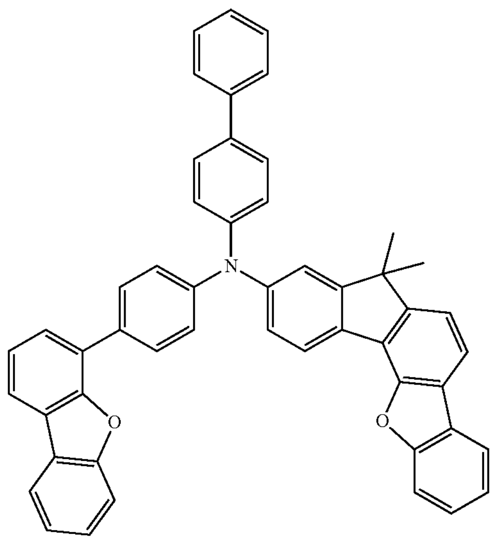
-continued
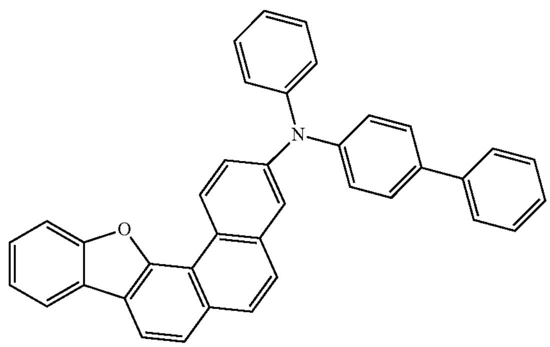
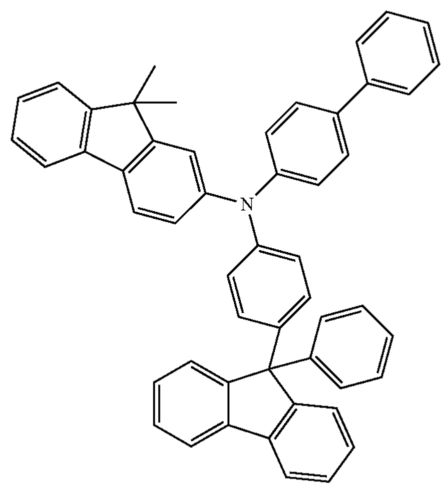
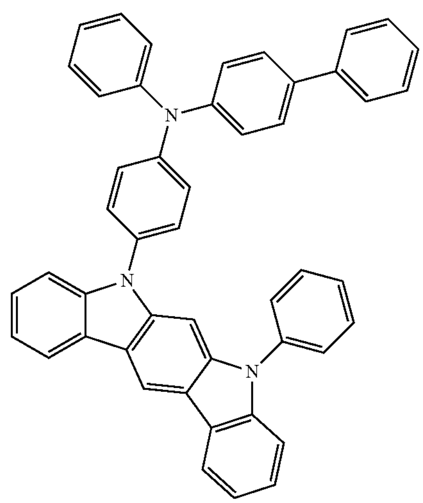

-continued
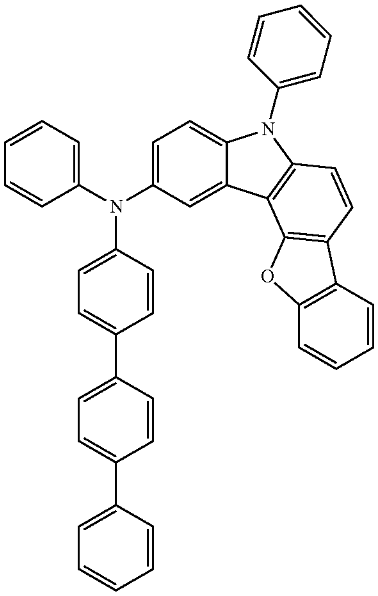
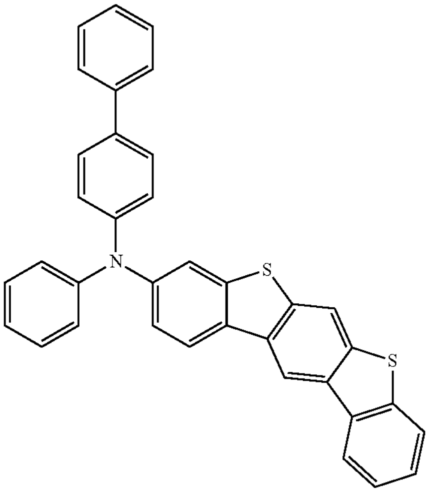
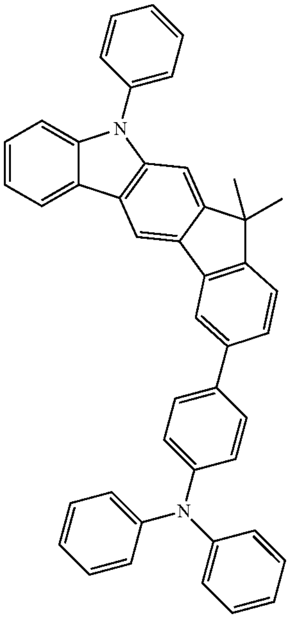
-continued
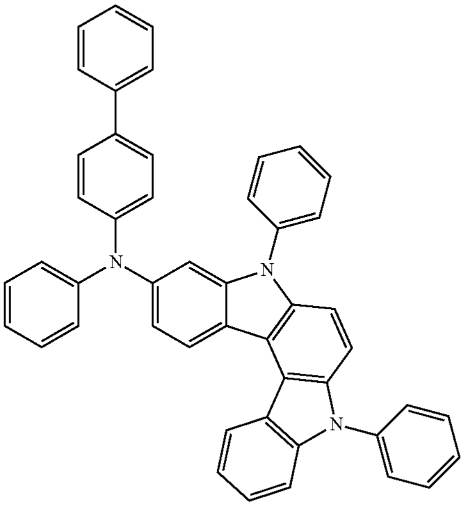
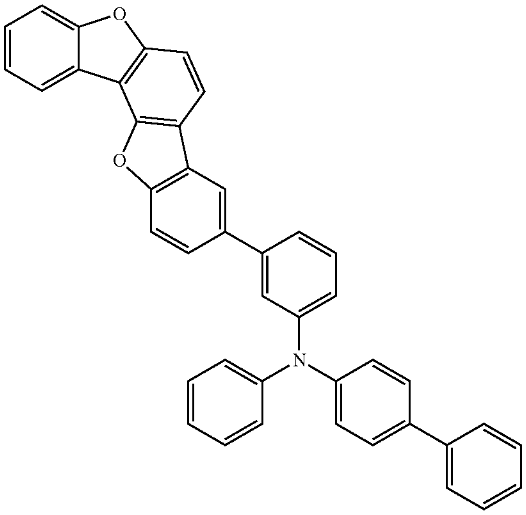
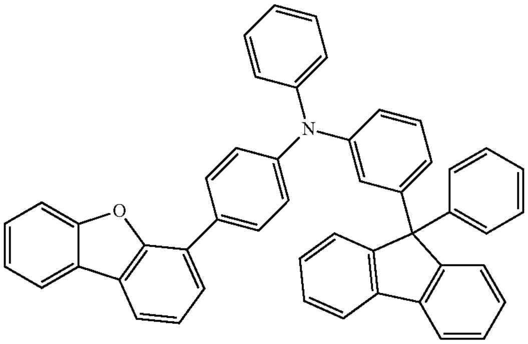

-continued
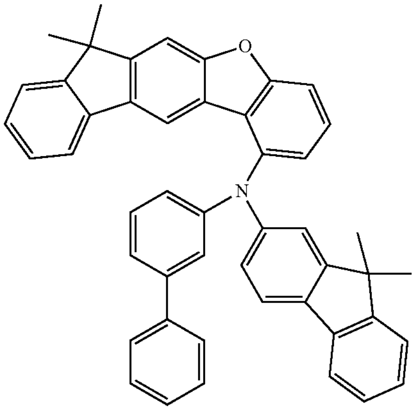
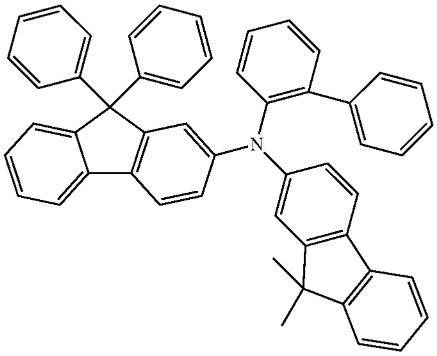
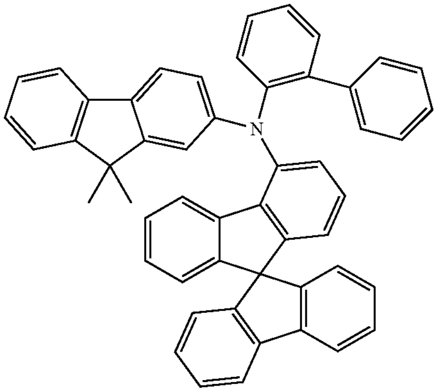
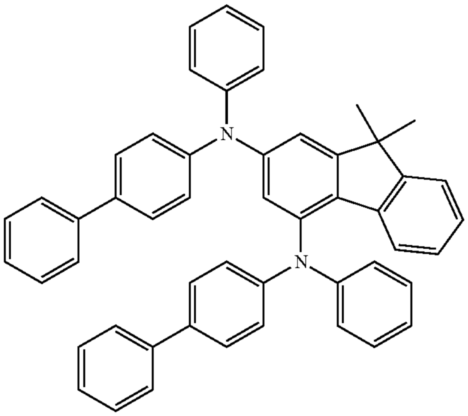
-continued
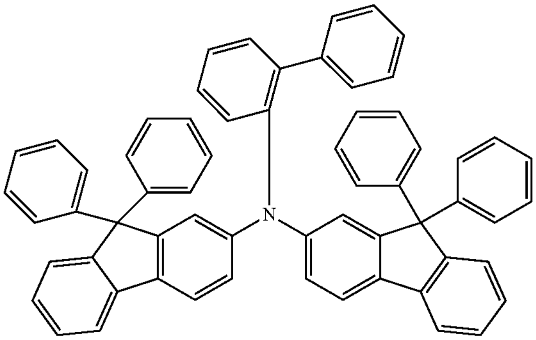
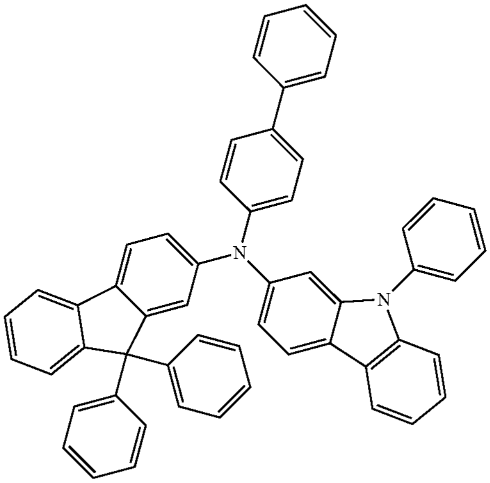
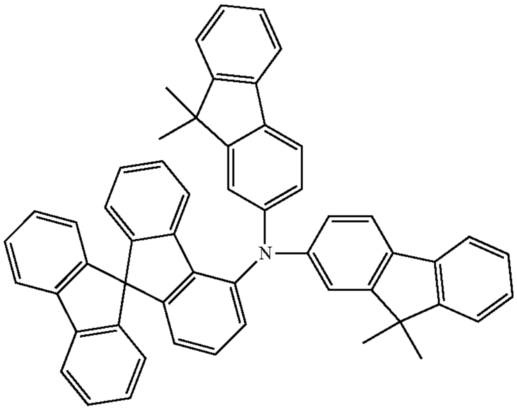
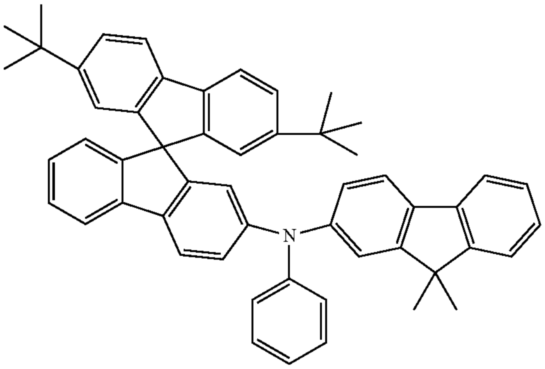

-continued
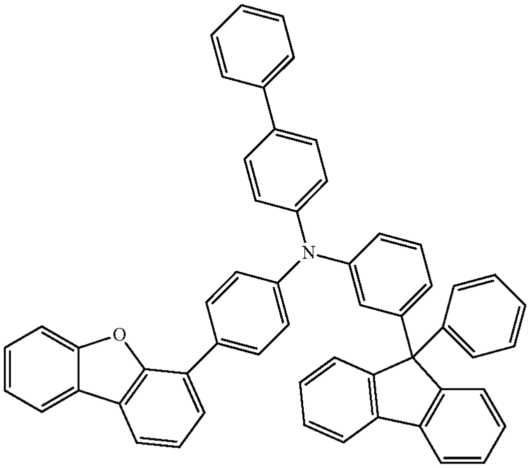
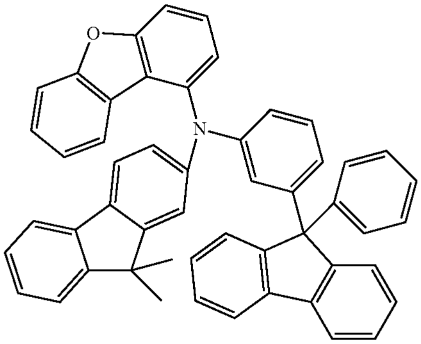
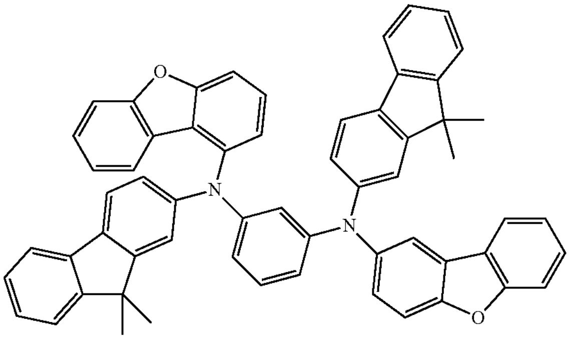
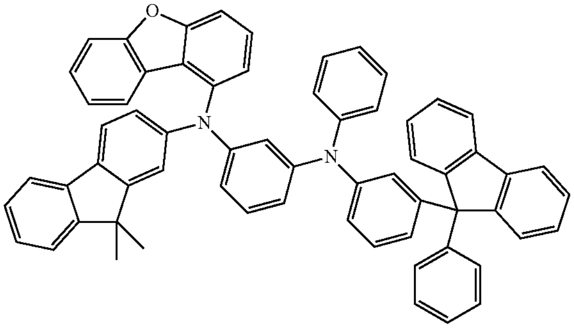
-continued
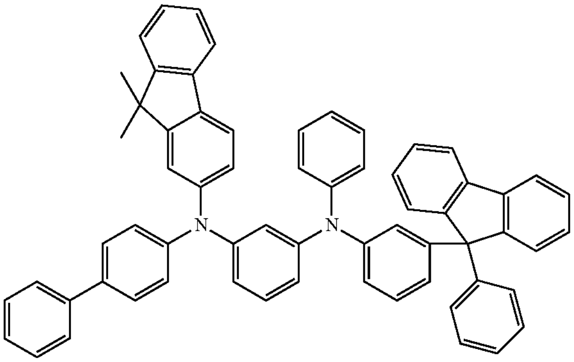
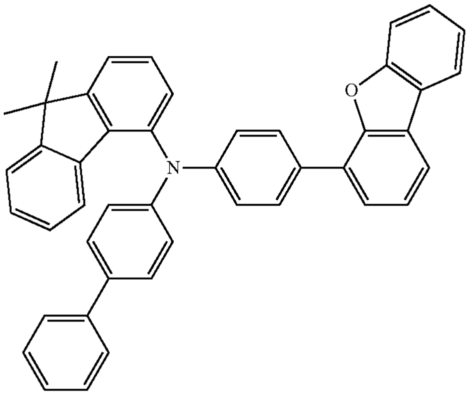
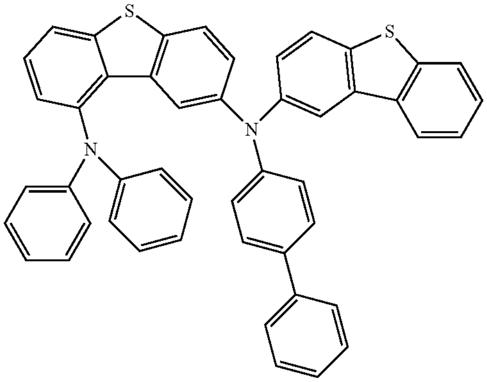
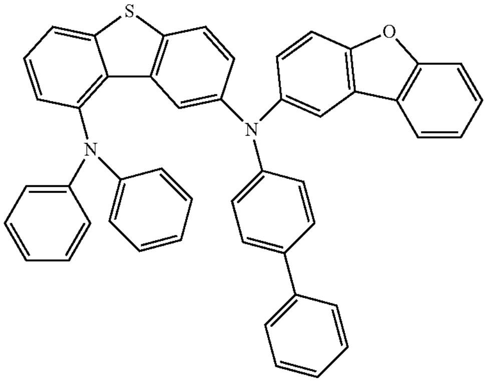

-continued

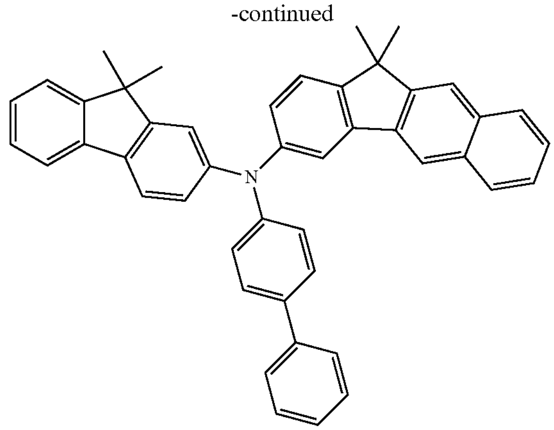

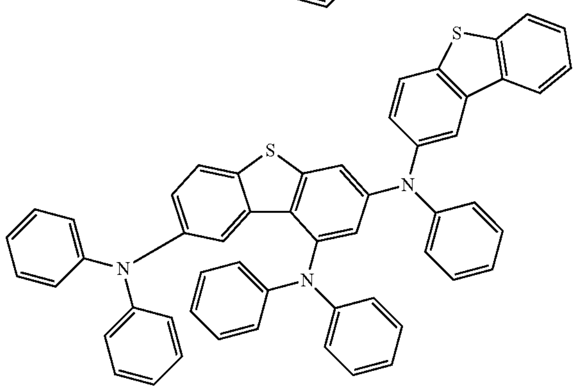

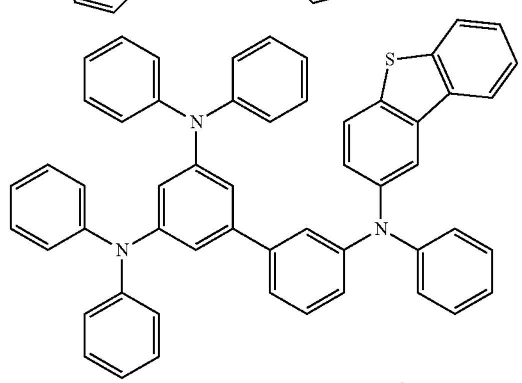

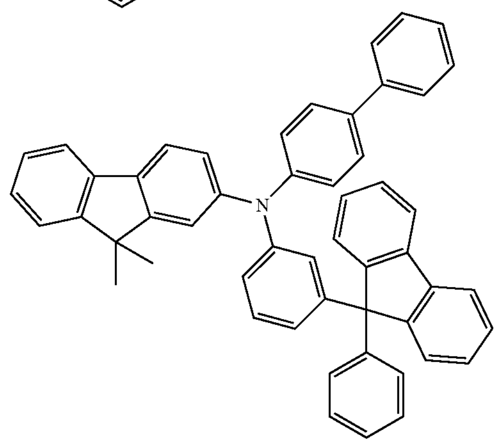

In the hole transport region, in addition to the compounds described above, other suitable compounds may also be used.

In an implementation, the charge transport region may be, e.g., the electron transport region 150.

Figure 3:
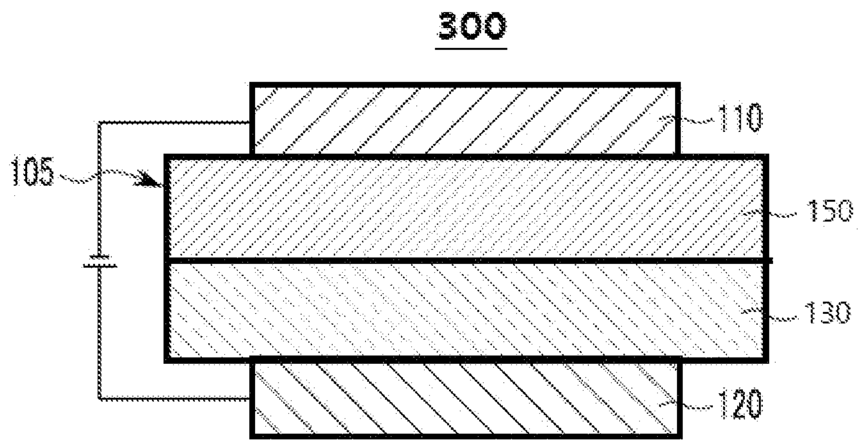

Referring to FIG. 3, the organic light emitting diode 300 may further include an electron transport region 150 in addition to the light emitting layer 130. The electron transport region 150 may help further increase electron injection and/or electron mobility and block holes between the cathode 110 and the light emitting layer 130.

In an implementation, the electron transport region 150 may include an electron transport layer between the cathode 110 and the light emitting layer 130, and an electron transport auxiliary layer between the light emitting layer 130 and the electron transport layer, and at least one of the compounds of Group F may be included in at least one of the electron transport layer and the electron transport auxiliary layer.

[Group F]

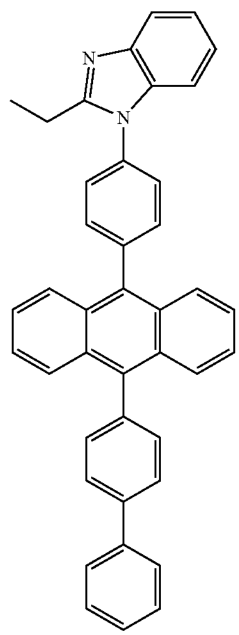

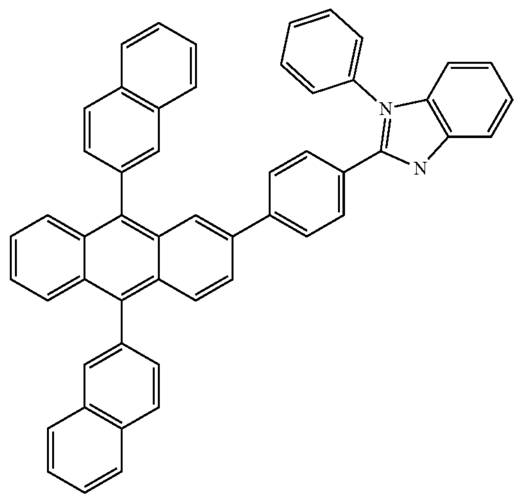

-continued
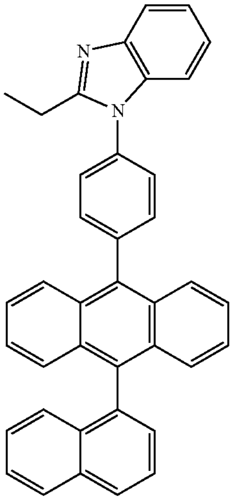
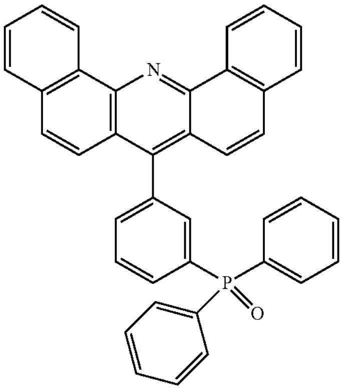
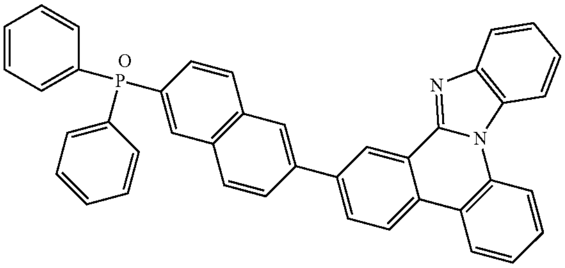
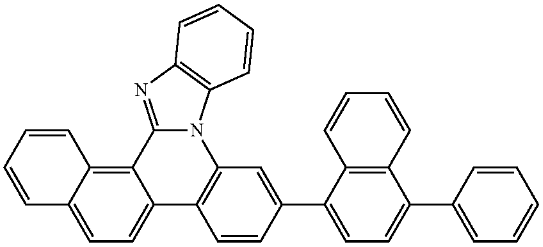
-continued
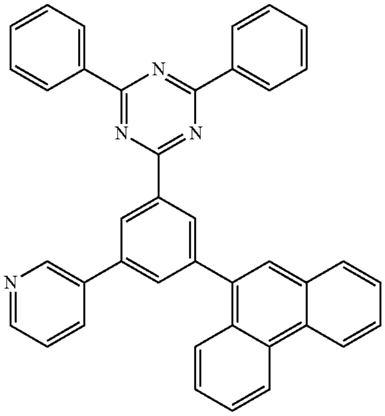
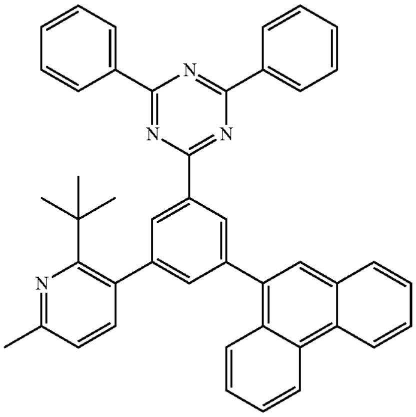
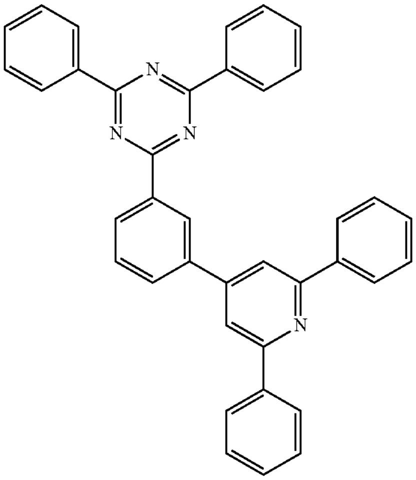
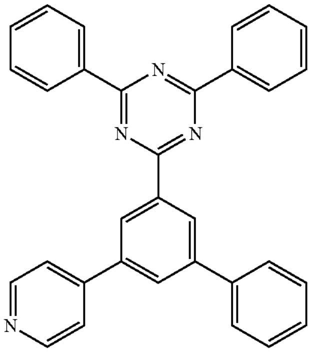

-continued
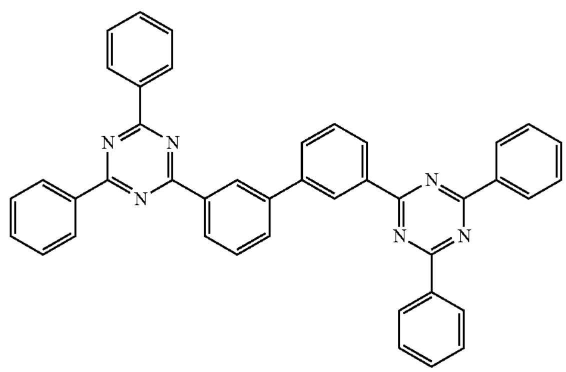
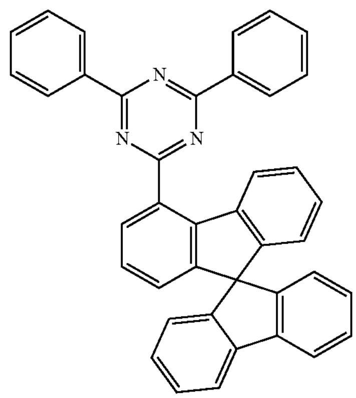
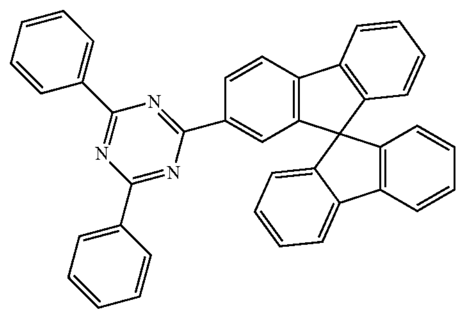
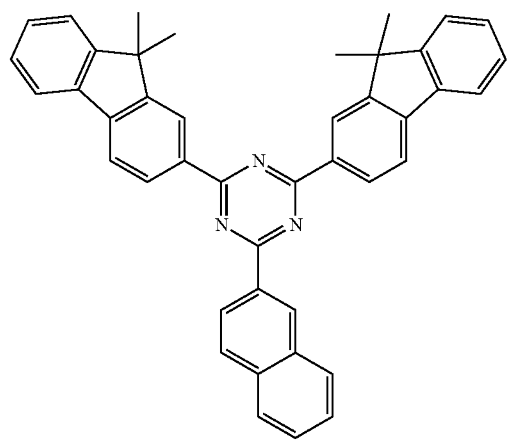
-continued
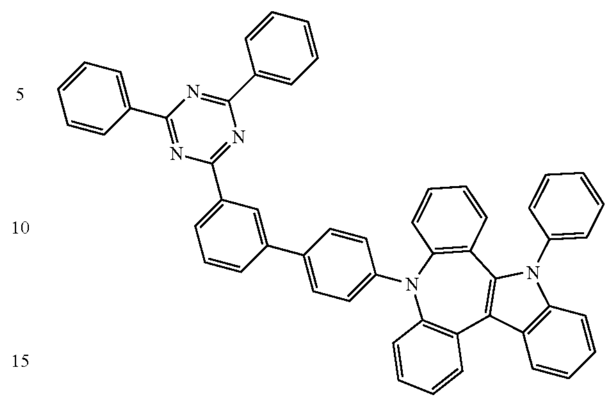
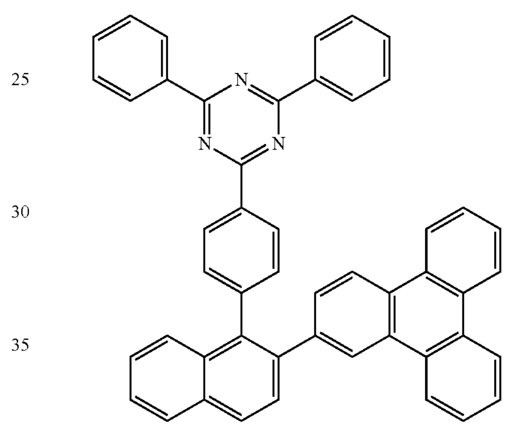
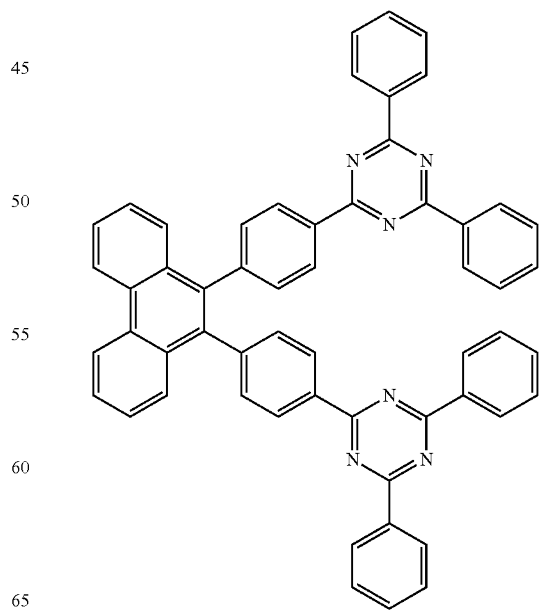

-continued
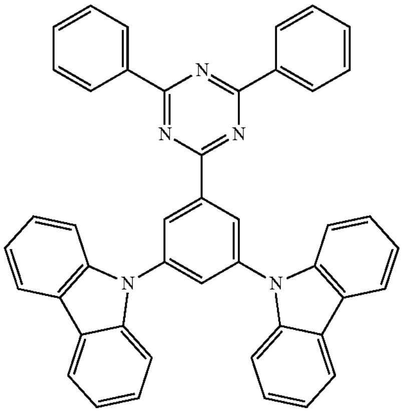
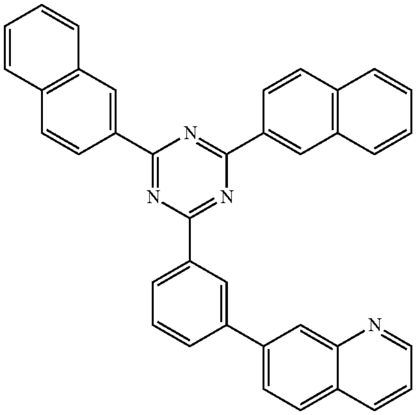
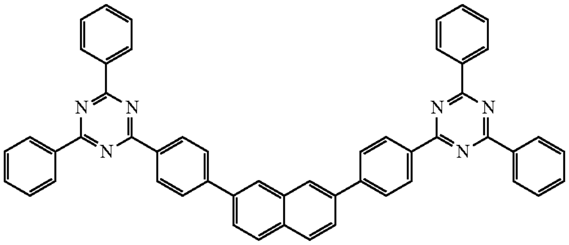
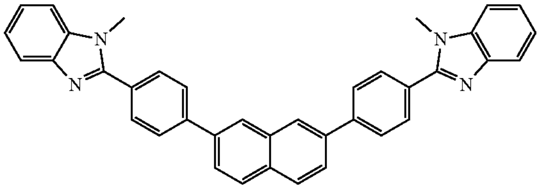
-continued
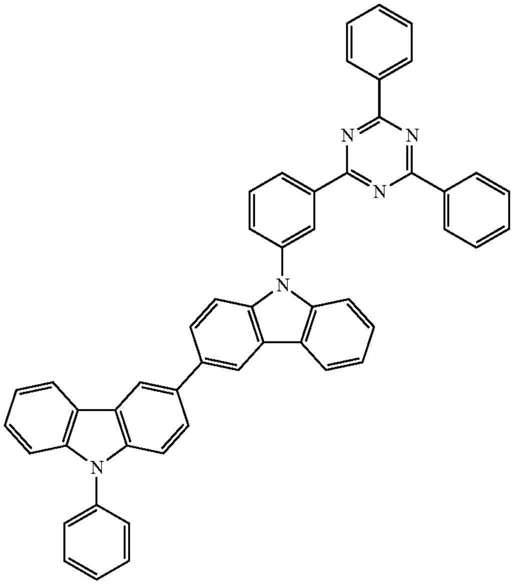
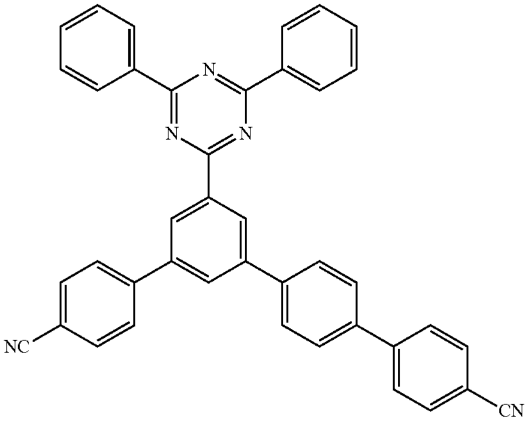
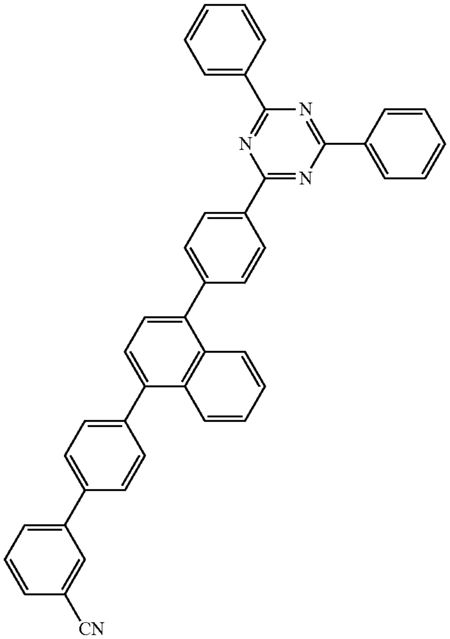

-continued
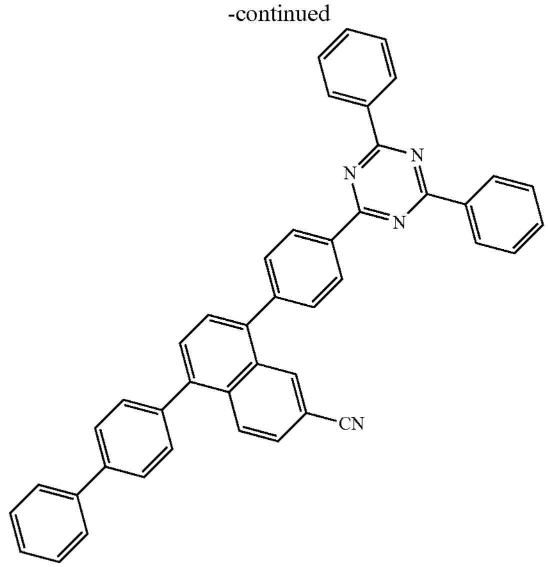
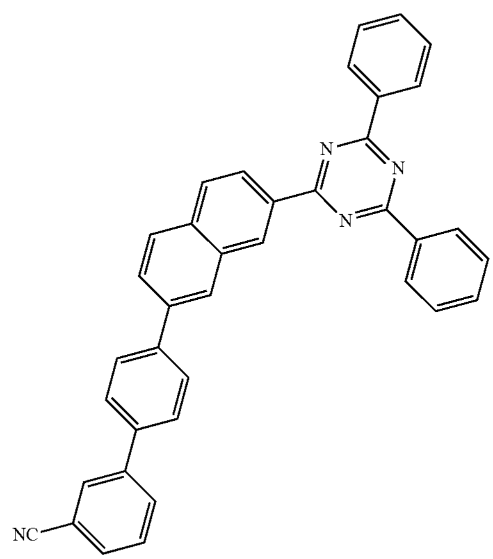
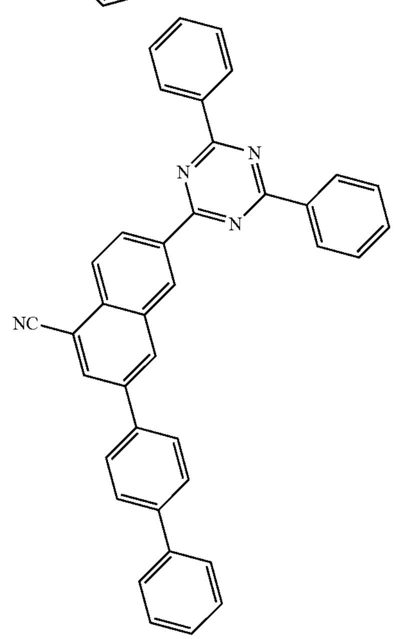
-continued
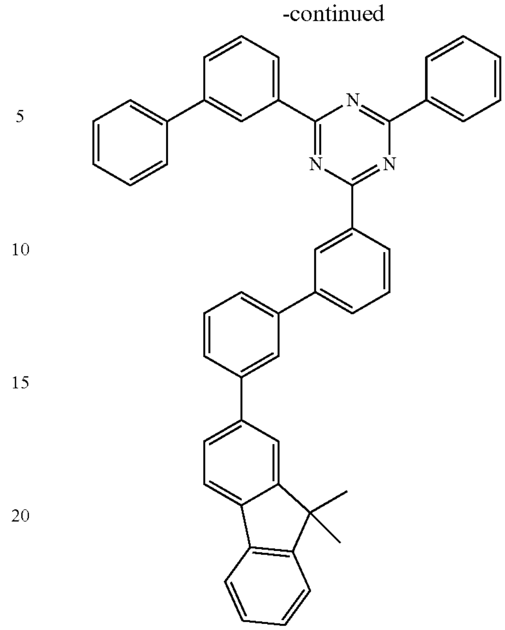
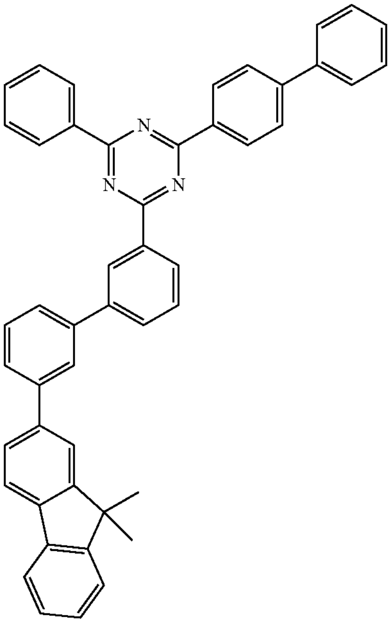

-continued
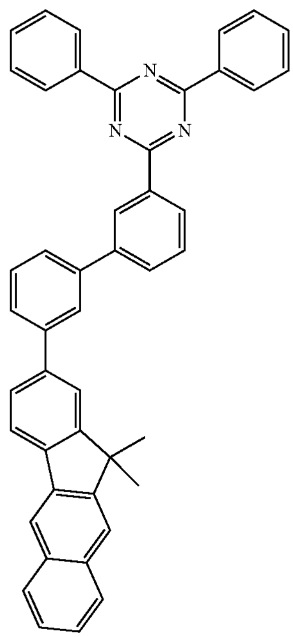
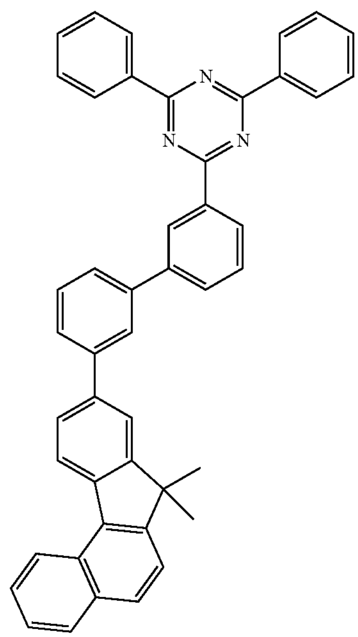
-continued
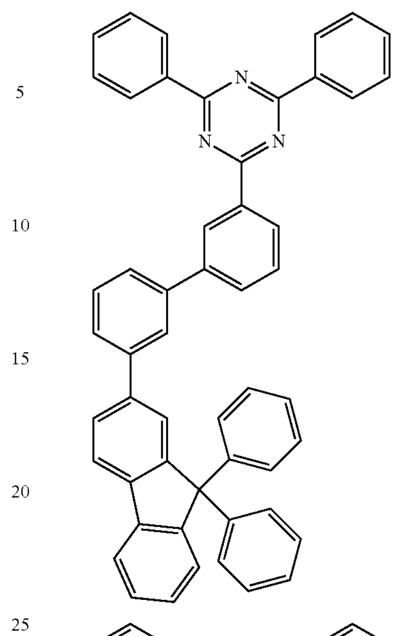
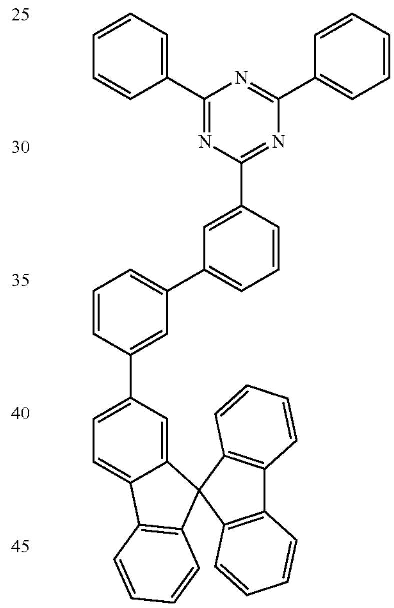
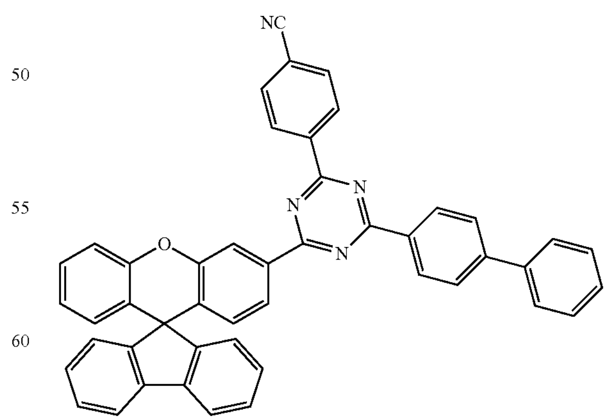

-continued

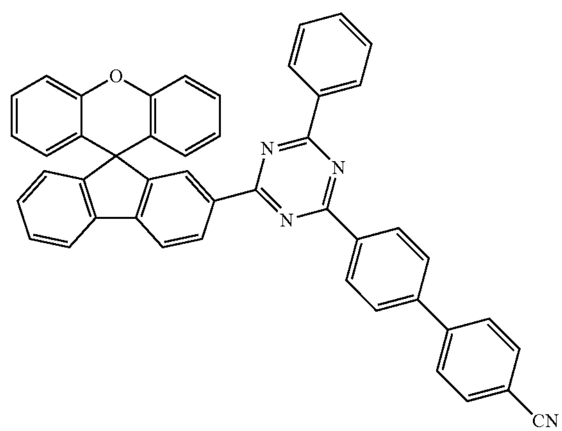

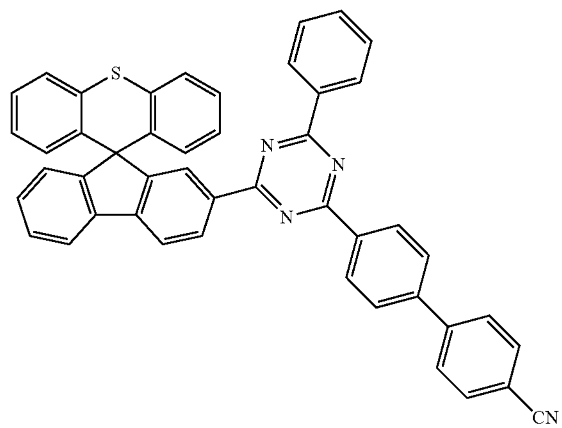

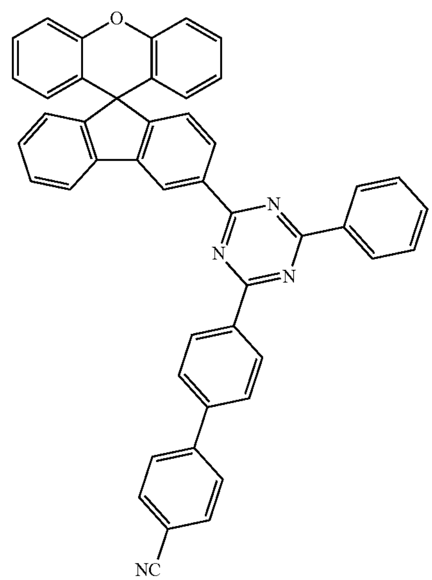

-continued

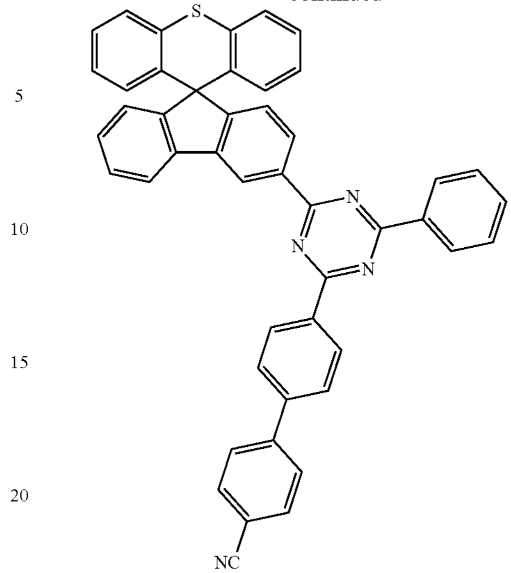

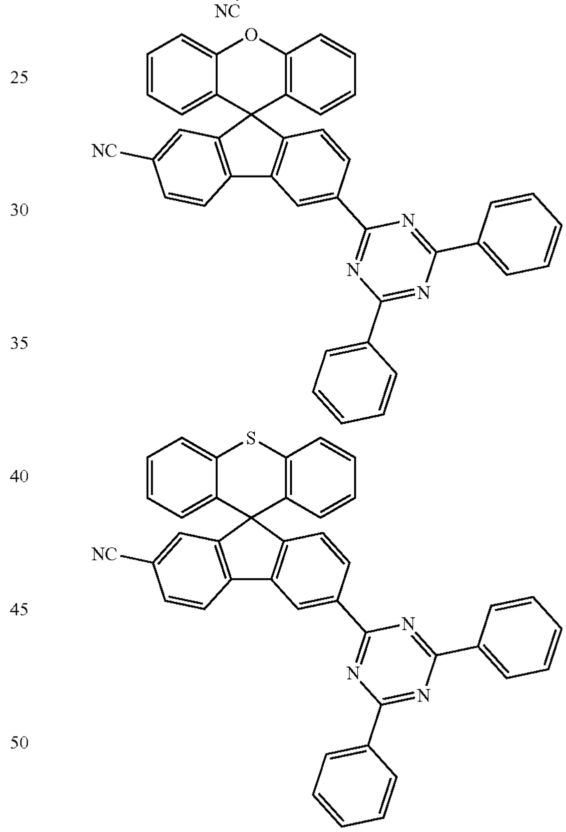

An embodiment may provide an organic light emitting diode including the light emitting layer 130 as the organic layer 105 as shown in FIG. 1.

Another embodiment may provide an organic light emitting diode including a hole transport region 140 in addition to the light emitting layer 130 as the organic layer 105, as shown in FIG. 2.

Another embodiment may provide an organic light emitting diode including an electron transport region 150 in addition to the light emitting layer 130 as the organic layer 105 as shown in FIG. 3.

Figure 4:
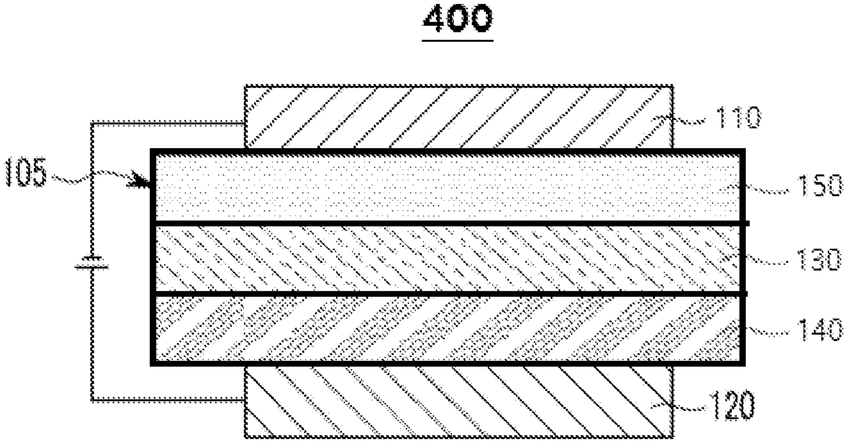

Another embodiment may provide an organic light emitting diode including a hole transport region 140 and an electron transport region 150 in addition to the light emitting layer 130 as the organic layer 105, as shown in FIG. 4.

In another embodiment, an organic light emitting diode may further include an electron injection layer, a hole injection layer, or the like, in addition to the light emitting layer 130 as the organic layer 105 in each of FIGS. 1 to 4.

The organic light emitting diodes 100, 200, 300, and 400 may be manufactured by forming an anode or a cathode on a substrate, and then forming an organic layer by a dry film method such as vacuum deposition, sputtering, plasma plating and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in examples and synthesis examples were purchased from Sigma-Aldrich Co. Ltd., TCI Inc., Tokyo Chemical Industry Co., Ltd., or P&H Tech Co., Ltd., as far as there is no particular comment or were synthesized by suitable methods.

(Preparation of Compound for Organic Optoelectronic Device)

Compounds were synthesized through the following steps.

Synthesis Example 1: Synthesis of Compound 1

1st Step: Synthesis of Intermediate M-1

[Reaction Scheme 1]

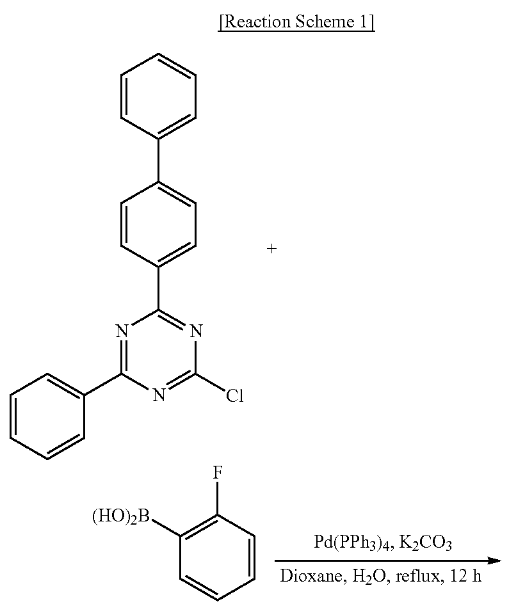

-continued

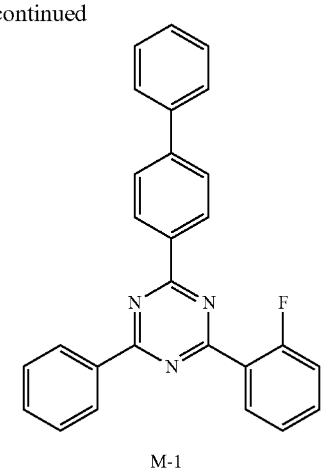

M-1

49 g (142.5 mmol) of 2-([1,1'-biphenyl]-4-yl)-4-chloro-6-phenyl-1,3,5-triazine and 18 g (128.6 mmol) of (2-fluorophenyl)boronic acid were dissolved in 400 ml of dioxane, and 132 ml of an aqueous solution in which 53 g (383 mmol) of $K_2CO_3$ was dissolved was added thereto and then, stirred. Subsequently, 7.43 g (6.43 mmol) of $Pd(PPh_3)_4$ was added thereto and then, stirred under reflux for 12 hours under a nitrogen atmosphere. When a reaction was completed, a solid produced therein was filtered and separated under a reduced pressure, dissolved in toluene, and recrystallized to obtain Intermediate M-1 (39 g, Yield: 75%).

LC-MS M+H: 404.4 g/mol

2nd Step: Synthesis of Intermediate M-2

[Reaction Scheme 2]

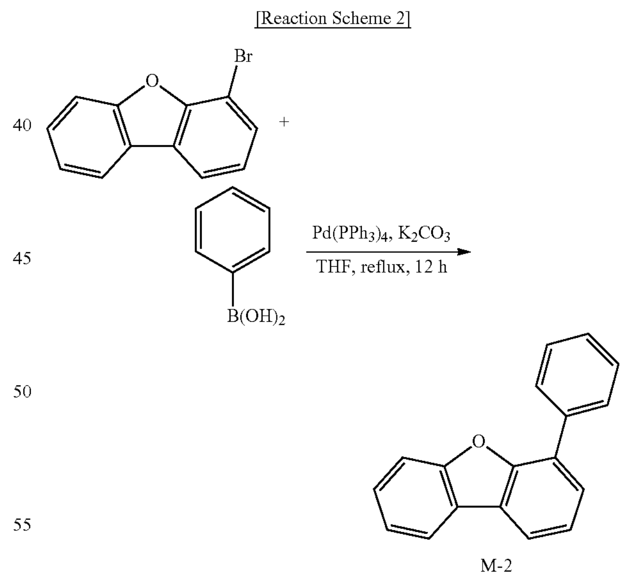

M-2

75 g (305 mmol) of 4-bromodibenzofuran and 45 g (365 mmol) of phenylboronic acid were dissolved in 760 ml of tetrahydrofuran, and 381 ml of an aqueous solution in which 126.5 g (915 mmol) of $K_2CO_3$ was dissolved was added thereto and then, stirred. Subsequently, 17.62 g (15.25 mmol) of $Pd(PPh_3)_4$ was added thereto and then, stirred under reflux for 12 hours under a nitrogen atmosphere. When a reaction was completed, water was added to the reaction solution and then, extracted with ethyl acetate (EA), treated with anhydrous magnesium sulfate to remove moisture therefrom, filtered, and concentrated under a reduced pressure. The obtained residue was separated and purified through flash column chromatography to obtain Intermediate M-2 (73.12 g, Yield: 98%).

LC-MS M+H: 245.01 g/mol

3rd Step: Synthesis of Intermediate M-3

[Reaction Scheme 3]

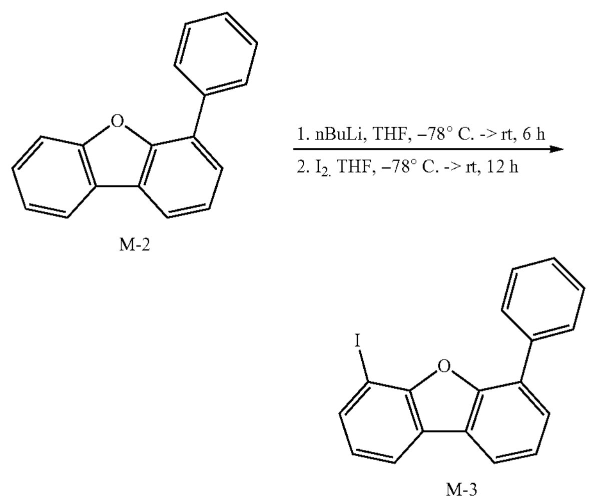

M-2

M-3

73.12 g (298 mmol) of Intermediate M-2 was dissolved in 750 ml of tetrahydrofuran and then, cooled down to −78° C. and then, stirred under a nitrogen atmosphere. Subsequently, 192 ml (479 mmol) of a 2.5 M n-BuLi solution in n-hexane was slowly added thereto and then, stirred at room temperature under a nitrogen atmosphere for 6 hours. The reaction solution was cooled down to −78° C., and 121.57 g (479 mmol) of iodine dissolved in 100 ml of tetrahydrofuran was added thereto and then, stirred at room temperature under a nitrogen atmosphere for 12 hours. When a reaction was completed, water was added to the reaction solution and then, extracted with ethyl acetate (EA), treated with anhydrous magnesium sulfate to remove moisture therefrom, filtered, and concentrated under a reduced pressure. The obtained residue was separated and purified through flash column chromatography to obtain Intermediate M-3 (64.62 g, Yield: 85%).

LC-MS M+H: 372.2 g/mol,

4th Step: Synthesis of Intermediate M-4

[Reaction Scheme 4]

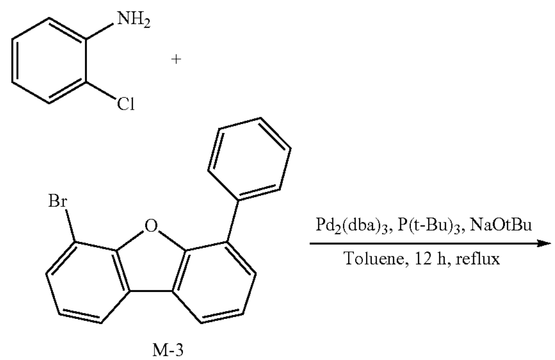

M-3

-continued

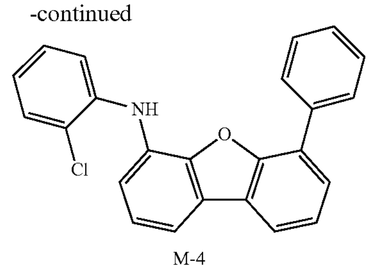

M-4

Intermediate M-3 (40 g, 174.6 mmol), 2-chloroaniline (26.7 g, 209.5 mmol), NaOtBu (25.2 g, 261.8 mmol), and $Pd_2(dba)_3$ (8 g, 8.7 mmol) were suspended in 873 ml of toluene and then, 50 wt % of $P(t\text{-}Bu)_3$ (10.6 ml, 26.2 mmol) was added thereto and then, stirred under reflux for 12 hours under a nitrogen atmosphere. Subsequently, distilled water was added to the reaction solution to separate the mixture. A product obtained therefrom was dissolved in toluene and then, recrystallized to obtain Intermediate M-4 (43.3 g, Yield: 67%).

LC-MS M+H: 369.85 g/mol,

5th Step: Synthesis of Intermediate M-5

[Reaction Scheme 5]

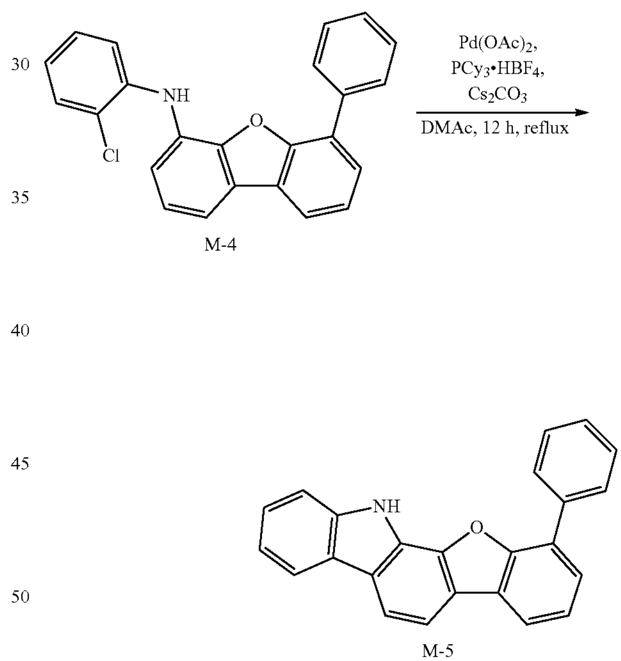

M-4

M-5

Intermediate M-4 (29.6 g, 80.17 mmol), $Cs_2CO_3$ (78.36 g, 240.51 mmol), $PCy_3 \cdot HBF_4$ (6.02 g, 16.34 mmol), and $Pd(OAc)_2$ (1.84 g, 8.17 mmol) were added to 800 ml of dimethylacetamide and then, stirred under reflux for 12 hours under a nitrogen atmosphere. When a reaction was completed, distilled water was added to the reaction solution to separate the mixture. A product obtained therefrom was dissolved in toluene and then, recrystallized to obtain Intermediate M-5 (13.9 g, Yield: 52%).

LC-MS M+H: 333.39 g/mol,

6th Step: Synthesis of Compound 1

[Reaction Scheme 6]

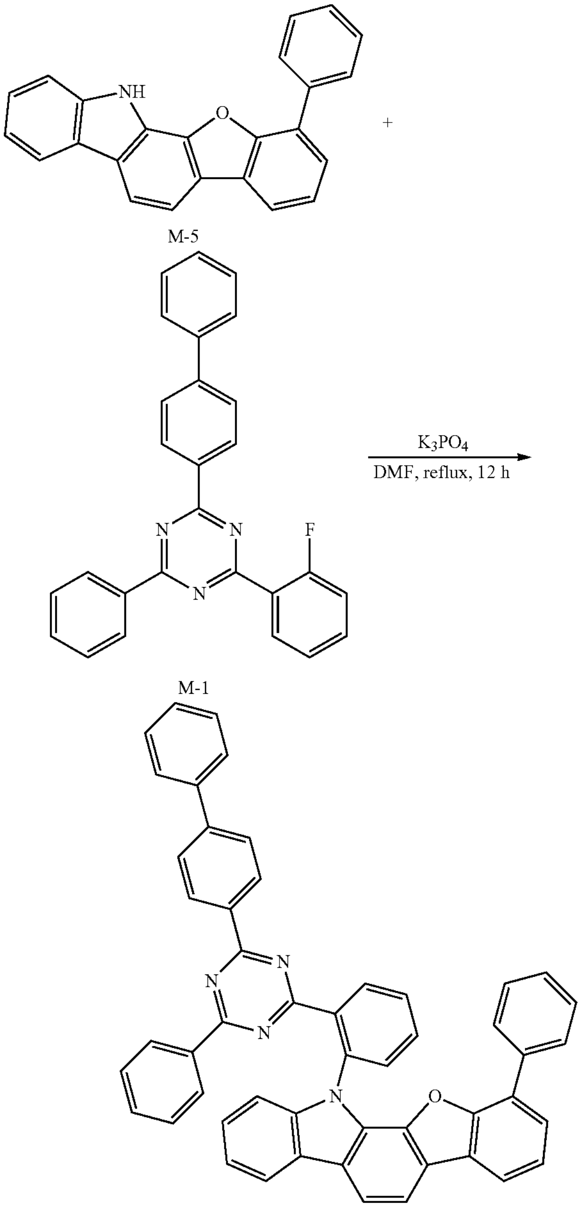

M-5

M-1

1

Intermediate M-5 (2 g, 6 mmol) and Intermediate M-1 (3.63 g, 9.01 mmol) were dissolved in 21 ml of dimethylformamide (DMF) under a nitrogen atmosphere, and potassium phosphate tribasic (3.19 g, 15.01 mmol) was added thereto and then, heated under reflux for 12 hours. When a reaction was completed, distilled water was added to the reaction solution, and a solid produced therein was filtered. A product obtained therefrom was dissolved in toluene and then, recrystallized to obtain Compound 1 (3.44 g, Yield: 80%).

LC-MS M+H: 716.84 g/mol,

Synthesis Example 2: Synthesis of Compound 2

1st Step: Synthesis of Intermediate M-6

[Reaction Scheme 7]

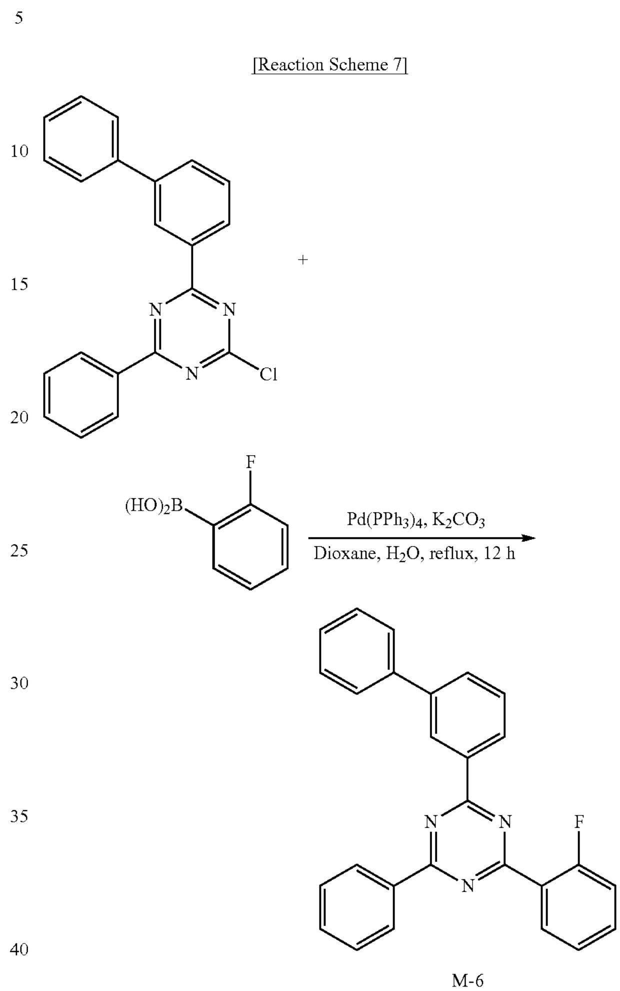

M-6

Intermediate M-6 (19 g, Yield: 90%) was obtained according to the same method as Synthesis Example 1 except that 18 g (52 mmol) of 2-([1,1'-biphenyl]-3-yl)-4-chloro-6-phenyl-1,3,5-triazine was used instead of the 2-([1,1'-biphenyl]-4-yl)-4-chloro-6-phenyl-1,3,5-triazine in Reaction Scheme 1 of the 1st step of Synthesis Example 1.

LC-MS M+H: 403.46 g/mol,

2nd Step: Synthesis of Compound 2

[Reaction Scheme 8]

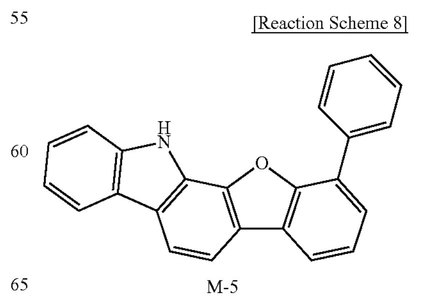

M-5

-continued

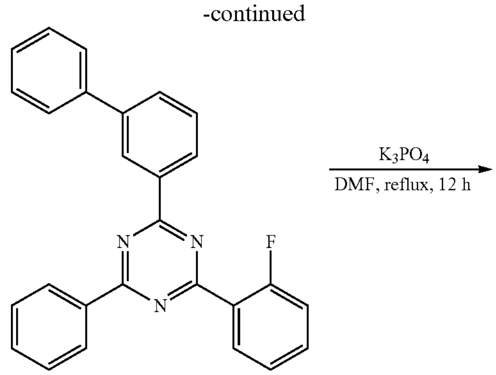

M-6

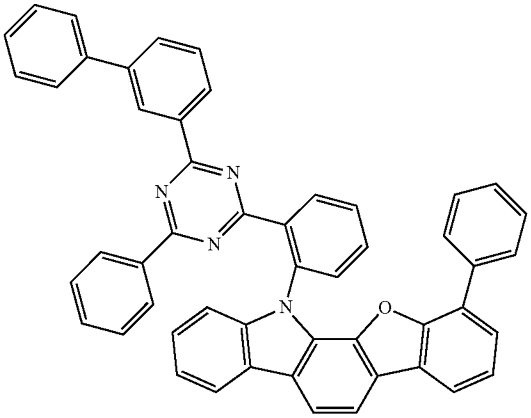

2

Compound 2 (10.53 g, Yield: 83%) was obtained according to the same method as Synthesis Example 2 except that 10.72 g (26.57 mmol) of Intermediate M-6 was used instead of Intermediate M-1 in Reaction Scheme 6 of the 6th step of Synthesis Example 2.

LC-MS M+H: 716.84 g/mol,

Synthesis Example 3: Synthesis of Compound 5

1st Step: Synthesis of Intermediate M-8

[Reaction Scheme 9]

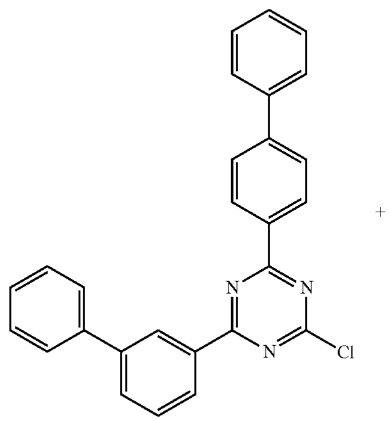

M-7

-continued

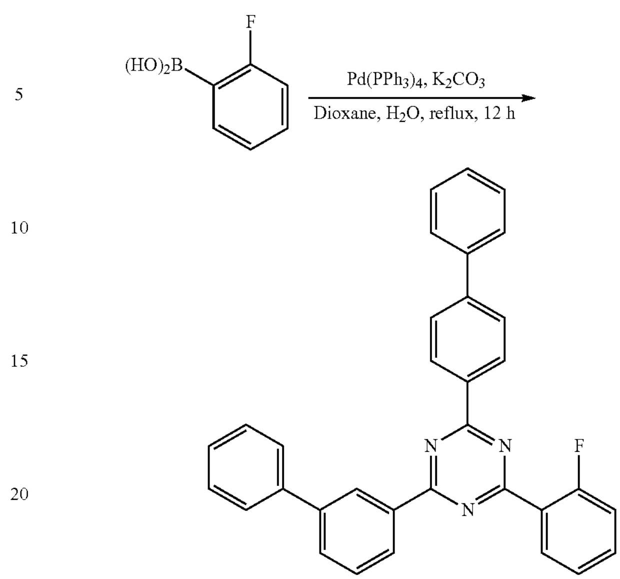

M-8

Intermediate M-8 (29.49 g, Yield: 86%) was obtained according to the same method as Synthesis Example 1 except that 30 g (71.5 mmol) of Intermediate M-7 (2-([1,1'-biphenyl]-3-yl)-4-([1,1'-biphenyl]-4-yl)-6-chloro-1,3,5-triazine) was used instead of the 2-([1,1'-biphenyl]-4-yl)-4-chloro-6-phenyl-1,3,5-triazine in Reaction Scheme 1 of the 1st step of Synthesis Example 1.

LC-MS M+H: 479.56 g/mol,

2nd Step: Synthesis of Compound 5

[Reaction Scheme 10]

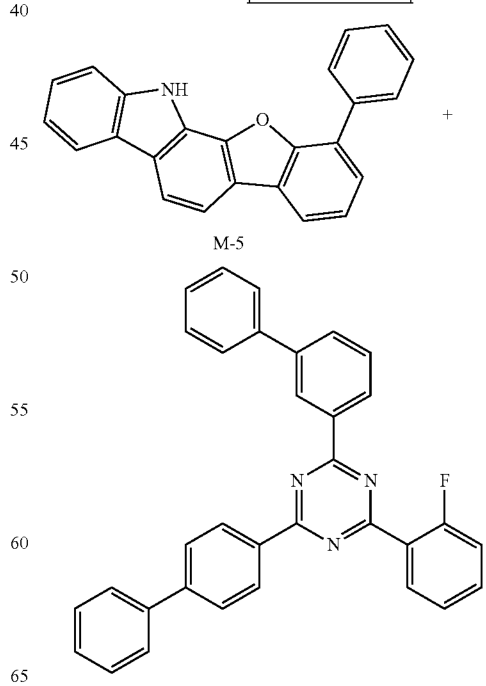

M-5

M-8

K$_3$PO$_4$
DMF,
reflux,
12 h

-continued

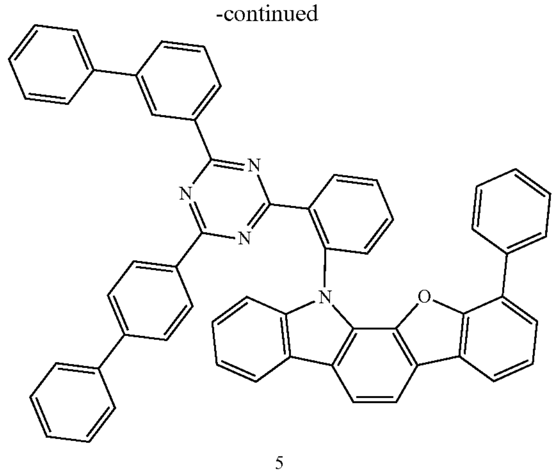

5

Compound 5 (11.99 g, Yield: 84%) was obtained according to the same method as Synthesis Example 2 except that 11.21 g (23.4 mmol) of Intermediate M-8 was used instead of Intermediate M-1 in Reaction Scheme 6 of the 6th step of Synthesis Example 2.

LC-MS M+H: 792.94 g/mol,

Synthesis Example 4: Synthesis of Compound 16

1st Step: Synthesis of Intermediate M-9

[Reaction Scheme 11]

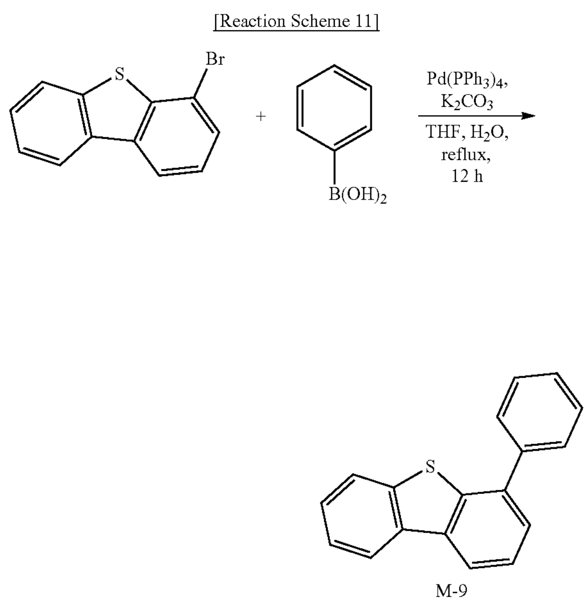

M-9

Intermediate M-9 (26.88 g, Yield: 89%) was obtained according to the same method as Synthesis Example 1 except that 30.5 g (116 mmol) of 4-bromodibenothiophene was used instead of the 4-bromodibenzofuran in Reaction Scheme 2 of the 2nd step of Synthesis Example 1.

LC-MS M+H: 260.35 g/mol,

2nd Step: Synthesis of Intermediate M-10

[Reaction Scheme 12]

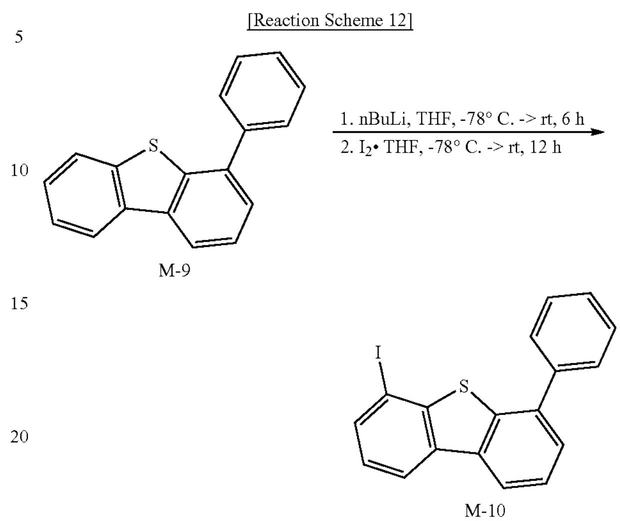

M-9

M-10

Intermediate M-10 (30 g, Yield: 75%) was obtained according to the same method as Synthesis Example 1 except that 26.88 g (103 mmol) of Intermediate M-9 was used instead of Intermediate M-2 in Reaction Scheme 3 of the 3rd step of Synthesis Example 1.

LC-MS M+H: 386.25 g/mol,

3rd Step: Synthesis of Intermediate M-11

[Reaction Scheme 13]

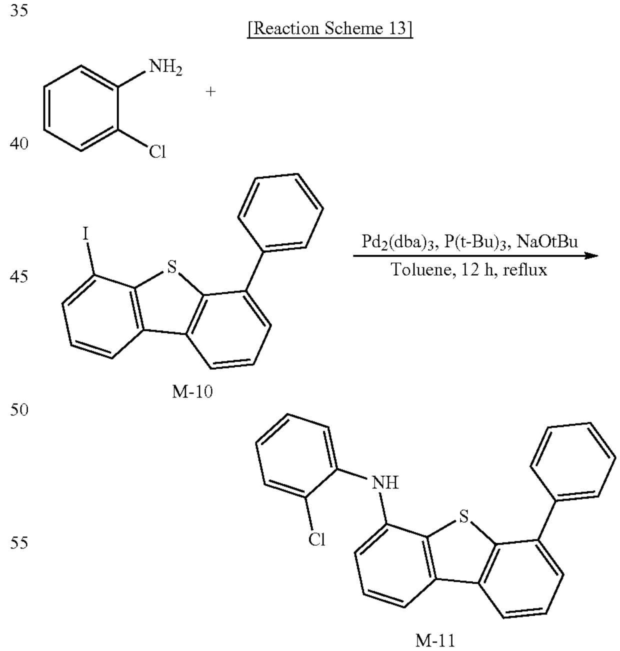

M-10

M-11

Intermediate M-11 (21.5 g, Yield: 72%) was obtained according to the same method as Synthesis Example 1 except that 30 g (77.67 mmol) of Intermediate M-10 was used instead of Intermediate M-3 in Reaction Scheme 4 of the 4th step of Synthesis Example 1.

LC-MS M+H: 385.91 g/mol,

4th Step: Synthesis of Intermediate M-12

[Reaction Scheme 14]

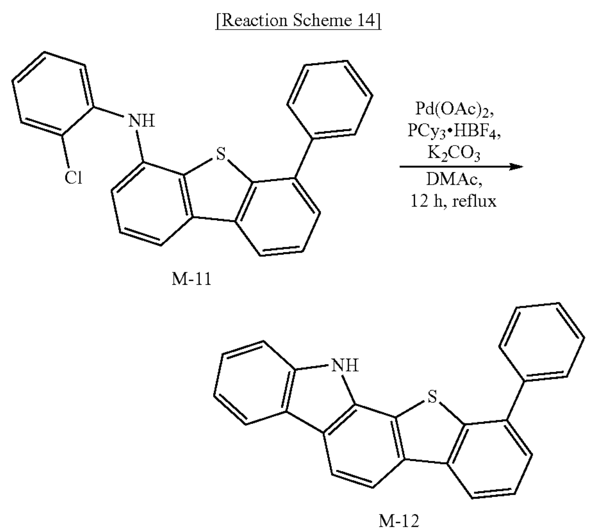

M-11

M-12

Intermediate M-12 (4.48 g, Yield: 23%) was obtained according to the same method as Synthesis Example 1 except that 21.5 g (55.71 mmol) of Intermediate M-11 was used instead of Intermediate M-4 in Reaction Scheme 5 of the 5th step of Synthesis Example 1.

LC-MS M+H: 349.45 g/mol,

5th Step: Synthesis of Compound 16

[Reaction Scheme 15]

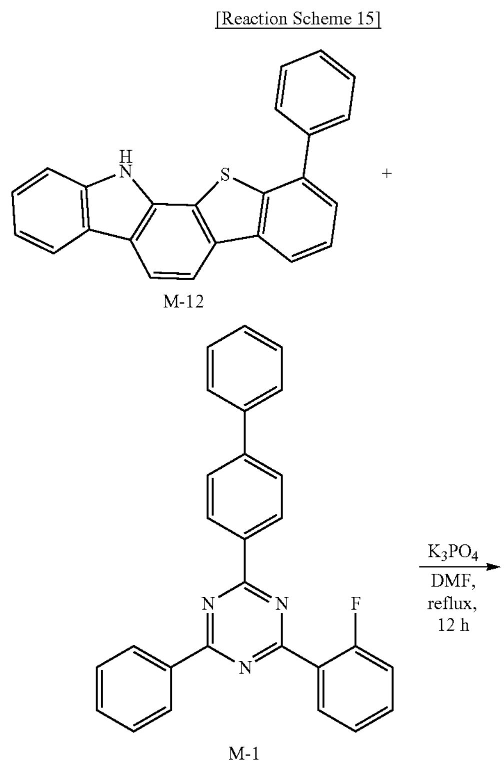

M-12

+

M-1

-continued

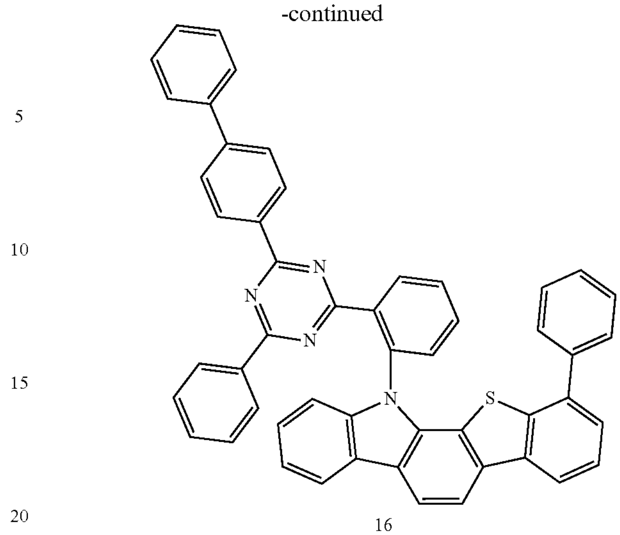

16

Compound 16 (9.01 g, Yield: 80%) was obtained according to the same method as Synthesis Example 1 except that 4.48 g (12.81 mmol) of Intermediate M-12 was used instead of Intermediate M-5 in Reaction Scheme 6 of the 6th step of Synthesis Example 1.

LC-MS M+H: 732.91 g/mol,

Synthesis Example 5: Synthesis of Compound 31

1st Step: Synthesis of Intermediate M-13

[Reaction Scheme 16]

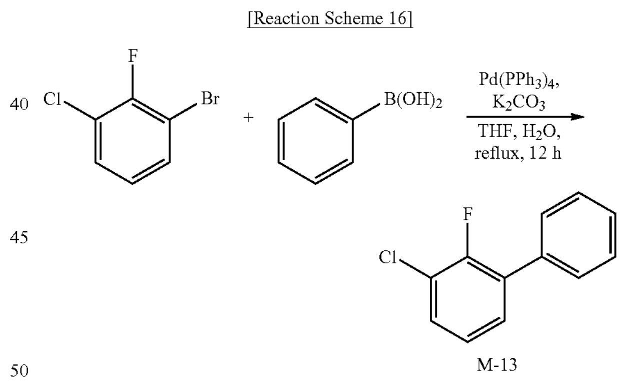

+

M-13

40 g (192.43 mmol) of 1-bromo-3-chloro-2-fluorobenzene and 25.8 g (211.67 mmol) of phenylboronic acid were dissolved in 500 ml of tetrahydrofuran, and 320 ml of an aqueous solution in which 79.2 g (573 mmol) of $K_2CO_3$ was dissolved was added thereto and then, stirred. Subsequently, 8.7 g (9.6 mmol) of $Pd(PPh_3)_4$ was added thereto and then, stirred under reflux for 12 hours under a nitrogen atmosphere. When a reaction was completed, water was added to the reaction solution and then, extracted with ethyl acetate (EA), treated with anhydrous magnesium sulfate to remove moisture, filtered, and concentrated under a reduced pressure. The obtained residue was separated and purified through flash column chromatography to obtain Intermediate M-13 (34.59 g, Yield: 87%).

LC-MS M+H: 206.64 g/mol

2nd Step: Synthesis of Intermediate M-14

[Reaction Scheme 17]

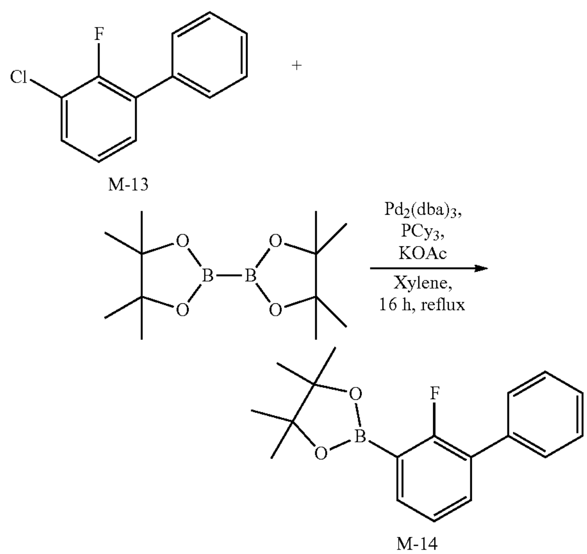

M-13

M-14

Intermediate M-13 (34.59 g, 167.42 mmol) was dissolved in 837 ml of xylene under a nitrogen atmosphere, and then, potassium acetate (49.3 g, 502.2 mmol), bis(pinacolato) diboron (46.8 g, 184.1 mmol), tris(dibenzylideneacetone) dipalladium (0) (7.7 g, 8.4 mmol), and tricyclohexylphosphine (9.4 g, 33.5 mmol) were added thereto and then, heated under reflux for 8 hours. When a reaction was completed, water was added to the reaction solution and then, extracted with dichloromethane (DCM), treated with anhydrous magnesium sulfate to remove moisture therefrom, filtered, and concentrated under a reduced pressure. The obtained residue was separated and purified through flash column chromatography to obtain Intermediate M-14 (27.96 g, Yield: 56%).

LC-MS M+H: 298.16 g/mol

3rd Step: Synthesis of Intermediate M-15

[Reaction Scheme 18]

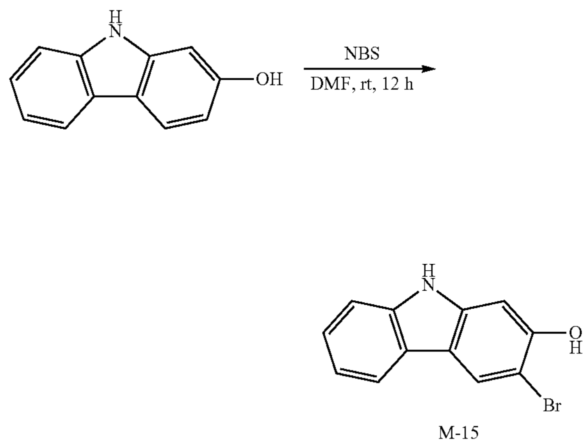

M-15

9H-carbazol-2-ol (16.27 g, 88.80 mmol) was dissolved in 222 ml of N,N-dimethylformamide (DMF) in a nitrogen environment, and N-bromosuccinimide (17.39 g, 97.68 mmol) was slowly added thereto at room temperature and then, stirred for 10 hours. When a reaction was completed, the resultant was neutralized with sodium thiosulfate saturated in water at 0° C. Subsequently, the neutralized product was extracted with dichloromethane (DCM), treated with anhydrous magnesium sulfate to remove moisture therefrom, filtered, and concentrated under a reduced pressure. The obtained residue was separated and purified through flash column chromatography to obtain Intermediate M-15 (20.48 g, Yield: 88%).

LC-MS M+H: 262.11 g/mol

4th Step: Synthesis of Intermediate M-16

[Reaction Scheme 19]

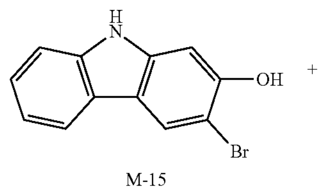

M-15

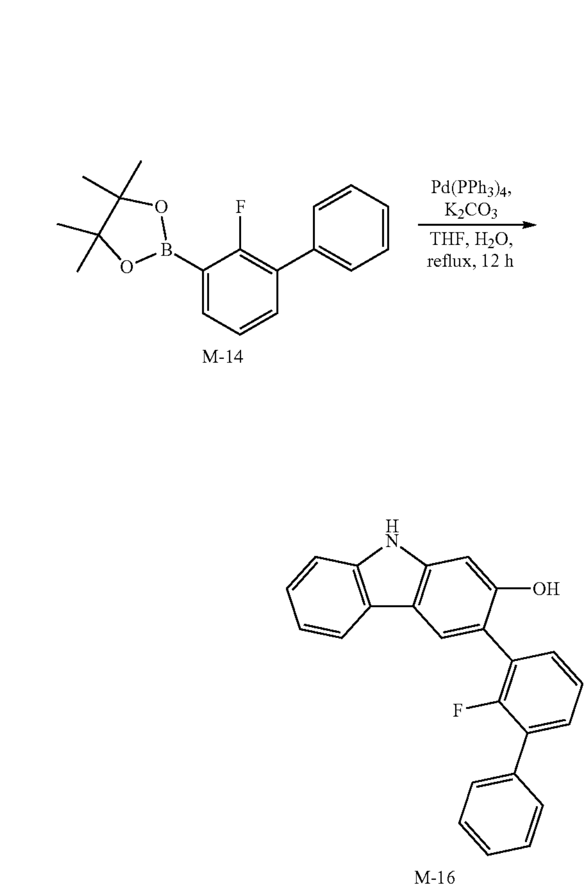

M-14

M-16

Intermediate M-16 (11.88 g, Yield: 43%) was obtained according to the same method as Synthesis Example 5 except that 20.48 g (78.14 mmol) of Intermediate M-15 was used instead of phenylboronic acid, and 27.96 g (93.76 mmol) of Intermediate M-14 was used instead of the 1-bromo-3-chloro-2-fluorobenzene in Reaction Scheme 16 of the 1st step of Synthesis Example 5.

LC-MS M+H: 353.4 g/mol

5th Step: Synthesis of Intermediate M-17

[Reaction Scheme 20]

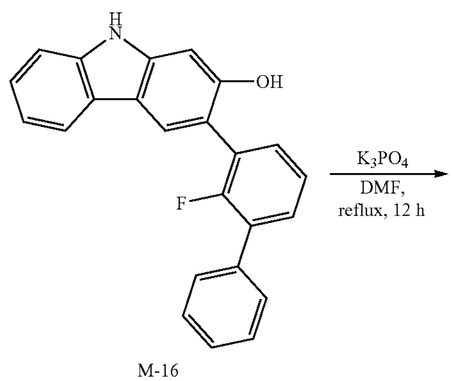

M-16

-continued

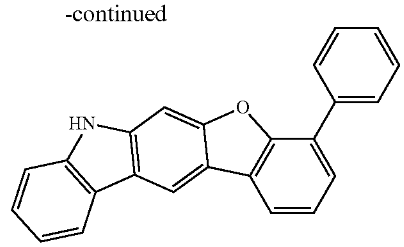

M-17

Intermediate M-16 (11.88 g, 33.62 mmol) was dissolved in 180 ml of dimethylformamide (DMF) under a nitrogen atmosphere, and potassium phosphate tribasic (14.27 g, 67.24 mmol) was added thereto and then, heated under reflux for 12 hours. When a reaction was completed, distilled water was added to the reaction solution, and a solid produced therein was filtered. A product obtained therefrom was dissolved in toluene and then, recrystallized to obtain Intermediate M-17 (8.63 g, Yield: 77%).

LC-MS M+H: 333.39 g/mol

6th Step: Synthesis of Compound 31

[Reaction Scheme 21]

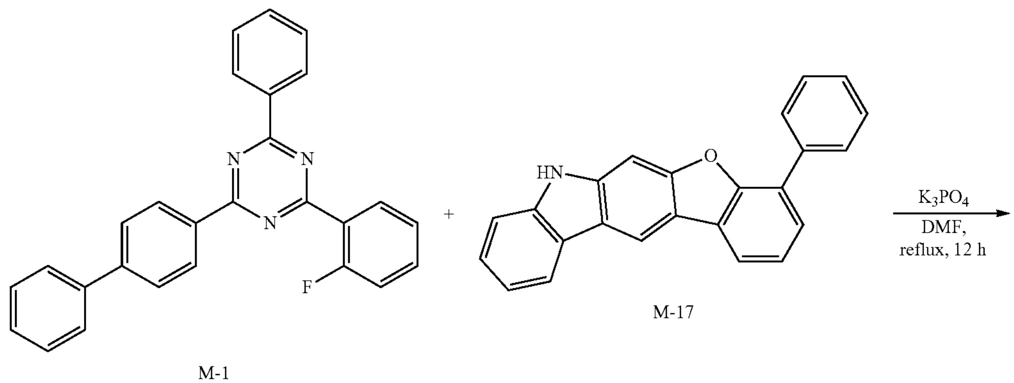

M-1

M-17

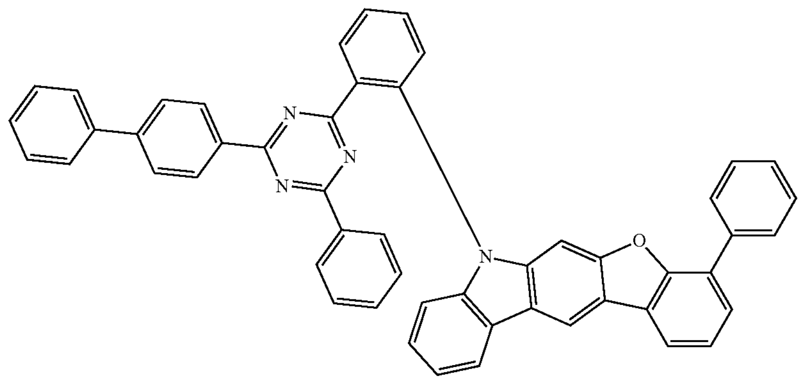

31

Compound 31 (15.42 g, Yield: 83%) was obtained according to the same method as Synthesis Example 1 except that 8.63 g (25.9 mmol) of intermediate M-17 was used instead of Intermediate M-5 in Reaction Scheme 6 of the 6th step of Synthesis Example 1.

LC-MS M+H: 716.84 g/mol

Synthesis Example 6: Synthesis of Compound 91

1st Step: Synthesis of Intermediate M-18

[Reaction Scheme 22]

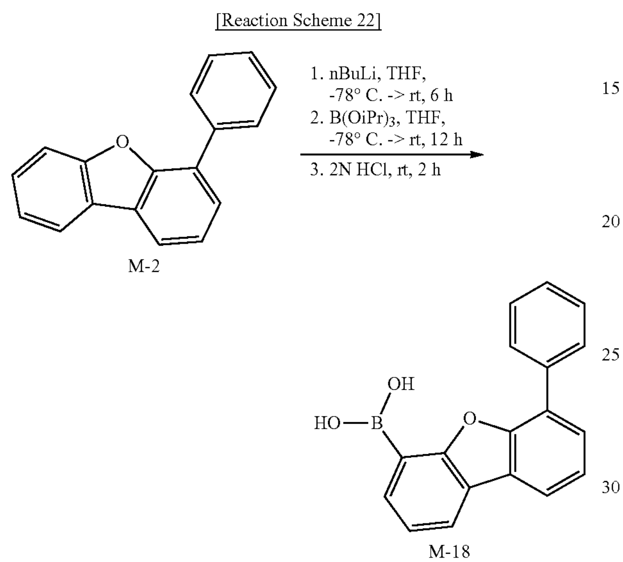

M-2

M-18

40 g (163.8 mmol) of Intermediate M-2 was dissolved in 410 ml of tetrahydrofuran and then, cooled down to −78° C. and stirred under a nitrogen atmosphere. Subsequently, 85.23 ml (213.2 mmol) of a 2.5 M n-BuLi solution in n-hexane was slowly added thereto and then, stirred at room temperature under a nitrogen atmosphere for 6 hours. The reaction solution was cooled down to −78° C., and 56.77 ml (246 mmol) of triisopropylborate was slowly added thereto and then, stirred at room temperature under a nitrogen atmosphere for 6 hours. Subsequently, 106.5 ml of a 2.0 N hydrochloric acid aqueous solution was added thereto and then, stirred for 1 hour, and a solid produced therein was filtered under a reduced pressure to separate the mixture. The obtained product was dissolved in methylene chloride and then, recrystallized to obtain Intermediate M-18 (30.7 g, Yield: 65%).

LC-MS M+H: 288.11 g/mol

2nd Step: Synthesis of Intermediate M-20

[Reaction Scheme 23]

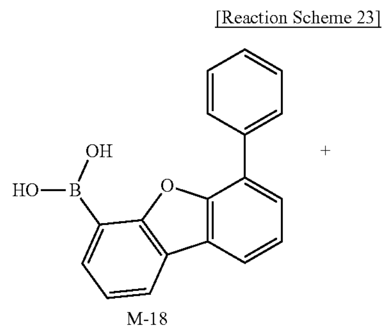

M-18

+

-continued

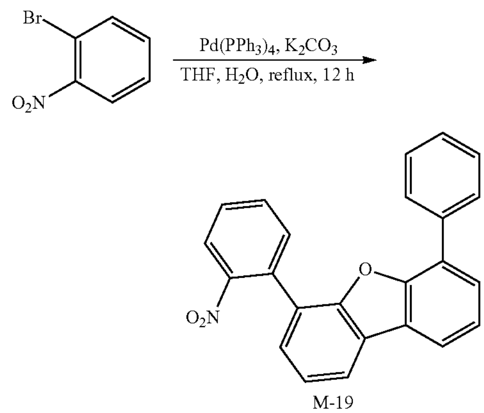

M-19

Intermediate M-19 (28.3 g, Yield: 78%) was obtained according to the same method as Synthesis Example 5 except that 17.92 g (88.72 mmol) of 1-bromo-2-nitrobenzene was used instead of the 1-bromo-3-chloro-2-fluorobenzene, and 30.7 g (106.47 mmol) of Intermediate M-18 was used instead of phenylboronic acid in Reaction Scheme 16 of the 1$^{st}$ step of Synthesis Example 5.

LC-MS M+H: 365.39 g/mol

3rd Step: Synthesis of Intermediate M-20

[Reaction Scheme 24]

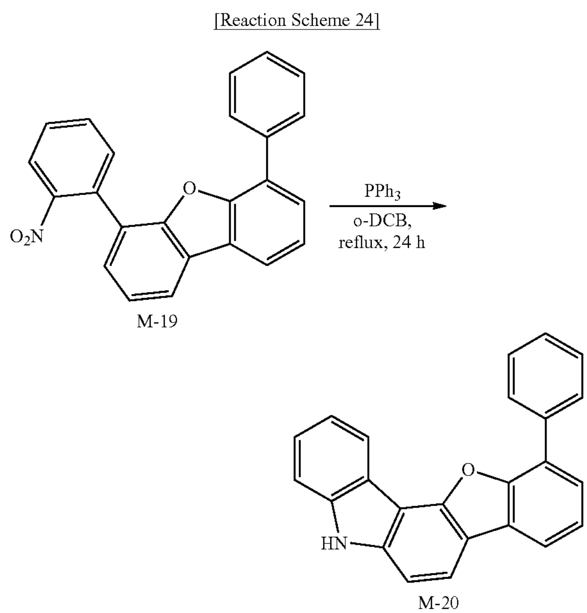

M-19

M-20

28.3 g (77.45 mmol) of Intermediate M-19 and 70 g (232.54 mmol) of triphenyiphosphine were dissolved in 110 ml of dichlorobenzene and then, stirred under a nitrogen atmosphere for 24 hours at 170° C. When a reaction was completed, the resultant was extracted with toluene and DIW, and an extract therefrom was concentrated under a reduced pressure. A product therefrom was purified with n-hexane/dichloromethane through silica gel column chromatography to obtain Intermediate M-20 (10.33 g, Yield: 40%).

LC-MS M+H: 333.39 g/mol

4th Step: Synthesis of Compound 91

[Reaction Scheme 25]

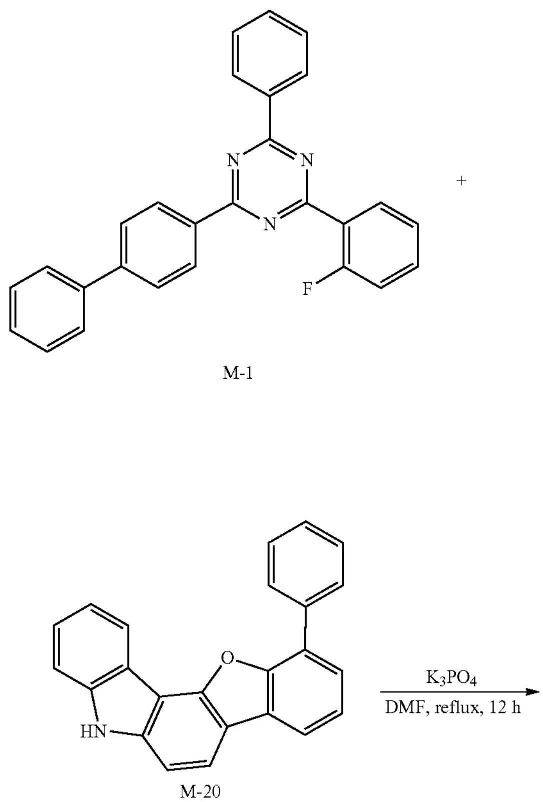

M-1

M-20

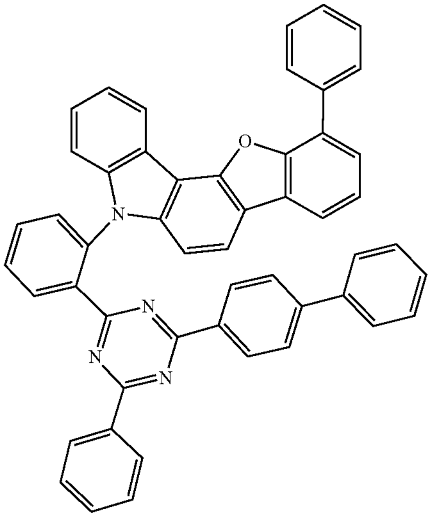

91

Compound 91 (25.4 g, Yield: 82%) was obtained according to the same method as Synthesis Example 1 except that 10.33 g (30.98 mmol) of Intermediate M-20 was used instead of Intermediate M-5 in Reaction Scheme 6 of the $6^{th}$ step of Synthesis Example 1.

LC-MS M+H: 716.84 g/mol (Synthesis of Second Compound for Organic Optoelectronic Device)

Synthesis Example 7: Synthesis of Compound A-136

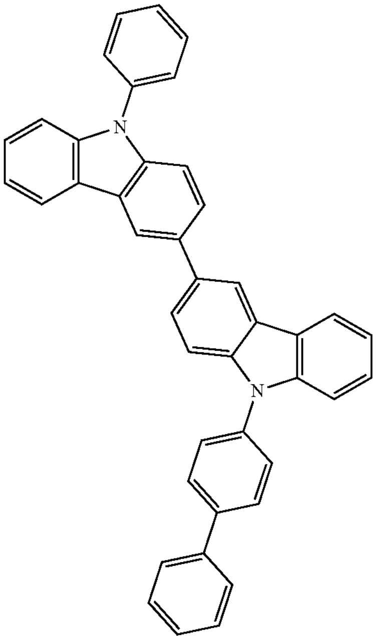 [SMILES: c1ccc(-c2ccc(-n3c4ccccc4c4cc(-c5ccc6c(c5)c5ccccc5n6-c5ccccc5)ccc43)cc2)cc1]

Compound A-136 was synthesized with reference to a method described in KR10-2019-0007968A.

Comparative Synthesis Example 1: Synthesis of Host A

1st Step: Synthesis of Intermediate M-21

[Reaction Scheme 26]

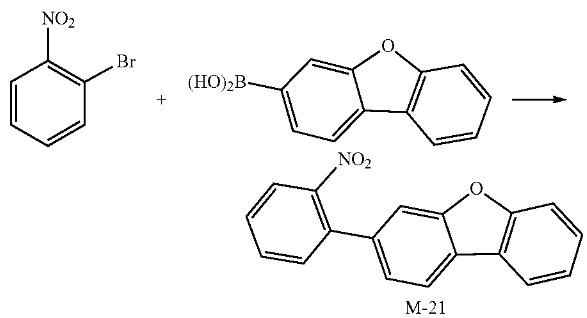

M-21

Intermediate M-21 (12.73 g, Yield: 78%) was obtained according to the same method as Synthesis Example 5 except that 10 g (49.5 mmol) of 1-bromo-2-nitrobenzene was used instead of the 1-bromo-3-chloro-2-fluorobenzene, and 12.6 g (59.4 mmol) of dibenzo[b,d]furan-3-ylboronic acid was used instead of the phenylboronic acid in Reaction Scheme 16 of the $1^{st}$ step of Synthesis Example 5.

LC-MS M+H: 289.29 g/mol

2nd Step: Synthesis of Intermediate M-22

[Reaction Scheme 27]

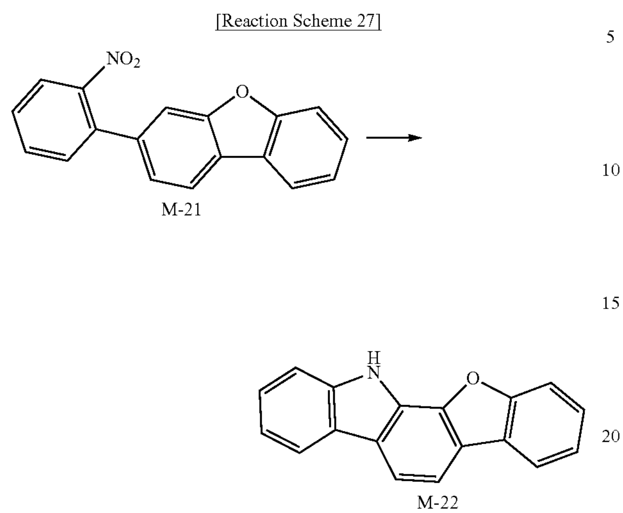

M-21

M-22

Intermediate M-22 (7.14 g, Yield: 63%) was obtained according to the same method as Synthesis Example 6 except that 12.73 g (44.05 mmol) of Intermediate M-21 was used instead of Intermediate M-19 in Reaction Scheme 24 of the 3rd step of Synthesis Example 6.

LC-MS M+H: 257.29 g/mol

3rd Step: Synthesis of HOST A

[Reaction Scheme 28]

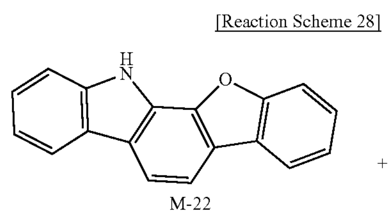

M-22

+

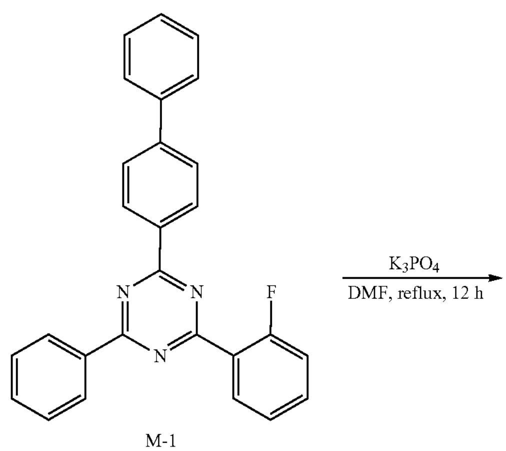

M-1

-continued

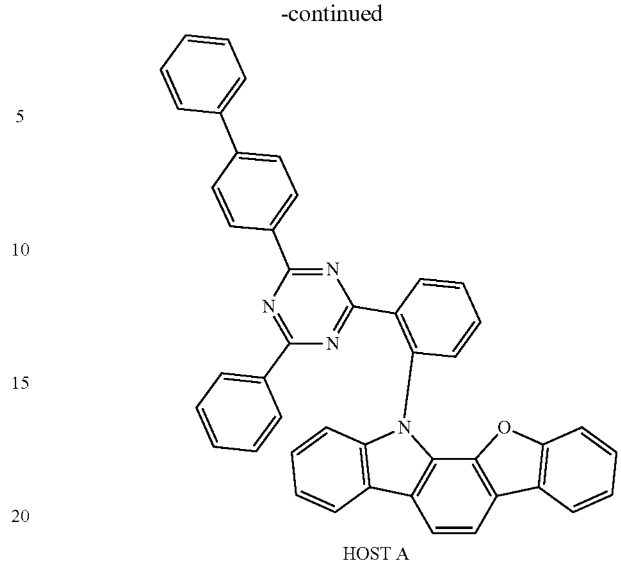

HOST A

HOST A (14.19 g, Yield: 80%) was obtained according to the same method as Synthesis Example 1 except that 7.14 g (27.7 mmol) of Intermediate M-22 was used instead of Intermediate M-5 in Reaction Scheme 6 of the 6th step of Synthesis Example 1.

LC-MS M+H: 640.75 g/mol

Comparative Synthesis Example 2: Synthesis of Host B

[Reaction Scheme 29]

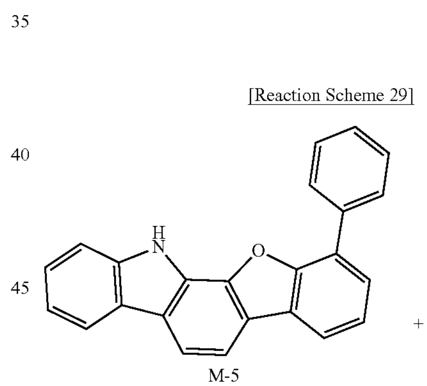

M-5

+

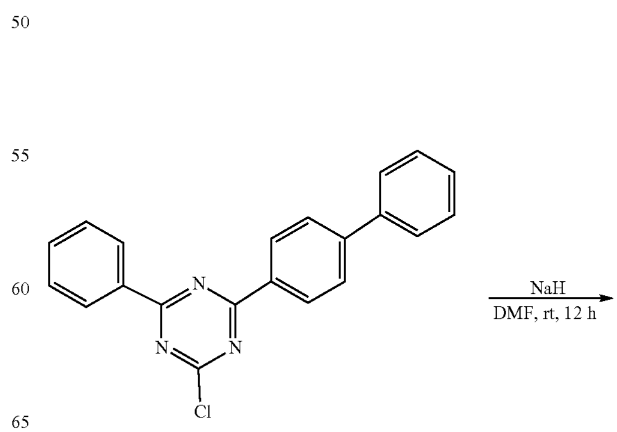

-continued

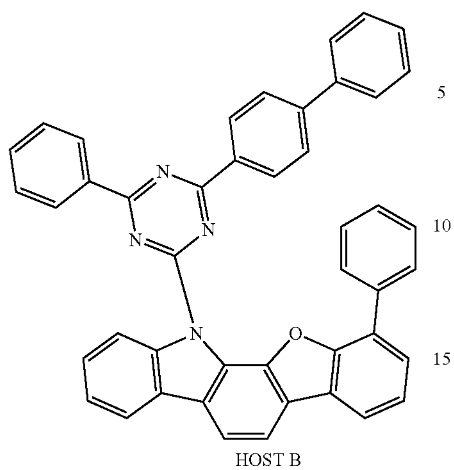

HOST B 4 g (12 mmol) of Intermediate M-5 was dissolved in 60 ml of DMF, and 3.46 g (14.4 mmol) of 60 wt % NaH was slowly added to the reaction solution and then, stirred for 30 minutes. Subsequently, 0.58 g (15.6 mmol) of 2-([1,1'-biphenyl]-4-yl)-4-chloro-6-phenyl-1,3,5-triazine was added thereto and then, stirred at room temperature. When a reaction was completed, distilled water was added to the reaction solution, and a solid produced therein was filtered. The obtained product was dissolved in toluene and then, recrystallized to obtain HOST B (6.15 g, Yield: 80%).

LC-MS M+H: 640.75 g/mol

Comparative Synthesis Example 3: Synthesis of Host C

[Reaction Scheme 30]

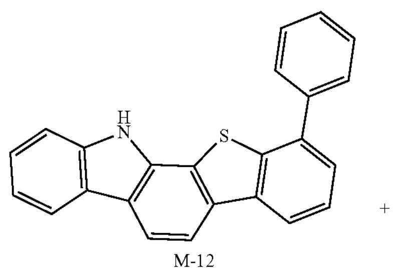

M-12

+

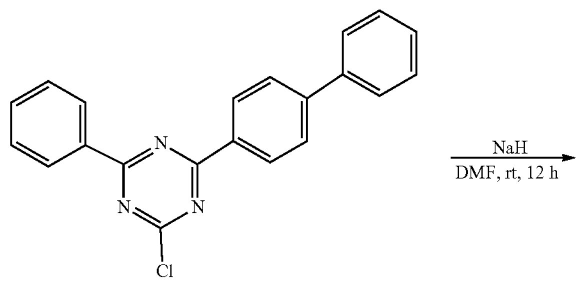

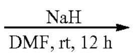

-continued

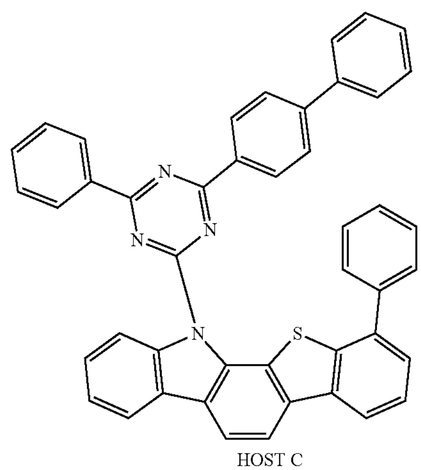

HOST C

HOST C (5.514 g, Yield: 73%) was obtained according to the same method as Comparative Synthesis Example 2 except that 4.02 g (11.5 mmol) of Intermediate M-12 was used instead of Intermediate M-5 in Reaction Scheme 29 of Comparative Synthesis Example 2.

LC-MS M+H: 656.81 g/mol

Comparative Synthesis Example 4: Synthesis of Host D

[Reaction Scheme 31]

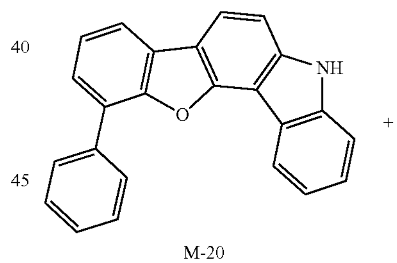

M-20

+

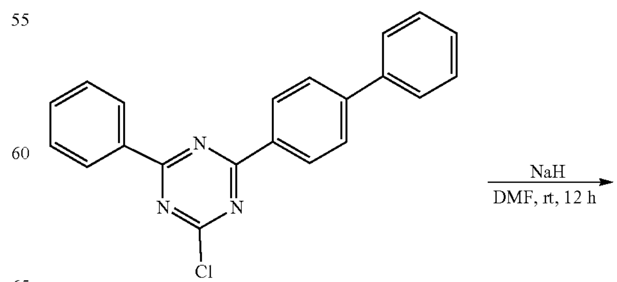

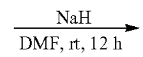

-continued

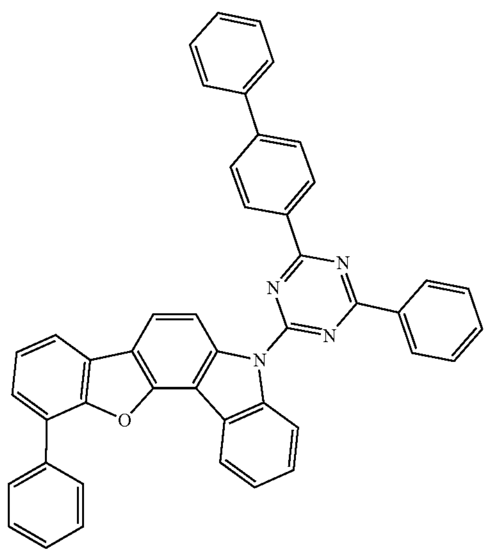

HOST D

HOST D (5.3 g, Yield: 76%) was obtained according to the same method as Comparative Synthesis Example 2 except that 3.6 g (10.9 mmol) of Intermediate M-20 was used instead of Intermediate M-5 in Reaction Scheme 29 of Comparative Synthesis Example 2.

LC-MS M+H: 640.75 g/mol

Comparative Synthesis Example 5: Synthesis of Host E

1st Step: Synthesis of Intermediate M-23

[Reaction Scheme 32]

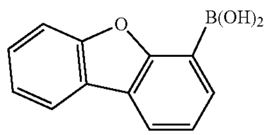

+

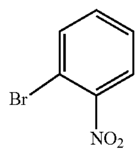

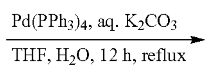

-continued

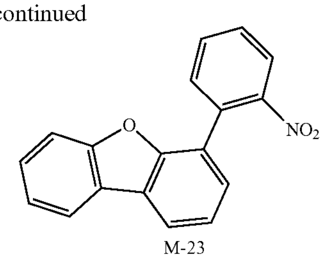

M-23

Intermediate M-23 (50 g, Yield: 92%) was obtained according to the same method as Synthesis Example 5 except that 42 g (207.54 mmol) of 1-bromo-2-nitrobenzene was used instead of the 1-bromo-3-chloro-2-fluorobenzene, and 40 g (188.7 mmol) of dibenzo[b,d]furan-4-ylboronic acid was used instead of the phenylboronic acid in Reaction Scheme 16 of the 1st step Synthesis Example 5.

LC-MS M+H: 290.07 g/mol

2nd Step: Synthesis of Intermediate M-24

[Reaction Scheme 33]

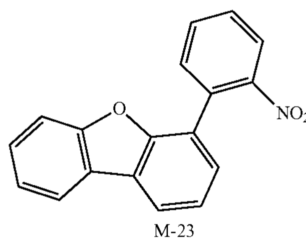

M-23

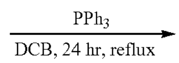

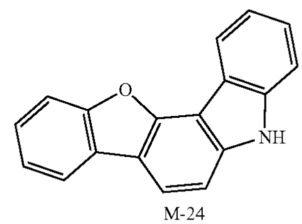

M-24

Intermediate M-24 (16.7 g, Yield: 75%) was used according to the same method as Synthesis Example 6 except that 25 g (86.4 mmol) of Intermediate M-23 was used instead of Intermediate M-19 in Reaction Scheme 24 of the 3$^{rd}$ step of Synthesis Example 6.

LC-MS M+H: 258.08 g/mol

3rd Step: Synthesis of HOST E
[Reaction Scheme 34]
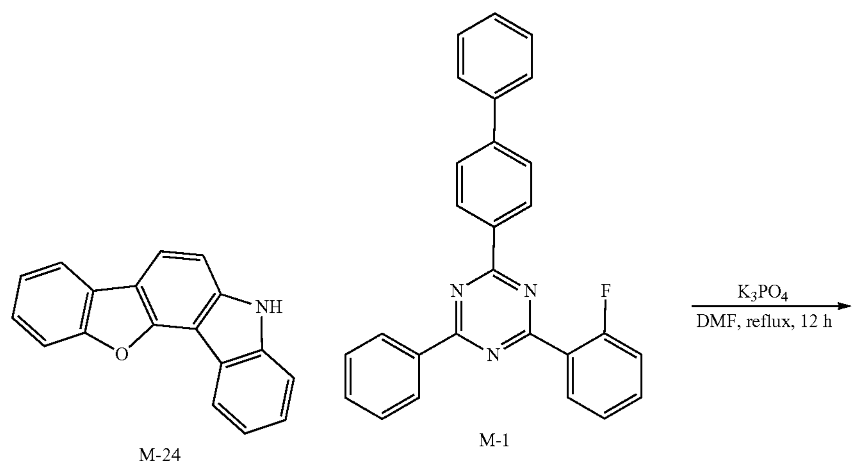
M-24 M-1
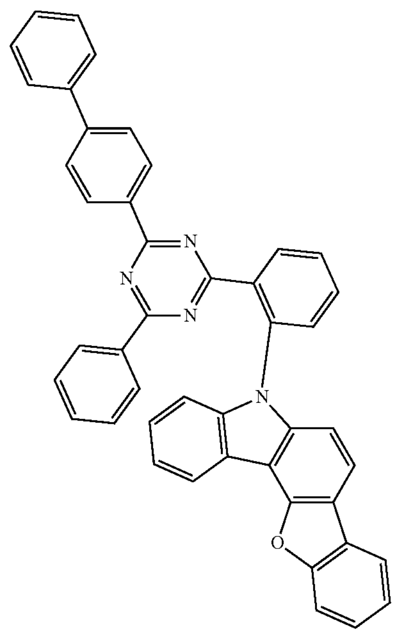
HOST E HOST E (32 g, Yield: 78%) was obtained according to the same method as Synthesis Example 1 except that 16.7 g (64.9 mmol) of Intermediate M-24 was used instead of Intermediate M-5 in Reaction Scheme 6 of the 6th step of Synthesis Example 1.

LC-MS M+H: 640.75 g/mol

Comparative Synthesis Example 6: Synthesis of Host F

1st Step: Synthesis of Intermediate M-26

[Reaction Scheme 34]

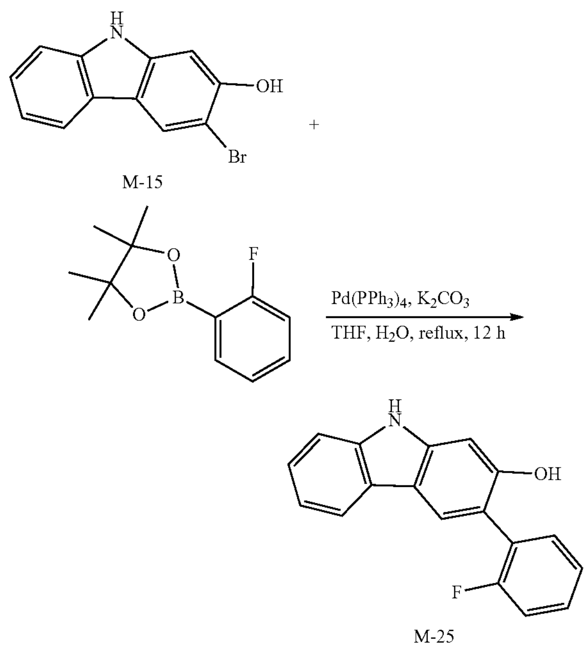

Intermediate M-25 (17.59 g, Yield: 64%) was obtained according to the same method as Synthesis Example 5 except that 23 g (99.13 mmol) of Intermediate M-15 was used instead of the 1-bromo-3-chloro-2-fluorobenzene, and 26 g (118.97 mmol) of 2-fluorobenzeneboronic acid was used instead of the phenylboronic acid in Reaction Scheme 16 of the 1st step of Synthesis Example 5.

LC-MS M+H: 277.3 g/mol

2nd Step: Synthesis of Intermediate M-26

[Reaction Scheme 35]

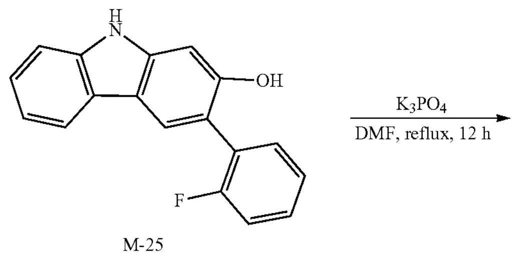

M-25

-continued

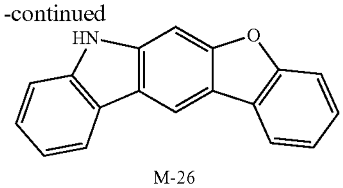

M-26

Intermediate M-26 (9.14 g, Yield: 56%) was obtained according to the same method as Synthesis Example 5 except that 17.59 g (63.43 mmol) of Intermediate M-25 was used instead of Intermediate M-16 in Reaction Scheme 20 of the 5th step of Synthesis Example 5.

LC-MS M+H: 257.29 g/mol

3rd Step: Synthesis of HOST F

[Reaction Scheme 36]

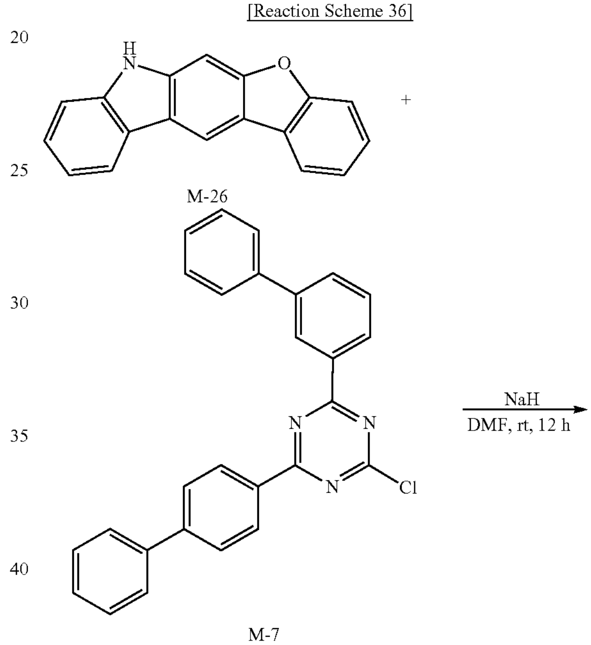

M-7

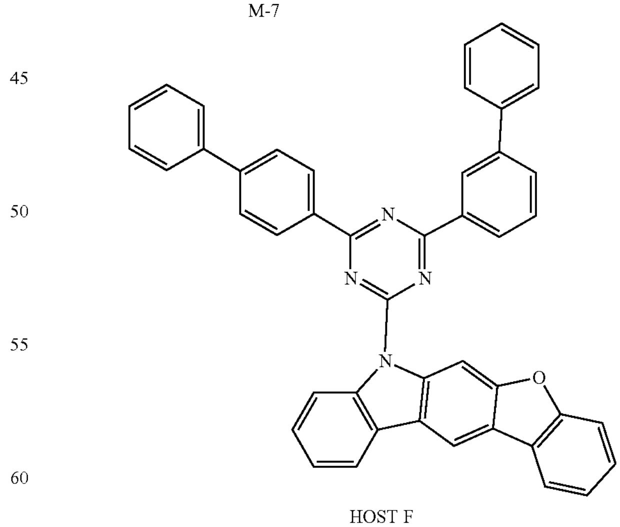

HOST F

HOST F (20.7 g, Yield: 91%) was obtained according to the same method as Comparative Synthesis Example 2 except that 9.14 g (35.5 mmol) of Intermediate M-26 was used instead of Intermediate M-5, and 17.88 g (42.6 mmol)

of Intermediate M-7 (2-([1,1'-biphenyl]-3-yl)-4-([1,1'-biphenyl]-4-yl)-6-chloro-1,3,5-triazine) was used instead of the 2-([1,1'-biphenyl]-4-yl)-4-chloro-6-phenyl-1,3,5-triazine in Reaction Scheme 29 of Comparative Synthesis Example 2.

LC-MS M+H: 640.75 g/mol (Manufacture of Organic Light Emitting Diode)

Example 1

A glass substrate coated with a thin film of indium tin oxide (ITO) was washed with distilled water and ultrasonic waves. After washing with the distilled water, the glass substrate was ultrasonically washed with isopropyl alcohol, acetone, or methanol, and dried and then, moved to a plasma cleaner, cleaned by using oxygen plasma for 10 minutes, and moved to a vacuum depositor. This obtained ITO transparent electrode was used as an anode, Compound A doped with 1% NDP-9 (commercially available from Novaled) was vacuum-deposited on the ITO substrate to form a 1,400 Å-thick hole transport layer, and Compound B was deposited on the hole transport layer to form a 350 Å-thick hole transport auxiliary layer. On the hole transport auxiliary layer, Compound 1 of Synthesis Example 1 was used as a host, and the host was doped with 10 wt % of PhGD as a dopant to form a 400 Å-thick light emitting layer by vacuum deposition, and in the case of the following Examples and Comparative Examples, weight ratios of the materials of the host in the light emitting layer are described below. Then, Compound C was deposited on the light emitting layer to form a 50 Å-thick electron transport auxiliary layer, and Compound D and Liq were simultaneously vacuum-deposited at a weight ratio of 1:1 to form a 300 Å-thick electron transport layer. 15 Å of LiQ and 1,200 Å of Al were sequentially vacuum-deposited on the electron transport layer to form a cathode, to finish manufacturing an organic light emitting diode.

The organic light emitting diode has a structure having five organic layers, and is specifically as follows.

ITO/Compound A (1% NDP-9 doping, 1,400 Å)/Compound B (350 Å)/[Compound 1:PhGD=90:10 (wt %)] (400 Å)/Compound C (50 Å)/Compound D:LiQ (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-bis(9,9-dimethyl-9H-fluoren-4-yl)-9,9-spirobi(fluorene)-2-amine Compound C: 2-(3-(3-(9,9-dimethyl-9H-fluoren-2-yl)phenyl)phenyl)-4,6-diphenyl-1,3,5-triazine Compound D: 8-(4-(4,6-di(naphthalen-2-yl)-1,3,5-triazin-2-yl)phenyl)quinolone

[PhGD]

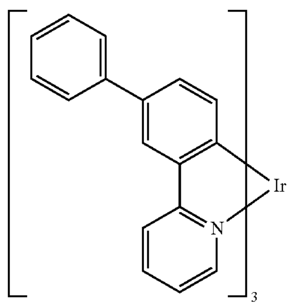

Examples 2 to 7 and Comparative Examples 1 to 7

Diodes according to Examples 2 to 7 and Comparative Examples 1 to 7 were manufactured according to the same method as Example 1 except that the hosts were changed as shown in Tables 1 to 7.

The diodes according to Examples 2 to 7 and Comparative Examples 2 to 7 were manufactured by mixing the first host and the second host in a weight ratio of 3:7.

Evaluation

The driving voltages, luminous efficiency, and lifespan characteristics of the organic light emitting diodes according to Examples 2 to 7 and Comparative Examples 1 to 7 were evaluated. Specific measurement methods are as follows.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area of the device to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

Luminous efficiency (cd/A) at the same current density (10 mA/$cm^2$) were calculated by using the luminance, current density, and voltage from the items (1) and (2).

(4) Measurement of Life-Span

T95 life-spans of the organic light emitting diodes according to Example 1 to 7, and Comparative Examples 1 to 7 were measured as a time when their luminance decreased down to 95% relative to the initial luminance (cd/$m^2$) after emitting light with 6,000 cd/$m^2$ as the initial luminance (cd/$m^2$) and measuring their luminance decrease depending on a time with a Polanonix life-span measurement system.

(5) Measurement of Driving Voltage

A driving voltage of each diode was measured using a current-voltage meter (Keithley 2400) at 15 mA/$cm^2$.

Each measurement value of the Examples was calculated as a relative value based on those of Comparative Examples 1 to 7, and the results are shown in Tables 1 to 7.

TABLE 1

| | Single host | T95 (%) | Driving voltage ratio (%) |
|---|---|---|---|
| Example 1 | Compound 1 | 160% | 92% |
| Comparative Example 1 | HOST A | 100% | 100% |

TABLE 2

| | Host | | Electric power efficiency ratio | Driving voltage ratio |
|---|---|---|---|---|
| | First host | Second host | (%) | (%) |
| Example 2 | Compound 1 | A-136 | 104 | 100 |
| Comparative Example 2 | HOST B | A-136 | 100 | 100 |

TABLE 3

| | Host | | Electric power | Driving |
|---|---|---|---|---|
| | First host | Second host | efficiency ratio (%) | voltage ratio (%) |
| Example 3 | Compound 16 | A-136 | 106 | 97 |
| Comparative Example 3 | HOST C | A-136 | 100 | 100 |

TABLE 4

| | Host | | Electric power | T95 |
|---|---|---|---|---|
| | First host | Second host | efficiency ratio (%) | (%) |
| Example 4 | Compound 91 | A-136 | 105 | 114 |
| Comparative Example 4 | HOST D | A-136 | 100 | 100 |

TABLE 5

| | Host | | T95 |
|---|---|---|---|
| | First host | Second host | (%) |
| Example 5 | Compound 1 | A-136 | 166 |
| Comparative Example 5 | HOST A | A-136 | 100 |

TABLE 6

| | Host | | Electric power | T95 |
|---|---|---|---|---|
| | First host | Second host | efficiency ratio (%) | (%) |
| Example 6 | Compound 91 | A-136 | 103 | 188 |
| Comparative Example 6 | HOST E | A-136 | 100 | 100 |

TABLE 7

| | Host | | Electric power | T95 |
|---|---|---|---|---|
| | First host | Second host | efficiency ratio (%) | (%) |
| Example 7 | Compound 31 | A-136 | 103 | 180 |
| Comparative Example 7 | HOST F | A-136 | 100 | 100 |

Referring to Table 1, the diode of Example 1, including a compound including a substituent at the positions $Ar^3$ to $Ar^6$ alone (as the host) exhibited significantly improved life-span characteristics and driving voltage, compared with the diode of Comparative Example 1.

Referring to Table 5, the diode of Example 5, including compound including a substituent at the positions $Ar^3$ to $Ar^6$ as a first host with a second host exhibited significantly improved life-span characteristics, compared with the diode of Comparative Example 5, including a compound including no substituent at the positions $Ar^3$ to $Ar^6$ (as a first host) along with a second host.

Referring to Tables 6 and 7, in the case of a specific fusion type, the diodes of Examples 6 and 7, including compounds including a substituent at the positions $Ar^3$ to $Ar^6$ as a first host, along with a second host, exhibited improved electric power efficiency as well as life-span characteristics, compared with the diodes of Comparative Examples 6 and 7, including compounds including no substituent at the positions as a first host, along with a second host.

Referring to Tables 2 to 4, the diodes of Examples 2 to 4, including compounds including a structure in which triazine and fused carbazole were linked by an ortho-phenylene group, exhibited improved driving voltage or life-span characteristics as well as electric power efficiency, compared with the diodes of Comparative Examples 2 to 4, including compounds including a structure that the triazine and the fused carbazole were not linked by the ortho-phenylene group, but rather directly linked.

One or more embodiments may provide a compound for an organic optoelectronic device capable of implementing an organic optoelectronic device having high efficiency and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic optoelectronic device, comprising:

an anode and a cathode facing each other, and a light emitting layer between the anode and the cathode, wherein:

the light emitting layer includes a composition, including a first compound, and a second compound, the first compound is represented by a combination of Chemical Formula 1 and Chemical Formula 2, and the second compound is represented by Chemical Formula 3-8,

[Chemical Formula 1]

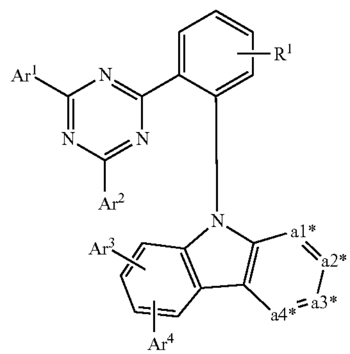

[Chemical Formula 2]

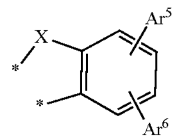

wherein, in Chemical Formula 1 and Chemical Formula 2,

X is O or S, two adjacent ones of a1* to a4* of Chemical Formula 1 are linking carbons linked at * of Chemical Formula 2, the remaining two of a1* to a4* of Chemical Formula 1, not linked at * of Chemical Formula 2, are $CR^a$, $Ar^1$ and $Ar^2$ are each independently a substituted or unsubstituted phenyl group or a substituted or unsubstituted biphenyl group, $R^a$, $R^1$, $Ar^3$, $Ar^4$, and $Ar^6$ are each independently hydrogen or deuterium, and $Ar^5$ is a substituted or unsubstituted C6 to C18 aryl group, and

[Chemical Formula 3-8]

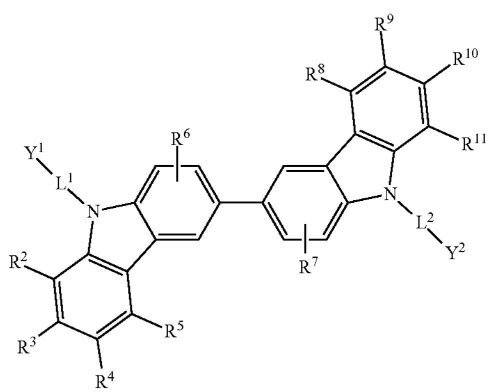

in Chemical Formula 3-8, $R^2$ to $R^{11}$ are each independently hydrogen or a substituted or unsubstituted C6 to C12 aryl group, and moieties *-$L^1$-$Y^1$ and *-$L^2$-$Y^2$ are each independently a moiety of Group II,

[Group II]

C-1

C-2

C-3

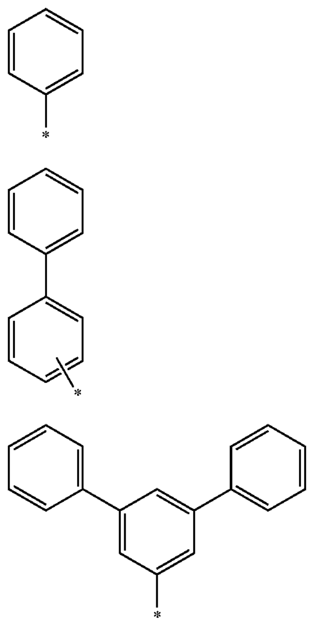

-continued

C-4

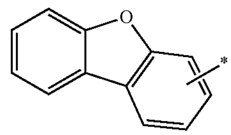

in Group II, * is a linking point.

2. The organic optoelectronic device as claimed in claim 1, wherein:

the combination of Chemical Formula 1 and Chemical Formula 2 is represented by one of Chemical Formula 1A to Chemical Formula 1F,

[Chemical Formula 1A]

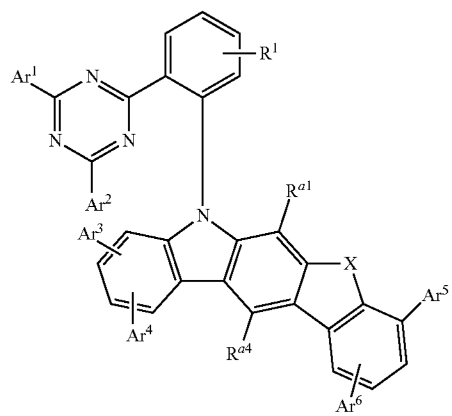

[Chemical Formula 1B]

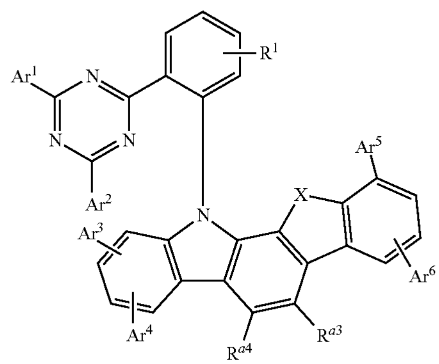

[Chemical Formula 1C]

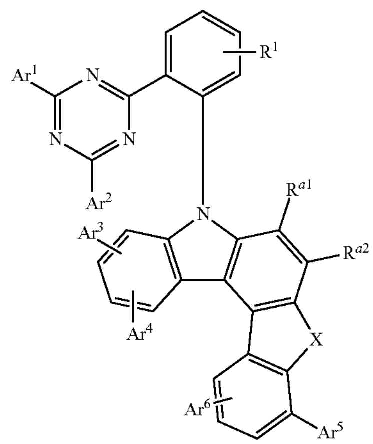

-continued

[Chemical Formula 1D]

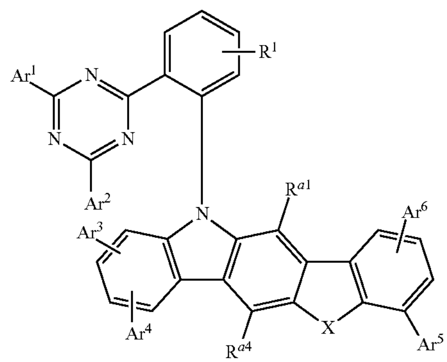

[Chemical Formula 1E]

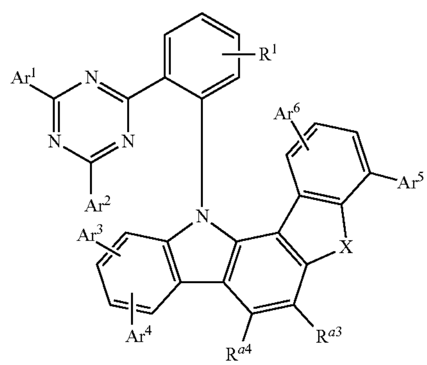

[Chemical Formula 1F]

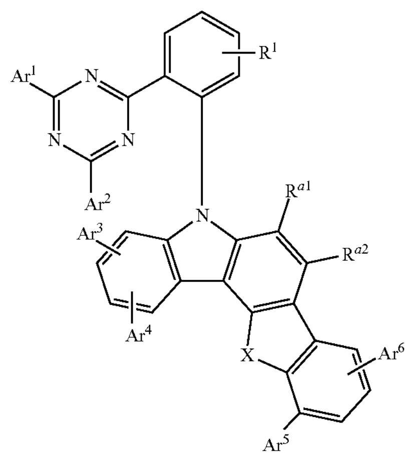

in Chemical Formula 1A to Chemical Formula 1F,

X, $Ar^1$ to $Ar^6$, and $R^1$ are defined the same as those of Chemical Formulae 1 and 2, and $R^{a1}$ to $R^{a4}$ are each independently defined the same as $R^a$.

3. The organic optoelectronic device as claimed in claim 1, wherein:

the combination of Chemical Formula 1 and Chemical Formula 2 is represented by Chemical Formula 1A-I-4, Chemical Formula 1B-I-4, Chemical Formula 1C-I-4, Chemical Formula 1E-I-4, or Chemical Formula 1F-I-4,

[Chemical Formula 1A-I-4]

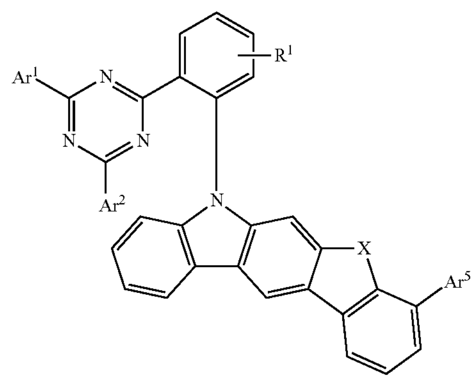

[Chemical Formula 1B-I-4]

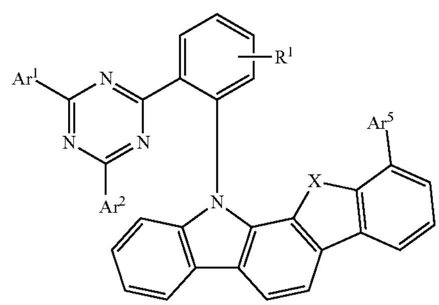

[Chemical Formula 1C-I-4]

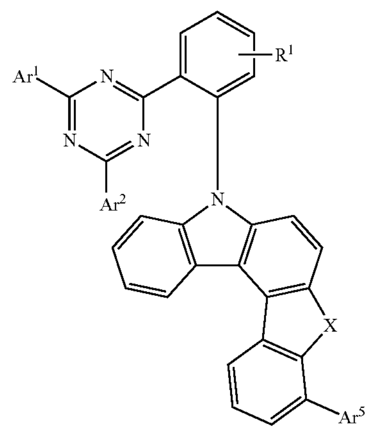

[Chemical Formula 1E-I-4]

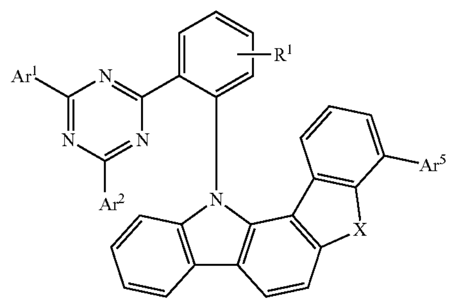

-continued

[Chemical Formula 1F-I-4]

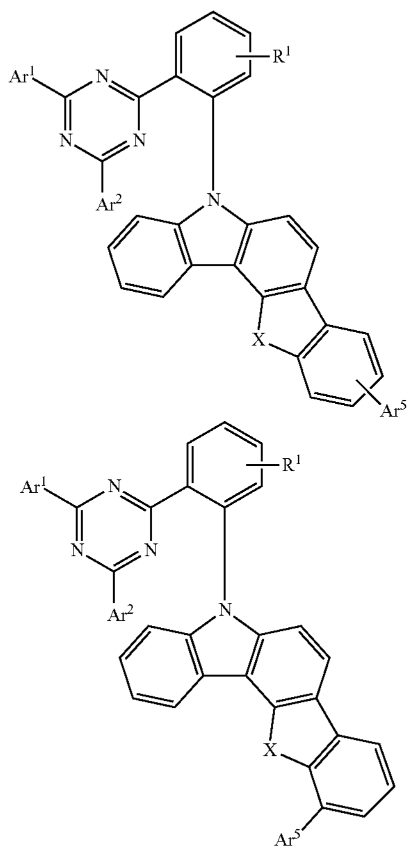

in Chemical Formula 1A-I-4, Chemical Formula 1B-I-4, Chemical Formula 1C-I-4, Chemical Formula 1E-I-4, and Chemical Formula 1F-I-4, X, $Ar^1$, $Ar^2$, and $R^1$ are defined the same as those of Chemical Formulae 1 and 2, and $Ar^5$ is a substituted or unsubstituted C6 to C18 aryl group.

4. The organic optoelectronic device as claimed in claim 3, wherein the combination of Chemical Formula 1 and Chemical Formula 2 is represented by Chemical Formula 1A-I-4, Chemical Formula 1B-I-4, or Chemical Formula 1F-I-4.

5. The organic optoelectronic device as claimed in claim 1, wherein:

$Ar^1$ and $Ar^2$ are each independently a substituted or unsubstituted phenyl group or a substituted or unsubstituted biphenyl group, provided that at least one of $Ar^1$ and $Ar^2$ is a substituted or unsubstituted biphenyl group.

6. The organic optoelectronic device as claimed in claim 1, wherein:

moiety

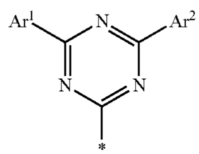

of Chemical Formula 1 is a moiety of Group I:

[Group I]

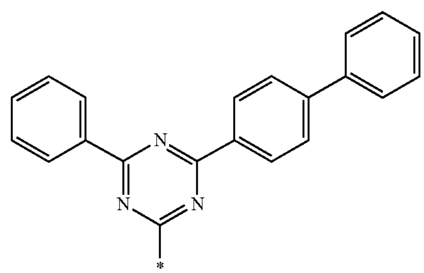

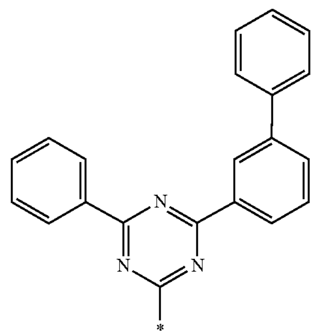

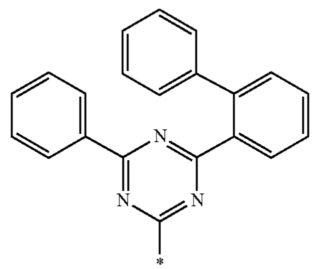

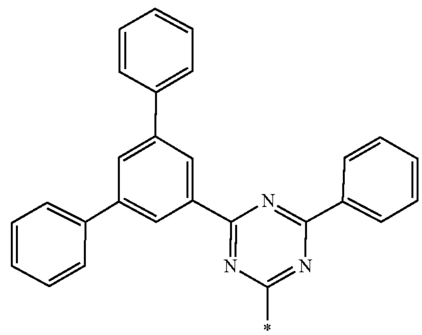

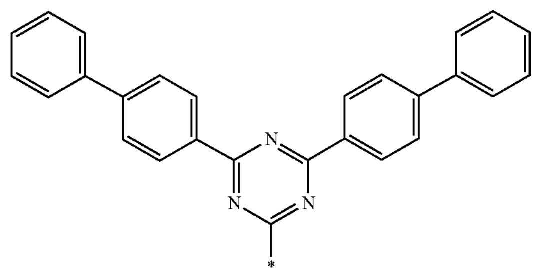

-continued
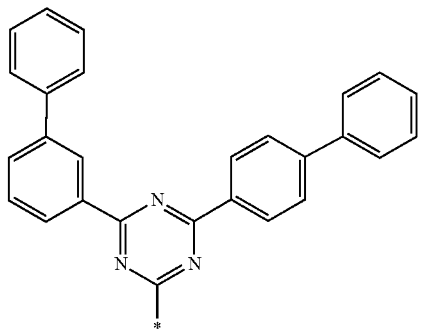
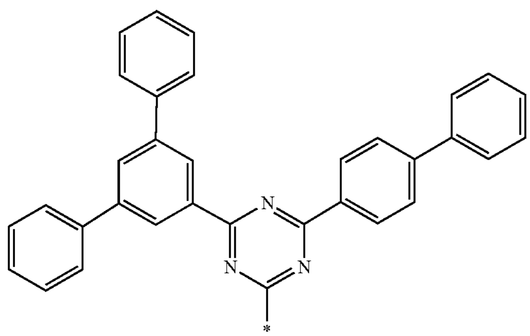
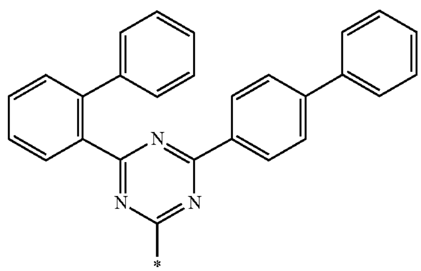 [SMILES: *c1nc(-c2ccc(-c3ccccc3)cc2)nc(-c2ccccc2-c2ccccc2)n1]
in Group I, * is a linking point.
7. The organic optoelectronic device as claimed in claim 1, wherein the first compound is a compound of Group 1:
[Group 1]
1
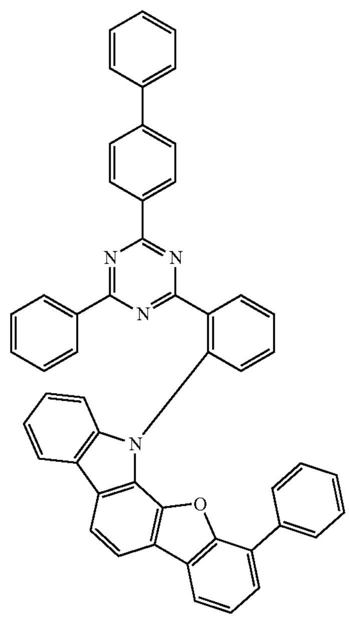
2
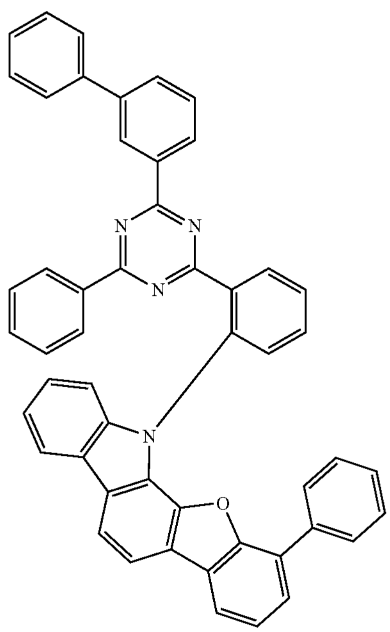

-continued
3
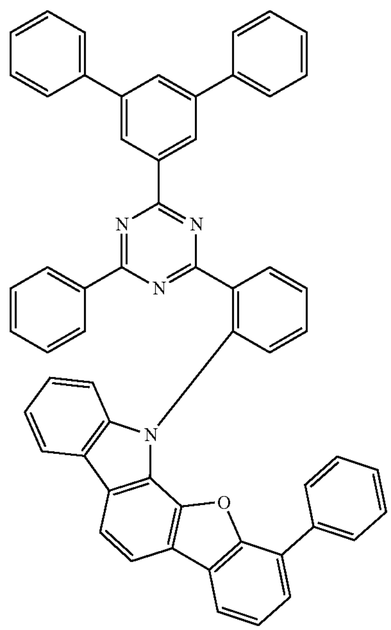
4
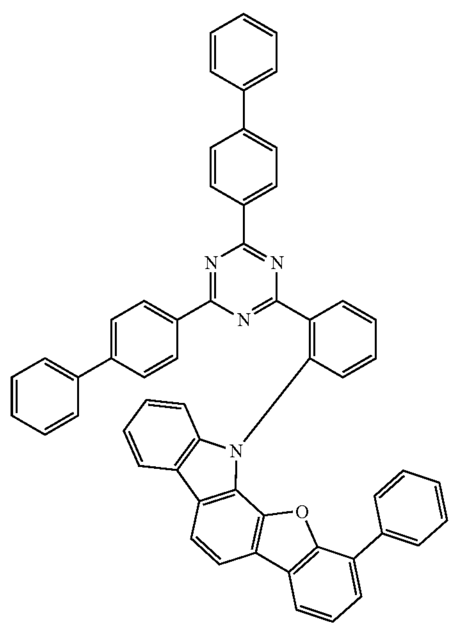
-continued
5
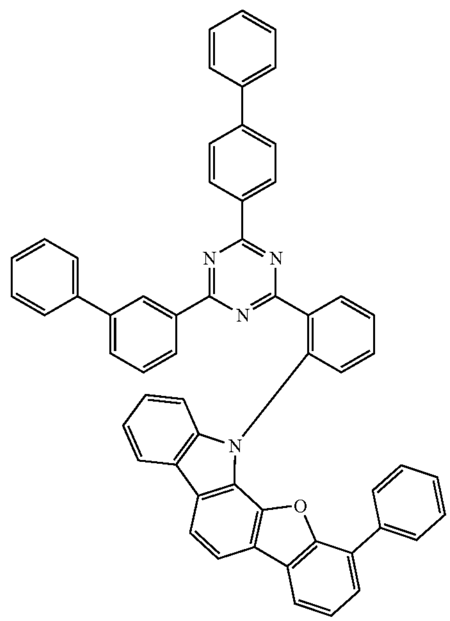
14
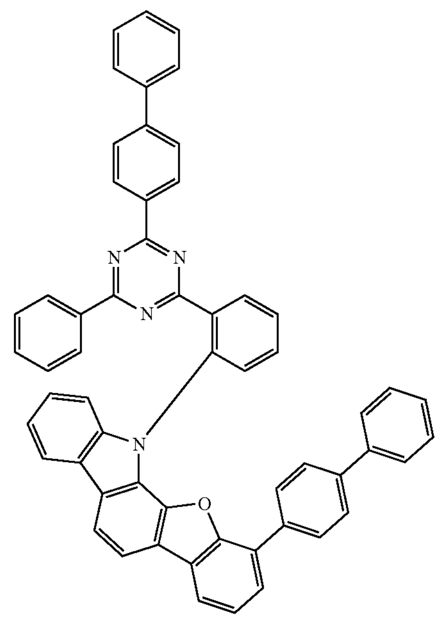

-continued
15
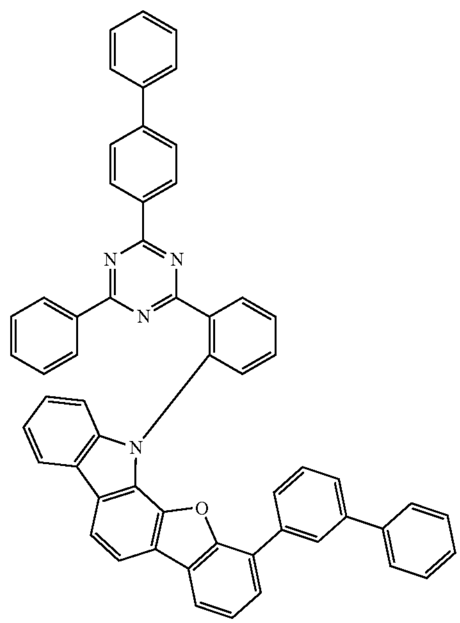
16
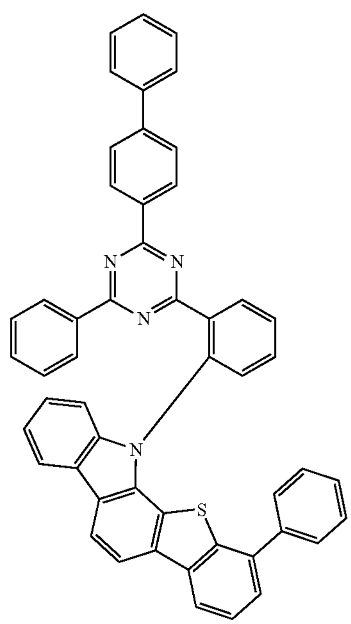
-continued
17
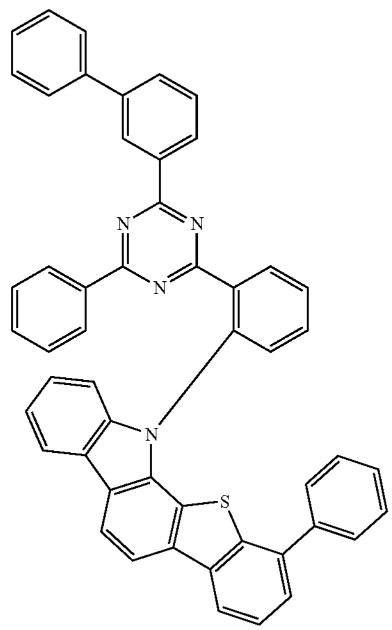
18
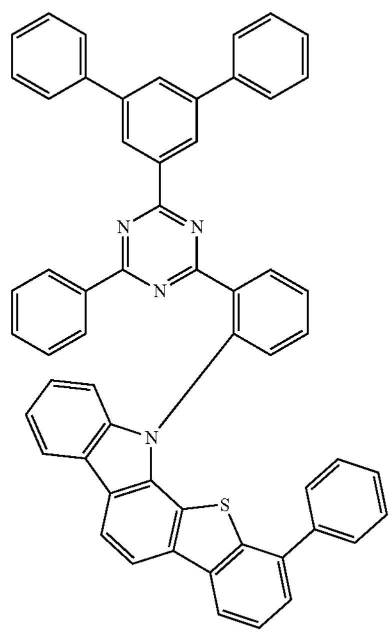

-continued
19
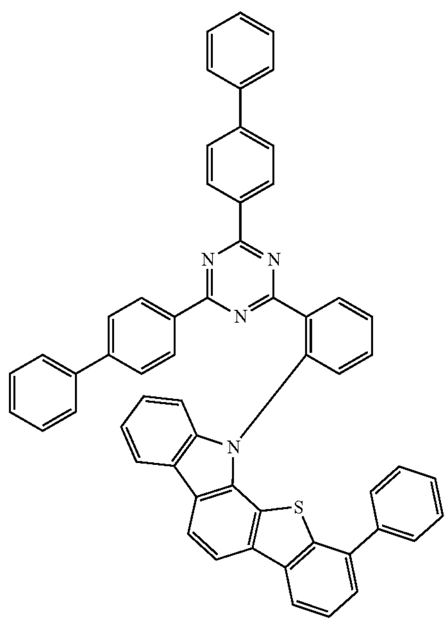
20
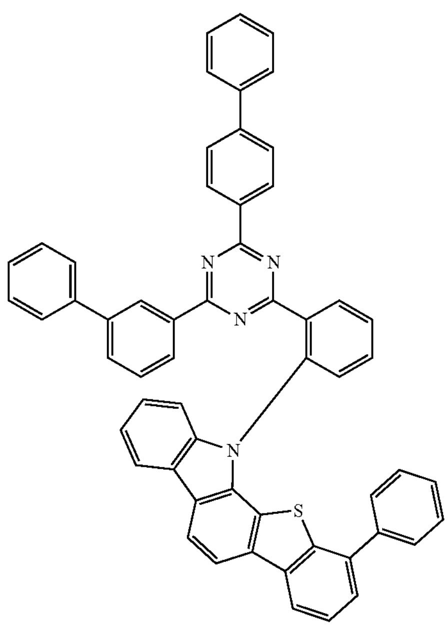
-continued
29
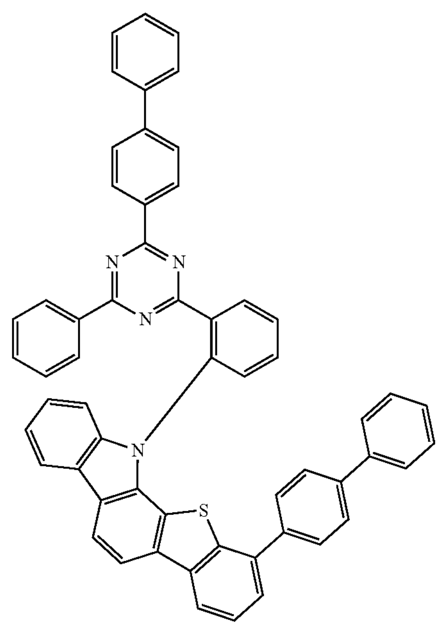
30
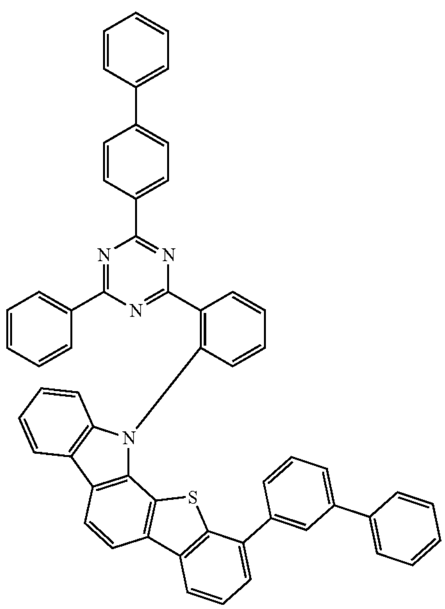

-continued
31
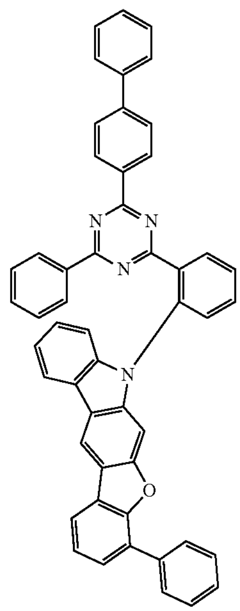
32
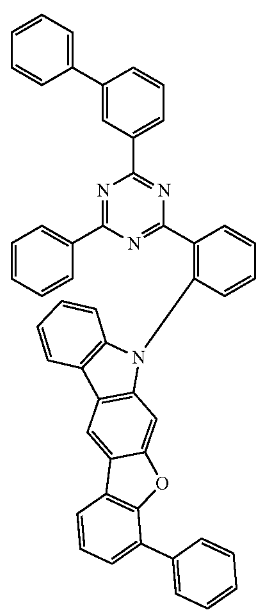
-continued
33
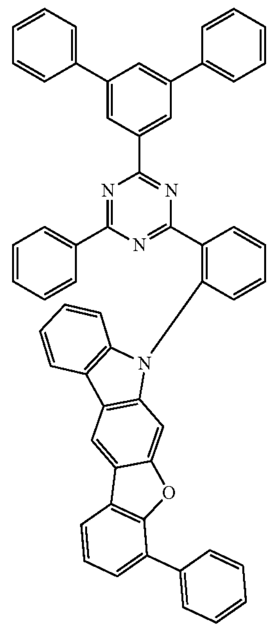
34
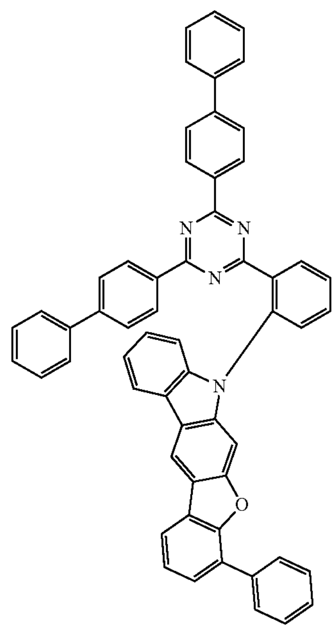

-continued
35
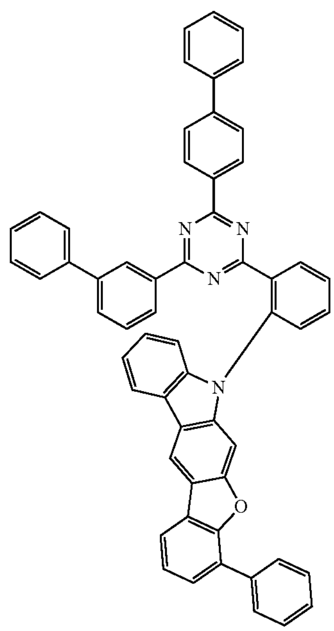
44
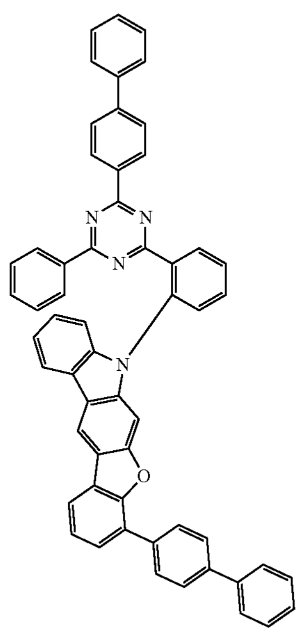
-continued
45
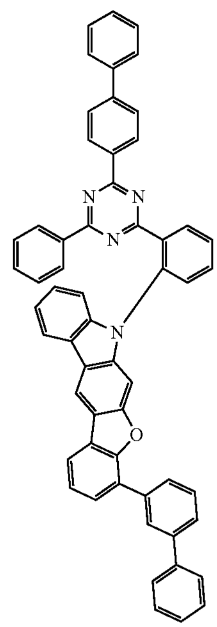
46
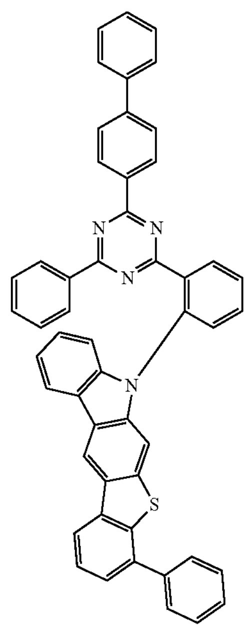

-continued
47
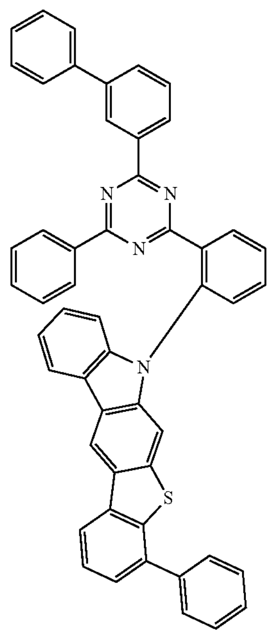
48
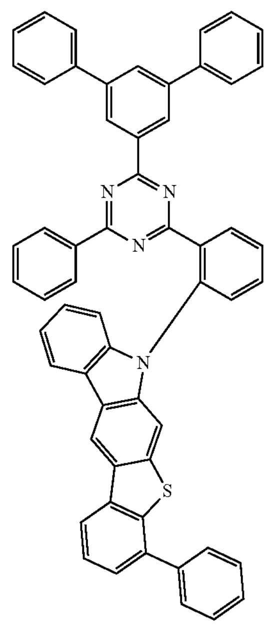
-continued
49
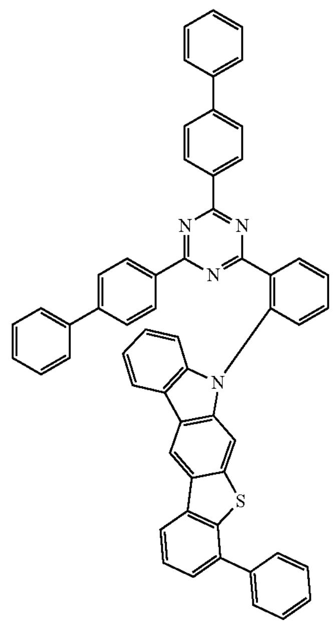
50
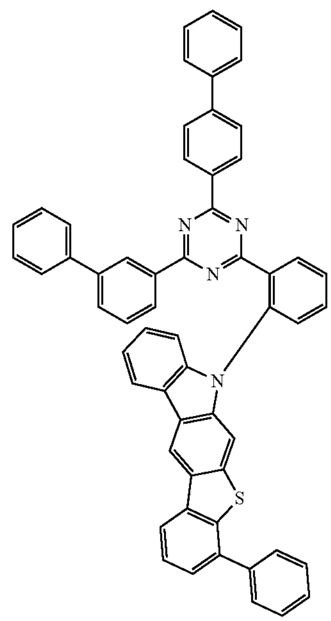

-continued
59
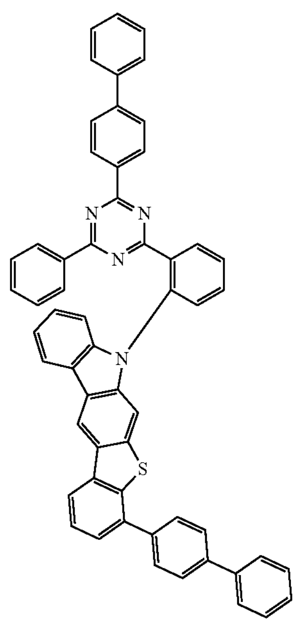
60
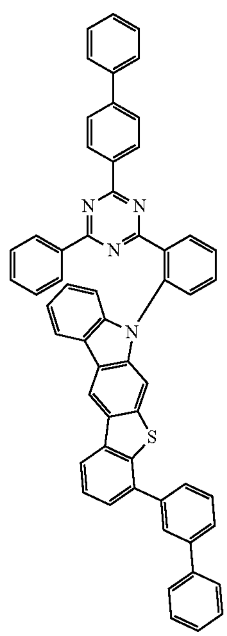
-continued
61
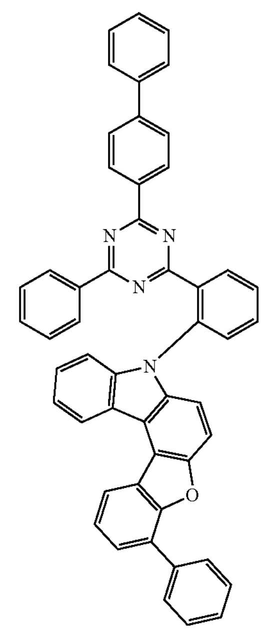
62
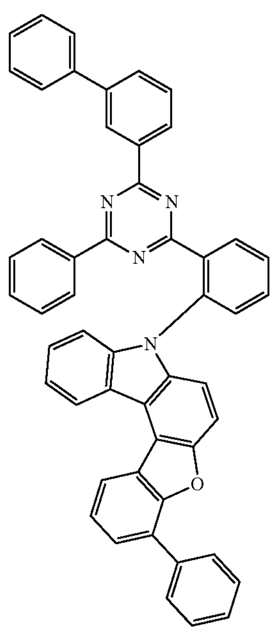

-continued
63
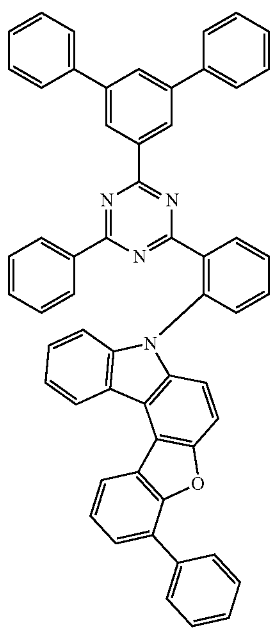
64
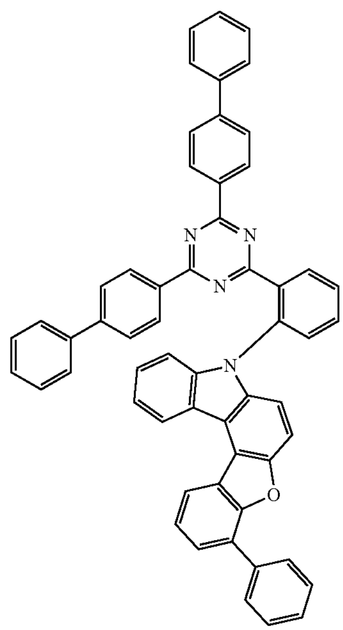
-continued
65
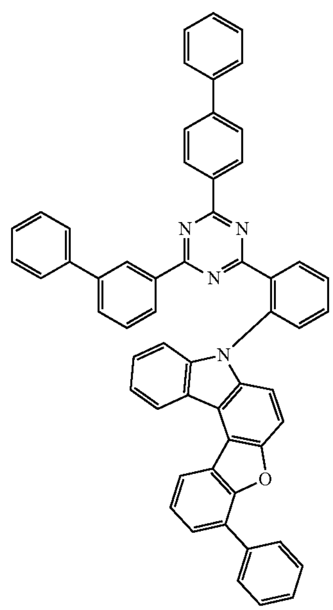
74
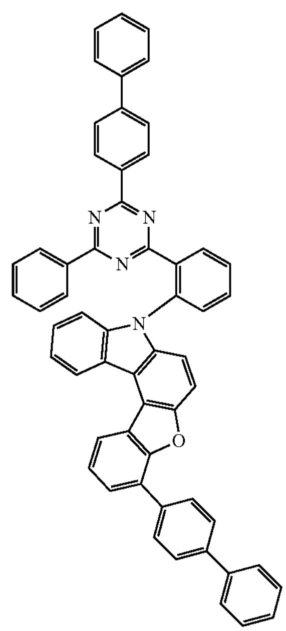

-continued
75
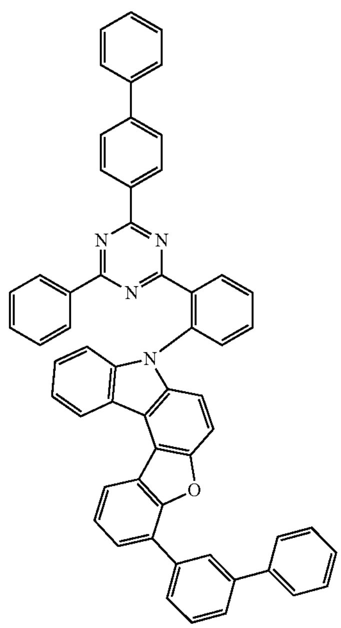
76
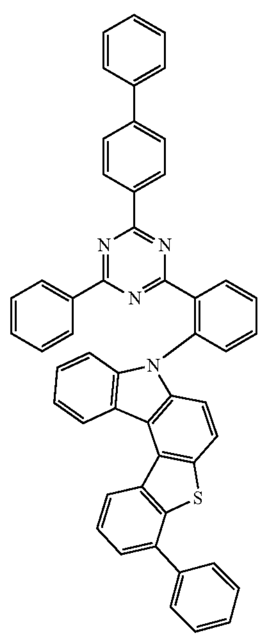
-continued
77
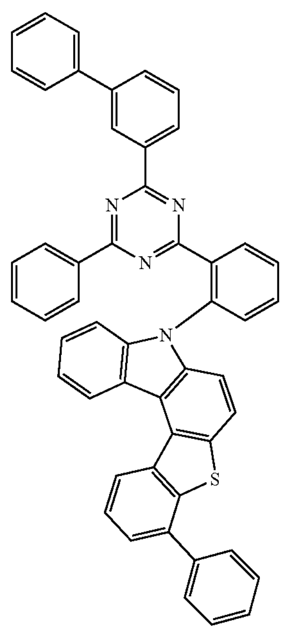
78
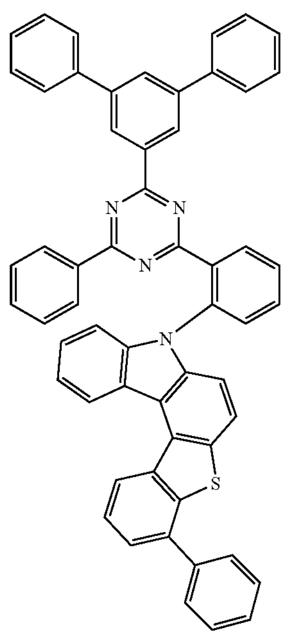

-continued
79
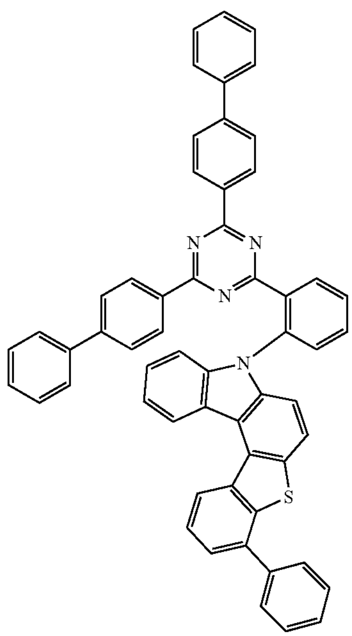
80
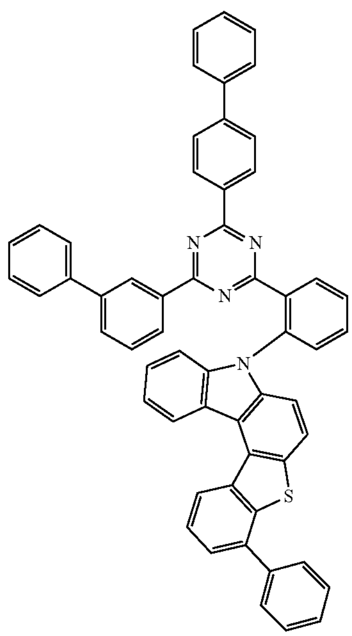
-continued
89
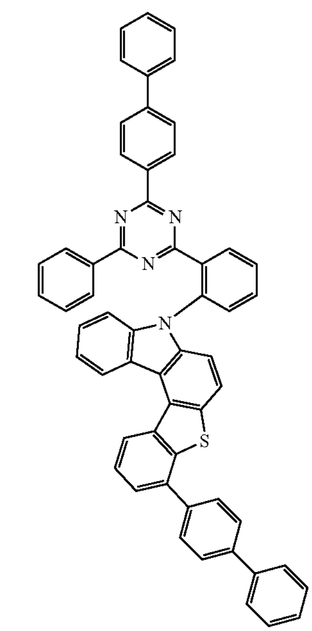
90
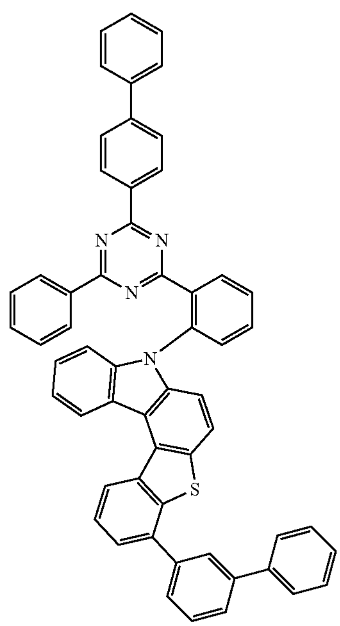

-continued
91
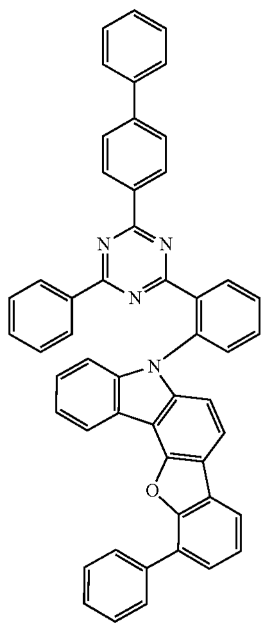
92
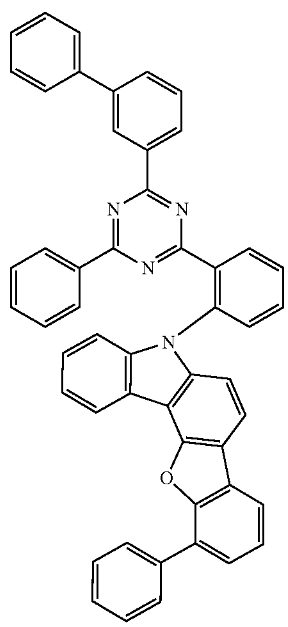
-continued
93
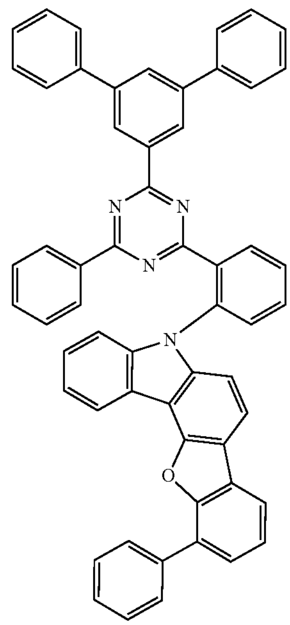
94
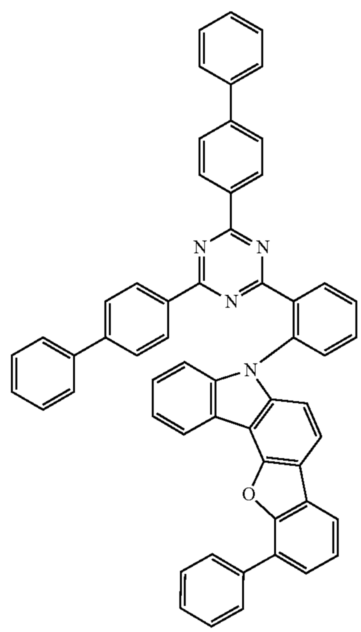

-continued
95
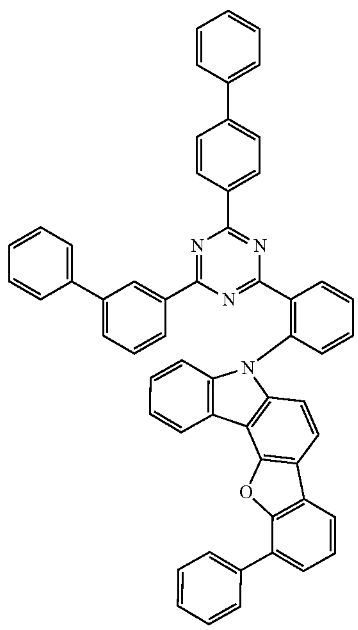
104
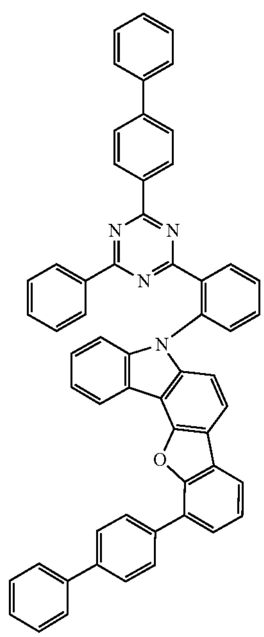
-continued
105
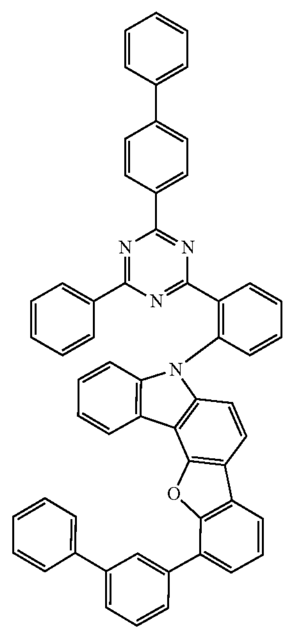
106
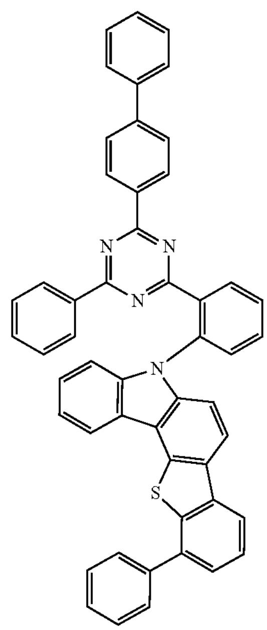

107
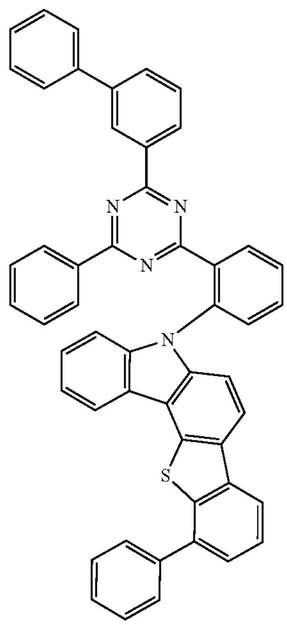
108
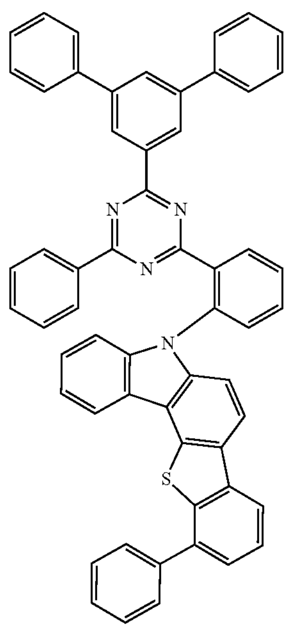
109
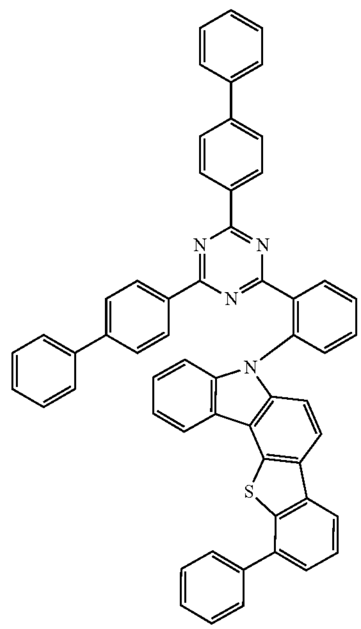
110
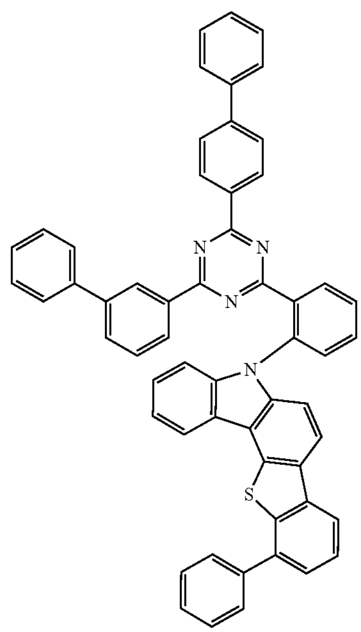

-continued
119
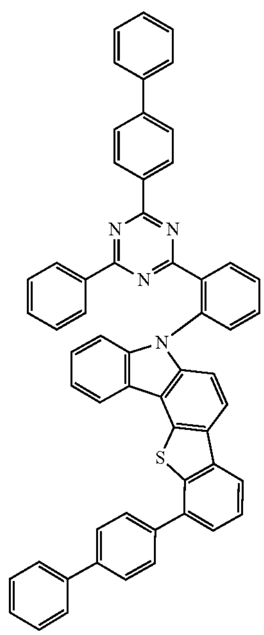
120
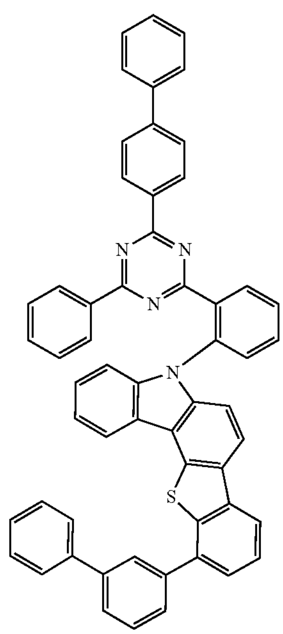
-continued
121
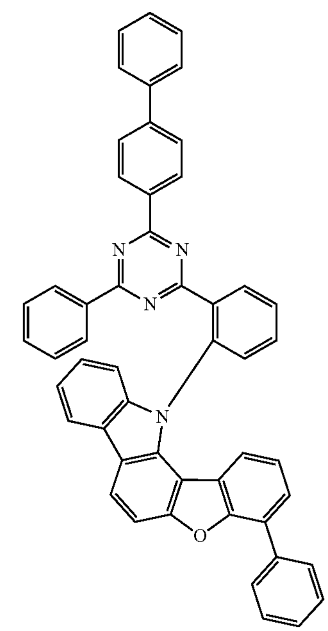
122
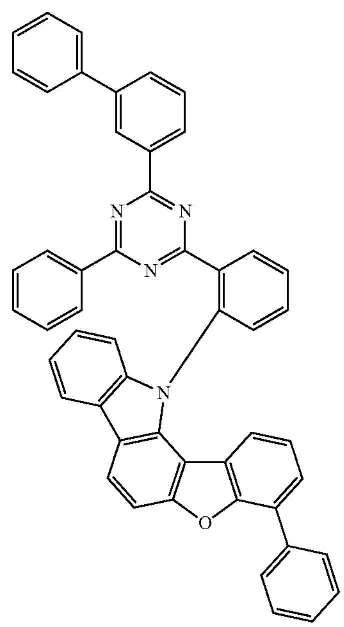

-continued
123
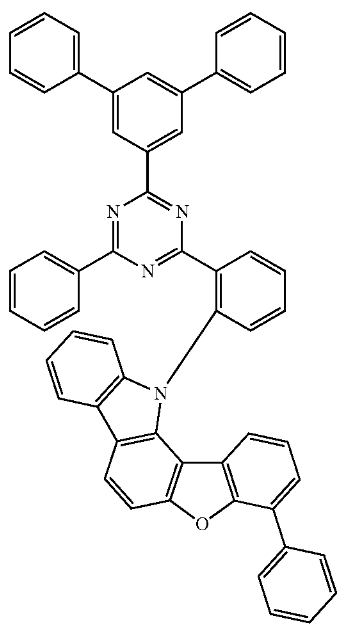
124
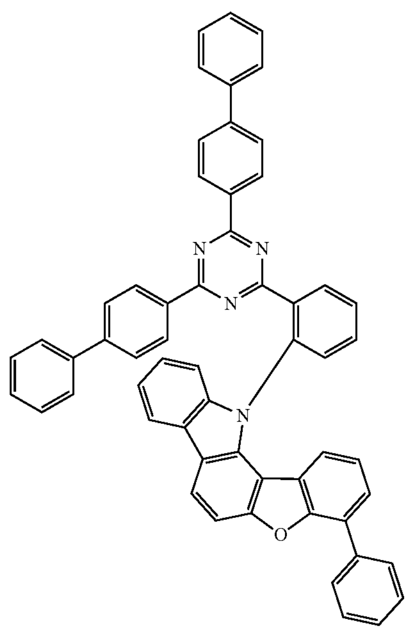
-continued
125
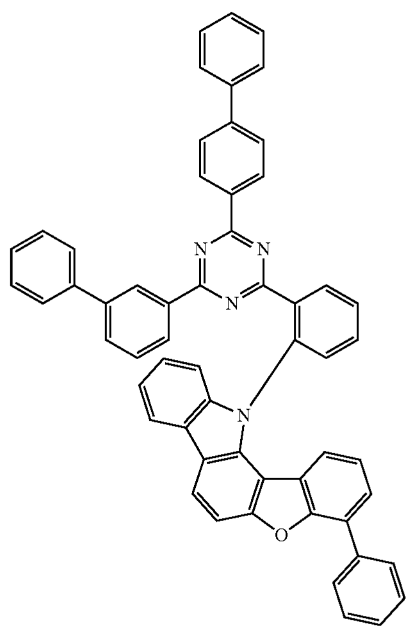
134
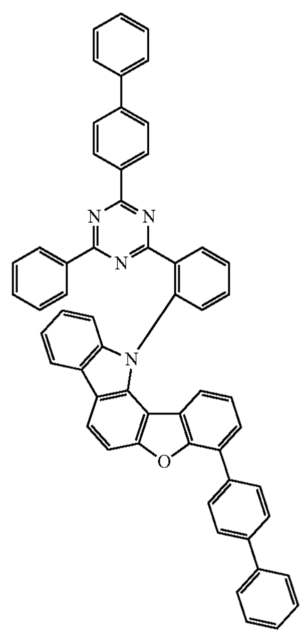

-continued
135
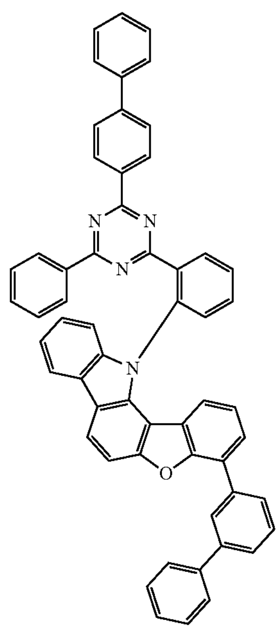
136
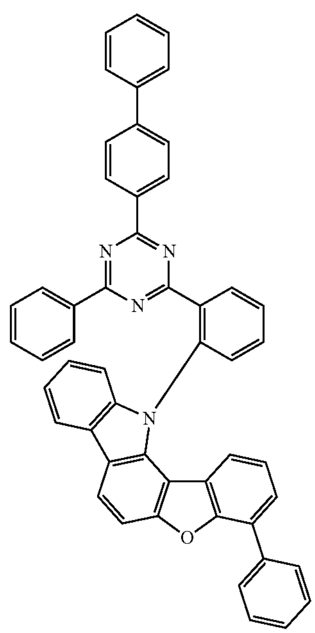
-continued
137
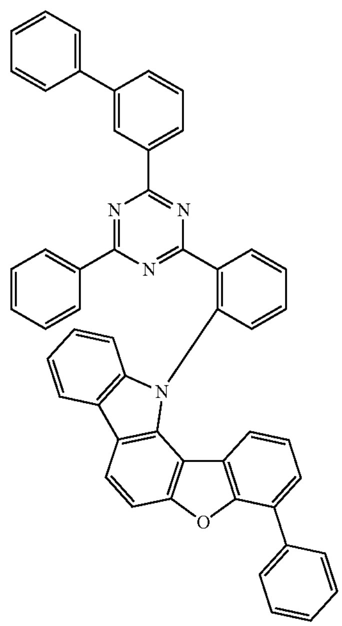
138
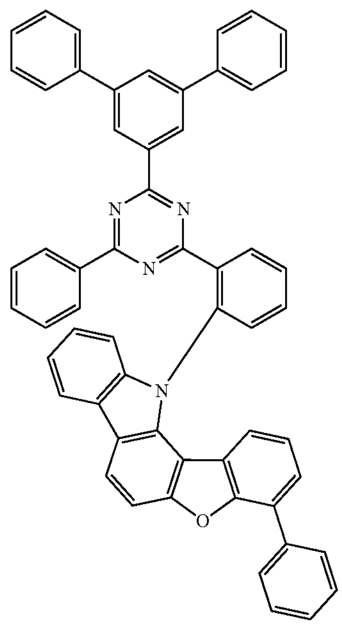

-continued

139

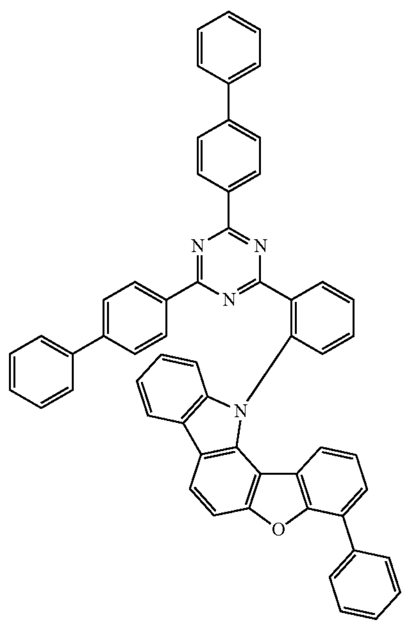

140

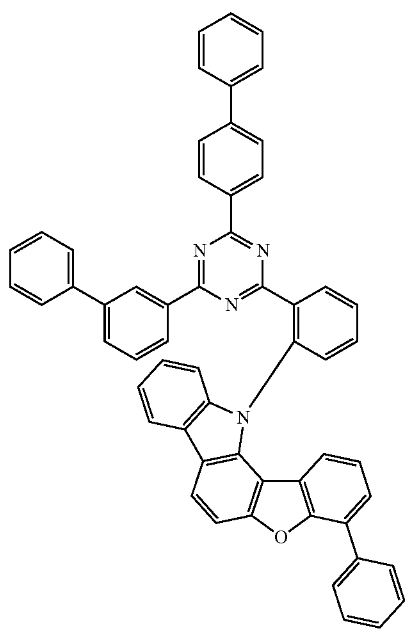

-continued

149

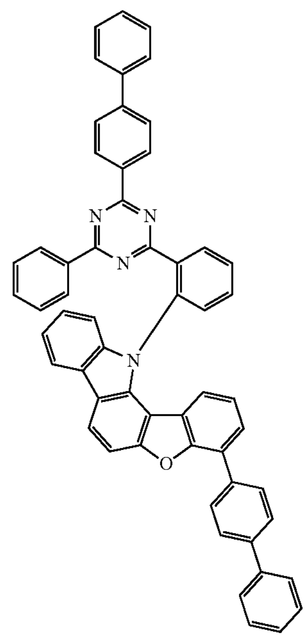

150

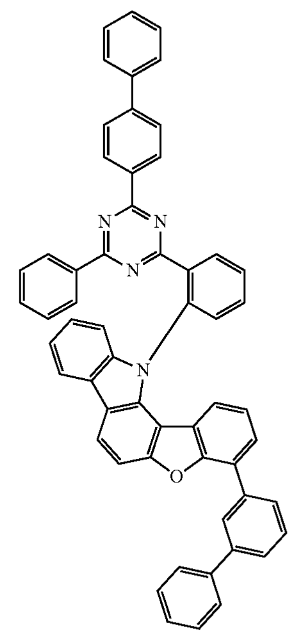

.

8. A display device comprising the organic optoelectronic device as claimed in claim 1.

9. An organic optoelectronic device, comprising:

an anode and a cathode facing each other, and at least one organic layer between the anode and the cathode, wherein:

the at least one organic layer includes a composition, including a first compound, a second compound, the first compound is the compound for the organic optoelectronic device of claim 1, which is a compound of Group 1', and
[Group 1']
1
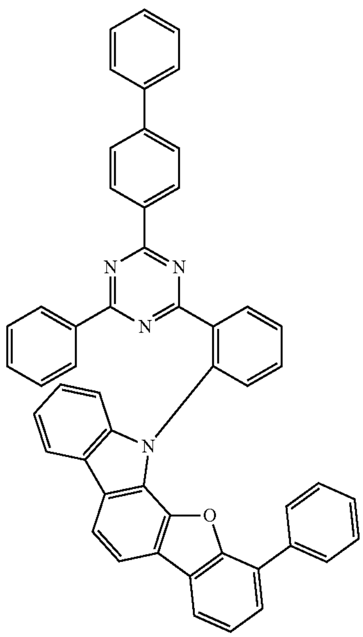
16
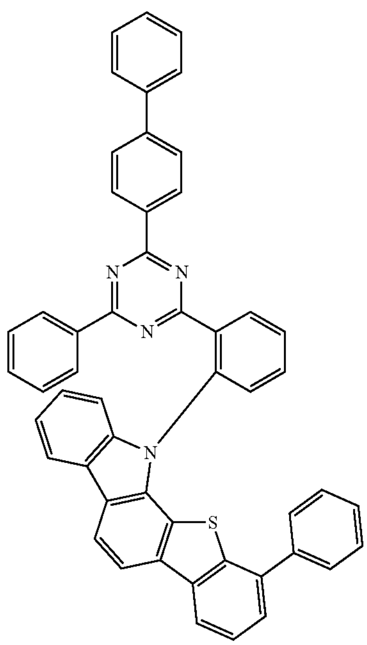
-continued
31
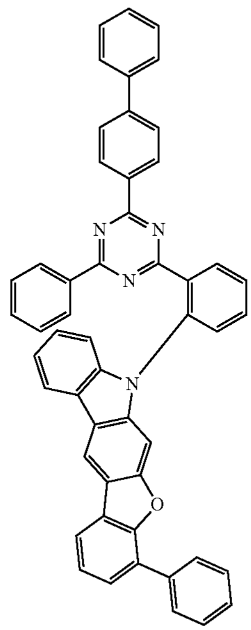
91
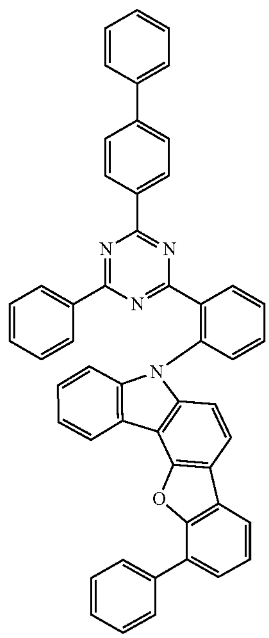

the second compound is a compound of Group 2',
[Group 2']
[A-136]
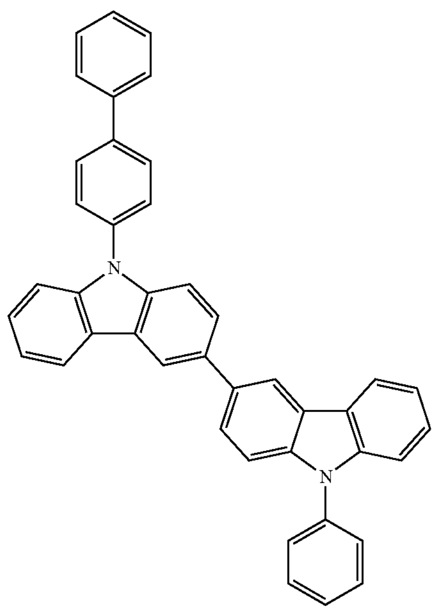
.
* * * * *